(12) United States Patent
Shibazaki

(10) Patent No.: US 10,310,384 B2
(45) Date of Patent: Jun. 4, 2019

(54) EXPOSURE APPARATUS, MOVABLE BODY DRIVE SYSTEM, PATTERN FORMATION APPARATUS, EXPOSURE METHOD, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/704,412

(22) Filed: Sep. 14, 2017

(65) Prior Publication Data

US 2018/0004098 A1  Jan. 4, 2018

Related U.S. Application Data

(60) Continuation of application No. 15/599,785, filed on May 19, 2017, which is a continuation of application (Continued)

(30) Foreign Application Priority Data

Dec. 28, 2007 (JP) ................................ 2007-340460
Dec. 28, 2007 (JP) ................................ 2007-340641
(Continued)

(51) Int. Cl.
*G03B 27/42* (2006.01)
*G03B 27/52* (2006.01)
(Continued)

(52) U.S. Cl.
CPC ...... *G03F 7/70341* (2013.01); *G03F 7/70425* (2013.01); *G03F 7/70975* (2013.01);
(Continued)

(58) Field of Classification Search
CPC ............ G03F 7/70341; G03F 7/70716; G03F 7/7085; G03F 7/707; G03F 9/7088;
(Continued)

(56) References Cited

U.S. PATENT DOCUMENTS 4,780,617 A   10/1988 Umatate et al.
5,448,332 A    9/1995 Sakakibara et al.
(Continued)

FOREIGN PATENT DOCUMENTS

EP   1 420 298 A2   5/2004
EP   1 630 585 A1   3/2006
(Continued)

OTHER PUBLICATIONS

Nov. 28, 2014 Office Action issued in U.S. Appl. No. 12/344,659.
(Continued)

*Primary Examiner* — Mesfin T Asfaw
(74) *Attorney, Agent, or Firm* — Oliff PLC

(57) ABSTRACT

While a wafer stage moves linearly in a Y-axis direction, surface position information of a wafer surface at a plurality of detection points set at a predetermined interval in an X-axis direction is detected by a multipoint AF system, and by a plurality of alignment systems arranged in a line along the X-axis direction, marks at different positions on the wafer are each detected, and a part of a chipped shot of the wafer is exposed by a periphery edge exposure system. This allows throughput to be improved when compared with the case when detection operation of the marks, detection operation of the surface position information (focus information), and periphery edge exposure operation are performed independently.

21 Claims, 72 Drawing Sheets

Related U.S. Application Data

No. 14/466,408, filed on Aug. 22, 2014, now Pat. No. 9,690,205, which is a division of application No. 12/344,659, filed on Dec. 29, 2008, now Pat. No. 9,229,333.

(60) Provisional application No. 61/071,899, filed on May 23, 2008, provisional application No. 61/006,812, filed on Jan. 31, 2008, provisional application No. 61/006,813, filed on Jan. 31, 2008.

(30) Foreign Application Priority Data

Apr. 21, 2008 (JP) .................................. 2008-110766
Nov. 28, 2008 (JP) .................................. 2008-303735

(51) Int. Cl.
G03F 7/20 (2006.01)
G03F 9/00 (2006.01)

(52) U.S. Cl.
CPC .......... G03F 9/7088 (2013.01); G03F 9/7096 (2013.01); *Y10T 29/49002* (2015.01)

(58) Field of Classification Search
CPC ............. G03F 7/70725; G03F 7/70733; G03F 7/70775; G03F 7/2041; G03F 7/70825; G03F 7/20; G03F 2009/005; G03F 7/70466

See application file for complete search history.

(56) References Cited

U.S. PATENT DOCUMENTS

| | | | |
|---|---|---|---|
| 5,610,715 | A | 3/1997 | Yoshii et al. |
| 5,677,758 | A | 10/1997 | McEachern et al. |
| 5,715,064 | A | 2/1998 | Lin |
| 5,929,976 | A | 7/1999 | Shibuya et al. |
| 5,969,441 | A | 10/1999 | Loopstra et al. |
| 6,208,407 | B1 | 3/2001 | Loopstra |
| 6,262,796 | B1 | 7/2001 | Loopstra et al. |
| 6,341,007 | B1 | 1/2002 | Nishi et al. |
| 6,400,441 | B1 | 6/2002 | Nishi et al. |
| 6,549,269 | B1 | 4/2003 | Nishi et al. |
| 6,590,634 | B1 | 7/2003 | Nishi et al. |
| 6,611,316 | B2 | 8/2003 | Sewell |
| 6,778,257 | B2 | 8/2004 | Bleeker et al. |
| 6,952,253 | B2 | 10/2005 | Lof et al. |
| 7,023,610 | B2 | 4/2006 | Ohtsuki et al. |
| 7,161,659 | B2 | 1/2007 | Van Den Brink et al. |
| 7,307,692 | B2 | 12/2007 | Korenaga et al. |
| 7,310,132 | B2 | 12/2007 | Van Der Schoot et al. |
| 7,333,174 | B2 | 2/2008 | Koenen et al. |
| 7,589,822 | B2 | 9/2009 | Shibazaki |
| 2001/0004105 | A1 | 6/2001 | Kwan et al. |
| 2002/0041377 | A1 | 4/2002 | Hagiwara et al. |
| 2002/0132409 | A1 | 9/2002 | Akutsu et al. |
| 2003/0025890 | A1 | 2/2003 | Nishinaga |
| 2004/0032575 | A1 | 2/2004 | Nishi et al. |
| 2004/0233407 | A1 | 11/2004 | Nishi et al. |
| 2005/0168714 | A1 | 8/2005 | Renkens et al. |
| 2005/0219486 | A1* | 10/2005 | Korenaga .......... G03F 7/70641 355/53 |
| 2005/0248856 | A1 | 11/2005 | Omura et al. |
| 2005/0280791 | A1 | 12/2005 | Nagasaka et al. |
| 2006/0001852 | A1 | 1/2006 | Lee et al. |
| 2006/0114445 | A1 | 6/2006 | Ebihara |
| 2006/0139591 | A1 | 6/2006 | Jung |
| 2006/0139660 | A1 | 6/2006 | Kwan |
| 2006/0227308 | A1* | 10/2006 | Brink ................. G03F 7/70341 355/53 |
| 2006/0227309 | A1 | 10/2006 | Loopstra et al. |
| 2006/0231206 | A1 | 10/2006 | Nagasaka et al. |
| 2007/0109515 | A1 | 5/2007 | Nishi |
| 2007/0127006 | A1 | 6/2007 | Shibazaki |
| 2007/0263191 | A1 | 11/2007 | Shibazaki |
| 2007/0263197 | A1 | 11/2007 | Luttikhuis et al. |
| 2007/0288121 | A1 | 12/2007 | Shibazaki |
| 2008/0030715 | A1 | 2/2008 | Kondo et al. |
| 2008/0043212 | A1 | 2/2008 | Shibazaki |
| 2008/0088843 | A1 | 4/2008 | Shibazaki |
| 2008/0094592 | A1 | 4/2008 | Shibazaki |
| 2008/0094593 | A1 | 4/2008 | Shibazaki |
| 2008/0094604 | A1 | 4/2008 | Shibazaki |
| 2008/0106722 | A1 | 5/2008 | Shibazaki |
| 2008/0218713 | A1 | 9/2008 | Shibazaki |
| 2008/0239256 | A1 | 10/2008 | Nagasaka |
| 2008/0240501 | A1 | 10/2008 | Van Der Wijst et al. |
| 2009/0305150 | A1* | 12/2009 | Shiraishi ............. G03F 7/70341 430/30 |

FOREIGN PATENT DOCUMENTS

| | | |
|---|---|---|
| EP | 1 947 683 A1 | 7/2008 |
| JP | S61-044429 A | 3/1986 |
| JP | H05-045886 A | 2/1993 |
| JP | H07-270122 A | 10/1995 |
| JP | H09-275073 A | 10/1997 |
| JP | H10-163097 A | 6/1998 |
| JP | 2000-068192 A | 3/2000 |
| JP | 2001-223159 A | 8/2001 |
| JP | 2002280283 A | 9/2002 |
| JP | 2004-519850 A | 7/2004 |
| JP | 2004-289126 A | 10/2004 |
| JP | 2006-278820 A | 10/2006 |
| JP | 2006-332656 A | 12/2006 |
| JP | 2007-129194 A | 5/2007 |
| WO | 99/46835 A1 | 9/1999 |
| WO | 2001/035168 A1 | 5/2001 |
| WO | 2004/019128 A2 | 3/2004 |
| WO | 2004/053951 A1 | 6/2004 |
| WO | 2004/055803 A1 | 7/2004 |
| WO | 2004/057590 A1 | 7/2004 |
| WO | 2004/086468 A1 | 10/2004 |
| WO | 2004/107011 A1 | 12/2004 |
| WO | 2005/029559 A1 | 3/2005 |
| WO | 2005/059617 A2 | 6/2005 |
| WO | 2005/059618 A2 | 6/2005 |
| WO | 2005/074014 A1 | 8/2005 |
| WO | 2005/124834 A1 | 12/2005 |
| WO | 2007/055237 A1 | 5/2007 |
| WO | 2007/097379 A1 | 8/2007 |

OTHER PUBLICATIONS

Jun. 3, 2015 Office Action issued in U.S. Appl. No. 12/344,659.
Apr. 21, 2016 Office Action Issued in U.S. Appl. No. 14/466,408.
May 29, 2012 Notification of Reasons for Refusal issued in Japanese Patent Application No. 2009-547917 (with translation).
Mar. 25, 2009 Written Opinion of the International Searching Authority issued in PCT/JP2008/004044 (with translation).
May 22, 2014 Office Action issued in U.S. Appl. No. 12/344,659.
Apr. 10, 2012 Office Action issued in U.S. Appl. No. 12/344,659.
Oct. 3, 2012 Office Action issued in U.S. Appl. No. 12/344,659.
Aug. 5, 2011 Office Action issued in Chinese Patent Application No. 200880019589.2 (with translation).
Oct. 14, 2016 Office Action issued in U.S. Appl. No. 14/466,408.
Feb. 21, 2017 Notice of Allowance issued in U.S. Appl. No. 14/466,408.
May 10, 2018 Office Action Issued in U.S. Appl. No. 15/599,785.
Oct. 9, 2018 Office Action issued in U.S. Appl. No. 15/704,341.

* cited by examiner

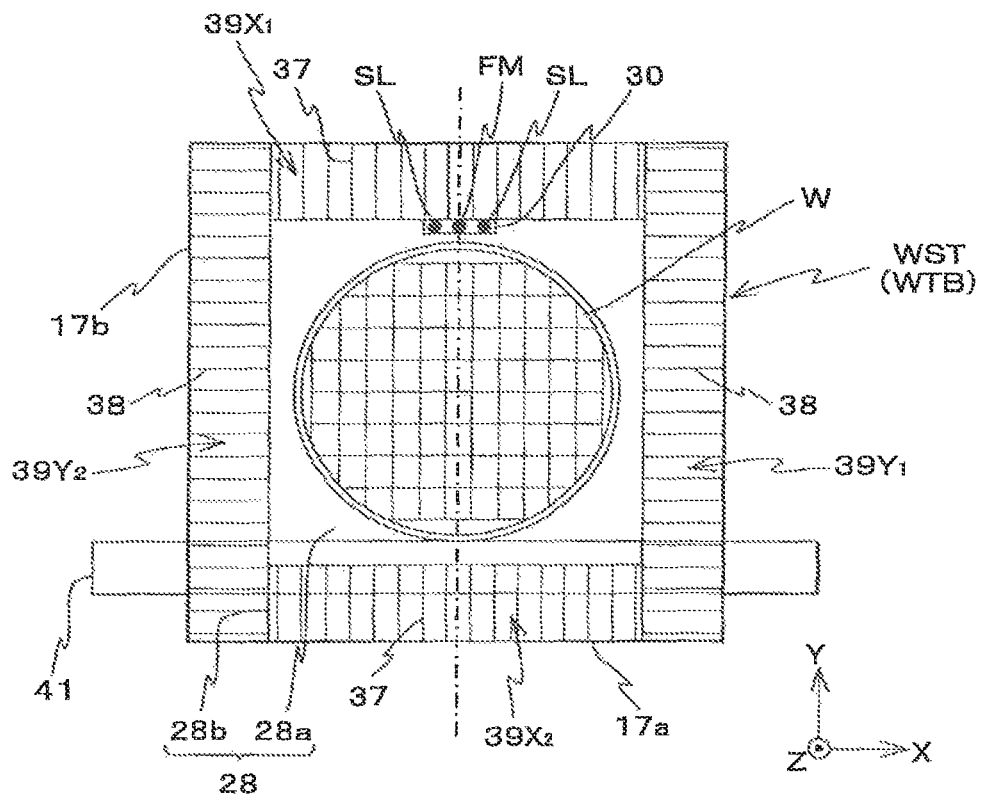
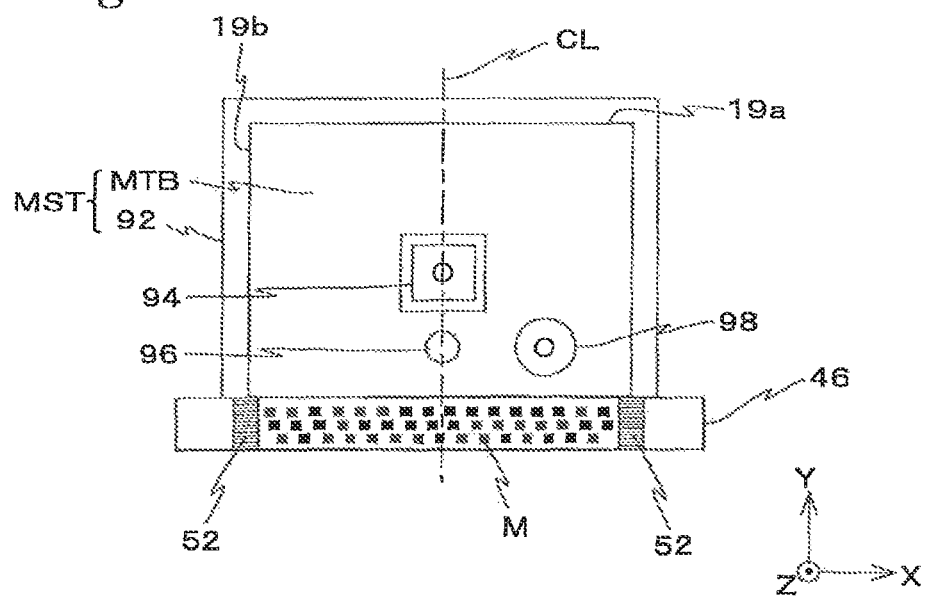

EXPOSURE APPARATUS, MOVABLE BODY DRIVE SYSTEM, PATTERN FORMATION APPARATUS, EXPOSURE METHOD, AND DEVICE MANUFACTURING METHOD

CROSS REFERENCE TO RELATED APPLICATIONS

This non-provisional application is a continuation of non-provisional application Ser. No. 15/599,785 filed May 19, 2017, which in turn is a continuation of non-provisional application Ser. No. 14/466,408 filed Aug. 22, 2014 and issued on Jun. 27, 2017 as U.S. Pat. No. 9,690,205, which in turn is a division of non-provisional application Ser. No. 12/344,659 filed Dec. 29, 2008 and issued on Jan. 5, 2016 as U.S. Pat. No. 9,229,333, which claims the benefit of Provisional Application No. 61/006,812 filed Jan. 31, 2008, Provisional Application No. 61/006,813 filed Jan. 31, 2008, and Provisional Application No. 61/071,899 filed May 23, 2008, the disclosures of which are hereby incorporated herein by reference in their entirety.

BACKGROUND OF THE INVENTION

Field of the Invention

The present invention relates to exposure apparatus, movable body drive systems, pattern formation apparatus, exposure methods, and device manufacturing methods, and more particularly to an exposure apparatus used in a lithography process when electronic devices such as a semiconductor device a liquid crystal display device and the like are produced, a movable body drive system which can be suitably used in the exposure apparatus, and measures a position of a movable body using an encoder system, a pattern formation apparatus equipped with the movable body drive system, an exposure method used in a lithography process, and a device manufacturing method which uses the exposure apparatus or the exposure method.

Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method so-called stepper) and a projection exposure apparatus by a step-and-scan method (a so-called scanning stepper (which is also called a scanner) are mainly used.

When exposure of a wafer is performed with these kinds of exposure apparatus, a section (an area that cannot be used as a product (chip)) which is not exposed is produced in the periphery of the wafer. However, the existence of such a section (an area) which is not exposed becomes a problem in a chemical mechanical processing (CMP) process which is applied to planarize the surface of a wafer on which a pattern is formed. Therefore, also in the past, of shot areas (hereinafter referred to as a "periphery shot") that do not completely fit in the effective exposure area in the periphery portion of the wafer, a periphery edge exposure in which the portion which cannot be used as a device is exposed has been performed (e.g., refer to Kokai (Japanese Patent Unexamined Application Publication) No. 2006-278820)).

However, in the case of performing the periphery edge exposure separately from the exposure of transferring and forming a reticle pattern on a wafer, throughput declines due to the time required for the periphery edge exposure.

Meanwhile, as an approach for improving the throughput, various proposals are made on a twin wafer stage type exposure apparatus which employs a method where a plurality of wafer stages holding a wafer, such as for example, two wafer stages, are arranged, and concurrent processing of different operations is performed on the two stages. Recently, a proposal has been made on a twin wafer stage type exposure apparatus which employs a liquid immersion method (for example, refer to U.S. Pat. No. 7,161,659).

However, the device rule (practical minimum line width) is becoming finer, and with this, an overlay performance with higher precision is becoming required in the exposure apparatus. Because of this, a further increase is expected in the number of sample shots in Enhanced Global Alignment (EGA), which is the mainstream in wafer alignment, which may cause a decrease in the throughput even if the exposure apparatus is the twin wafer stage type exposure apparatus.

Further, in exposure apparatus such as steppers, scanners and the like, for example, position measurement of a stage holding a wafer was generally measured using a laser interferometer. However, due to finer patterns which accompany higher integration of semiconductor devices, requirements in performance is becoming tighter, and short-term variation of measurement values which is caused by air fluctuation which occurs due to the influence of temperature fluctuation and/or temperature gradient of the atmosphere on the beam path of the laser interferometer can no longer be ignored.

Therefore, recently, an encoder with a high resolution which is impervious to air fluctuation when compared with an interferometer has begun to gather attention, and inventors have proposed an exposure apparatus which uses the encoder in position measurement of a wafer stage and the like (for example, refer to the pamphlet of International Publication 2007/097379 and the like).

However, in the case of arranging a scale (a grating) on the upper surface of the wafer stage as in the exposure apparatus according to the embodiment of the pamphlet of International Publication 2007/097379 described above, there were hardly any degrees of freedom in the placement which made it difficult to create a layout, because there were many encoder heads.

SUMMARY OF THE INVENTION

According to a first aspect of the present invention, there is provided a first exposure apparatus that exposes an object with an exposure beam, the apparatus comprising: a movable body which holds the object and moves along a predetermined plane including a first axis and a second axis orthogonal to each other; a measurement system which is placed away from an exposure position where the exposure is performed in a direction parallel to the first axis that performs a predetermined measurement of the object; and a periphery edge exposure system, which is placed away from the measurement system in a direction parallel to the first axis that exposes at least some periphery shot areas of the object.

According to this apparatus, at least some shot areas in the periphery of the object are exposed by the periphery edge exposure system while the movable body holding the object is moved along a direction parallel to the first axis within the predetermined plane. This allows the periphery edge exposure to be performed in parallel with the movement of the object (movable body) which is moved from the measurement system toward the exposure position, or with the movement of the object (movable body) in an opposite direction (for example, movement of the movable body from the exposure position to the exchange position of the object), which hardly reduces the throughput compared with when the periphery edge exposure is performed independently.

According to a second aspect of the present invention, there is provided a second exposure apparatus that exposes an object with an exposure beam, the apparatus comprising: a movable body which holds the object and is movable within a predetermined plane including a first axis and a second axis orthogonal to each other; and a periphery edge exposure system which is arranged between an exposure position where the exposure is performed and an exchange position of the object placed away from the exposure position in a direction parallel to the first axis, and exposes at least a part of a periphery area which is different from an area on the object where the exposure is performed, whereby at least a part of an exposure operation of the periphery area is performed in parallel with a movement operation of the movable body from one of the exposure position and the exchange position to the other.

According to this apparatus, at least a part of the exposure operation of the periphery areas by the periphery edge exposure system is performed, in parallel with a movement operation of the movable body from one of the exposure position and the exchange position to the other. Therefore, unlike the case when the periphery edge exposure is performed independently, the throughput is hardly reduced.

According to a third aspect of the present invention, there is provided a third exposure apparatus that exposes an object with an energy beam and forms a pattern on the object, the apparatus comprising: a first movable body which holds an object and moves within a predetermined plane which includes a first axis and a second axis orthogonal to each other; a second movable body which holds an object and moves independently from the first movable body within the plane; a mark detection system which has a plurality of detection areas whose positions are different in a direction parallel to the second axis, and detects a mark on the object mounted on each of the first and second movable bodies; and a controller which detects a plurality of different marks of an object held by the other one of the first and second movable bodies with the mark detection system and measures positional information of the marks, while moving the other one of the movable bodies in a direction parallel to the first axis, in parallel with an exposure performed of an object held by one of the first and second movable bodies.

According to this apparatus, the controller detects a plurality of different marks of an object held by the other one of the first and second movable bodies with the mark detection system and measures positional information of the marks, while moving the other one of the movable bodies in a direction parallel to the first axis, in parallel with an exposure performed of an object held by one of the first and second movable bodies. Therefore, it becomes possible to detect the positional information of a plurality of, such as for example, all of the marks on the object held by the other movable body while the other movable body is being moved in the first axis direction from the position (for example, in the vicinity of the position where exchange of the object held by the movable body is performed) in the vicinity of the plurality of detection areas of the mark detection system to the exposure position, in parallel with exposure of the object held by one of the movable bodies. As a consequence, it becomes possible to achieve improvement of the throughput as well as improvement of the overlay accuracy.

According to a fourth aspect of the present invention, there is provided a fourth exposure apparatus that, exposes an object with an energy beam and forms a pattern on the object, the apparatus comprising: a first movable body which holds an object and moves within a predetermined plane which includes a first axis and a second axis orthogonal to each other; a second movable body which holds an object and moves independently from the first movable body within the plane; a planar motor which drives the first and the second movable body within the plane; and a controller which controls the planar motor, and also moves the first movable body along a first return path located on one side of an exposure position where the exposure is performed in a direction parallel to the second axis to a first exchange position where an object on the first movable body is exchanged when exposure of an object held by the first movable body has been completed, as well as move the second movable body along a second return path located on the other side of an exposure position in a direction parallel to the second axis to a second exchange position where an object on the second movable body is exchanged when exposure of an object held by the second movable body has been completed.

In this case, the first exchange position and the second exchange position can either be the same or different.

According to this apparatus, the controller controls the planar motor which drives the first and second movable bodies within a plane, and also moves the first movable body along the first return path located on one side of the exposure position in a direction parallel to the second axis to the first exchange position where the object on the first movable body is exchanged when exposure of the object held by the first movable body has been completed, as well as move the second movable body along the second return path located on the other side of the exposure position in a direction parallel to the second axis to a second exchange position where the object on the second movable body is exchanged when exposure of the object held by the second movable body has been completed. Therefore, by attaching a cable for wiring/piping to the first movable body from one side of a direction parallel to the second axis, and attaching a cable for wiring/piping to the second movable body from the other side of a direction parallel to the second axis, the cables can be kept from being tangled, and the length of the cables as short as possible.

According to a fifth aspect of the present invention, there is provided a fifth exposure apparatus that exposes an object with an energy beam and forms a pattern on the object, the apparatus comprising: a first movable body which holds an object and moves within a predetermined plane which includes a first axis and a second axis orthogonal to each other; a second movable body which holds an object and moves independently from the first movable body within the plane; a planar motor which drives the first and the second movable body within the plane; an optical member which emits the energy beam; a liquid immersion device which supplies liquid in a space between the optical member and one of the first and second movable bodies, and forms a liquid immersion area; and a controller which controls the planar motor so as to perform a switching between a proximity state in which the first movable body and the second movable body are made to be in proximity in a direction parallel to the first axis by a predetermined distance or less and a separation state in which both movable bodies are separated so as to pass the liquid immersion area from the one movable body to the other movable body, after exposure has been completed on an object held by the one movable body, and to move the one movable body separated from the other movable body along a return path positioned on one side of the exposure position in a direction parallel to the second axis to an exchange position where an object on the first and second movable bodies are exchanged.

The proximity state made to be in proximity by a predetermined distance or less, in this case, includes a state where the first movable body and the second movable body are in contact in a direction parallel to the first axis, or more particularly, a state where the separation distance between the first movable body and the second movable body is zero. In this description, the term proximity state is used as a concept including the state above where the separation distance is zero, or more specifically, including a contact state, even when the state is not defined clearly, as well as when the contact state is clearly specified.

According to this apparatus, the controller controls the planar motor so as to performs a switching between a proximity state in which the first movable body and the second movable body are made to be in proximity in a direction parallel to the first axis by a predetermined distance or less and a separation state in which both movable bodies are separated so as to pass the liquid immersion area from the one movable body to the other movable body, after exposure has been completed on an object held by the one movable body, as well as to move the one movable body separated from the other movable body along a return path positioned on one side of the exposure position in a direction parallel to the second axis to an exchange position where an object on the first and second movable bodies are exchanged. Therefore, the movement range of both movable bodies in a direction parallel to the second axis can be set narrower than in the case where one of the movable bodies is moved to the exchange position along a return path positioned on one side of the exposure position in a direction parallel to the second axis and the other movable body is moved to the exchange position along a return path positioned on the other side of the exposure position in a direction parallel to the second axis.

According to a sixth aspect of the present invention, there is provided a movable body drive system, which drives a movable body substantially along a predetermined plane, the system comprising: an encoder system which has a head irradiating a detection beam on a scale having a two-dimensional grating whose periodic directions are a first and second direction orthogonal to each other within a plane parallel to the predetermined plane and receiving light from the scale, and measures positional information of the movable body at least in directions of two degrees of freedom within the predetermined plane including the first and second directions based on measurement values of the head; and a drive device which drives the movable body along the predetermined plane based on measurement information of the encoder system.

According to this system, the movable body is driven along the predetermined plane by the drive device, based on the measurement information of the encoder system which has a head irradiating a detection beam on a scale having a two-dimensional grating and receiving the reflected light from the scale, and measures the positional information of the movable body at least in directions of two degrees of freedom within the predetermined plane including the first and second directions based on measurement values of the head. Therefore, the degree of freedom of the placement of the heads remarkably improves and layout becomes easy when compared with the case where an encoder system including a plurality of one-dimensional heads that each measures the positional information of the movable body in the first and second directions is used. For example, it becomes possible to measure the position of the movable body in directions of two degrees of freedom within a surface parallel to the predetermined plane by using only one scale.

According to a seventh aspect of the present invention, there is provided a pattern formation apparatus, comprising: a movable body on which an object is mounted that can move substantially along a movement plane holding the object; a patterning device which generates a pattern on the object; and a movable body drive system of the present invention which drives the movable body for pattern formation to the object.

According to this apparatus, by generating a pattern with a patterning unit on the object on the movable body driven with good precision by the movable body drive system of the present invention, it becomes possible to form a pattern on the object with good precision.

According to an eighth aspect of the present invention, there is provided a sixth exposure apparatus that forms a pattern on an object by an irradiation of an energy beam, the apparatus comprising: a patterning device that irradiates the energy beam on the object; and the movable body drive system of the present invention, whereby the movable body drive system drives the movable body on which the object is mounted for relative movement of the energy beam and the object.

According to this apparatus, for relative movement of the energy beam irradiated on the object from the patterning device and the object, the movable body on which the object is mounted is driven with good precision by the movable body drive system of the present invention. Accordingly, it becomes possible to form a pattern on the object with good precision by scanning exposure.

According to a ninth aspect of the present invention, there is provided a seventh exposure apparatus that exposes an object with an energy beam, the apparatus comprising: a movable body which can hold the object and is also substantially movable along a predetermined plane; a measurement device which has a measurement position where a measurement beam is irradiated placed away from an exposure position where the energy beam is irradiated in a first direction within the predetermined plane, and measures positional information of the object; an encoder system in which a scale having a two-dimensional grating and whose longitudinal direction is in the first direction is placed on both sides of the movable body in a second direction orthogonal to the first direction within the predetermined plane, and a pair of head units having a plurality of heads whose positions in the second direction are different and at least one head faceable to each of the two scales is placed faceable to the movable body, and based on an output of two heads simultaneously facing the pair of scales, measures positional information of the movable body in directions of three degrees of freedom within the predetermined plane; and a drive device which drives the movable body based on positional information of the movable body measured by the measurement device and positional information of the movable body measured by the encoder system.

According to this apparatus, the measurement device measures the positional information of the object on the movable body at the measurement position where the measurement beams are irradiated that is placed away from the exposure position within a predetermined plane in the first direction, the encoder system measures the positional information of the movable body in directions of three degrees of freedom within the predetermined plane based on the output of the two heads that simultaneously face the two (a pair of) scales, and the drive device drives the movable body with good precision, based on the positional information of the object measured by the measurement device and the positional information of the movable body measured by the encoder system. Therefore, it becomes possible to expose the object held by the movable body with high accuracy. Further, the layout of the heads and the like becomes easy when compared with the case where an encoder system including a plurality of one-dimensional heads that each measures the positional information of the movable body in the first and second directions is used.

According to a tenth aspect of the present invention, there is provided an eighth exposure apparatus that exposes an object with an energy beam, the apparatus comprising: a movable body which can hold the object and is also substantially movable along a predetermined plane; a measurement device which has a measurement position where a measurement beam is irradiated placed away from an exposure position where the energy beam is irradiated in a first direction within the predetermined plane, and measures positional information of the object; an encoder system in which a pair of scales having a two-dimensional grating and whose longitudinal direction is in a second direction orthogonal to the first direction within the predetermined plane is placed faceable to the movable body, and a plurality of heads whose positions in the first direction are different and at least one head is faceable to each of the two scales are placed on both sides of the movable body, and based on an output of two heads simultaneously facing the pair of scales, measures positional information of the movable body in directions of three degrees of freedom within the predetermined plane; and a drive device which drives the movable body based on positional information of the movable body measured by the measurement device and positional information of the movable body measured by the encoder system.

According to this apparatus, the measurement device measures the positional information of the object on the movable body at the measurement position where the measurement beams are irradiated that is placed away from the exposure position within a predetermined plane in the first direction, the encoder system measures the positional information of the movable body in directions of three degrees of freedom within the predetermined plane based on the output of the two heads that simultaneously face a pair of scales, and the drive device drives the movable body with good precision, based on the positional information of the object measured by the measurement device and the positional information of the movable body measured by the encoder system. Therefore, it becomes possible to expose the object held by the movable body with high accuracy. Further, the placement of the heads becomes easy when compared with the case where an encoder system including a plurality of one-dimensional heads that each measures the positional information of the movable body in the first and second directions is used.

According to an eleventh aspect of the present invention, there is provided a first device manufacturing method, including exposing an object using one of the first and eighth exposure apparatus of the present invention; and developing the exposed object.

According to a twelfth aspect of the present invention, there is provided a first exposure method in which an object is exposed with an exposure beam, the method comprising: a process in which the object is mounted on a movable body which moves along a predetermined plane including a first axis and a second axis orthogonal to each other; and a process in which at least a part of a periphery shot area of the object is exposed, using a periphery edge exposure system placed away in a direction parallel to the first axis from a measurement system, which is placed away in a direction parallel to the first axis direction within the predetermined plane from an exposure position where the exposure is performed as well as perform a predetermined measurement on the object, while a movable body on which the object is mounted is moved along a direction parallel to the first axis.

According to this method, at least some shot areas in the periphery of the object are exposed by the periphery edge exposure system while the movable body on which the object is mounted is moved along a direction parallel to the first axis within the predetermined plane. This allows the periphery edge exposure to be performed in parallel with the movement of the object (movable body) which is moved from the measurement system toward the exposure position, or with the movement of the object (movable body) in an opposite direction (for example, movement of the movable body from the exposure position to the exchange position of the object), which hardly reduces the throughput compared with when the periphery edge exposure is performed independently.

According to a thirteenth aspect of the present invention, there is provided a second exposure method in which an object is exposed with an exposure beam, the method comprising: a process in which a movable body that is movable within a predetermined plane including a first axis and a second axis orthogonal to each other is made to hold an object; and a process in which at least a part of an exposure operation of the periphery area is performed in parallel with a movement operation of the movable body from one of the exposure position and the exchange position to the other, using a periphery edge exposure system which is arranged between an exposure position where the exposure is performed and an exchange position of the object placed away from the exposure position in a direction parallel to the first axis, and exposes at least a part of a periphery area which is different from an area on the object where the exposure is performed.

According to this method, at least a part of the exposure operation of the periphery areas by the periphery edge exposure system is performed, in parallel with a movement operation of the movable body from one of the exposure position and the exchange position to the other. Therefore, unlike the case when the periphery edge exposure is performed independently, the throughput is hardly reduced.

According to a fourteenth aspect of the present invention, there is provided a third exposure method in which an object is exposed with an energy beam and a pattern is formed on the object, the method comprising: a process in which exposure is performed on an object held by one of a first and second movable bodies which respectively hold an object and independently move within a predetermined plane including a first axis and a second axis orthogonal to each other, and in parallel, a plurality of marks on an object held by the other movable body of the first and second movable bodies are detected with a mark detection system which has a plurality of detection areas whose position is different in a direction parallel to the second axis and positional, information of the marks measured, while the other object is driven in a direction parallel to the first axis.

According to this method, a plurality of different marks of an object held by the other one of the first and second movable bodies is detected with the mark detection system having a plurality of detection areas whose positions are different in a direction parallel to the second axis and the positional information measured while moving the other one of the movable bodies in a direction parallel to the first axis, in parallel with an exposure performed of an object held by one of the first and second movable bodies. Therefore, it becomes possible to detect the positional information of a plurality of, such as for example, all of the marks on the object held by the other movable body while the other movable body is being moved in the first axis direction from the position (for example, in the vicinity of the position where exchange of the object held by the movable body is performed) in the vicinity of the plurality of detection areas of the mark detection system to the exposure position, in parallel with exposure of the object subject to exposure held by one of the movable bodies. As a consequence, it becomes possible to achieve improvement of the throughput as well as improvement of the overlay accuracy.

According to a fifteenth aspect of the present invention, there is provided a fourth exposure method in which an object is exposed with an energy beam and a pattern is formed on the object, the method comprising: a process in which by controlling a planar motor which drives the first and second movable bodies respectively holding an object independently within a predetermined plane including a first axis and a second axis orthogonal to each other, the first movable body is moved along a first return path located on one side of an exposure position where the exposure is performed in a direction parallel to the second axis to a first exchange position where an object on the first movable body is exchanged when exposure of an object held by the first movable body has been completed, and the second movable body is also moved along a second return path located on the other side of the exposure position in a direction parallel to the second axis to a second exchange position where an object on the second movable body is exchanged when exposure of an object held by the second movable body has been completed.

According to this method, by controlling the planar motor which drives the first and second movable bodies within a plane, the first movable body is moved along the first return path located on one side of the exposure position in a direction parallel to the second axis to the first exchange position where the object on the first movable body is exchanged when exposure of the object held by the first movable body has been completed, and the second movable body is also moved along the second return path located on the other side of the exposure position in a direction parallel to the second axis to a second exchange position where the object on the second movable body is exchanged when exposure of the object held by the second movable body has been completed. Therefore, by attaching a cable for wiring/piping to the first movable body from one side of a direction parallel to the second axis, and attaching a cable for wiring/piping to the second movable body from the other side of a direction parallel to the second axis, the cables can be kept from being tangled, and the length of the cables as short as possible.

According to a sixteenth aspect of the present invention, there is provided a fifth exposure method in which an object is exposed with an energy beam, the method comprising: holding the object with a movable body; and driving the movable body with the movable body drive system of the present invention, and exposing the object with the energy beam.

According to this method, because the movable body holding the object is driven with good accuracy by the movable body drive system of the present invention, and the object is exposed by the energy beam, exposure with high precision of the object becomes possible.

According to a seventeenth aspect of the present invention, there is provided a sixth exposure method in which an object is exposed with an energy beam, the method comprising: holding an object with a movable body which is substantially movable along a predetermined plane; measuring positional information of the object on the movable body with a measurement device at a measurement position where a measurement beam is irradiated that is placed away from an exposure position where the energy beam is irradiated in a first direction within the predetermined plane; measuring positional information of the movable body in directions of three degrees of freedom within the predetermined plane with an encoder system in which a pair of scales having a two-dimensional grating and whose longitudinal direction is in the first direction is placed on the movable body separately in a second direction orthogonal to the first direction within the predetermined plane, and a pair of head units having a plurality of heads whose positions in the second direction are different and at least one head faceable to each of the pair of scales is placed faceable to the movable body; and driving the movable body based on positional information which has been measured and the measurement information of the encoder system and exposing the object with the energy beam.

According to this method, the positional information of the object on the movable body is measured at the measurement position where the measurement beam is irradiated placed apart from the exposure position in the first direction within the predetermined plane, and by the encoder system, the positional information of the movable body in directions of three degrees of freedom within the predetermined plane is measured. And by driving the movable body based on the positional information which has been measured and the measurement information of the encoder system, the object is exposed by the energy beam. Accordingly, the object can be exposed with high precision.

According to an eighteenth aspect of the present invention, there is provided a seventh exposure method in which an object is exposed with an energy beam, the method comprising: holding an object with a movable body which is substantially movable along a predetermined plane; measuring positional information of the object on the movable body with a measurement device at a measurement position where a measurement beam is irradiated that is placed away from an exposure position where the energy beam is irradiated in a first direction within the predetermined plane; measuring positional information of the movable body in directions of three degrees of freedom within the predetermined plane, with an encoder system in which a pair of scales having a two-dimensional grating and whose longitudinal direction is in a second direction orthogonal to the first direction within the predetermined plane is placed faceable to the movable body, and a plurality of heads whose positions in the first direction are different and at least one head is faceable to the pair of scales are placed on both sides of the movable body; and driving the movable body based on positional information which has been measured and the measurement information of the encoder system and exposing the object with the energy beam.

According to this method, the positional information of the object on the movable body is measured at the measurement position where the measurement beam is irradiated placed apart from the exposure position in the first direction within the predetermined plane, and by the encoder system, the positional information of the movable body in directions of three degrees of freedom within the predetermined plane is measured. And by driving the movable body based on the positional information which has been measured and the measurement information of the encoder system, the object is exposed by the energy beam. Accordingly, the object can be exposed with high precision.

According to a nineteenth aspect of the present invention, there is provided a second device manufacturing method, the method including: exposing an object and forming a pattern by one of the first and seventh exposure method of the present invention; and developing an object on which the pattern has been formed.

BRIEF DESCRIPTION OF THE DRAWINGS

In the accompanying drawings;

FIG. 2 is a planar view that shows a wafer stage;

FIG. 3 is a planar view that shows a measurement stage;

FIG. 6 is a view used to explain a placement of heads of an encoder system, an alignment system, a periphery edge exposure unit and the like;

FIG. 29 is a planar view that shows a placement of a stage device and an interferometer which exposure apparatus of FIG. 27 is equipped with;

FIG. 30 is a planar view that shows a placement of a stage device and a sensor unit which exposure apparatus of FIG. 27 is equipped with;

FIG. 45 is a view used to explain a placement of heads and the like of an encoder system, a surface position measurement system and the like that constitute a measurement system which the wafer stage device of FIG. 42 is equipped with;

DESCRIPTION OF THE EMBODIMENTS

A First Embodiment

Hereinafter, a first embodiment of the present invention will be described, with reference to FIGS. 1 to 26.

Figure 1:
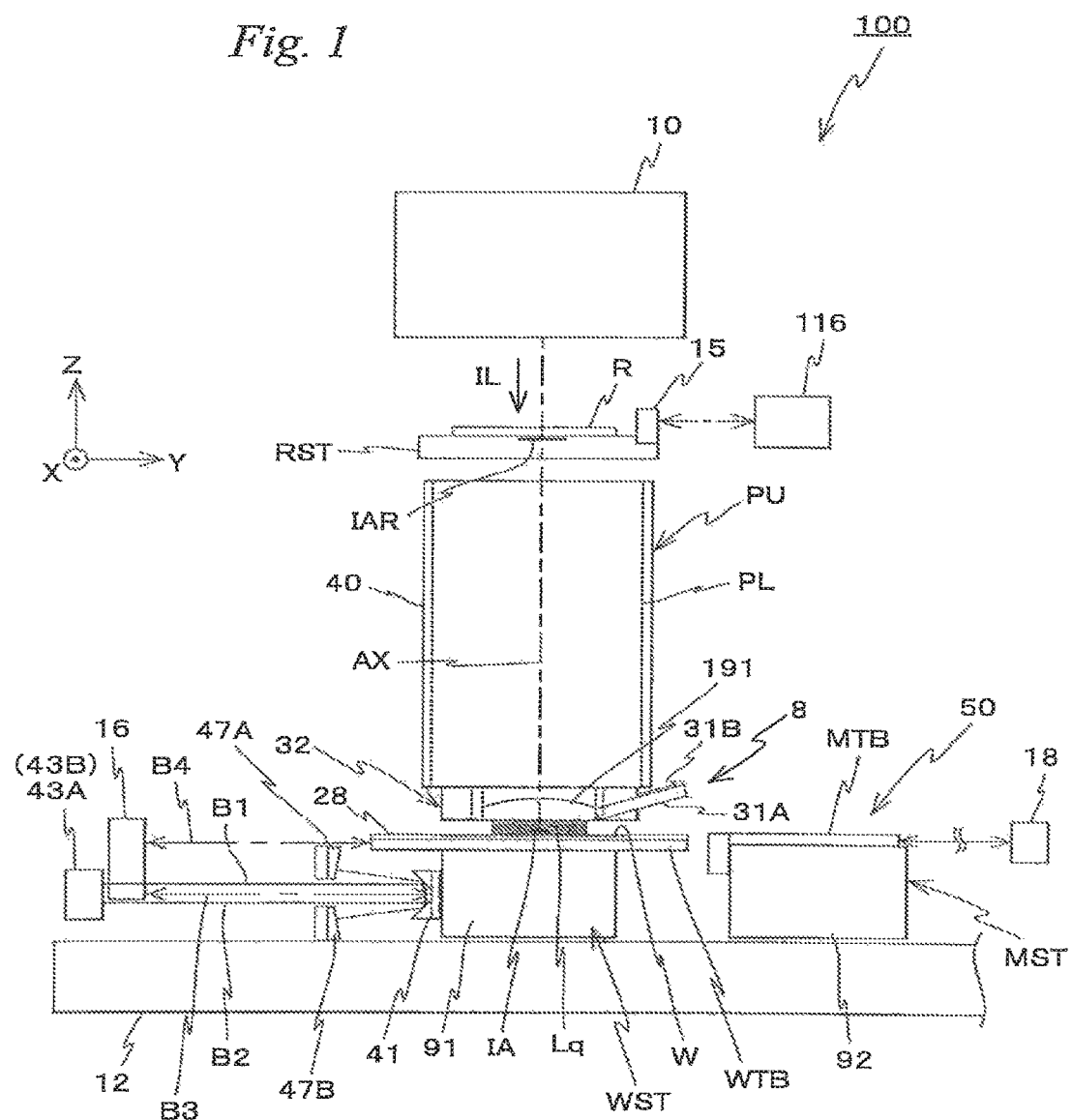
FIG. 1 is a view that schematically shows a configuration of an exposure apparatus related to a first embodiment.

FIG. 1 schematically shows a configuration of an exposure apparatus 100 in the first embodiment. Exposure apparatus 100 is a projection exposure apparatus by the step-and-scan method, or a so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 is equipped with an illumination system 10, a reticle stage RST, a projection unit PU, a stage device 50 having a wafer stage WST and a measurement stage MST, and a control system of these parts. In FIG. 1, a wafer W is mounted on wafer stage WST.

Illumination system 10 includes a light source, an illuminance uniformity optical system that has an optical integrator and the like, and an illumination optical system that has a reticle blind (none of which are shown), as is disclosed in, for example, U.S. Patent Application Publication No. 2003/0025890 and the like. Illumination system 10 illuminates a slit-shaped illumination area IAR, which is set on reticle R with a reticle blind (a masking system) by an illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive system 11 (not shown in FIG. 1, refer to FIG. 10) that includes a linear motor or the like, and reticle stage RST is also drivable in a scanning direction (in this case, the Y-axis direction, which is the lateral direction of the page surface in FIG. 1) at a predetermined scanning speed.

The positional information (including information on position (hereinafter also appropriately described as θz rotation (or θz rotation quantity), or yawing (or yawing amount)) in the θz direction) of reticle stage RST in the XY plane is constantly detected at a resolution of, for example, around 0.25 nm by a reticle laser interferometer (hereinafter referred to as a "reticle interferometer") 116, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction). The measurement values of reticle interferometer 116 are sent to a main controller 20 (not shown in FIG. 1, refer to FIG. 10).

Projection unit PU is placed below reticle stage RST in FIG. 1. Projection unit PU includes a barrel 40, and projection optical system PL stored within barrel 40. As projection optical system PL, for example, a dioptric system is used, consisting of a plurality of lenses (lens elements) that is disposed along optical axis AX, which is parallel to the Z-axis direction. Projection optical system PL is, for example, a both-side telecentric dioptric system that has a predetermined projection magnification (such as one-quarter times, one-fifth times, or one-eighth times). Therefore, when illumination system 10 illuminates illumination area IAR on reticle R, by illumination light IL which has passed through reticle R placed so that its pattern surface substantially coincides with a first surface (object surface) of projection optical system PL, a reduced image of the circuit pattern of reticle R within illumination area IAR via projection optical system PL (projection unit PU) is formed on an area (hereinafter also referred to as an exposure area) IA conjugate with illumination area IAR on a wafer W whose surface is coated with a resist (sensitive agent) and is placed on a second surface (image plane surface) side of projection optical system PL. And by reticle stage RST and wafer stage WST being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern is generated on wafer W according to illumination system 10, reticle R, and projection optical system PL, and then by the exposure of the sensitive layer (resist layer) on wafer W with illumination light IL, the pattern is formed on wafer W.

Figure 5:
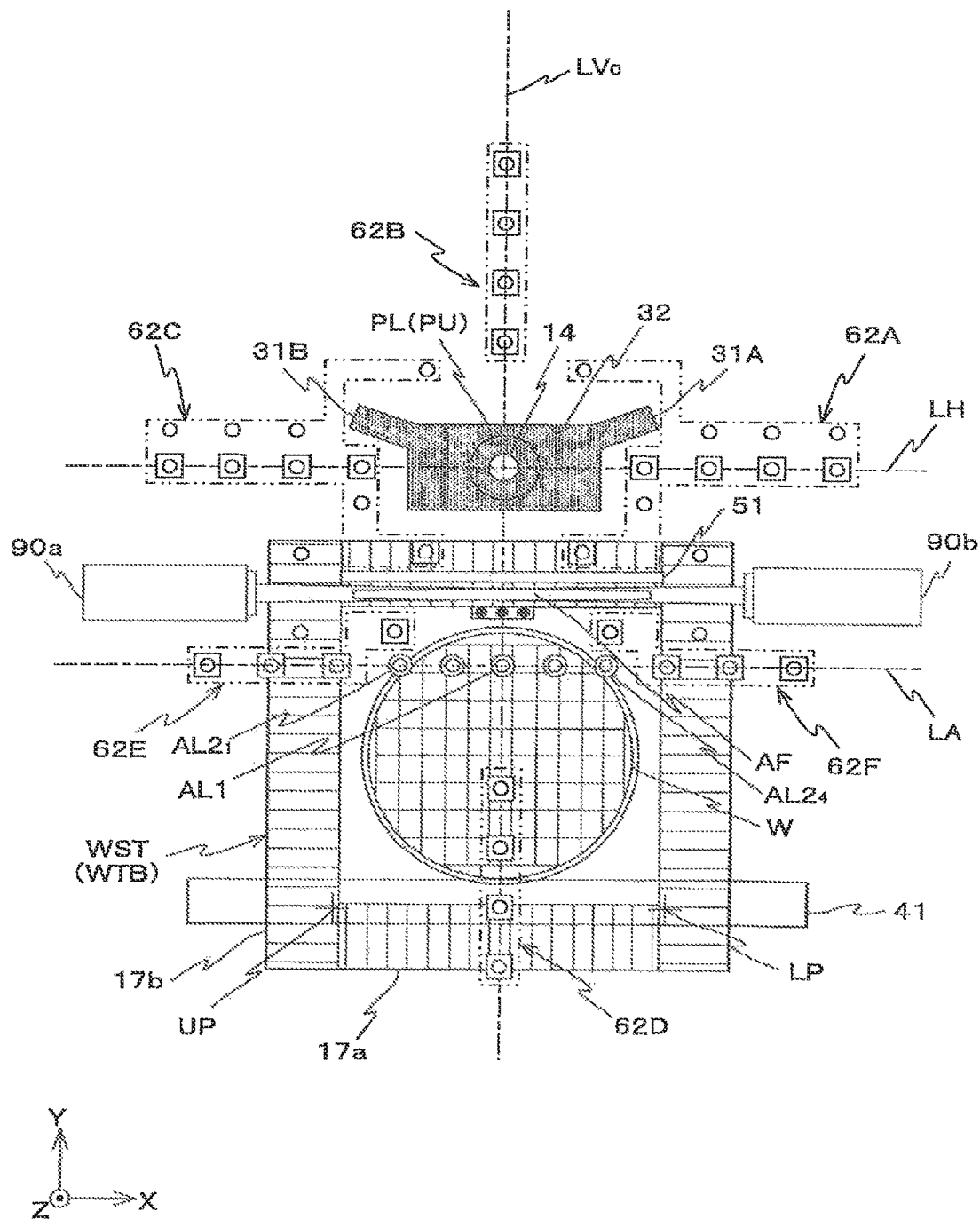
FIG. 5 is a planar view that shows a stage device and various measurement devices.

In exposure apparatus 100 of the embodiment, a local liquid immersion device 8 is installed to perform exposure by a liquid immersion method. Local liquid immersion device 8, for example, includes a liquid supply device 5, a liquid recovery device 6 (both of which are not shown in FIG. 1, refer to FIG. 10), a liquid supply pipe 31A, a liquid recovery pipe 31B, a nozzle unit 32 and the like. As shown in FIG. 1, nozzle unit 32 is supported in a suspended state by a mainframe (not shown) holding projection unit PU, so that the periphery of the lower end portion of barrel 40 that holds an optical element closest to the image plane side (the wafer W side) constituting projection optical system PL, in this case, a lens (hereinafter also referred to as a "tip lens") 191, is enclosed. In the embodiment, as shown in FIG. 1, the lower end surface of nozzle unit 32 is set to be on a substantially flush surface with the lower end surface of tip lens 191. Further, nozzle unit 32 is equipped with a supply opening and a recovery opening of a liquid Lq, a lower surface to which wafer W is placed facing and at which the recovery opening is arranged, and a supply flow channel and a recovery flow channel that are connected to a liquid supply pipe 31A and a liquid recovery pipe 31B respectively. Liquid supply pipe 31A and liquid recovery pipe 31B are slanted by around 45 degrees relative to an X-axis direction and Y-axis direction in a planar view (when viewed from above) as shown in FIG. 5, and are placed symmetric to a straight line (a reference axis) $LV_0$ which passes through the center (optical axis AX of projection optical system PL, coinciding with the center of exposure area IA previously described in the embodiment) of projection unit PU and is also parallel to the Y-axis.

Figure 10:
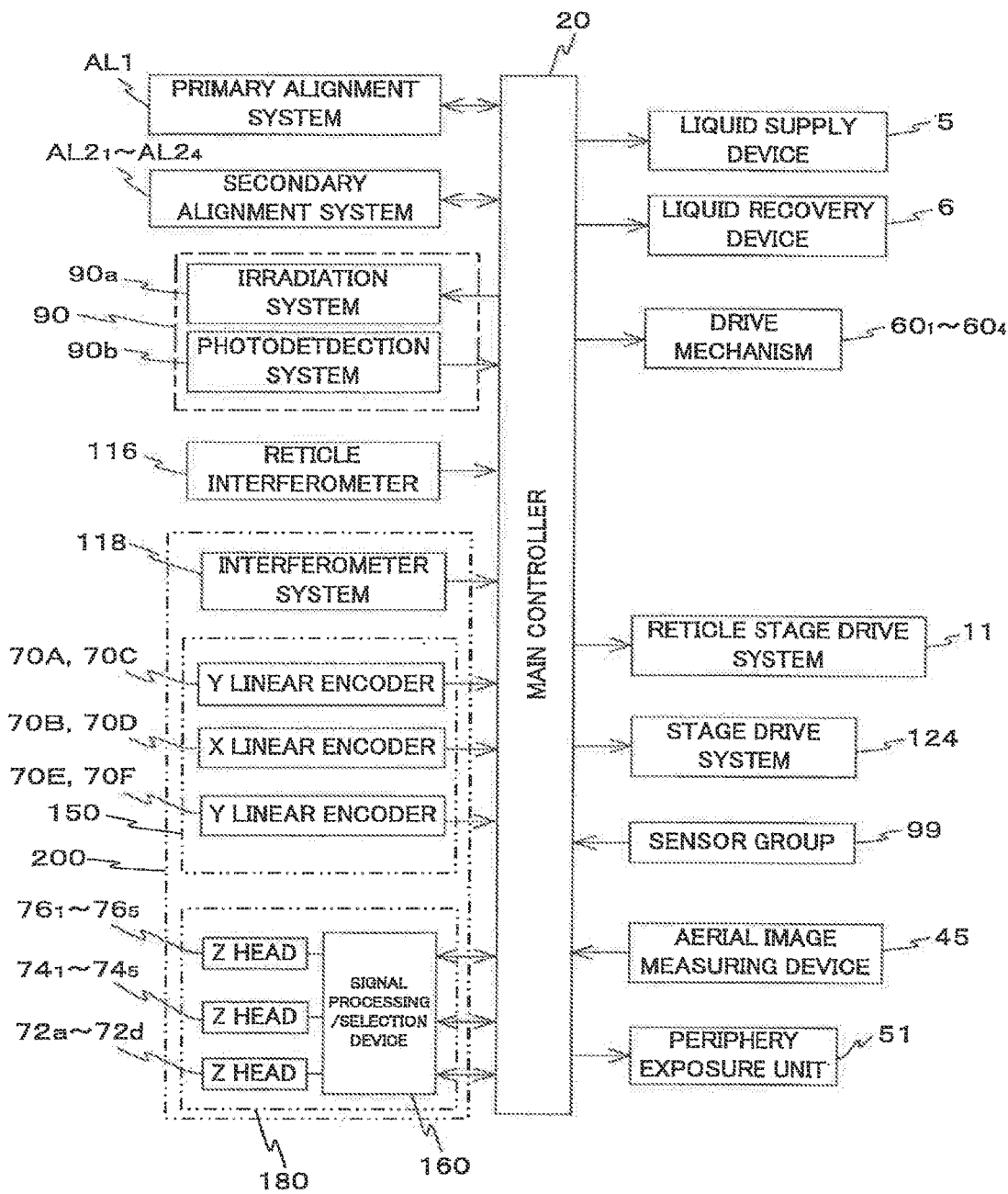
FIG. 10 is a block diagram that shows a main configuration of a control system of the exposure apparatus in FIG. 1.

Liquid supply pipe 31A connects to liquid supply device 5 (not shown in FIG. 1, refer to FIG. 10), and liquid recovery pipe 31B connects to liquid recovery device 6 (not shown in FIG. 1, refer to FIG. 10). In this case, in liquid supply device 5, a tank to store the liquid, a compression pump, a temperature controller, a valve for controlling the flow amount of the liquid, and the like are equipped. In liquid recovery device 6, a tank to store the liquid which has been recovered, a suction pump, a valve for controlling the flow amount of the liquid, and the like are equipped.

Main controller 20 controls liquid supply device 5 (refer to FIG. 10), and supplies liquid Lq between tip lens 191 and wafer W via liquid supply pipe 31A, as well as control liquid recovery device 6 and recovers liquid Lq from between tip lens 191 and wafer W via liquid recovery pipe 31B. During the operations, main controller 20 controls liquid supply device 5 and liquid recovery device 6 so that the quantity of liquid Lq supplied constantly equals the quantity of liquid Lq which has been recovered. Accordingly, in the space between tip lens 191 and wafer W, a constant quantity of liquid Lq (refer to FIG. 1) is held constantly replaced, and by this, a liquid immersion area 14 (refer to FIG. 14) is formed. Incidentally, in the case measurement stage MST which will be described later on is positioned below projection unit liquid immersion area 14 can be formed similarly in the space between tip lens 191 and the measurement table.

In the embodiment, as the liquid described above, pure water (hereinafter, it will simply be referred to as "water" besides the case when specifying is necessary) that transmits the ArF excimer laser light (light with a wavelength of 193 nm) is to be used. Incidentally, refractive index n of the water with respect to the ArF excimer laser beam is around 1.44, and in the water the wavelength of illumination light IL is 193 nm×1/n, shortened to around 134 nm.

As shown in FIG. 1, stage device 50 is equipped with a wafer stage WST and a measurement stage MST placed above a base board 12, a measurement system 200 (refer to FIG. 10) which measures positional information of the stages WST and MST, a stage drive system 124 (refer to FIG. 10) which drives stages WST and MST and the like. Measurement system 200 includes an interferometer system 118, an encoder system 150, and a surface position measurement system 180 as shown in FIG. 10.

Wafer stage WST and measurement stage MST are supported on base board 12, via a clearance of around several µm by noncontact bearings (not shown) fixed to each of the bottom surfaces, such as, for example, air bearings. Further, stages WST and MST are independently drivable within the XY plane by stage drive system 124 (refer to FIG. 10), which includes, for example, a linear motor and the like.

Wafer stage WST includes a stage main section 91, and a wafer table WTB that is mounted on stage main section 91. Wafer table WTB and stage main section 91 are configured, for example, drivable in directions of six degrees of freedom (X, Y, Z, θx, θy, and θz) with respect to base board 12 by a drive system including a linear motor and a Z leveling mechanism (including a voice coil motor and the like) (none of which are shown).

In the center of the upper surface of wafer table WTB, a wafer holder (not shown) is arranged which holds wafer W by vacuum suction or the like. On the outer side of the wafer holder (mounting area of the wafer), as shown in FIG. 2, a plate (a liquid repellent plate) 28 is arranged that has a circular opening one size larger than the wafer holder formed in the center, and also has a rectangular outer shape (contour). A liquid repellent treatment against liquid. Lq is applied to the surface of plate 28. Incidentally, plate 28 is installed so that its entire surface (or a part of its surface) becomes flush with the surface of wafer W.

Plate 28 has a first liquid repellent area 28a having a rectangular outer shape (contour) with the opening formed in the center, and a second liquid repellent area 28*b* having a rectangular frame (loop) shape placed around the first liquid repellent area 28*a*. Incidentally, in the embodiment, water is used as liquid Lq as is described above, and therefore, hereinafter the first liquid repellent area 28*a* and the second liquid repellent area 28*b* are also referred to as a first water repellent plate 28*a* and a second water repellent plate 28*b*.

On an end on the +Y side of the first water repellent plate 28*a*, a measurement plate 30 is arranged. On measurement plate 30, a fiducial mark FM is arranged in the center, and a pair of aerial image measurement slit patterns (slit-shaped measurement patterns) SL is arranged with fiducial mark FM in between. And, in correspondence with each aerial image measurement slit pattern SL, a light-transmitting system (not shown) which guides illumination light IL having passed through the slit patterns outside wafer stage WST (a photodetection system arranged in measurement stage MST which will be described later on) is arranged.

On the second liquid repellent area 28*b*, on the upper surface in areas on one side and the other side in the X-axis direction (the horizontal direction of the page surface in FIG. 2) Y scales 39Y$_1$ and 39Y$_2$ are formed, respectively. Y scales 39Y$_1$ and 39Y$_2$ are each composed of a :reflective grating (for example, a diffraction grating) having a periodic direction in the Y-axis direction in which grid lines 33 having the longitudinal direction in the X-axis direction are placed in a predetermined pitch along a direction parallel to the Y-axis (the Y-axis direction).

Similarly, on the upper surface of the second liquid repellent area 28*b* in areas on one side and the other side in the Y-axis direction (the vertical direction of the page surface in FIG. 2), X scales 39X$_1$ and 39X$_2$ are formed, respectively. X scales 39X$_1$ and 39X$_2$ are each composed of a reflective grating (for example, a diffraction grating) having a periodic direction in the X-axis direction in which grid lines 37 having the longitudinal direction in the Y-axis direction are placed in a predetermined pitch along a direction parallel to the X-axis (the X-axis direction). Each scale is created by marking the graduations of the diffraction grating, for example, in a pitch between 138 nm to 4 μm, for example, a pitch of 1 μm on a thin plate shaped glass. These scales are covered with the liquid repellent film (water repellent film) described above. Incidentally, the pitch of the grating is shown much wider in FIG. 2 than the actual pitch, for the sake of convenience. The same is true also in other drawings. Incidentally, in order to protect the diffraction grating, the diffraction grating can be covered with a glass plate with low thermal expansion that has water repellency so that the surface of the glass plate becomes the same height (surface position) as the surface of the wafer. In this case, as the glass plate, a plate whose thickness is the same level as the wafer, such as for example, a plate 1 mm thick, can be used.

Incidentally, a pattern for positioning (not shown) is arranged for deciding the relative position between an encoder head and a scale near the edge of each scale (to be described later). The pattern for positioning is configured, for example, from grid lines that have different reflectivity, and when the encoder head scans the pattern, the intensity of the output signal of the encoder changes. Therefore, a threshold value is determined beforehand, and the position where the intensity of the output signal exceeds the threshold value is detected. Then, the relative position between the encoder head and the scale is set, with the detected position as a reference.

Figure 4:
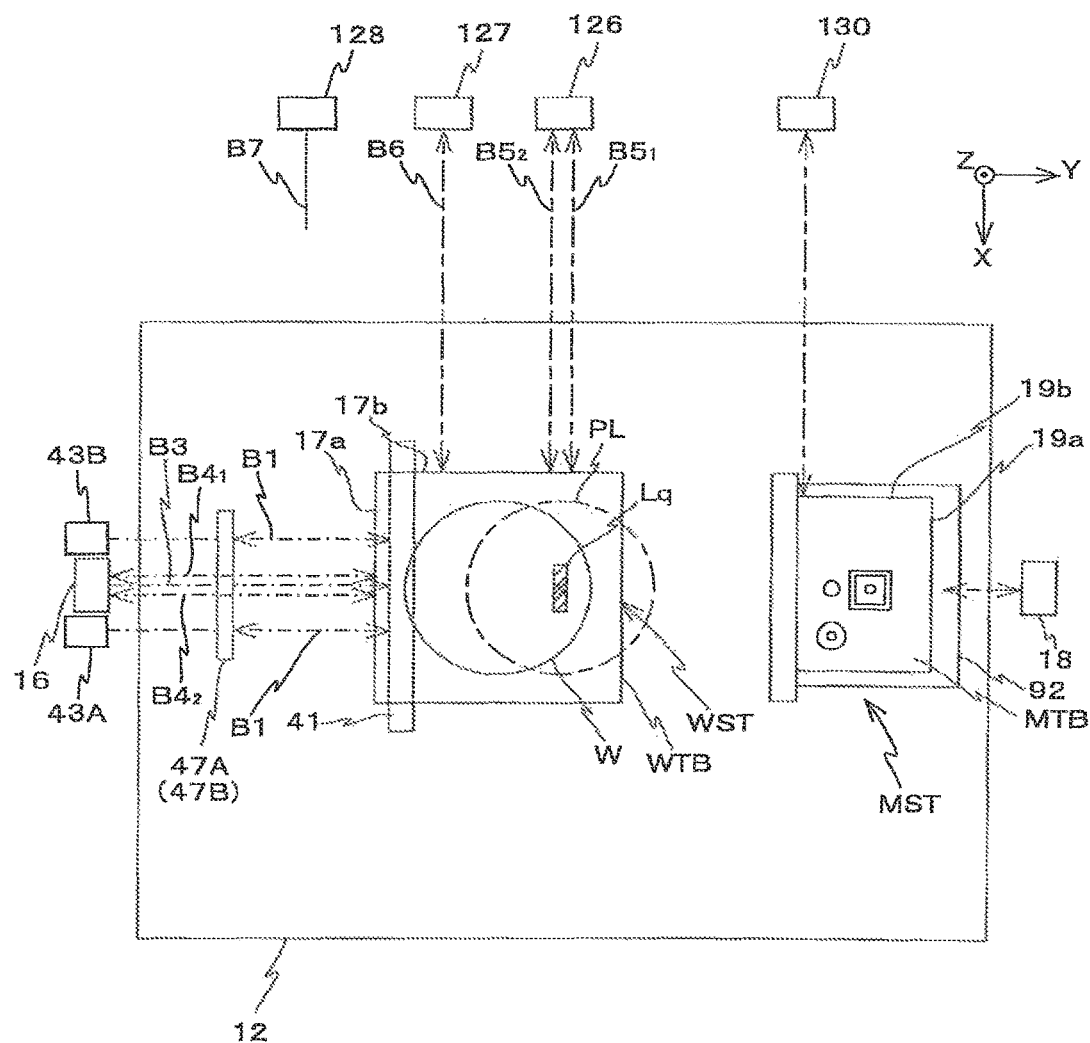
FIG. 4 is a view used to explain an interferometer system.

On the −Y edge surface and the −X edge surface of wafer table WTB, as shown in FIGS. 2, 4 and the like, a reflection surface 17*a* and a reflection surface 17*b* used in the interferometer system (to be described later) are formed.

Measurement stage MST has a stage main section 92 driven in the XY plane by a linear motor and the like (not shown), and a measurement table MTB mounted on stage main section 92, as shown in FIG. 1. Measurement stage MST is configured drivable in at least directions of three degrees of freedom (X, Y, and θz) with respect to base board 12 by a drive system (not shown).

Incidentally, in FIG. 10, the drive system of wafer stage WST and the drive system of measurement stage MST are included and are shown as stage drive system 124.

Various measurement members are arranged at measurement table MTB (and stage main section 92). As such measurement members, for example, as shown in FIG. 3, members such as an uneven illuminance measuring sensor 94, an aerial image measuring instrument 96, a wavefront aberration measuring instrument 98, an illuminance monitor (not shown) and the like are arranged. Further, in stage main section 92, a pair of photodetection systems (not shown) is arranged in a placement facing the pair of light-transmitting systems (not shown) previously described. In the embodiment, an aerial image measuring unit 45 (refer to FIG. 10) is configured in a state where wafer stage WST and measurement stage MST are in proximity within a predetermined distance in the Y-axis direction (including a contact state) and illumination lights IL that has been transmitted through each aerial image measurement slit pattern SL of measurement plate 30 on wafer stage WST are guided by each light-transmitting system (not shown) and are received by light-receiving elements of each photodetection system (not shown) within measurement stage MST.

On the −Y side end surface of measurement table MTB, a fiducial bar (hereinafter, shortly referred to as an "FD bar") 46 is arranged extending in the X-axis direction, as shown in FIG. 3. FD bar 46 is kinematically supported on measurement stage MST by a full-kinematic mount structure. Since FD bar 46 serves as a prototype standard (measurement standard), optical glass ceramics with a low coefficient of thermal expansion, such as Zerodur (the brand name) of Schott AG are employed as the materials. In the vicinity of the end portions on one side and the other side in the longitudinal direction of FD bar 46, a reference grating (for example, a diffraction grating) 52 whose periodic direction is the Y-axis direction is respectively formed, placed symmetric to a center line CL. Further, on the upper surface of FD bar 46, a plurality of reference marks M is formed. As each of reference marks M, a two-dimensional mark having a size that can be detected by a primary alignment system and secondary alignment systems (to be described later) is used. Incidentally, the surface of FD bar 46 and the surface of measurement table MTB are al so covered with a liquid repellent film (water repellent film).

On the end surface on the +Y side and the −X side end surface of measurement table MTB, reflection surfaces 19*a* and 19*b* are formed similar to wafer table WTB (refer to FIG. 3).

Figure 6:
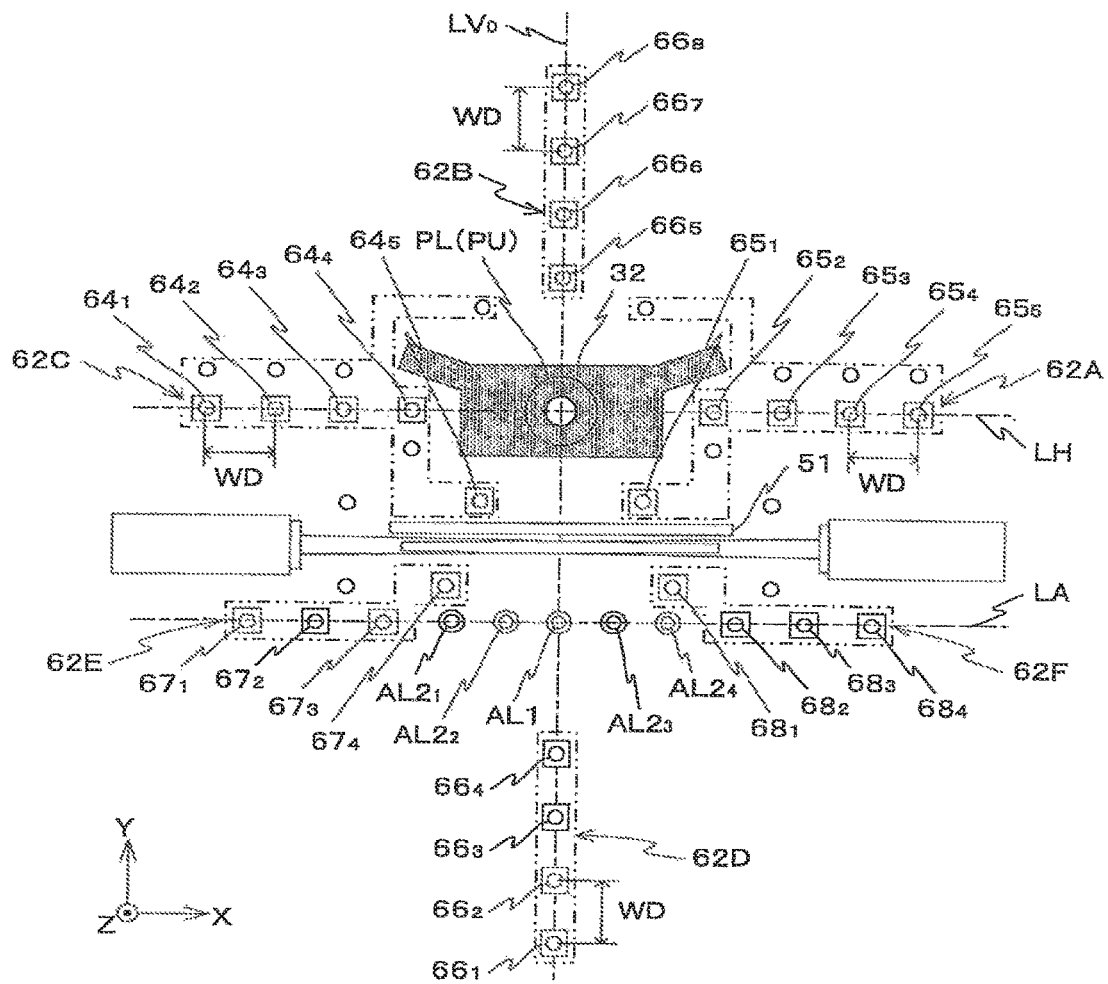

In exposure apparatus 100 of the embodiment, a primary alignment system AL1 having a detection center at a position spaced apart from optical axis AX of projection optical system PL at a predetermined distance on the −Y side is arranged on reference axis LV$_0$ previously described as shown in FIG. 6. Primary alignment system AL1 is fixed to the lower surface of the mainframe (not shown). On one side and the other side in the X-axis direction with primary alignment system AL1 in between, secondary alignment systems AL2$_1$ and AL2$_2$, and AL2$_3$ and AL2$_4$ whose detection centers are substantially symmetrically placed with respect to reference axis LV$_0$ are severally arranged. Secondary alignment systems AL2$_1$ to AL2$_4$ are fixed via a movable support member (not shown) to the lower surface of the mainframe (not shown), and by using drive mechanisms 60$_1$ to 60$_4$ (refer to FIG. 10), the relative position of the detection areas can be adjusted in the X-axis direction. Incidentally, a straight line (a reference axis) LA which passes through the detection center of primary alignment system. AL1 and is parallel to the X-axis shown in FIG. 6 and the like coincides with the optical axis of a measurement beam 136 from interferometer 127 previously described.

In the embodiment, as each alignment system AL1 and AL2$_1$ to AL2$_4$, for example, an FIA (Field Image Alignment) system by an image processing method is used. The imaging signals from each of alignment systems AL1 and AL2$_1$ to AL2$_4$ are supplied to main controller 20, via a signal processing system (not shown).

Next, a configuration and the like of: interferometer system 118 (refer to FIG. 10), which measures the positional information of wafer stage WST and measurement stage MST, will be described.

Interferometer system 118 includes a Y interferometer 16, X interferometers 126, 127, and 128, and Z interferometers 43A and 43B for position measurement of wafer stage WST, a Y interferometer 18 and an X interferometer 130 for position measurement of measurement stage MST and the like, as shown in FIG. 4. Y interferometer 16 and the three X interferometers 126, 127, and 128 each irradiate interferometer beams (measurement beams) B4 (B4$_1$, B4$_2$), B5 (B5$_1$, B5$_2$), B6, and B7 on reflection surfaces 17a and 17b of wafer table WTB. And, Y interferometer 16, and the three X interferometers 126, 127, and 128 each receive the reflected lights, and measure the positional information of wafer stage WST in the XY plane, and supply the positional information which has been measured to main controller 20.

In this case, for example, X interferometer 126 irradiates at least three measurement beams parallel to the X-axis including a pair of measurement beams B5$_1$ and B5$_2$ which passes through optical axis (in the embodiment, also coinciding with the center of exposure area IA previously described) AX of projection optical system PL and is symmetric about a straight line (reference axis LH (refer to FIG. 5 and the like)) parallel to the X-axis. Further, Y interferometer 16 irradiates at least three measurement beams parallel to the Y-axis including a pair of measurement beams B4$_1$, B4$_2$, which are symmetric about reference axis LV$_0$ previously described, and B3 on reflection surface 17a and a movable mirror 41 (to be described later on). As described, in the embodiment, as each interferometer, a multiaxial interferometer which a plurality of measurement axis is used, with an exception for a part of the interferometers (for example, interferometer 128). Therefore, based on measurement results of Y interferometer 16 and X interferometers 126 or 127, main controller 20 can also compute the position of wafer table WTB (wafer stage WST) in the θx direction (hereinafter appropriately expressed as θx rotation (or ex rotation quantity), or pitching (or pitching amount)), the position in the θy direction (hereinafter appropriately expressed as θy rotation (or θy rotation quantity), or rolling (or rolling amount)), and the θz rotation (that is, yawing amount), in addition to the X, Y positions.

Further, as shown in FIG. 1, movable mirror 41 having a concave-shaped reflection surface is attached to the side surface on the −Y side of stage main section 91. As it can be seen from FIG. 2, movable mirror 41 is designed so that the length in the X-axis direction is longer than reflection surface 17a of wafer table WTB.

A pair of Z interferometers 43A and 43B are arranged (refer to FIGS. 1 and 4), facing movable mirror 41. Z interferometers 43A and 43B irradiate two measurement beams B1 and B2, respectively, on fixed mirrors 47A and 47B, which are fixed, for example, on the mainframe (not shown) supporting projection unit PU, via movable mirror 41. And by receiving each reflected light, Z interferometers 43A and 43B measure the optical path length of measurement beams B1 and B2. And from the results, main controller 20 computes the position of wafer stage WST in four degrees of freedom (Y, Z, θy, and θz) directions.

In the embodiment, the position within the XY plane (including the rotation information in the θz direction) of wafer stage WST (wafer table WTB) is mainly measured by an encoder system (to be described later), interferometer system 118 is used when wafer stage WST is positioned outside the measurement area (for example, near unloading position UP and loading position LP as shown in FIG. 5) of the encoder system. Further, interferometer system 118 is used secondarily such as when correcting (calibrating) a long-term fluctuation (for example temporal deformation of the scale) of the measurement results of the encoder system, or as backup at the time of output abnormality in the encoder system. As a matter of course, the position of wafer stage WST (wafer table WTB) can be controlled using both interferometer system 118 and the encoder system together.

Y interferometer 18 and X interferometer 130 of interferometer system 118 irradiate interferometer beams (measurement beams) on reflection surfaces 19a and 19b of measurement table MTB as shown in FIG. 4, and measure the positional information of measurement stage MST (including, for example, at least the position in the X-axis and the Y-axis directions and the rotation information in the θz, direction) by receiving the respective reflected lights, and supply the measurement results to main controller 20.

Next, the structure and the like of encoder system 150 (refer to FIG. 10) which measures the positional information of wafer stage WST in the XY plane (including rotation information in the θz direction) will be described. The main configuration of encoder system 150 is disclosed, such as in, for example, U.S. Patent Application Publication No. 2008/0088843 and the like.

In exposure apparatus 100, as shown in FIG. 5, four head units 62A, 62B, 62C and 62D are placed on the +X side, +Y side, and −X side of nozzle unit 32, and the −Y side of primary alignment system AL1, respectively. Further, on the −Y side of each of the head units 62C and 62A and also at a Y position almost the same as primary alignment system AL1, head units 62E and 62F are arranged, respectively. Head units 62A to 62F are fixed to the mainframe (not shown) holding projection unit PU in a suspended state, via a support member.

As shown in FIG. 6, head unit 62A is placed on the +X side of nozzle unit 32, and is equipped with a plurality of (in this case, four) Y heads 65$_2$ to 65$_5$ placed on reference axis LH previously described along the X-axis direction at a distance WD, and a Y head 65$_1$ placed at a position on the −Y side of nozzle unit 32 a predetermined distance away in the −Y direction from reference axis LH. In this case, the distance in the X-axis direction of Y heads 65$_1$ and 65$_2$ is also set approximately equal to WD. As shown in FIG. 6, head unit 620 is configured symmetrical to head unit 62A, and is placed symmetrical with respect to reference axis LV$_0$ previously described. Head unit 620 is equipped with five Y heads $64_1$ to $64_5$, which are placed symmetrical to Y heads $65_5$ to $65_1$, with respect to reference axis $LV_0$. Hereinafter, Y heads $65_1$ to $65_5$ and $64_1$ to $64_5$ will also be described as Y heads 65 and 64, respectively, as necessary.

Head unit 62A constitutes a multiple-lens (five-lens, in this case) Y linear encoder (hereinafter appropriately shortened to "Y encoder" or "encoder") 70A (refer to FIG. 10) that measures the position of wafer stage WST (wafer table WTB) in the Y-axis direction (the Y-position) using Y scale 39Y, previously described. Similarly, head unit 62C constitutes a multiple-lens (five-lens, in this case) Y linear encoder 70C (refer to FIG. 10) that measures the Y-position of wafer stage WST (wafer table WTB) using Y scale $39Y_2$ described above. In this case, of the five Y heads $64_i$ and $65_j$ that head units 62A and 62C are each equipped with, distance WD in the X-axis direction of adjacent Y heads (to be more accurate, the irradiation points of the measurement beams generated by Y heads 65 and 64 on the scale) is set slightly narrower than the width (to be more precise, the length of grid line 38) of Y scales $39Y_2$ and $39Y_1$ in the X-axis direction. Accordingly, on exposure and the like, of the respective five Y heads $65_j$ and $64_i$ at one head each constantly faces the corresponding Y scales $39Y_1$ and $39Y_2$.

As shown in FIG. 6, head unit 62B is placed on the +Y side of nozzle unit 32 (projection unit PU), and is equipped with a plurality of, in this case, four X heads $66_5$ to $66_8$ that are placed on reference axis $LV_0$ previously described along Y-axis direction at distance WD. Further, head unit 62D is placed on the -Y side of primary alignment system AL1, and is equipped with a plurality of, in this case, four X heads $66_1$ to $66_4$ that are placed on reference axis $LV_0$ at distance WD. Hereinafter, X heads $66_1$ to $66_8$ will also be described as X heads 66, as necessary.

Head unit 62B constitutes a multiple-lens (four-lens, in this case) X linear encoder (hereinafter, shortly referred to as an "X encoder" or an "encoder" as needed) 70B (refer to FIG. 10) that measures the position in the X-axis direction (the X-position) of wafer stage WST (wafer table WTB) using X scale $39X_1$ described above. Further, head unit 62D constitutes a multiple-lens (four-lens, in this case) X linear encoder 70D (refer to FIG. 10) that measures the X-position of wafer stage WST (wafer table WTB) using X scale $39X_2$ previously described.

Here, of the four X heads $66_1$ to $66_4$ and $66_5$ to $66_8$ that head units 62B and 62D are equipped with, respectively, distance WD between adjacent X heads 66 (to be more accurate, the irradiation point of the measurement beam generated by X head 66 on the scale) in the Y-axis direction is set shorter than the width of X scales $39X_1$ and $39X_2$ (to be more accurate, the length of grid line 37) in the Y-axis direction. Accordingly, at times such as exposure or wafer alignment, at least one head of the four X heads 66 each, or more specifically, the eight X heads 66 that head units 62B and 62D are equipped with, constantly faces the corresponding X scales $39X_1$ and $39X_2$. Incidentally, the distance between X head $66_5$ farthest to the -Y side of head unit 62B and X head $66_4$ farthest to the +Y side of head unit 62D is set slightly narrower than the width of wafer table WTB in the Y-axis direction so that switching (linkage described below) becomes possible between the two X heads by the movement of wafer stage WST in the Y-axis direction.

As shown in FIG. 6, head unit 62E is equipped with three Y heads $67_1$ to $67_3$ placed on the -X side of the secondary alignment system $AL2_1$ on reference axis LA previously described at substantially the same distance as distance WD, and a Y head 674 placed on the +Y side of the secondary alignment system $AL2_1$ located a predetermined distance away in the +Y direction from reference axis LA. In this case, the distance between Y heads $67_3$ and $67_4$ in the X-axis direction is also set to WD. Hereinafter, Y heads $67_1$ to $67_4$ will also be described, appropriately, as Y head 67.

Head unit 62F is symmetrical to head unit 62E with respect to reference axis $LV_0$ previously described, and is equipped with four Y heads $68_1$ to $68_4$ which are placed in symmetry to four Y heads $67_4$ to $67_1$ with respect to reference axis $LV_0$. Hereinafter, Y heads $68_1$ to $68_4$ will also be described, appropriately, as Y head 68.

On alignment operation and the like which will be described later on, at least one each of Y heads $67_p$ and $68_q$ (p, q=1 to 4) face Y scales $39Y_2$ and $39Y_1$, respectively. The Y position (and θz rotation) of wafer stage WST is measured by these Y heads $67_p$ and $68_q$ (more specifically, Y encoders 70E and 70F configured by Y heads $67_p$ and $68_q$).

Further, in the embodiment, at the time of baseline measurement and the like of the secondary alignment system which will be described later on, Y head $67_3$ and $68_2$ which are adjacent to the secondary alignment systems $AL2_1$ and $AL2_4$ in the X-axis direction face a pair of reference gratings 52 of FD bar 46, respectively, and by Y heads $67_3$ and $68_2$ that face the pair of reference gratings 52, the Y position of FD bar 46 is measured at the position of each reference grating 52. In the description below, encoders configured by Y heads $67_3$ and $68_2$ which face the pair of reference gratings 52, respectively, will be referred to as Y encoders $70E_2$ and $70F_2$, and for identification, Y encoders 70E and 70F configured by Y heads 67 and 68 that face Y scales $39Y_2$ and $39Y_1$ previously described, will be referred to as Y encoders $70E_1$ and $70F_1$.

The measurement values of encoders 70A to 70F described above are supplied to main controller 20, and main controller 20 controls the position within the XY plane of wafer stage WST based on three measurement values of encoders 70A to 70D or on three measurement values of encoders 70B, 70D, $70E_1$, and $70F_1$, and also controls the rotation (yawing) in the θz direction of FD bar 46 (measurement stage FST) based on the measurement values of encoders $70E_2$ and $70F_2$.

Incidentally, in FIG. 5, measurement stage MST is omitted and a liquid immersion area that is formed by water Lq held in the space between measurement stage MST and tip lens 191 is shown by a reference code 14. Further, in FIG. 5, reference codes UP and LP indicate an unloading position where a wafer on wafer table WTB is unloaded and a loading position where a wafer is loaded on wafer table WTB that are set symmetrical with respect to reference axis $LV_0$, respectively. Incidentally, unloading position UP and loading position LP may be the same position.

Figure 7:
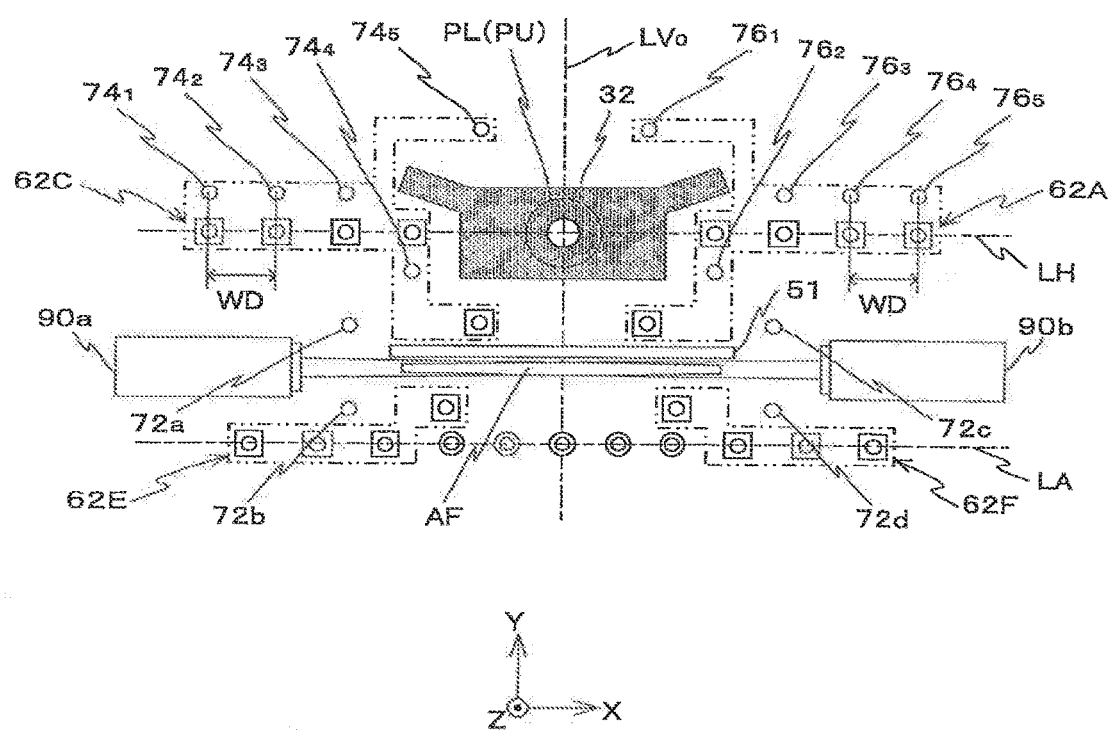
FIG. 7 is a view used to explain a placement of a multipoint AF system and Z heads of a surface position measurement system.

In exposure apparatus 100 of the embodiment, as shown in FIGS. 5 and 7, a multipoint focal position detecting system (hereinafter, shortly referred to as a "multipoint AF system") 90 by an oblique incident method is arranged, which is composed of an irradiation system 90a and a photodetection system 90b, having a configuration similar to the one disclosed in, for example, U.S. Pat. No. 5,448,332 and the like. In the embodiment, as an example, irradiation system 90a is placed on the +Y side of the -X end portion of head unit 62E previously described, and photodetection system 90b is placed on the +Y side of the +X end portion of head unit 62F previously described in a state opposing irradiation system 90a. Incidentally, multipoint AF system 90 is fixed to the lower surface of the mainframe holding projection unit PU previously described.

A plurality of detection points of the multipoint AF system 90 (90a, 90b) are placed at a predetermined distance along the X-axis direction on the surface to be detected. In the embodiment, the plurality of detection points are placed, for example, in the arrangement of a matrix having one row and M columns (M is a total number of detection points) or having two rows and N columns (N=M/2). In FIGS. 5 and 7, the plurality of detection points to which a detection beam is severally irradiated are not individually shown, but are shown as an elongate detection area (beam area) AF that extends in the X-axis direction between irradiation system 90a and photodetection system 90b. Because the length of detection area AF in the X-axis direction is set to around the same as the diameter of wafer W, by only scanning wafer W in the Y-axis direction once, position information (surface position information) in the Z-axis direction across the entire surface of wafer W can be measured.

As shown in FIG. 7, in the vicinity of both end portions of detection area AF of multipoint AF system 90 (90a, 90b), heads 72a and 72b, and 72c and 72d of surface position sensors for Z position measurement (hereinafter, shortly referred to as "Z heads") are arranged each in a pair, in symmetrical placement with respect to reference axis $LV_0$. Z heads 72a to 72d are fixed to the lower surface of the mainframe (not shown).

As Z heads 72a to 72d, for example, a head of an optical displacement sensor similar to an optical pickup used in a CD drive device is used. Z heads 72a to 72d irradiate measurement beams to wafer table WTB from above, and by receiving the reflected lights, measure the surface position of wafer table WTB at the reflection points. Incidentally, in the embodiment, a configuration is employed where the measurement beams of the Z heads are reflected by the reflection grating configuring the Y scales $39Y_1$ and $39Y_2$ previously described.

Furthermore, as shown in FIG. 6, head units 62A and 62C previously described are respectively equipped with Z heads $76_j$ and $74_i$ (i, j=1 to 5), which are five heads each, at the same X position as Y heads $65_j$ and $64_i$ (i, j=1 to 5) that head units 62A and 62C are respectively equipped with, with the Y position shifted. In this case, Z heads $76_3$ to $76_5$ and $74_1$ to $74_3$, which are three heads each on the outer side belonging to head units 62A and 62C, respectively, are placed parallel to reference axis LH a predetermined distance away in the +Y direction from reference axis LH. Further, Z heads $76_1$ and $74_5$, which are heads on the innermost side belonging to head units 62A and 62C, respectively, are placed on the +Y side of projection unit PU, and the remaining Z heads $76_2$ and $74_4$ are placed on the −Y side of Y heads $65_2$ and $64_4$, respectively. And five Z heads $76_j$ and $74_i$, which belong to head unit 62A and 62C, respectively, are placed symmetric to each other with respect to reference axis $LV_0$. Incidentally, as each of the Z heads $76_j$ and $74_i$, an optical displacement sensor head similar to Z heads 72a to 72d described above is employed.

The distance of the five Z heads $76_j$ and $74_i$ (to be more accurate, the irradiation point of the measurement beam generated by the Z heads on the scale) in the X-axis direction ti that are equipped in each of head units 62A and 62C is set equal to distance WD of Y heads 65 and 64 in the X-axis direction. Accordingly, on exposure and the like, of the respective five Y heads $65_j$ and $64_i$, at least one head each constantly faces the corresponding Y scales $39Y_1$ and $39Y_2$.

Z heads 72a to 72d, Z heads $74_1$ to $74_5$, and Z heads $76_1$ to $76_5$ described above connect to main controller 20 via a signal processing/selection device 160, as shown in FIG. 10. Main controller 20 selects an arbitrary Z head from Z heads 72a to 72d, Z heads $74_1$ to $74_5$, and Z heads $76_1$ to $76_5$ via signal processing/selection device 160 and makes the head move into an operating state, and then receives the surface position information detected by the Z head which is in the operating state via signal processing/selection device 160. In the embodiment, a surface position measurement system 180 that measures positional information of wafer stage WST in the Z-axis direction and the direction of inclination with respect to the XY plane is configured, including Z heads 72a to 72d, $74_1$ to $74_5$, and $76_1$ to $76_5$, and signal processing/selection device 160.

Furthermore, in exposure apparatus 100 of the embodiment, as shown in FIG. 5, a periphery exposure unit 51 extending in the X-axis direction is placed in between a detection area (a beam area) AF of the multipoint AF system and head units 62C and 62A. Periphery edge exposure unit 51 is supported in a suspended state via a support member (not shown) on the lower surface of the mainframe (not shown).

Periphery edge exposure unit 51 has a light source (not shown) which emits light having substantially the same wavelength as illumination light IL, and an active mask (hereinafter appropriately shortly referred to as an active mask) 51a (refer to FIG. 8) used for periphery edge exposure on which the light from the light source is incident. Incidentally, instead of the light from the light source, for example, an optical fiber can be used to guide illumination light IL to active mask 51a.

Figure 8:
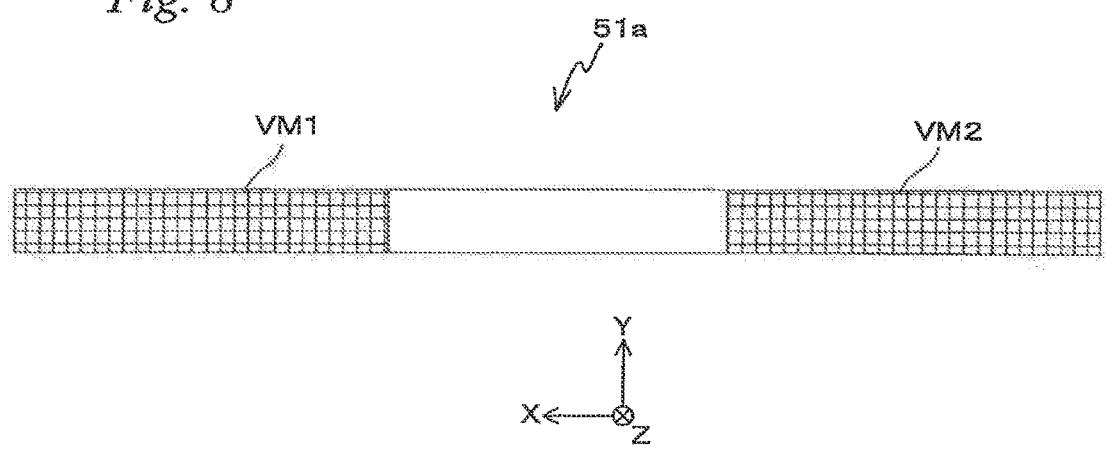
FIG. 8 is a view used to explain an active mask used in a periphery edge exposure.

As shown in FIG. 5, the length of periphery edge exposure unit 51 (active mask 51a) is set somewhat longer than the diameter of wafer W. As an example, as shown in FIG. 8, active mask 51a has a pair of variable shaped masks VM1 and VM2 on both ends in the X-axis direction.

As each of the variable shaped masks VM1 and VM2, as an example, a micromirror array which includes a plurality of micromirrors $M_{ij}$ (refer to FIGS. 9A and 9B) placed in a matrix within an XY plane is used. This micromirror array is a movable micromirror formed using MEMS technology on an integrated circuit made by a CMOS process. The mirror surface (reflection surface) of each micromirror can be inclined around a predetermined axis (for example, an axis coinciding with a diagonal line of the micromirror) in a range of a predetermined angle, ±θ (θ is, for example, 3 degrees (or 12 degrees)), and by driving an electrode arranged on the lower portion of the mirror surface, the micromirror can have two states which are "on (ON)" (−θ) and "off (OFF)" (+θ). More specifically, each variable shaped mask is equipped with a substrate which becomes a base portion, a movable micromirror $M_{ij}$ formed on the substrate, and an electrode which performs the on/off of each micromirror.

Figure 9A:
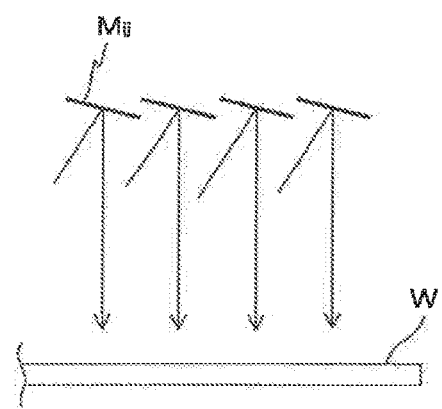
FIGS. 9A and 9B are views used to explain an on state and an off state of a micromirror, respectively.
Figure 9B:
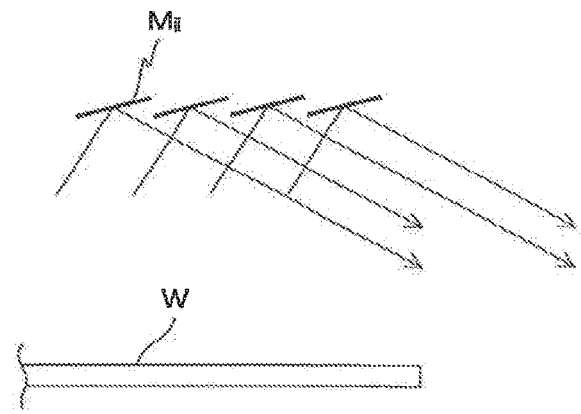

Each micromirror $M_{ij}$ is set, as an example, either to a state (or posture) in which light from the light source is reflected toward wafer W as shown in FIG. 9A, or a state (or posture) in which light from the light source is reflected to a predetermined direction that does not make the light from light source enter wafer W as shown in FIG. 9B by a drive signal supplied to the electrode. In the description below, the former will be referred to as an on state (or an on posture) of micromirror $M_{ij}$, and the latter will be referred to as an off state (or an off posture) of micromirror $M_{i,j}$.

Main controller 20 controls each micromirror $M_{ij}$ individually so that each micromirror is either in an on state (or on posture) or an off state (or off posture). Therefore, according to periphery edge exposure unit 51 of the embodiment, by moving wafer stage WST in the Y-axis direction in a state where the center of wafer W in the X-axis direction substantially coincides with the center of periphery edge exposure unit 51 in the longitudinal direction, an arbitrary position close to both edges of wafer W in the X-axis direction can be exposed and an arbitrary pattern can be formed. More specifically, periphery edge exposure unit 51 can form two irradiation areas for periphery edge exposure which are spaced apart in the X-axis direction, and the positions are movable at least in the X-axis direction.

FIG. 10 shows the main configuration of the control system of exposure apparatus 100. The control system is mainly configured of main controller 20 composed of a microcomputer (or workstation) that performs overall control of the entire apparatus. Incidentally, in FIG. 10, various sensors such as uneven illuminance measuring sensor 94, aerial image measuring instrument 96 and wavefront aberration measuring instrument 98 that are arranged at measurement stage MST are collectively shown as a sensor group 99.

Next, a parallel processing operation that uses wafer stage WST and measurement stage MST in exposure apparatus 100 of the embodiment will be described, based on FIGS. 14 to 24. Incidentally, during the operation below, main controller 20 performs the open/close control of each valve of liquid supply unit 5 of local liquid immersion unit 8 and liquid recovery unit 6 in the manner previously described, and water is constantly filled on the outgoing surface side of tip lens 191 of projection optical system PL. However, in the description below, for the sake of simplicity, the explanation related to the control of liquid supply unit 5 and liquid recovery unit 6 will be omitted. Further, many drawings are used in the operation description hereinafter, however, reference codes may or may not be given to the same member for each drawing. More specifically, the reference codes written are different for each drawing, however, such members have the same configuration, regardless of the indication of the reference codes. The same can be said for each drawing used in the description so far.

Figure 11:
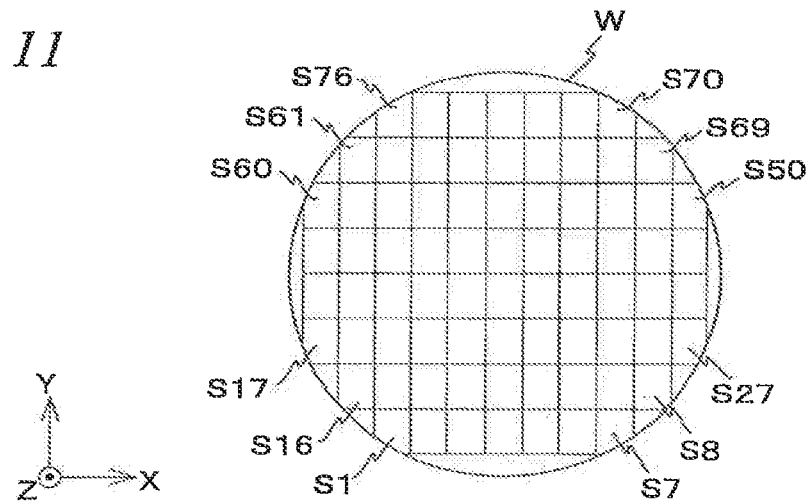
FIG. 11 is a view used to explain a shot map of a wafer.

Prior to describing the parallel processing operation, the size and arrangement of shot areas formed on wafer W subject to exposure, or more specifically, a shot map and the like of wafer W will now be described. FIG. 11 shows a planar view of wafer W. The effective exposure area (corresponding to an area inside a circular external form in FIG. 11) on which resist of wafer W has been applied is divided into a large number of shot areas Sj (In FIG. 11, j=1-76). And, as an example, shot area Sj is to be a shot area where two devices, which are identical devices (chips), are formed.

Figure 12:
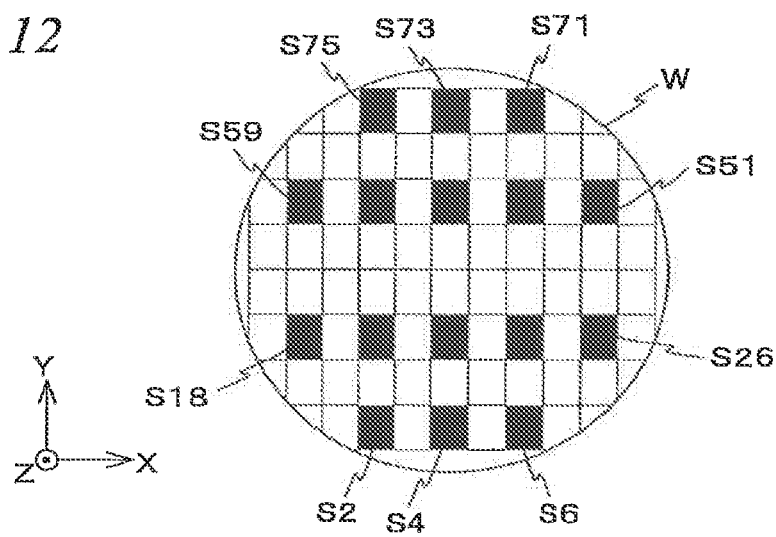
FIG. 12 is a view used to explain an alignment shot area of a wafer.

In the embodiment, 16 shot areas (S2, S4, S6, S18, S20, S22, S24, S26, S51, S53, S55, S57, S59, S71, S73, S75) which are indicated in black in FIG. 12 are to be specified as sample shot areas (alignment shot areas) on wafer alignment (EGA: Enhanced Global Alignment) by an operator. Of the 16 sample shot areas described above, three shot areas (S71, S73, S75) are a first alignment shot area, five shot areas (S51, S53, S55, S57, S59) are a second alignment shot area, five shot areas (S18, S20, S22, S24, S26) are a third alignment shot area, and three shot areas (S2, S4, S6) are a fourth alignment shot area.

Figure 13:
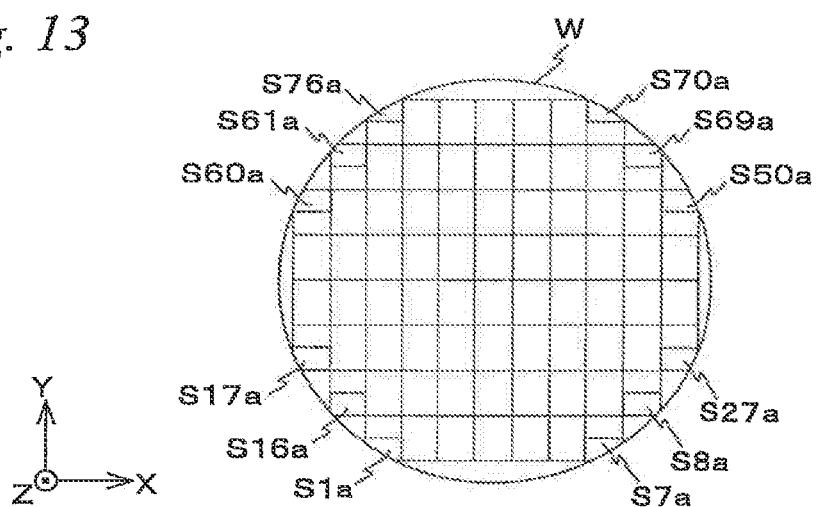
FIG. 13 is a view used to explain an area subject to periphery edge exposure.

Further, in the embodiment, as shown in FIG. 13, in the 12 periphery shots (S1, S7, S8, S16, S17, S27, S50, S60, S61, S69, S70, S76) of wafer W, half of the areas (S1a, S7a, S8a, S16a, S17a, S27a, S50a, S60a, S61a, S69a, S70a, S76a) on the edge side of wafer W are each subject to periphery edge exposure (hereinafter referred to as, periphery edge exposure area).

The parallel processing operation using both stages MST and WST which will be described below, is performed, as a whole, in a procedure similar to the parallel processing operation disclosed in, for example, the pamphlet of international Publication No. 2007/097379 (and the corresponding U.S. Patent Application Publication 2008/0088843).

Figure 14:
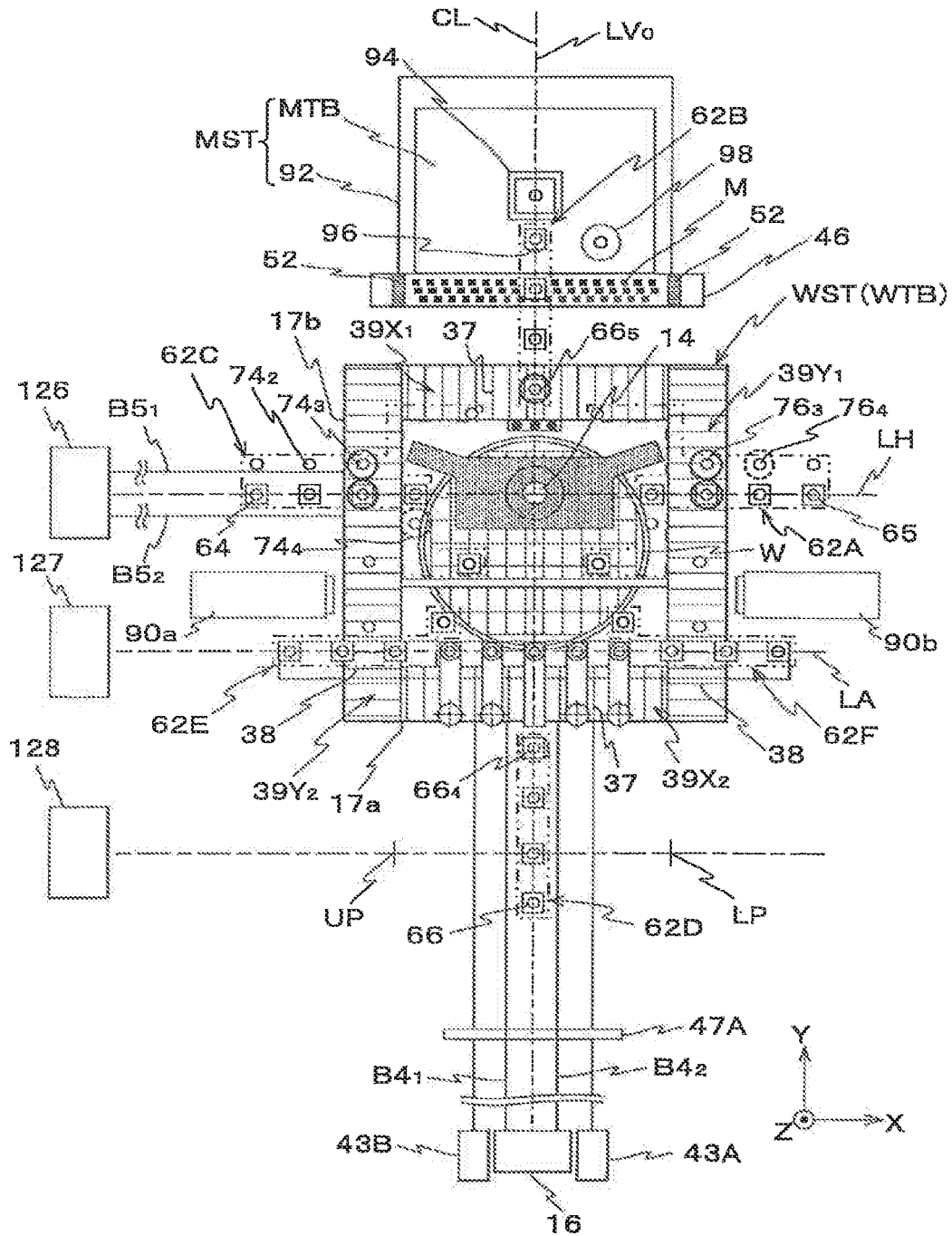
FIG. 14 is a view that shows a state of the wafer stage and the measurement stage where exposure to a wafer on the wafer stage is performed by a step-and-scan method.

FIG. 14 shows a state in which an exposure by the step-and-scan method of wafer W mounted on wafer stage WST is performed. This exposure is performed by repeating a movement between shots in which wafer stage WST is moved to a scanning starting position (acceleration staring position) to expose each shot area on wafer W and scanning exposure in which the pattern formed on reticle R is transferred onto each shot area by the scanning exposure method, based on results of wafer alignment (EGA: Enhanced Global Alignment) and the like which has been performed prior to the beginning of exposure. Further, exposure is performed in the following order, from the shot area located on the −Y side on wafer W to the shot area located on the +Y side. Incidentally, exposure is performed in a state where liquid immersion area 14 is formed in between projection unit PU and wafer W.

During the exposure described above, the position (including the position (θz rotation) in the θz direction) of wafer stage WST in the XY plane is controlled by main controller 20, based on measurement results of a total of three encoders which are the two Y encoders 70A and 70C, and one of the two X encoders 70B and 70D. In this case, the two X encoders 70B and 70D are made up of two X heads 66 that face X scale $39X_1$ and $39X_2$, respectively, and the two Y encoders 70A and 70C are made up of Y heads 65 and 64 that face Y scales $39Y_1$ and $39Y_2$, respectively. Further, the Z position and the θy rotation (rolling) of wafer stage WST are controlled, based on measurement results of Z heads $74_i$ and $76_j$, which respectively belong to head units 62C and 62A facing the end section on one side and the other side of the surface of wafer table WTB in the X-axis direction, respectively. The θx rotation (pitching) of wafer stage WST is controlled based on measurement values of Y interferometer 16. Incidentally, in the case three or more Z heads including Z head $74_i$ and $76_j$ face the surface of the second water repellent plate 28b of wafer table WTB, it is also possible to control the position of wafer stage WST in the Z-axis direction, the θy rotation (rolling), and the θx rotation (pitching), based on the measurement values of Z heads $74_i$, $76_j$ and the other one Z head. In any case, the control (more specifically, the focus leveling control of wafer W) of the position of wafer stage WST in the Z-axis direction, the θy rotation, and the θx rotation is performed, based on results of a focus mapping performed beforehand.

At the position of wafer stage WST shown in FIG. 14, while X head $66_5$ (shown circled in FIG. 14) faces X scale $39X_1$, there are no X heads 66 that face X scale $39X_2$. Therefore, main controller 20 uses one X encoder 70B and two Y encoders 70A and 70C so as to perform position (X, Y, θz) control of wafer stage WST. In this case, when wafer stage WST moves from the position shown in FIG. 14 to the −Y direction, X head $66_5$ moves off of (no longer faces) X scale $39X_1$, and X head $66_4$ (shown circled in a broken line in FIG. 14) faces X scale $39X_2$ instead. Therefore, main controller 20 switches to a control (hereinafter shortly referred to as stage control, as appropriate) of the position (and speed) of wafer stage WST using one X encoder 70D and two Y encoders 70A and 70C.

Further, when wafer stage WST is located at the position shown in FIG. 14, Z heads $74_3$ and $76_3$ (shown circled in FIG. 14) face Y scales $39Y_2$ and $39Y_1$, respectively. Therefore, main controller 20 performs position (Z, θy) control of wafer stage WST using Z heads $74_3$ and $76_3$. In this case, when wafer stage WST moves from the position shown in FIG. 14 to the +X direction, Z heads $74_3$ and $76_3$ move off of (no longer faces) the corresponding Y scales, and Z heads $74_4$ and $76_4$ (shown circled in a broken line in the drawing) respectively face Y scales $39Y_2$ and $39Y_1$ instead. Therefore, main controller 20 switches the stage control to a control that uses Z heads $74_4$ and $76_4$.

In this manner, main controller 20 performs stage control by consistently switching the encoders and the Z heads to be used depending on the position coordinate of wafer stage WST.

Incidentally, independent from the position measurement of wafer stage WST described above using the measuring instruments described above, position (X, Y, Z, θx, θy, θz) measurement of wafer stage WST using interferometer system 118 is constantly performed. In this case, the X position and θz rotation quantity (yawing amount) of wafer stage WST are measured using X interferometers 126, 127, or 128, the Y position, the θx rotation quantity, and the θz rotation quantity are measured using Y interferometer 16, and the Y position, the Z position, the θy rotation quantity, and the θz rotation quantity are measured using Z interferometers 43A and 43B that constitute interferometer system 118. Of X interferometers 126, 127, and 128, one interferometer is used according to the Y position of wafer stage WST. As indicated in FIG. 14, X interferometer 126 is used during exposure. The measurement results of interferometer system 118 except for the pitching amount (θx rotation quantity) are used for position control of wafer stage WST secondarily, or in the case of backup which will be described later on, or when measurement using encoder system 150 and/or surface position measurement system 180 cannot be performed.

When exposure of wafer W has been completed, main controller 20 drives wafer stage WST toward unload position UP. On this drive, wafer stage WST and measurement stage MST which were apart during exposure come into contact or move close to each other with a clearance of around 300 μm in between, and shift to a scrum state. In this case, the −Y side surface of FD bar 46 on measurement table MTB and the +Y side surface of wafer table WTB come into contact or move close together. And by moving both stages WST and MST in the −Y direction while maintaining the scrum condition, liquid immersion area 14 formed under protection unit PU moves to an area above measurement stage MST. For example, FIGS. 15 and 16 show the state after the movement.

When wafer stage WST moves further to the −Y direction and moves off from the effective stroke area (the area in which wafer stage WST moves at the time of exposure and wafer alignment), all the X heads and Y heads that constitute encoder system 150, and all the Z heads that constitute surface position measurement system 180 move off from the corresponding scales on wafer table WTB. Therefore, stage control based on the measurement results of encoder system 150 and surface position measurement system 180 is no longer possible. Thus, just before the stage control based on the measurement results of encoder system 150 and surface position measurement system 180 is no longer possible, main controller 20 switches the control from a stage control based on the measurement results of both systems 150 and 180 to a stage control based on the measurement results of interferometer system 118. In this case, of the three X interferometers 126, 127, and 128, X interferometer 128 is used.

Figure 15:
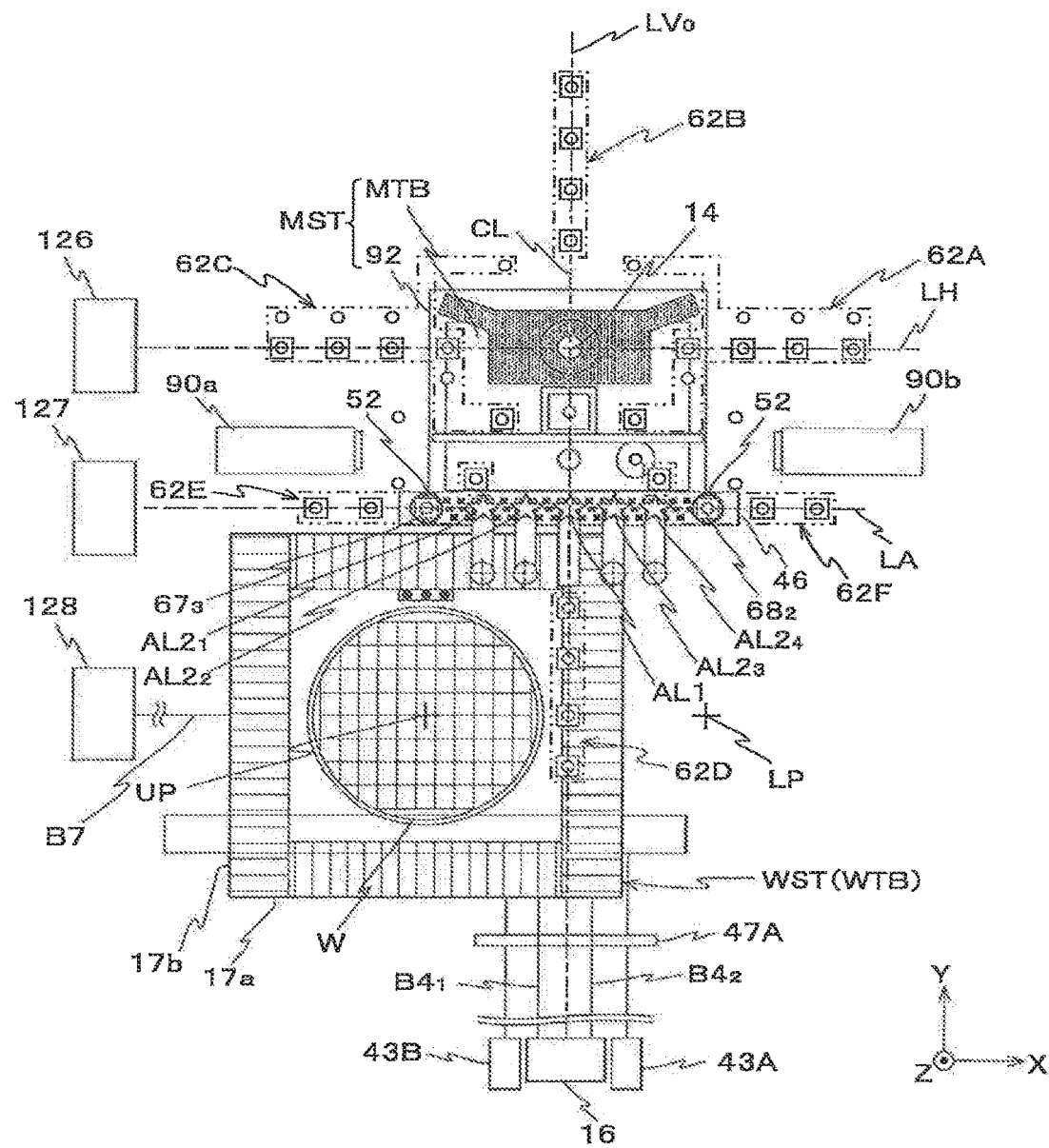
FIG. 15 is a view that shows a state of both stages at the time of unloading of a wafer (when the measurement stage reaches the position where Sec-BCHK (interval) is performed)
Figure 16:
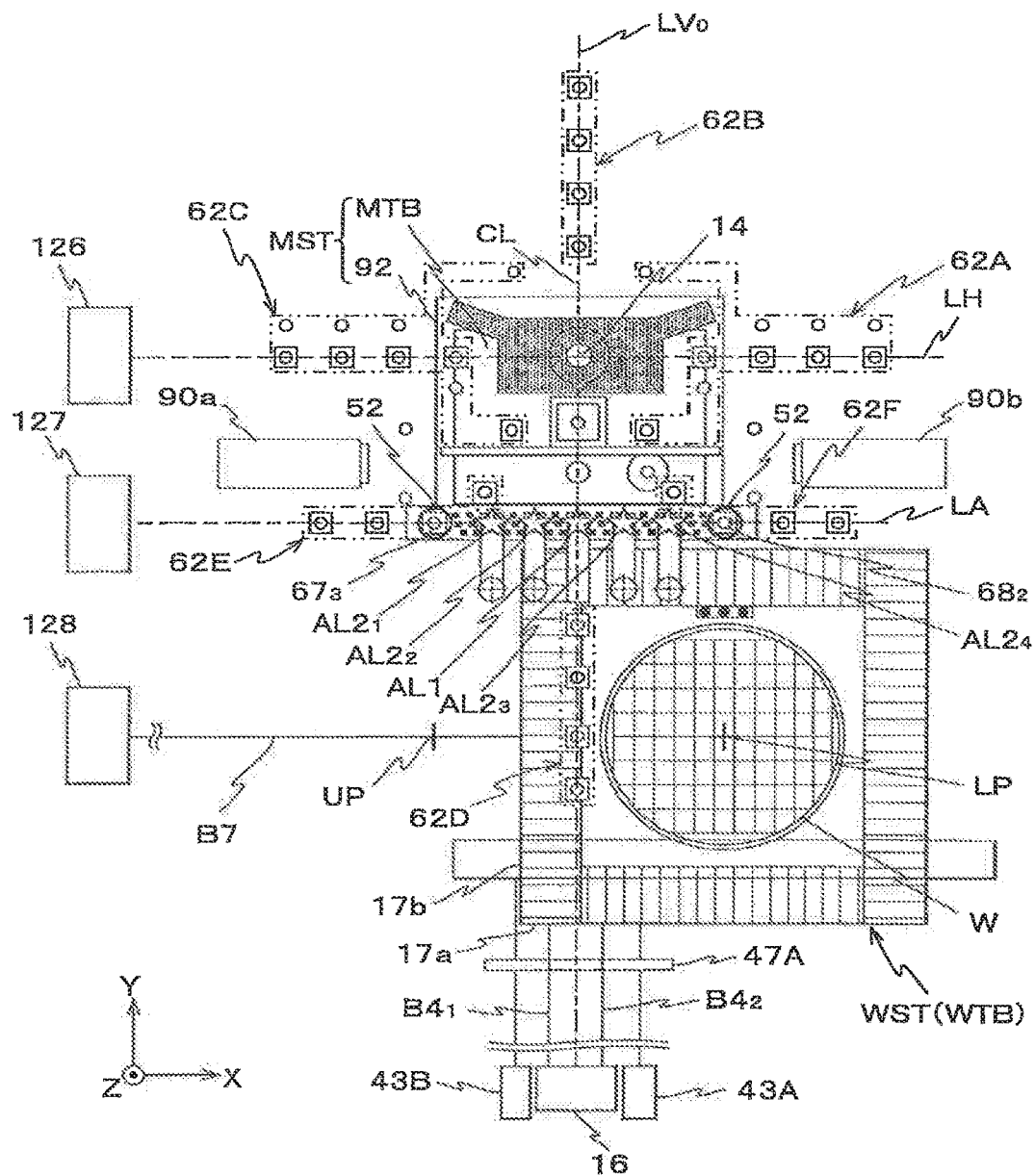
FIG. 16 is a view that shows a state of both stages at the time of loading of a wafer.

Then, as shown in FIG. 15, wafer stage WST releases the scrum state with measurement stage MST, and then moves to unloading position UP. After the movement, main controller 20 unloads wafer W on wafer table WTB. And then, as shown in FIG. 16, wafer stage WST is driven in the +X direction to loading position LP, and the next wafer W is loaded on wafer table WTB.

In parallel with these operations, main controller 20 performs Sec-BCHK (a secondary base line check) in which position adjustment of FD bar 46 supported by measurement stage MST in the XY plane and baseline measurement of the four secondary alignment system $AL2_1$ to $AL2_4$ are performed. Sec-BCHK is performed on an interval basis for every wafer exchange. In this case, in order to measure the θz rotation quantity of FD bar 46, Y encoder $70E_2$ and $70F_2$ describe above are used.

Figure 17:
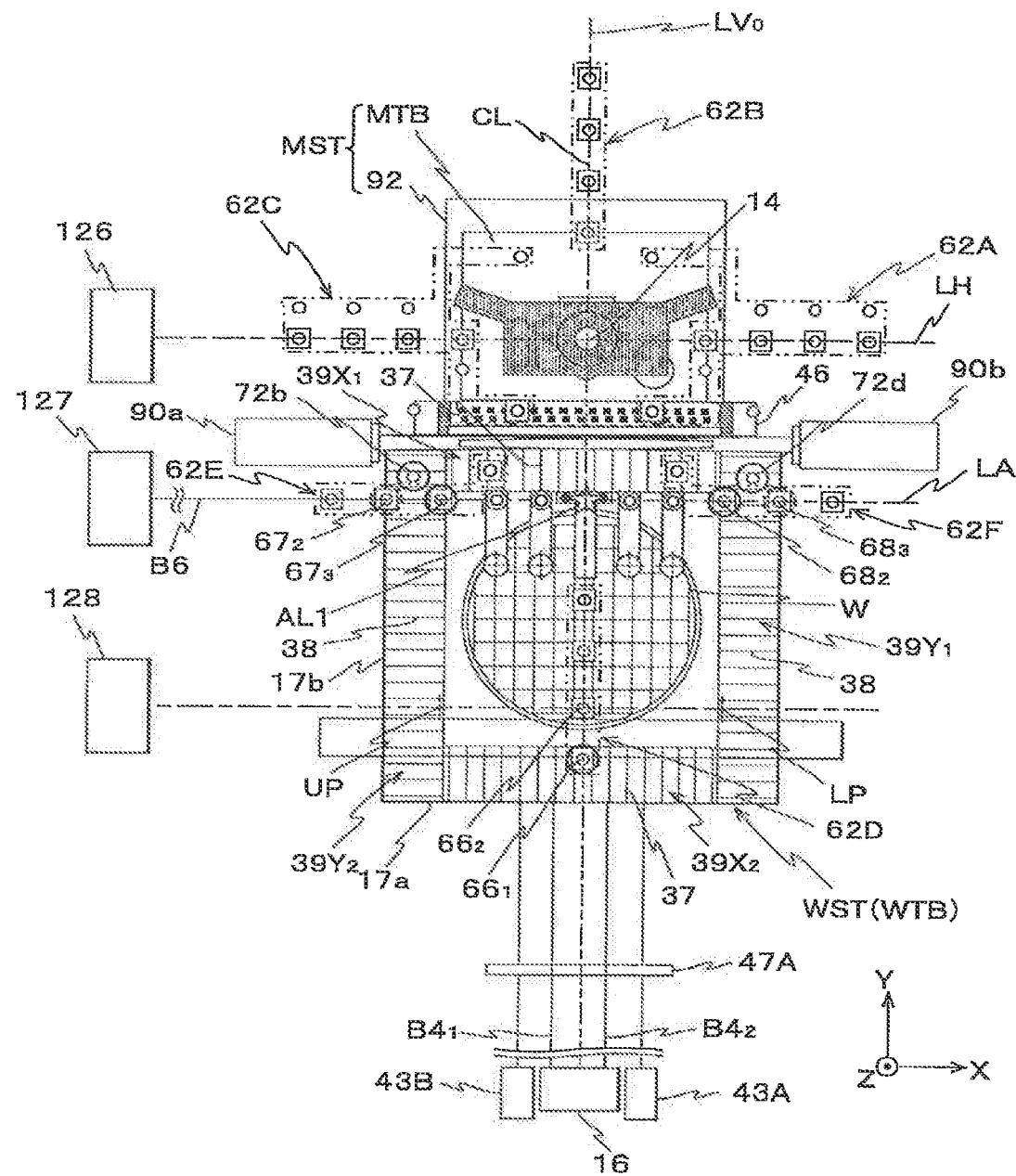
FIG. 17 is a view that shows a state of both stages at the time of switching (when the wafer stage has moved to a position where the former processing of Pri-BCHK is performed) from stage servo control by an interferometer to stage servo control by an encoder.

Next, as shown in FIG. 17, main controller 20 drives wafer stage WST and positions reference mark FM on measurement plate 30 within a detection field of primary alignment system AL1, and performs the former process of a Pri-BCHK (a primary baseline check) in which the reference position is decided for baseline measurement of alignment system AL1, and $AL2_1$ to $AL2_4$.

On this process, as shown in FIG. 17, two Y heads $68_2$ and $67_3$ and one X head $66_1$ (shown circled in the drawing) come to face Z scales $39Y_1$ and $39Y_2$, and X scale $39X_2$, respectively. Then, main controller 20 switches the stage control from a control using interferometer system 118, to a control using encoder system 150 (encoders $70E_1$, $70F_1$, and 70D). Interferometer system 118 is used secondarily again, except for measurement of the θx rotation quantity. Incidentally, of the three X interferometers 126, 127, and 128, X interferometer 127 is used.

Next, while controlling the position of wafer stage WST based on the measurement values of the three encoders described above, main controller 20 begins the movement of wafer stage WST in the +Y direction toward a position where an alignment mark arranged in three first alignment shot areas is detected.

Figure 18:
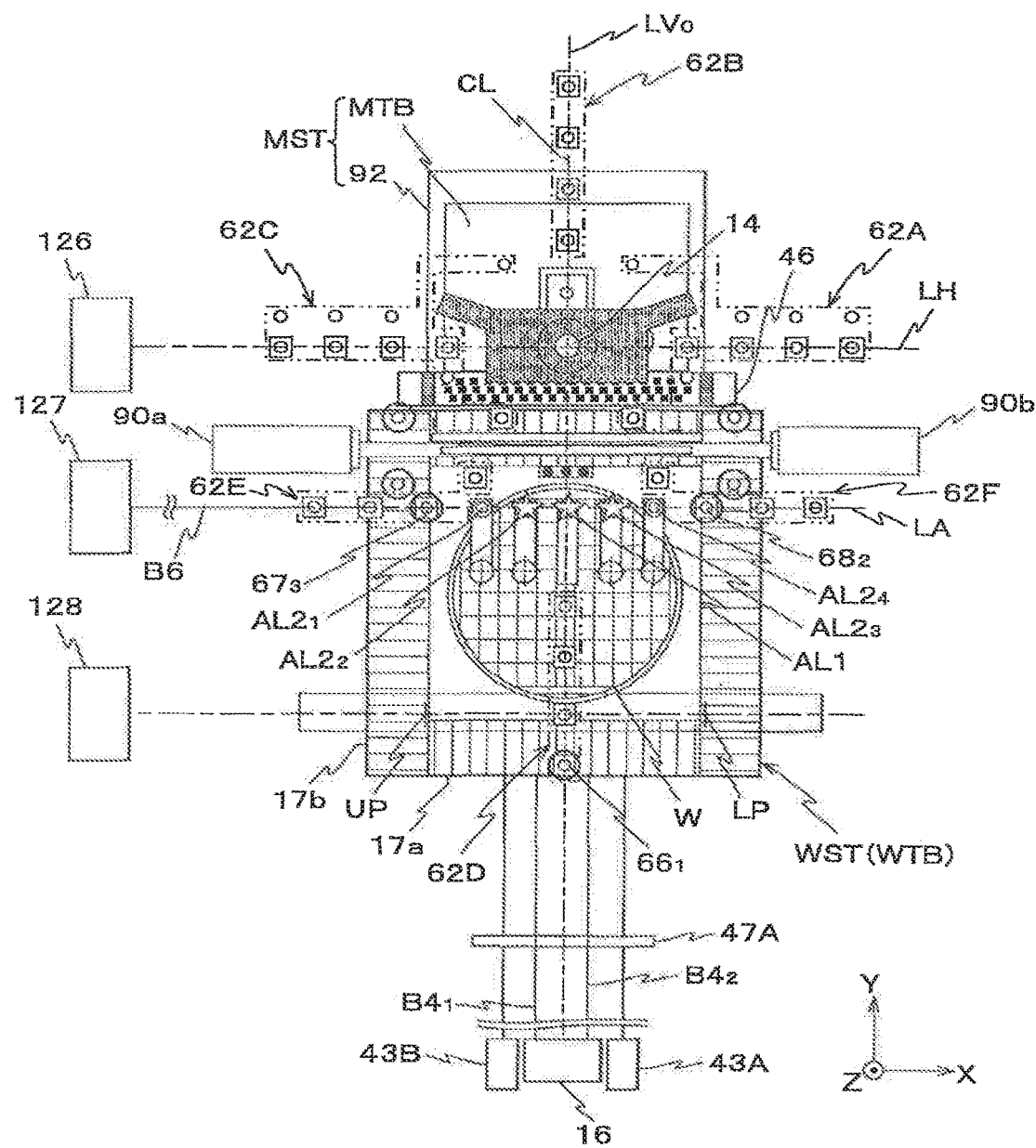
FIG. 18 is a view that shows a state of the wafer stage and the measurement, stage when alignment marks arranged in three first alignment shot areas are being simultaneously detected using alignment systems AL1, AL2$_2$ and AL2$_3$.

Then, when wafer stage WST reaches the position shown in FIG. 18, main controller 20 stops wafer stage WST. Prior to this opera ion, main controller 20 activates (turns ON) Z heads 72a to 72d and starts measurement of the Z-position and the tilt amount (the θy rotation quantity) of wafer table WTB at the point in time when all of or part of Z heads 72a to 72d face(s) wafer table WTB, or before that point in time.

After wafer stage WST is stopped, main controller 20 detects alignment marks arranged in the three first alignment shot areas substantially at the same time and also individually (refer to the star-shaped marks in FIG. 18), using primary alignment system AL1, and secondary alignment systems $AL2_2$ and $AL2_3$, and makes a link between the detection results of the three alignment systems AL1, $AL2_2$, and $AL2_3$ and the measurement values of the three encoders above at the time of the detection, and stores them in memory (not shown).

As described above, in the embodiment, the shift to the contact state (or proximity state) between measurement stage MST and wafer stage WST is completed at the position where detection of the alignment marks of the first alignment shot area is performed, and from the position, main controller 20 begins to move both stages WST and MST in the +Y direction (step movement toward the position for detecting the alignment marks arranged in the five second alignment shot areas) in the contact state (or proximity state). Prior to starting the movement of both stages WST and MST in the +Y direction, as shown in FIG. 18, main controller 20 begins irradiation of a detection beam from irradiation system 90 of the multipoint AF system (90a, 90b) to wafer table WTB. Accordingly, a detection area of the multipoint AF system is formed on wafer table WTB.

Figure 19:
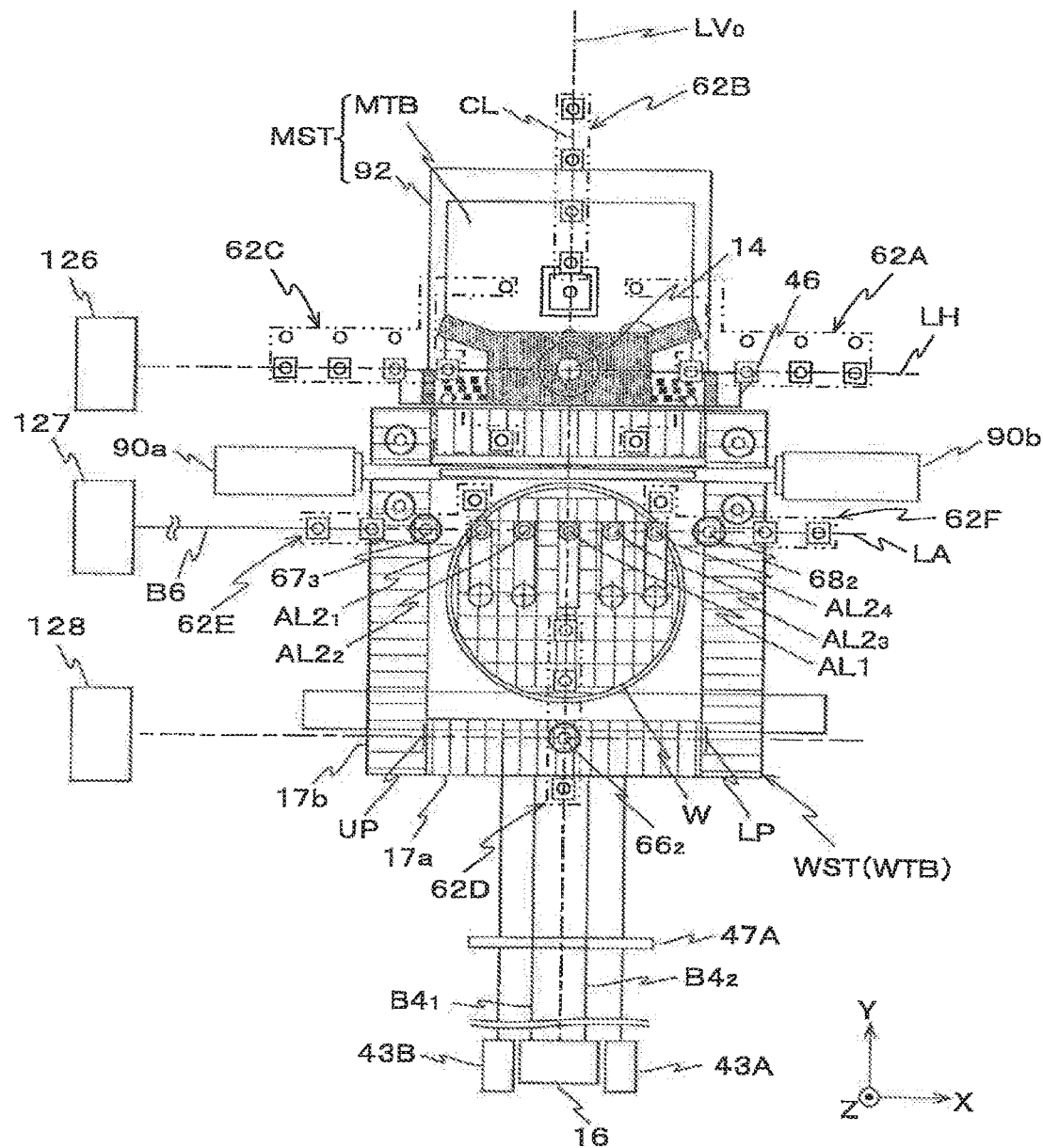
FIG. 19 is a view that shows a state of the wafer stage and the measurement stage when the former processing of focus calibration is being performed.

Then, when both stages WST and MST reach the position shown in FIG. 19 during the movement of both stages WST and MST in the +Y direction, main controller 20 performs the former process of the focus calibration in which the relation between the measurement values (surface position information on one side and the other side of wafer table WTB in the X-axis direction) of Z heads 72a, 72b, 72c, and 72d in a state where the center line of wafer table WTB coincides with reference axis $LV_0$, and the detection results (surface position information) of the surface of measurement plate 30 by the multipoint AF system (90a, 90b) is obtained. At this point, liquid immersion area 14 is formed on the upper surface of FD bar 46.

Figure 20:
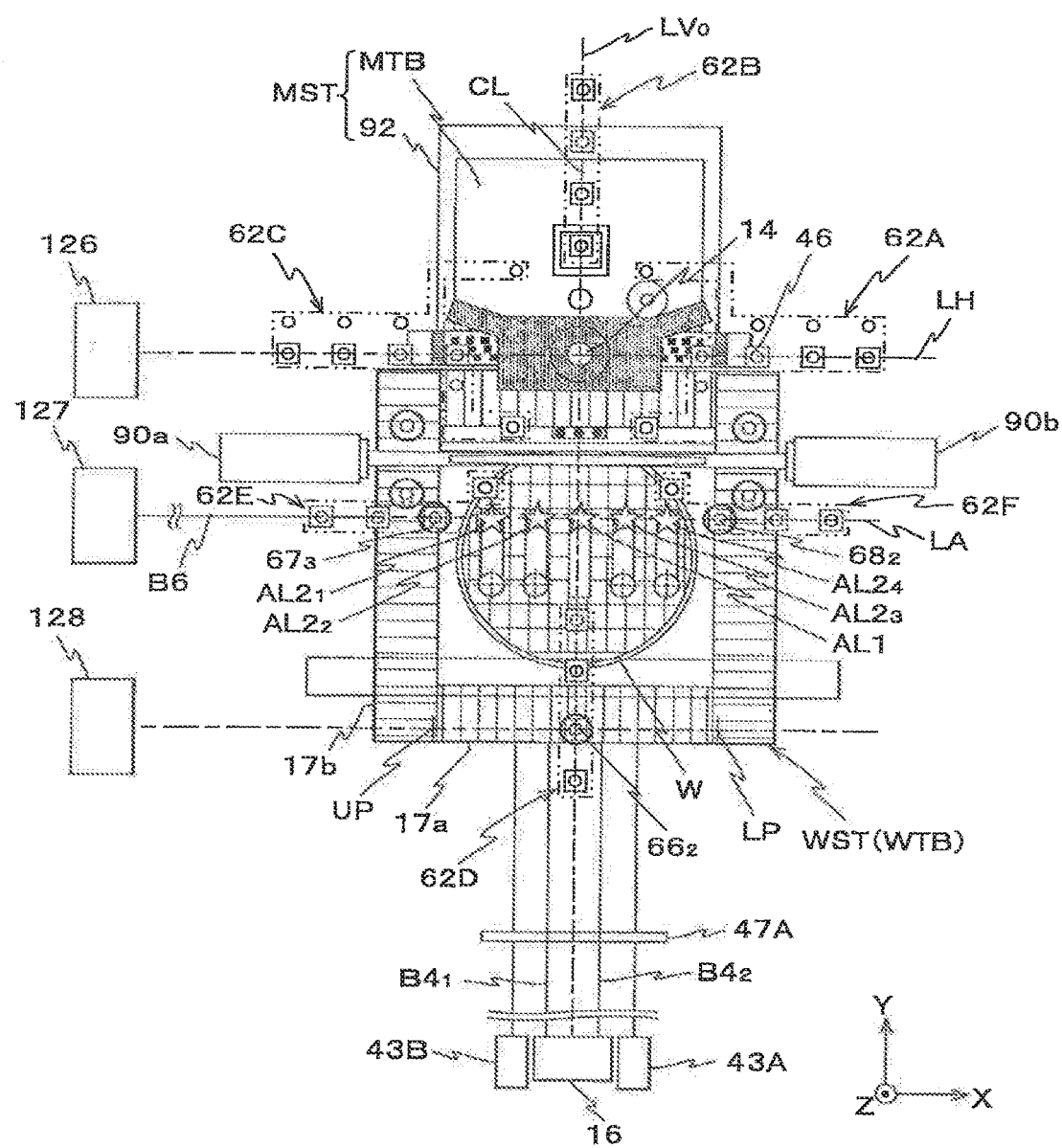
FIG. 20 is a view that shows a state of the wafer stage and the measurement stage when alignment marks arranged in five second alignment shot areas are being simultaneously detected using alignment systems AL1 and AL2$_1$ to AL2$_4$.

Then, when both stages WST and MST move further in the +Y direction while maintaining the contact state (or proximity state) and reach the position shown in FIG. 20, the alignment marks arranged in the five second alignment shot areas are detected (refer to the star-shaped marks in FIG. 20) individually, substantially at the same time, using the five alignment systems AL1, and $AL2_1$ to $AL2_4$, and a link is made between the detection results of the five alignment systems AL1, and $AL2_1$ to $AL2_4$ and the measurement values of the three encoders measuring the position of wafer stage WST in the XY plane at the time of the detection, and then is stored in memory (not shown). At this point, main controller 20 controls the position within the XY plane of wafer stage WST based on the measurement values of X head $66_2$ (X linear encoder 70D) that faces X scale $39X_2$ and Y linear encoders $70E_1$ and $70F_1$.

Further, after the detection of the alignment marks arranged in the five second alignment shot areas described above ends, main controller 20 starts the movement in the +Y direction again of both stages WST and MST in the contact state (or proximity state), and at the same time, starts the focus mapping in which positional information (surface position information) related to the wafer W surface in the Z-axis direction is detected using Z heads 72a to 72d and the multipoint AF system (90a, 90b), as shown in FIG. 20.

Figure 21:
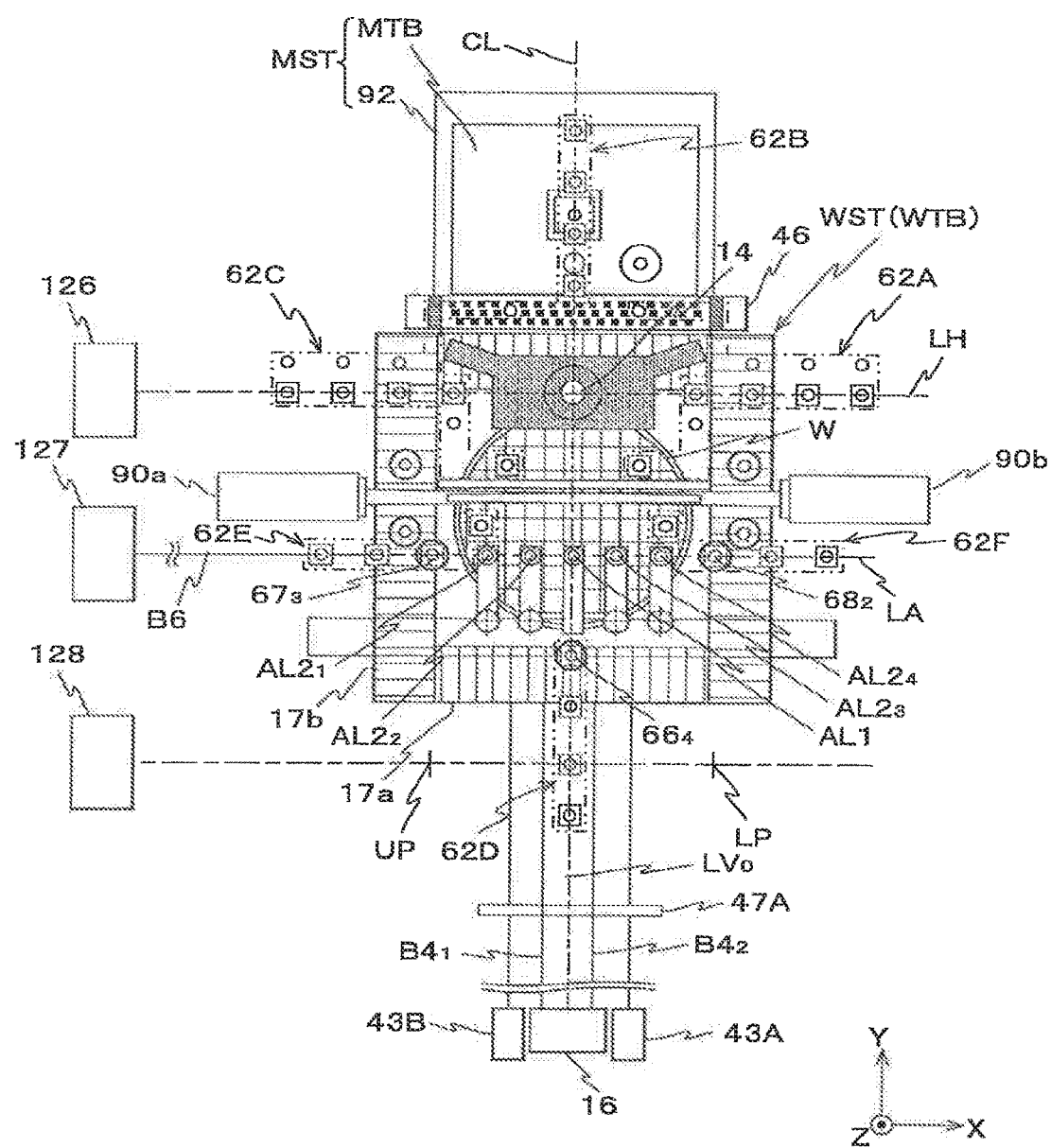
FIG. 21 is a view that shows a state of the wafer stare and the measurement stage when at least one of the latter processing of Pri-BCHK and the latter processing of focus calibration is being performed.
Figure 25A:
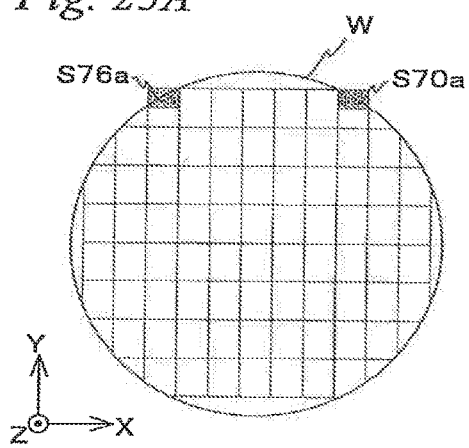
FIGS. 25A to 25F are views used to explain a proceeding process of a periphery edge exposure, respectively.
Figure 25B:
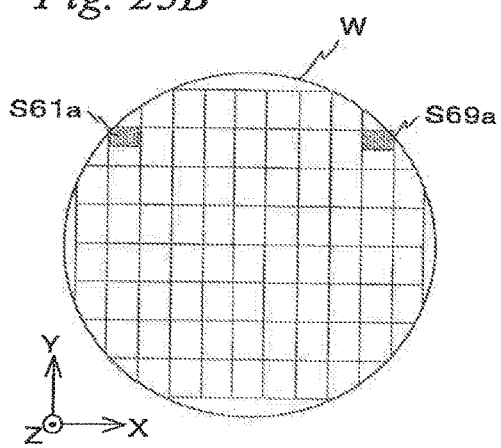
Figure 25C:
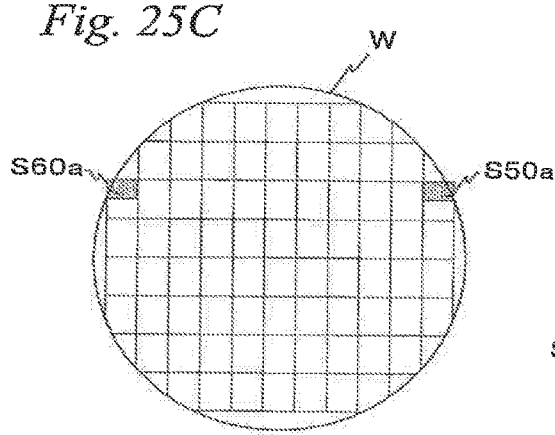

Then, after beginning the focus mapping until both stages WST and MST reach the position shown in FIG. 21, by individually controlling the ON/OFF of each micromirror $M_{ij}$ that constitute the two variable shaped masks VM1 and VM2 of periphery edge exposure unit 51 according to the Y position of wafer stage WST measured by Y linear encoders $70E_1$ and $70F_1$, main controller 20 sequentially exposes periphery edge exposure areas S70a and S76a, S61a and S69a, and S50a and S60a, as shown in FIGS. 25A, 25B, and 25C. In this case, main controller 20 can perform overall exposure of each periphery edge exposure area using periphery edge exposure unit 51, or a predetermined pattern can be formed.

Then, when both stages WST and MST reach the position shown in FIG. 21 where measurement plate 30 is located directly below projection optical system PL, main controller 20 performs the latter process of focus calibration as in the description below, in a state continuing the control of Z position of wafer stage WST (measurement plate 30) that uses the surface position information measured by Z heads 72a, 72b, 72c, and 72d as a reference, without switching the Z head used for position (Z position) control of wafer stage WST in the optical axis direction of projection optical system PL to Z heads $74_i$ and $76_j$. More specifically, while controlling the position of measurement plate 30 (wafer stage WST) in the optical axis direction of projection optical system PL (the Z position) using surface position information measured by Z heads 72a to 72d as a reference, main controller 20 measures an aerial image of a measurement mark formed on reticle R or on a mark plate (not shown) on reticle stage RST by a Z direction scanning measurement whose details are disclosed in, for example, the pamphlet of International Publication No. 2005/124834 (and the corresponding U.S. Patent Application Publication No. 2008/030715) and the like, using aerial image measuring device 45, and based on the measurement results, measures the best focus position of projection optical system PL. During the Z direction scanning measurement described above, main controller 20 takes in measurement values of a pair of Z heads $74_3$ and $76_3$ which measure the surface position information at end portions on one side and the other side of wafer table WTB in the X-axis direction, in synchronization with taking in output signals from aerial image measuring device 45. Then, main controller 20 stores the values of Z heads $74_3$ and $76_3$ corresponding to the best focus position of projection optical system PL in memory (not shown). Incidentally, the reason why the position (Z position) related to the optical axis direction of projection optical system PL of measurement plate 30 (wafer stage WST) is controlled using the surface position information measured in the latter process of the focus calibration by Z heads 72a to 72d is because the latter process of the focus calibration is performed during the focus mapping previously described.

Further, main controller 20 performs the latter process of Pri-BCHK as follows, around the time of the latter process of focus calibration described above. More specifically, main controller 20 measures a projection image (aerial image) of a pair of measurement marks on reticle R projected by projection optical system PL, respectively, using aerial image measuring device 45, in a method similar to the one disclosed in, for example, U.S. Patent Application Publication No. 2002/0041377 and the like, by an aerial image measurement operation of the slit scan method using a pair of aerial image measurement slit patterns SL, and the measurement results (aerial image intensity according to the XY position of wafer table WTB) are stored in memory. On this latter process of Pri-BCHK, the position of wafer table WTB in the XY plane is controlled based on X head $66_4$ (encoder 70D) which faces X scale $39X_2$, and two Y heads $67_3$ and $68_2$ (encoders $70E_1$ and $70F_1$) (or Y heads $65_j$ and $64_i$ (encoders 70A and 70C)) that face Y scales $39Y_1$ and $39Y_2$.

Then, based on the results of the former process of Pri-BCHK and the results of the latter process of the Pri-BCHK described above, main controller 20 computes the baseline of primary alignment system AL1. With such operation, main controller 20 obtains the offset at the representative detection point of the multipoint AF system (90a, 90b) based on the results of the former process and the latter process of focus calibration previously described, and stores the offset in an internal memory. And, on reading mapping information obtained from the results of focus mapping at the time of exposure, main controller 20 is to add the offset to the mapping information.

Incidentally, in the state of FIG. 21, the focus mapping is being continued.

Figure 22:
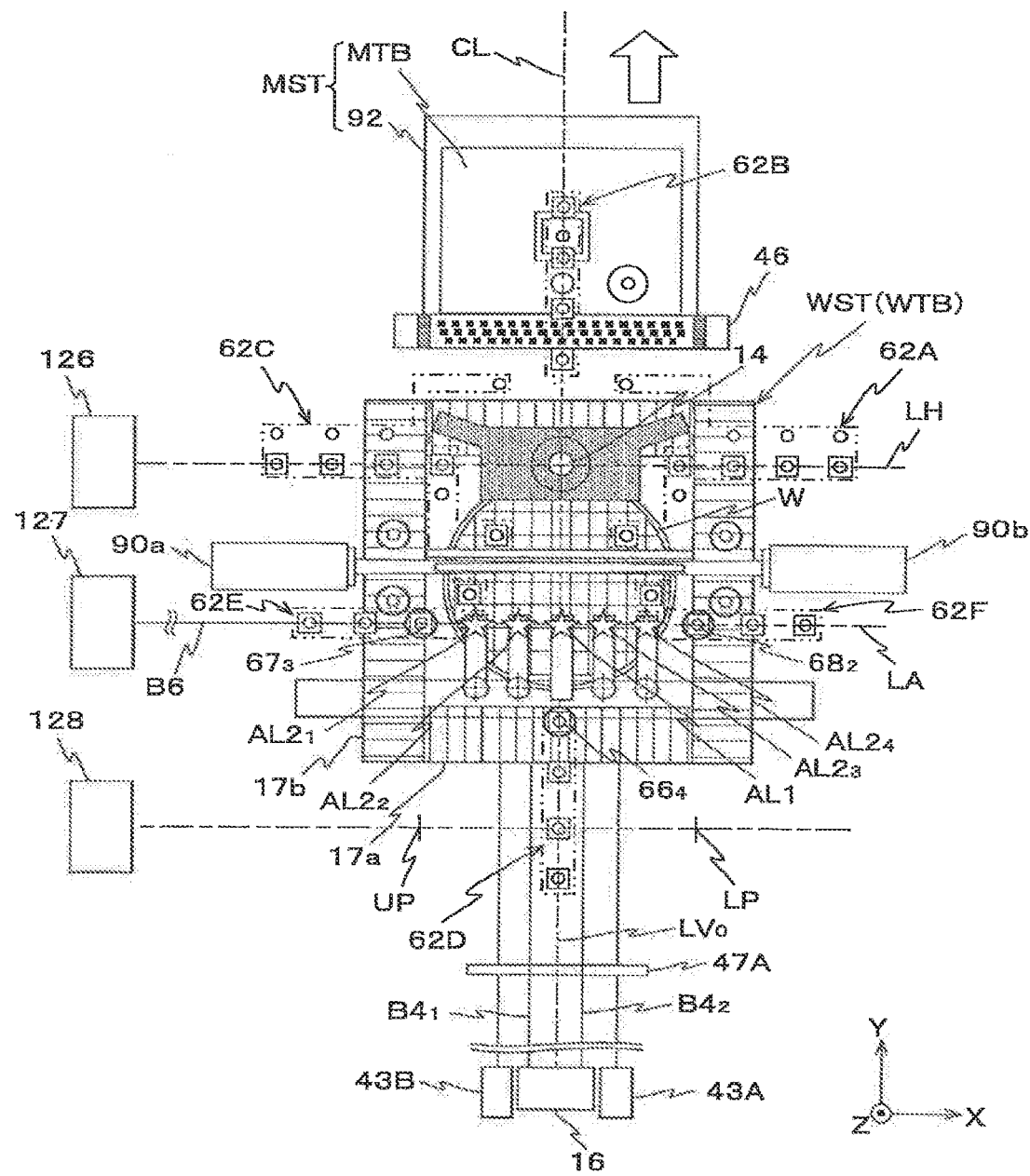
FIG. 22 is a view that shows a state of the wafer stage and the measurement stage when alignment marks arranged in five third alignment shot areas are being simultaneously detected using alignment systems AL1 and AL2$_1$ to AL2$_4$.

When wafer stage WST reaches the position shown in FIG. 22 by movement in the +Y direction of both stages WST and MST in the contact state (or proximity state) described above, main controller 20 stops wafer stage WST at that position, while making measurement stage MST continue the movement in the +Y direction. Then, main controller 20 detects the alignment mark arranged in the five second alignment shot areas substantially at the same time as well as individually (refer to the star-shaped marks in FIG. 22), using the five alignment systems AL1, and $AL2_1$ to $AL2_4$, and makes a link between the detection results of the five alignment systems AL1, and $AL2_1$ to $AL2_4$ and the measurement values of the three encoders at the time of the detection, and then stores them in the internal memory. Also at this point in time, the focus mapping is being continued.

Meanwhile, after a predetermined period of time from the suspension of wafer stage WST described above, measurement stage MST and wafer stage WST move from the contact state (or proximity state) into a separation state. After moving into the separation state, main controller 20 stops the movement of measurement stage MST when measurement stage MST reaches an exposure start waiting position where measurement stage MST waits until exposure is started.

Next, main controller 20 starts the movement of wafer stage WST in the +Y direction toward a position where the alignment mark arranged in the three fourth alignment shots are detected. At this point in time, the focus mapping is being continued. Meanwhile, measurement stage MST is waiting at the exposure start waiting position described above.

Figure 23:
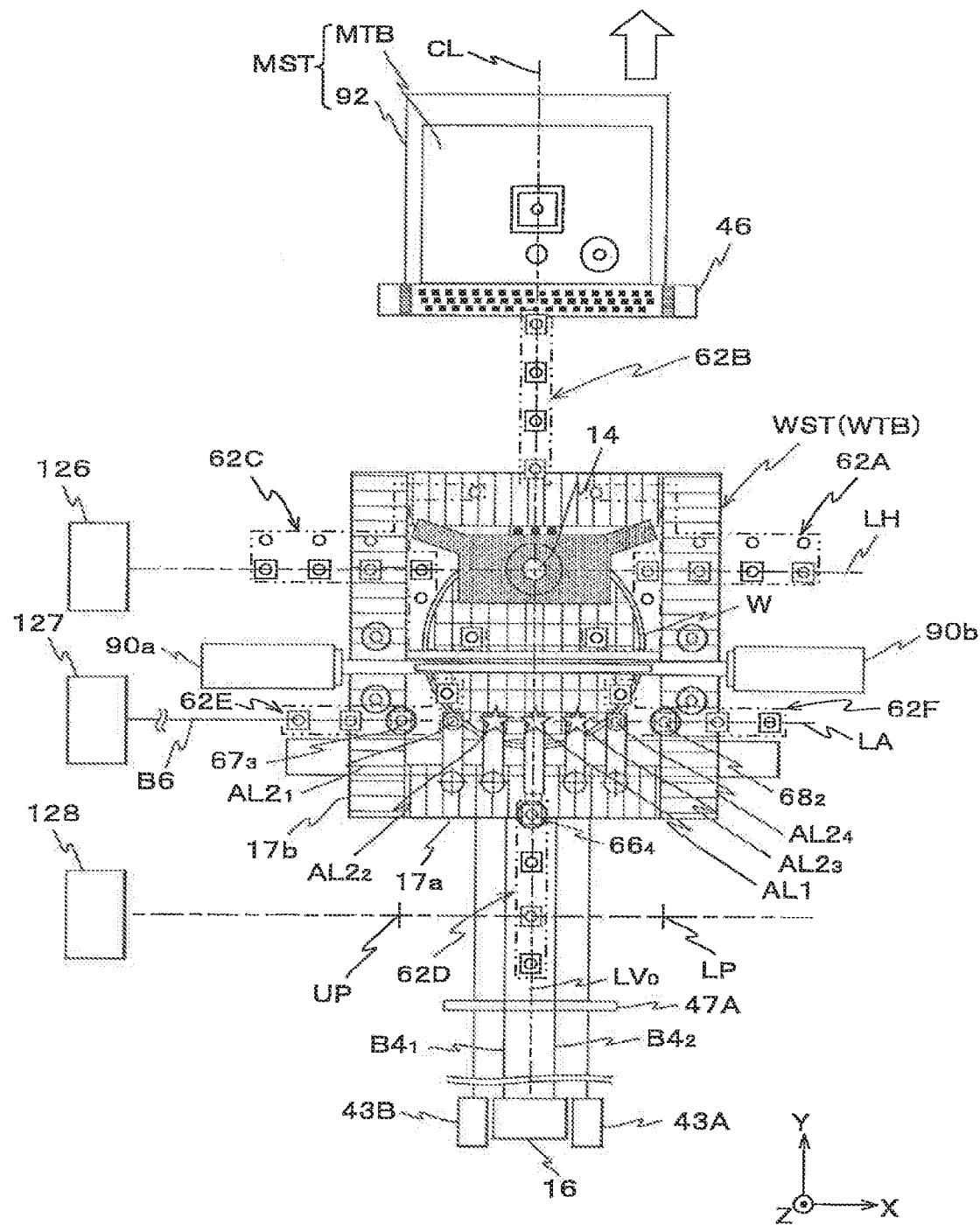
FIG. 23 is a view that shows a state of the wafer stage and the measurement stage when alignment marks arranged in three fourth alignment shot areas are being simultaneously detected using alignment systems AL1, AL2$_2$ and AL2$_3$.
Figure 25D:
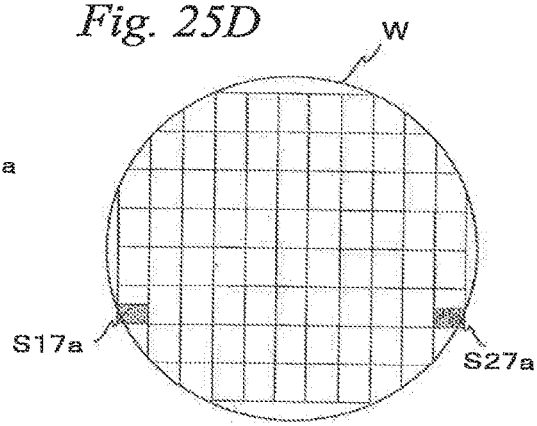
Figure 25E:
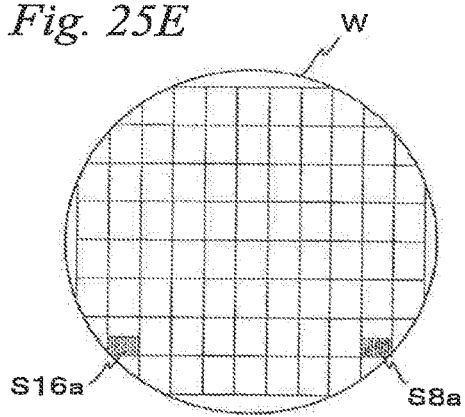

Then, after completing the focus calibration previously described, until both stages WST and MST reach the position shown in FIG. 23 after beginning the movement in the +Y direction, main controller 20 sequentially exposes periphery edge exposure areas S17a and S27a, and S8a and S16a, as shown in FIGS. 25D and 25E, by individually controlling the ON/OFF of each micromirror $M_{ij}$ that constitute the two variable shaped masks VM1 and VM2 of periphery edge exposure unit 51 according to the Y position of wafer stage WST measured by Y linear encoders $70E_1$ and $70F_1$. In this case as well, main controller 20 can perform overall exposure of each periphery edge exposure area using periphery edge exposure unit 51, or a predetermined pattern can be formed.

Then, when wafer stage WST reaches the position shown in FIG. 23, main controller 20 immediately stops wafer stage WST, and almost simultaneously and individually detects the alignment marks arranged in the three fourth alignment shot areas on wafer W (refer to star-shaped marks in FIG. 23) using primary alignment system AL1 and secondary alignment systems $AL2_2$ and $AL2_3$, links the detection results of three alignment systems AL1, $AL2_2$ and $AL2_3$ and the measurement values of the three encoders out of the four encoders at the time of the detection, and stores them in memory (not shown). Also at this point in time, the focus mapping is being continued, and measurement stage MST is still waiting at the exposure start waiting position. Then, main controller 20 computes an array information (coordinate values) of all the shot areas on wafer W on a coordinate system which is set by the measurement axes of the four encoders $70E_1$, $70E_2$, 70B, and 70D described above of the encoder system, by performing a statistical computation, which is disclosed in, for example, Kokai (Japanese Unexamined Patent Application Publication) No. 61-044429 and the like, using the detection results of a total of 16 alignment marks which have been obtained in the manner described above and the corresponding measurement values of the encoders.

Figure 25F:
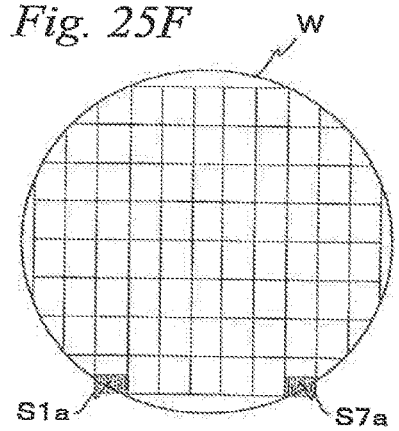
Figure 26:
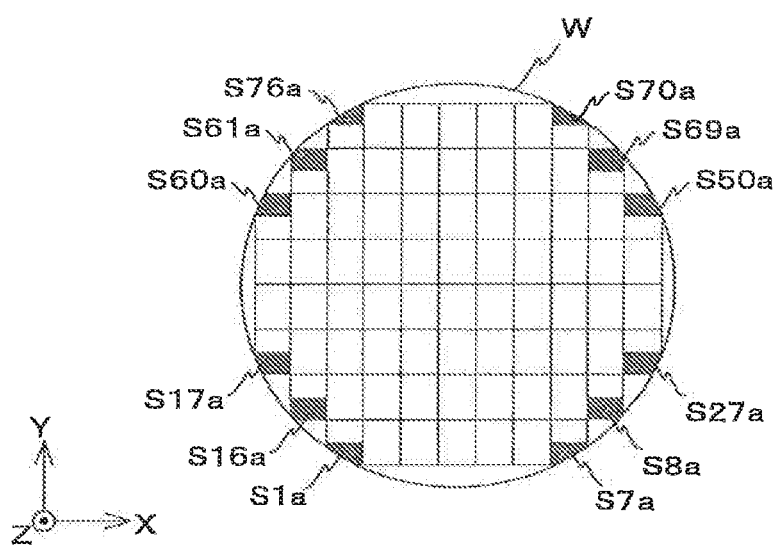
FIG. 26 is a view that shows all the areas exposed by periphery edge exposure.

Next, main controller 20 continues the focus mapping while moving wafer stage WST in the +Y direction again. During the movement of wafer stage WST in the +Y direction, main controller 20 sequentially exposes periphery edge exposure areas S1a and S7a, as shown in FIG. 25F, by individually controlling the ON/OFF of each micromirror $M_{ij}$ that constitute the two variable shaped masks VM1 and VM2 of periphery edge exposure unit 51 according to the Y position of wafer stage WST measured by Y linear encoders $70E_1$ and $70F_1$. In this case as well, main controller 20 can perform overall exposure of each periphery edge exposure area using periphery edge exposure unit 51, or a predetermined pattern can be formed. This completes the periphery edge exposure of wafer W, and as shown in FIG. 26, periphery edge exposure areas S1a, S7a, S8a, S16a, S17a, S27a, S50a, S60a, S61a, S69a, S70a, and S76a each become an area that has undergone exposure.

Figure 24:
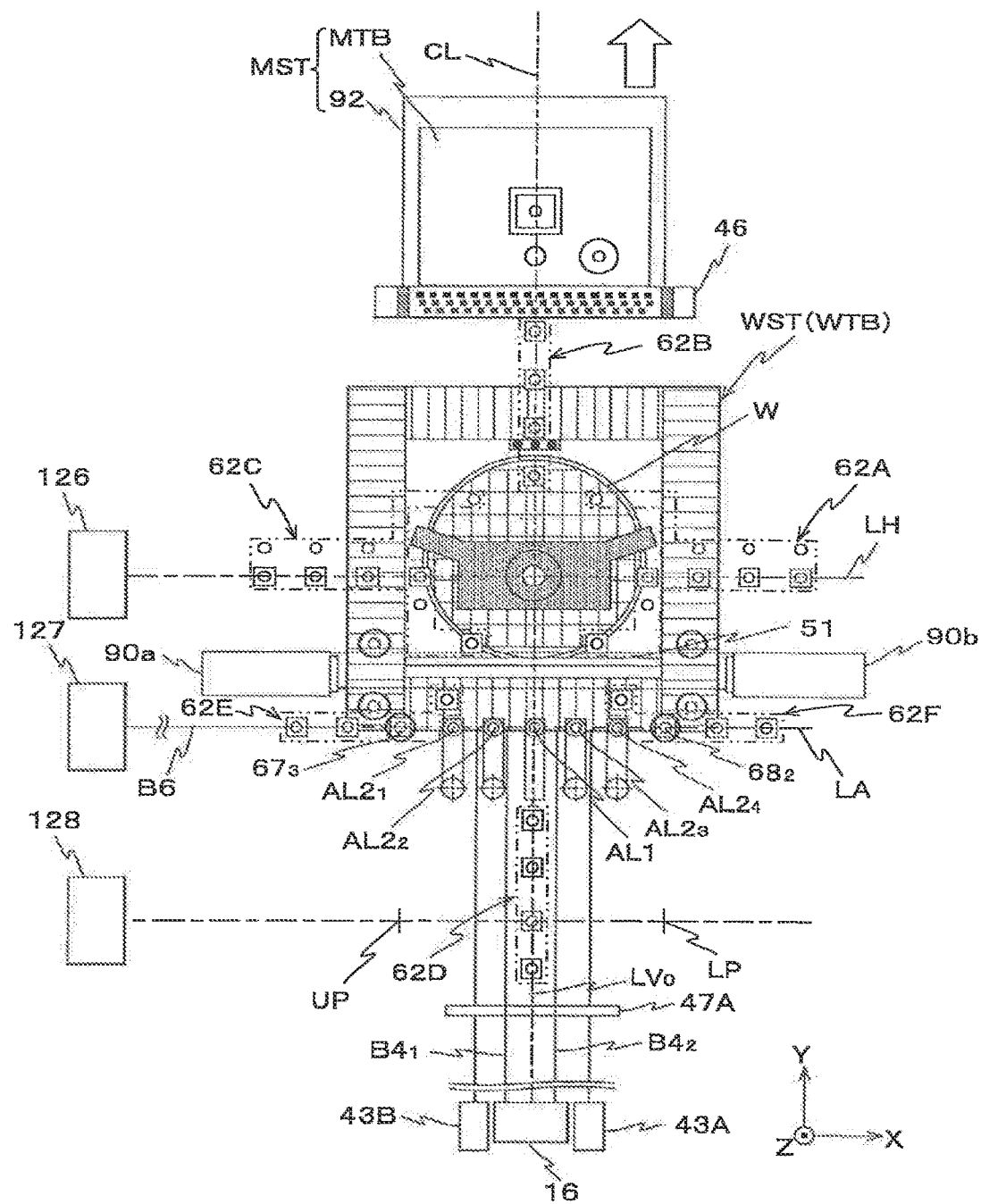
FIG. 24 is a view that shows a state of the wafer stage and the measurement stage when the focus mapping has ended.

Then, when wafer stage WST moves further in the +Y direction, and the detection beam from the multipoint AF system (90a, 90b) moves off of the wafer W surface as shown in FIG. 24, main controller 20 ends the focus mapping.

After the focus mapping has been completed, main controller 20 moves wafer stage WST to a scanning starting position (exposure starting position) for exposure of the first shot on wafer W, and during the movement, main controller 20 switches the Z heads used for control of the Z position and the θy rotation of wafer stage WST from Z heads 72a to 72d to Z heads $74_i$ and $74_j$ while maintaining the Z position, the θy rotation, and the θx rotation of wafer stage WST. Then, immediately after this switching, based on the results of the wafer alignment (EGA) previously described and the latest baselines and the like of the five alignment systems AL1 and $AL2_1$ to $AL2_4$, main controller 20 performs exposure by a step-and-scan method in a liquid immersion exposure, and sequentially transfers a reticle pattern to a plurality of shot areas on wafer W. Hereinafter, a similar operation is executed repeatedly.

As discussed in detail above, according to exposure apparatus 100 of the embodiment, while wafer stage WST moves linearly in the Y-axis direction, surface position information of the wafer W surface is detected by multipoint AF system (90a, 90b) whose plurality of detection points is set in the X-axis direction at a predetermined interval, and alignment marks having different positions on wafer W are detected by a plurality of alignment systems AL1, and $AL2_1$ to $AL2_4$ whose detection area is arranged in a line along the X-axis direction, and furthermore, periphery edge exposure of wafer W is performed by periphery edge exposure unit 51. More specifically, by wafer stage WST (wafer W) linearly passing the plurality of detection points (detection area AF) of the multipoint AF system (90a, 90b), the detection area of the plurality of alignment systems AL1, and $AL2_1$ to $AL2_4$, and below periphery edge exposure unit 51, three operations which are detection of surface position information of substantially the entire surface of wafer W, detection of all the alignment marks (for example, alignment marks in the alignment area on EGA) which should be detected on wafer W, and periphery edge exposure of wafer W are completed. Therefore, throughput can be improved remarkably when compared with the case when detection operation of the alignment marks, detection operation of the surface position information (focus information) and periphery edge exposure operation are performed independently (separately). More specifically, because it is possible to make the time required for periphery edge exposure operation approximately overlap the wafer alignment operating time, the periphery edge exposure operation hardly decreases the throughput.

Further, according to the embodiment, positional information of wafer table WTB in the XY plane is measured with high precision without being affected by air fluctuation and the like by encoder system 150 which includes encoders 70A to 70F whose short-term stability of measurement is good, and positional information of wafer table WTB in the Z-axis direction orthogonal to the XY plane is also measured with high precision without being affected by air fluctuation and the like by surface position measurement system 180 which includes Z heads 72a to 72d, 74$_1$ to 74$_5$, 75$_1$ to 76$_5$ and the like. In this case, because both encoder system 150 and surface position measurement system 180 measure the wafer table WTB upper surface directly, a simple and direct position control of wafer table WTB, or consequently, wafer W becomes possible.

Further, according to the embodiment, on the focus mapping previously described, main controller 20 simultaneously activates surface position measurement system. 180 and multipoint AF system (90a, 90b), and the detection results of multipoint AF system (90a, 90b) are converted into data which uses the measurement results of surface position measurement system 180 as a reference. Accordingly, by acquiring this conversion data in advance, surface position control of wafer W becomes possible by measuring only positional information of wafer table WTB in the Z-axis direction and positional information in a tilt direction with respect to the XY plane using surface position measurement system 180, without acquiring surface position information of wafer W. Accordingly, in the embodiment, although the working distance between tip lens 191 and wafer W surface is narrow, focus leveling control of wafer W on exposure can be performed with good precision, without any trouble.

Further, according to the embodiment, as described above, because wafer table WTB, or consequently, the surface position of wafer W can be controlled with high precision, exposure with high precision with hardly any exposure defect due to surface position control error becomes possible, which makes it possible to form an image of a pattern on wafer W without the image being blurred due to defocus.

Further, according to the embodiment, the placement distance in the X-axis direction of the plurality of Y heads 64 and 65 whose measurement direction is in the Y-axis direction is shorter than the width of Y scales 39Y$_1$ and 39Y$_2$ in the X-axis direction, and the placement distance in the Y-axis direction of the plurality of Y heads 66 whose measurement direction is in the X-axis direction is shorter than the width of X scales 39X$_1$ and 39X$_2$ in the Y-axis direction. Therefore, on moving wafer table WTB (wafer stage WST), the Y position of wafer table WTB (wafer stage WST) can be measured, based on the measurement values of Y linear encoder 70A or 70C which irradiates a detection light (beam) on Y scale 39Y$_1$ or 39Y$_2$ while sequentially switching the plurality of Y heads 64 and 65, and concurrently, the X position of wafer table WTB (wafer stage WST) can be measured, based on the measurement values of X linear encoder 70B or 70D which irradiates a detection light (beam) on X scale 39X$_1$ or 39X$_2$ while sequentially switching the plurality of X heads 66.

Further, in the embodiment above, while the example has been described in which the alignment systems (AL1, and AL2$_1$ to AL2$_4$) multipoint AF system 90, and periphery edge exposure unit 51 were placed away from the exposure position (the position below projection unit PU where liquid immersion area 14 is formed) where exposure of wafer W is performed in the Y-axis direction, the present invention is not limited to this. For example, one of the alignment systems (AL1, and AL2$_1$ to AL2$_4$) and multipoint AF system 90 does not have to be placed at the position described above. Even in such a case, the periphery edge exposure of the wafer can be performed concurrently while moving wafer stage WST in the Y-axis direction toward the exposure position, due to the measurement of the wafer by the other measurement device. Accordingly, because it is possible to make the time required for periphery edge exposure operation overlap the time for other operations, the throughput can be improved.

Or both the alignment systems (AL1, and AL2$_1$ to AL2$_4$) and multipoint AF system 90 do not have to be placed at the position described above. However, in this case, a measurement device which performs some kind of measurement on the wafer should be placed at a position similar to the alignment systems (AL1, and AL2$_1$ to AL$_4$) and the multipoint AF system (90a, 90b).

Incidentally, in the embodiment above, the case has been described where the pair of Y scales 39Y$_1$ and 39Y$_2$ used for measuring the position of wafer stage WST in the Y-axis direction while the pair of X scales 39X$_1$ and 39X$_2$ used for measuring the position in the X-axis direction are arranged, and corresponding to this, the pair of head units 62A and 62C are placed on one side and the other side of projection optical system PL in the X-axis direction, while two head units 62B and 62D are placed on one side and the other side of projection optical system PL in the Y-axis direction. However, the present invention is not limited to this, and of the Y scales 39Y$_1$ and 39Y$_2$ used to measure the position in the Y-axis direction and X scales 39X$_1$ and 39X$_2$ used to measure the position in the X-axis direction, at least one of the Y and X scales does not have to be a pair and can have only one scale arranged on wafer table WTB, or of the pair of head units 62A and 62C and two head units 62B and 62D, at least one of the two group of heads can have only one head arranged. Further, the extending direction of the scale and the extending direction of the head unit are not limited to orthogonal direction such as the X-axis direction and the Y-axis direction of the embodiment, and can be directions that intersect each other.

Further, in the embodiment above, while head units 62A to 62D had a plurality of heads placed at predetermined distance, a single head can also be employed, equipped with a light source which emits a light beam that extends narrowly in the pitch direction of the Y scale or the X scale and multiple light receiving elements arranged without a gap in the pitch direction of the Y scale or the X scale that receive the reflected light (diffraction light) from the Y scale or the X scale (diffraction grating) of the light beam.

Incidentally, in the embodiment above, while the case has been described where the present invention was applied to an exposure apparatus equipped with all sections such as wafer stage WST, measurement stage MST, alignment systems (AL1, and AL2$_1$ to AL2$_4$), multipoint AF system (90a, 90b), Z sensor, interferometer system 118, the encoder system (70A to 70F) and the like, the present invention is not limited to this. For example, the present invention can also be applied to an exposure apparatus which does not have measurement stage MST arranged. The present invention can be applied, as long as the exposure apparatus is equipped with a wafer stage (movable body) and some of the components besides the wafer stage. More specifically, the present invention can be applied as long as a measurement device, which can perform some kind of a measurement on the wafer, is arranged at a position similar to the alignment systems (AL1, and AL2$_1$ to AL$_4$) and multipoint AF system (90a, 90b) described above, away from the exposure position where exposure of wafer W is performed.

Incidentally, in the embodiment above, while the example has been described where periphery edge exposure unit 51 was placed on the projection unit PU side of alignment systems (AL1, and AL2$_1$ to AL$_4$) (and multipoint AF system (90*a*, 90*b*)), as well as this, the periphery edge exposure unit can be placed at the unloading position UP and loading position LP side of alignment systems (AL1, and AL2₁ to AL2₄) (and multipoint AF system (90*a*, 90*b*)).

Further, in the embodiment above, while the example has been described where the periphery edge exposure of wafer W was performed while wafer stage WST was proceeding from loading position LP to the exposure position (projection unit PU), as well as this, the periphery edge exposure can be performed while wafer stage WST is returning from the exposure position. (projection unit PU) to unloading position UP, or the periphery edge exposure of one wafer can be performed on both the proceeding and returning path.

Further, in the embodiment above, while the example has been described where periphery edge exposure unit 51 which can irradiate two irradiation areas for periphery edge exposure spaced apart in the X-axis direction is used, however, the configuration of the periphery edge exposure unit is not limited to this. However, it is desirable that the periphery edge exposure unit has a plurality of irradiation areas whose position at least in the X-axis direction is variable, as in periphery edge exposure unit 51 described above.

Further, in the embodiment above, the case has been described where by wafer stage WST (wafer W) linearly passing the plurality of detection points (detection area AF) of the multipoint AF system (90*a*, 90*b*), the detection area of the plurality of alignment systems AL1, and AL2₁ to AL2₄, and below periphery edge exposure unit 51, three operations which are detection of surface position information of substantially the entire surface of wafer W, detection of all the alignment marks which should be detected on wafer W, and periphery edge exposure of wafer W are completed. However, as well as this, at least a part of the periphery edge exposure operation can be performed in parallel with the movement of wafer stage WST (wafer W) from the loading position to the exposure position. In this case, when at least a part of the measurement operation (including mark detection and the like) is performed in parallel furthermore, the throughput can be further improved. More specifically, other issues are not essential as long as at least a part of the periphery edge exposure operation is performed during the movement of wafer stage WST (wafer W) from the loading position to the exposure position.

Further, in the embodiment above, while the case has been described where measurement system 200 includes both of interferometer system 118 and encoder system 150, as well as this, the measurement system can include only one of interferometer system 118 and encoder system 150.

A Second Embodiment

Next, a second embodiment of the present invention will he described, referring to FIGS. 27 to 39.

Figure 27:
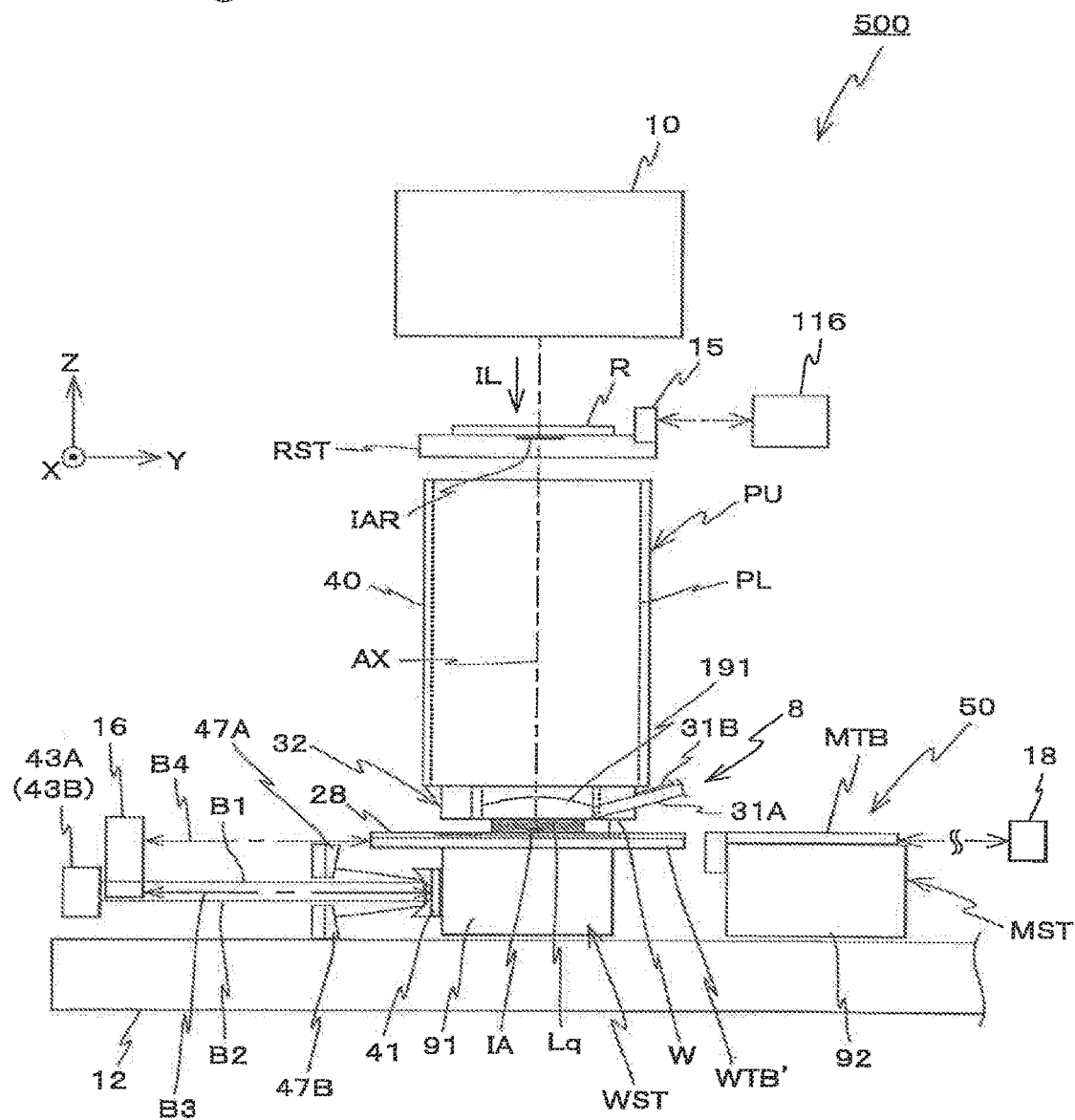
FIG. 27 is a view that schematically shows a configuration of an exposure apparatus related to a second embodiment.

FIG. 27 schematically shows a configuration of an exposure apparatus 500 in the second embodiment. Exposure apparatus 500 is a projection exposure apparatus by the step-and-scan method, or a so-called scanner.

Exposure apparatus 500 is equipped with an illumination system 10, a reticle stage RST, a projection unit PU, a stage device 50 having a wafer stage WST and a measurement stage MST, and a control system of these parts and the like. In FIG. 27, a wafer W is mounted on wafer stage WST. When compared with exposure apparatus 100 of the first embodiment, exposure apparatus 500 is configured similar to exposure apparatus 100 of the first embodiment except for the point that instead of wafer table WTB previously described, a wafer table WTB' is used, and the configuration of encoder system 150 is different. Hereinafter, the description will be made referring mainly to the differences, and the same reference numerals will be used for the same or similar sections as in the first embodiment previously described, and the description thereabout will be brief or omitted. Further, in order to simplify the description, explanation on the configuration and the like related to periphery edge exposure of wafer W and focus leveling control will be omitted.

Figure 32:
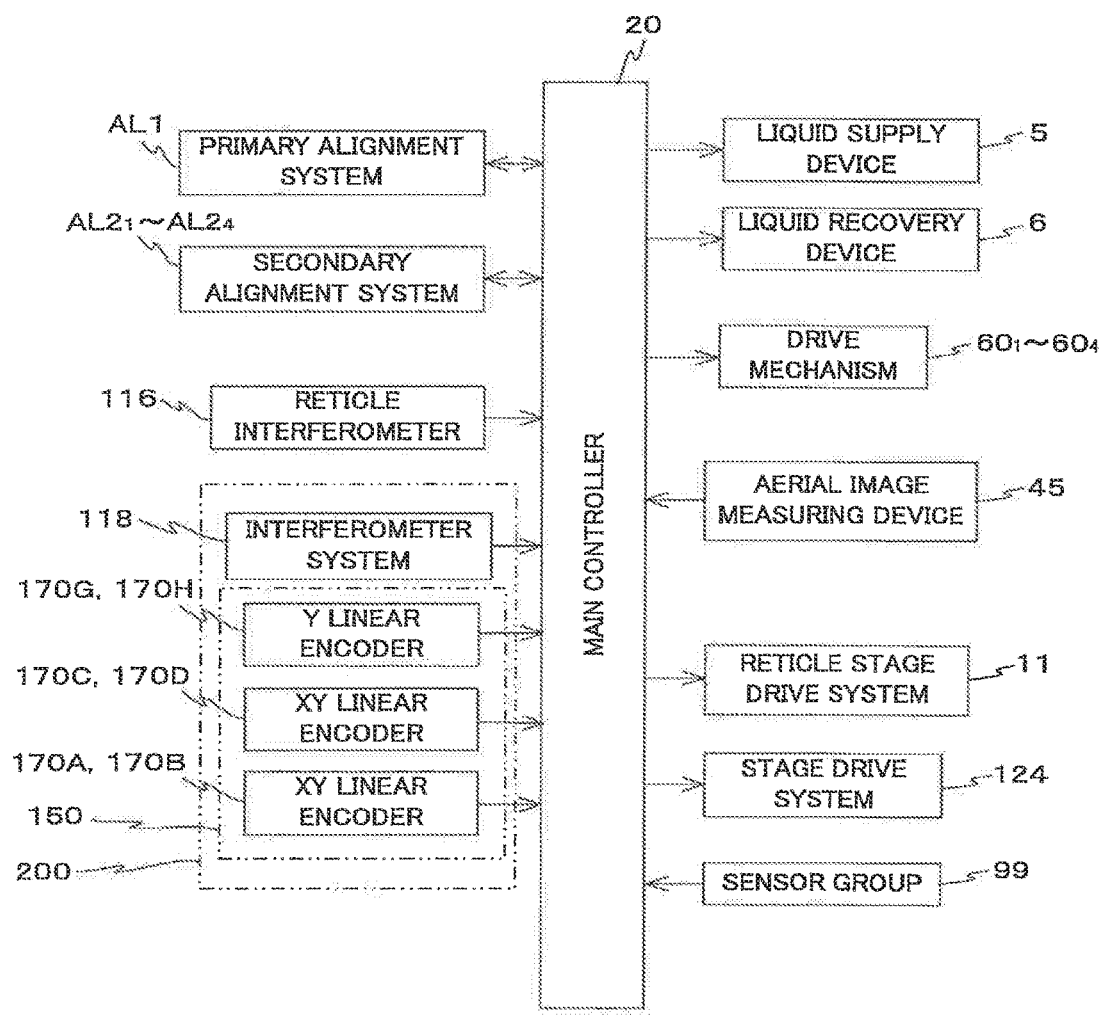
FIG. 32 is a block diagram that shows a main configuration of a control system of an exposure apparatus related to a second embodiment.

Similar to the first embodiment previously described, stage device 50 is equipped with wafer stage WST and measurement stage MST placed on base board 12, as shown in FIG. 27. Stage device 50, furthermore, is equipped with a measurement system 200 which measures positional information of both stages WST and MST, a stage drive system 124 and the like (neither are shown in FIG. 27, refer to FIG. 32) which drives and both stages WST and MST. Measurement system 200 includes an interferometer system 118 and an encoder system 150, as shown in FIG. 32.

Wafer stage WST includes a stage main section 91, and a wafer table WTB' that is mounted on stage main section 91. Wafer table WTB' and stage main section 91 are configured drivable in directions of six degrees of freedom (X, Y, Z, θx, θy, and θz) with respect to base board 12 by a drive system, including a linear motor and a Z leveling mechanism (including a voice coil motor and the like).

Figure 28:
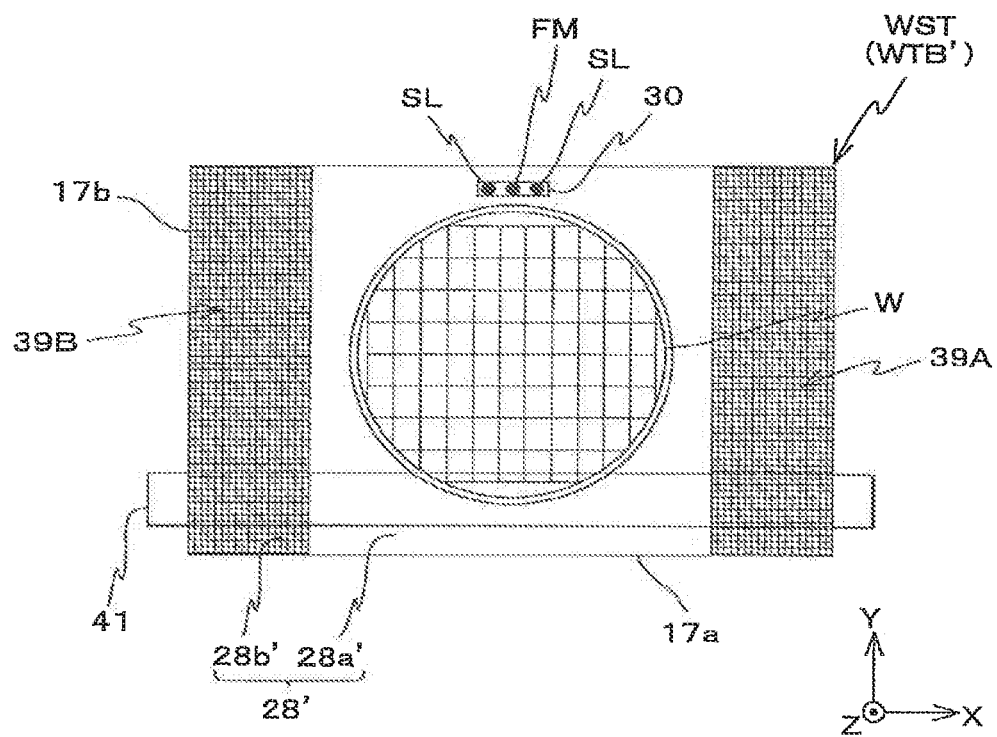
FIG. 28 is a planar view that shows a wafer stage.

In the center of the upper surface of wafer table WTB', a wafer holder (not shown) is arranged which holds wafer W by vacuum suction or the like. On the outer side of the wafer holder (mounting area of the wafer), as shown in FIG. 28, a plate (a liquid repellent plate) 28' is arranged that has a circular opening one size larger than the wafer holder formed in the center, and also has a rectangular outer shape (contour). A liquid repellent treatment against liquid Lq is applied to the surface of plate 28'. Incidentally, plate 28' is installed so that its entire surface, or a part of its surface, becomes flush with the surface of wafer W.

Plate 28' is located in the center of the X-axis direction of wafer table WTB, and has a first liquid repellent area 28*a*' having a rectangular outer shape (contour) with the circular opening described above formed in the center, and a rectangular pair of second liquid repellent areas 28*b*' positioned on the +X side end and −X side end of wafer table WTB in the X-axis direction with the first liquid repellent area 28*a*' in between. Incidentally, in the second embodiment, because water will be used as liquid Lq, hereinafter the first liquid repellent area 28*a*' and the second liquid repellent area 28*b*' will also referred to as a first water repellent plate 28*a*' and a second water repellent plate 28*b*'.

Near the end on the +Y side of the first water repellent plate 28*a*', a fiducial mark FM, and a measurement plate 30 on which a pair of aerial image measurement slit patterns (slit-shaped measurement patterns) are formed, is arranged. In correspondence with each aerial image measurement slit pattern SL, a light-transmitting system (not shown) is arranged, which guides illumination light IL passing through the slit patterns outside wafer stage WST, or to be more specific, to the photodetection system (not shown) previously described arranged in measurement table MTB (and stage main section 92). More specifically, also in the embodiment, an aerial image measuring unit 45 (refer to FIG. 32) is configured in a state where wafer stage WST and measurement stage MST are in proximity within a predetermined distance in the Y-axis direction (including a contact state), and illumination lights IL that has been transmitted through each aerial image measurement slit pattern SL of measurement plate 30 on wafer stage WST are guided by each light-transmitting system (not shown) and are received by light-receiving elements of each photodetection system (not shown) within measurement stage MST.

On the pair of second water repellent plates 28b', moving scales for an encoder system (to be described later) are formed. To enter the details, on the second pair of water repellent plates 28b', moving scales 39A and 39B are formed, respectively. Moving scales 39A and 39B are each configured of a reflection type two-dimensional diffraction grating, which is, for example, a diffraction grating having a periodic direction in the Y-axis direction and a diffraction grating having a periodic direction in the X-axis direction combined. The pitch of the grid lines of the two-dimensional diffraction gratings is set, for example, to 1 µm, for both the Y-axis direction and the X-axis direction. Incidentally, in FIG. 28, the pitch of the gratings is illustrated larger than the actual pitch for the sake of convenience. The same is true also in other drawings.

Incidentally, also in this case, in order to protect the diffraction grating, it is also effective to cover the grating, for example, with a glass plate with low thermal expansion that has water repellency, as previously described.

Incidentally, near the edge of the movable scales of each of the second water repellent plates 28b', a pattern for positioning (not shown) configured as is previously described for deciding the relative position between an encoder head and a movable scale (to be described later) is arranged.

Figure 29:
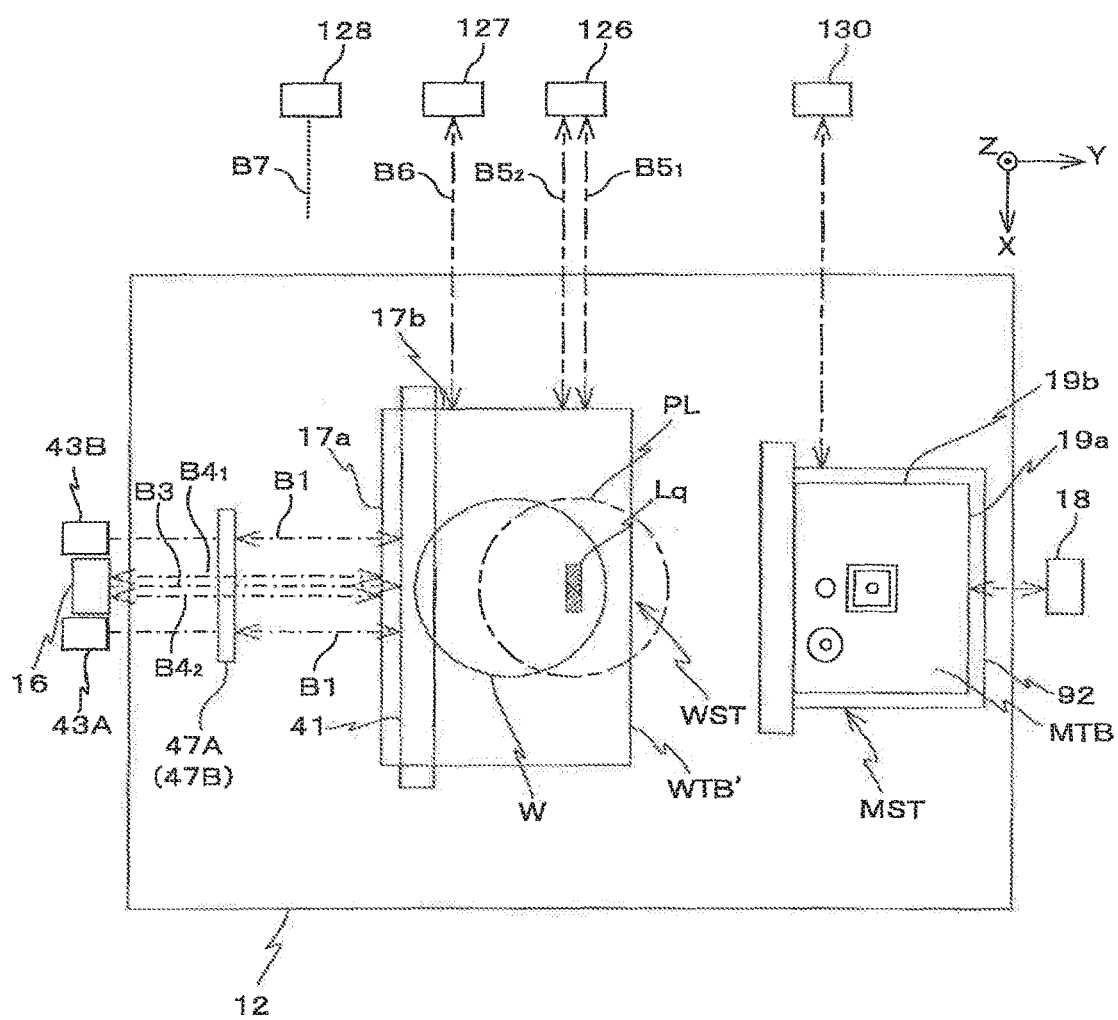

As shown in FIG. 28, on the −Y end surface and the −X end surface of wafer table WTB', a reflection surface 17a and a reflection surface 17b are formed. As shown in FIG. 29, Y interferometer 16 and the three X interferometers 126 to 128 of interferometer system 118 (refer to FIG. 32) irradiate interferometer beams (measurement beams) $B4_1$, $B4_2$, $B5_1$, $B5_2$, B6, and B7 and the like on reflection surfaces 17a and 17b, respectively. And Y interferometer 16 and the three X interferometers 126 to 128 each receive the reflected lights, and measure the positional information of wafer stage WST in the XY plane, and supply the positional information which has been measured to main controller 20. In the second embodiment as well, in addition to the X, Y positions of wafer table WTB' (wafer stage WST), main controller 20 can also compute rotation information (that is, pitching amount) in the θx direction, rotation information (that is, rolling amount) in the θy direction, and rotation information (that is, yawing amount) in the θz direction, based on the measurement results of Y interferometer 16 and X interferometers 126 or 127.

Further, as shown in FIG. 27, movable mirror 41 having a concave-shaped reflection surface is attached to the side surface on the −Y side of stage main section 91.

The pair of Z interferometers 43A and 43B configuring a part of interferometer system 118 irradiate two measurement beams B1 and B2 on fixed mirrors 47A and 47B via movable mirror 41, respectively, and measure the optical path length of measurement beams B1 and B2 by receiving each of the reflected lights. And from the results, main controller 20 computes the position of wafer stage WST in four degrees of freedom (Y, Z, θy, and θz) directions.

Figure 30:
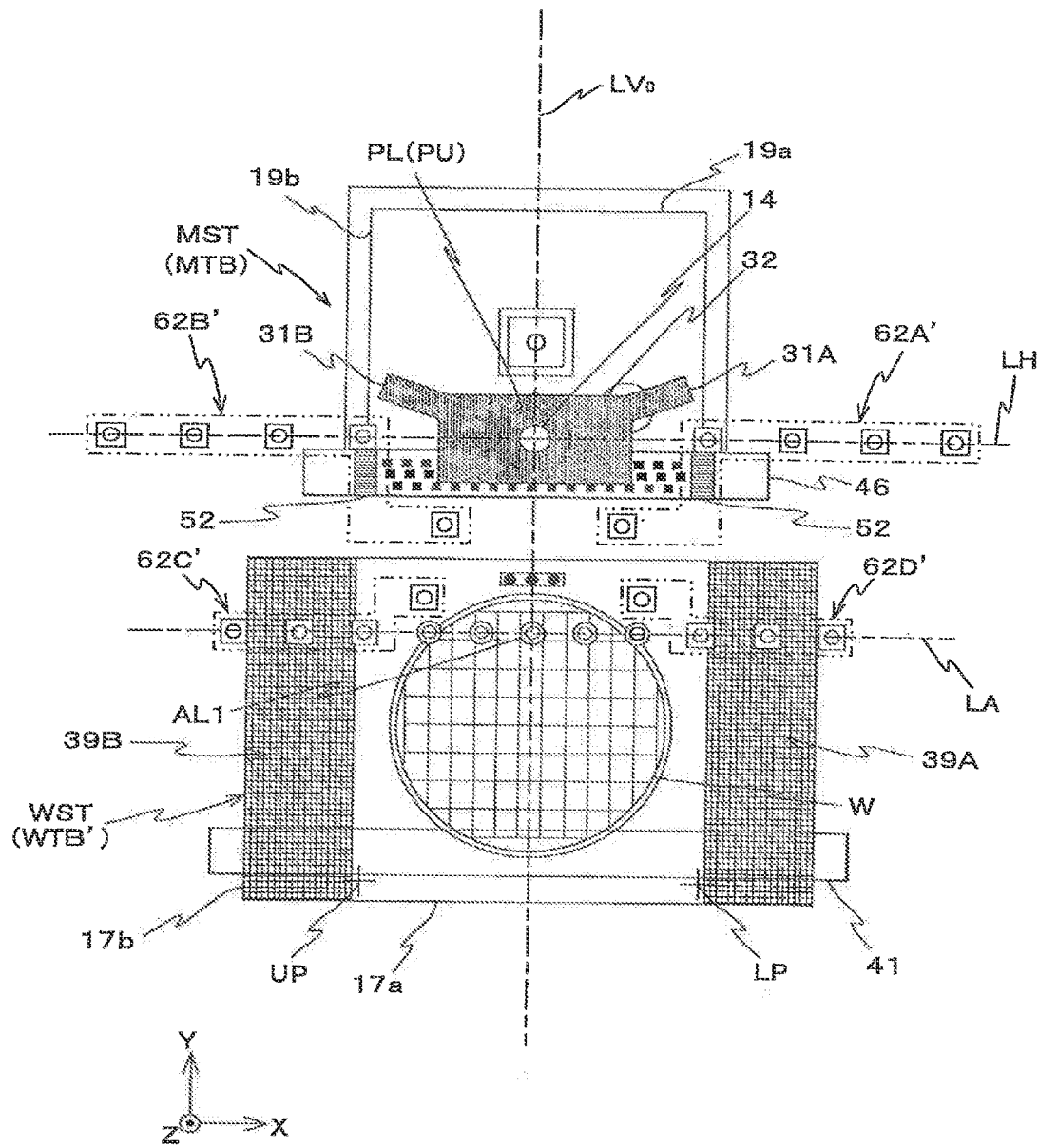

In the second embodiment, position information within the XY plane (including the rotation information in the θz direction) of wafer stage WST (wafer table WTB') is mainly measured by an encoder system (to be described later) (refer to FIG. 32). Interferometer system 118 is used when wafer stage WST is positioned outside the measurement area (for example, near unloading position UP or loading position LP as shown in FIG. 30) of the encoder system. Further, interferometer system 118 is used secondarily such as when correcting (calibrating) a long-term fluctuation (for example, temporal deformation of the scale) of the measurement results of the encoder system, or as backup at the time of output abnormality in the encoder system. As a matter of course, the position of wafer stage WST (wafer table WTB') can be controlled using both interferometer system 118 and the encoder system together.

Incidentally, also in FIG. 32, the drive system of wafer stage WST and the drive system of measurement stage MST are included and are shown as stage drive system 124.

Figure 31:
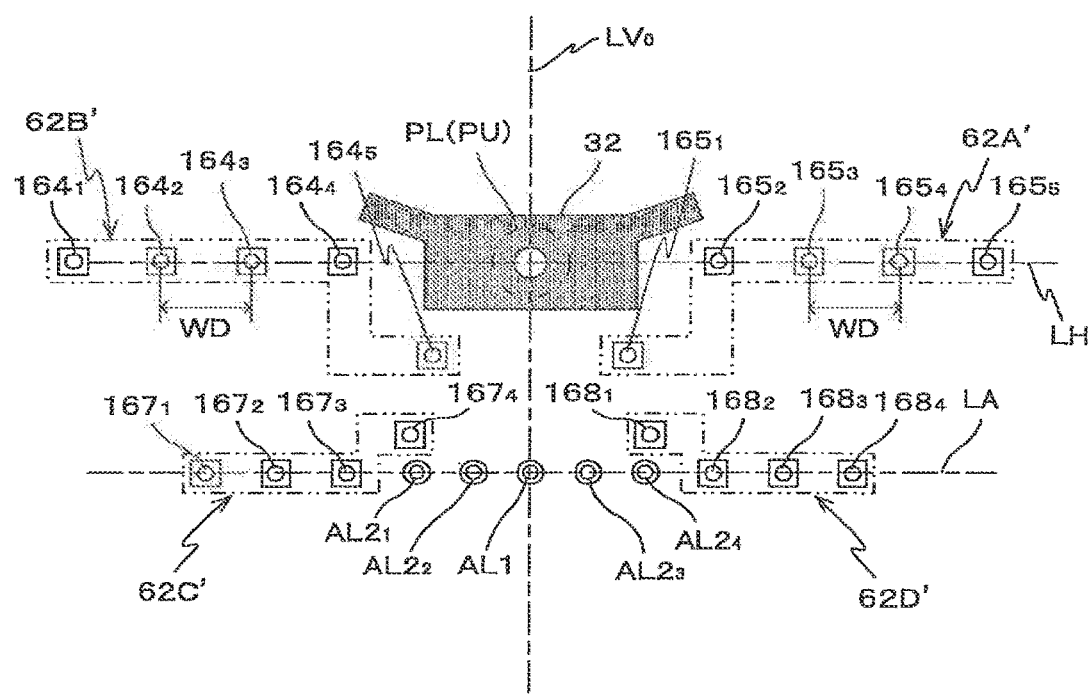
FIG. 31 is a planar view that shows a placement of an encoder head and an alignment system.

In exposure apparatus 500 of the second embodiment, a primary alignment system AL1 having a detection center at a position spaced apart from optical axis AX at a predetermined distance on the −Y side is placed on reference axis $LV_0$ shown in FIGS. 30 and 31. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to reference axis $LV_0$ are severally arranged.

Next, the structure and the like of encoder system 150 (refer to FIG. 32) which measures the positional information of wafer stage WST in the XY plane (including rotation information in the θz direction) will be described.

In exposure apparatus 500, as shown in FIG. 30, a pair of head units 62A' and 62B' is placed on the +X side and −X side of nozzle unit 32. These head units 62A' and 62B' are fixed to the mainframe (not shown) holding projection unit PU in a suspended state, via a support member.

As shown in FIG. 31, head units 62A' and 62B' are each equipped with a plurality of (in this case, four) two-dimensional heads (hereinafter shortly referred to as "heads" or "2D heads") $165_2$ to $165_5$ and $164_1$ to $164_4$ placed on reference axis LH at a distance WD, and heads $165_1$ and $164_5$ placed at positions on the −Y side of nozzle unit 32 a predetermined distance away in the −Y direction from reference axis LH. Incidentally, the distance between heads $165_1$ and $165_2$ and heads $164_4$ and $164_5$ in the X-axis direction is also set to WD. Hereinafter, heads $165_1$ to $165_5$ and heads $164_1$ to 164 will also be described as head 165 and head 164, respectively, as necessary.

Head unit 62A' constitutes a multiple-lens (five-lens, in this case) XY linear encoder (hereinafter appropriately shortened to "XY encoder" or "encoder") 170A (refer to FIG. 32) that measures the position of wafer stage WST (wafer table WTB') in the X-axis direction (the X-position) and the Y-axis direction (the Y-position) using moving scale 39A previously described. Similarly, head unit 62B' constitutes a multiple-lens (five-lens, in this case) XY encoder 170B (refer to FIG. 32) that measures the X-position and Y-position of wafer stage WST (wafer table WTB') using moving scale 39B previously described. In this case, distance WD in the X-axis direction of the five heads 165 and 164 (to be mare accurate, the irradiation points of the measurement beams (encoder beams) generated by heads 165 and 164 on the moving scales) that head units 62A' and 62B' are each equipped with, is set slightly narrower than the width of moving scales 39A and 39B in the x-axis direction. The term width of the moving scale, here, refers to the width of the diffraction grating (or its formation area), or to be more precise, the range where position measurement using the head is possible.

In the second embodiment, furthermore, as shown in FIG. 30, head units 62C' and 62D' are respectively arranged a predetermined distance away on the −Y side of head units 62B' and 62A'. Head units 62C' and 62D' are fixed to the mainframe (not shown) holding projection unit PU in a suspended state, via a support member.

As shown in FIG. 31, head unit 62C' is equipped with three heads $167_1$ to $167_3$ placed on the −X side of the secondary alignment system $AL2_1$ on reference axis LA at substantially the same distance as distance WD, and a head $167_4$ placed on the +Y side of the secondary alignment system $AL2_1$ a predetermined distance away in the +Y direction from reference axis LA. Incidentally, the distance between heads $167_3$ and $167_4$ in the X-axis direction is set slightly narrower than WD.

Head unit 62D' is symmetrical to head unit 62C' with respect to reference axis $LV_0$ previously described, and is equipped with four heads $168_1$ to $168_4$ which are placed in symmetry to four Y heads $167_4$ to $167_1$ with respect to reference axis $LV_0$. Hereinafter, heads $167_1$ to $167_4$ and heads $168_1$ to $168_4$ will also be described as head 167 and head 168, as necessary.

On an alignment operation and the like, at least one head each of heads 167 and 168 faces moving scales 39B and 39A, respectively. That is, of the measurement beams (encoder beams) that heads 167 and 168 emit, at least one measurement beam each constantly irradiates moving scales 39B and 39A. The X position, Y position, and θz rotation of wafer stage WST are measured by heads 167 and 168 (more specifically, XY encoders 170C and 170D configured by heads 161 and 168)

Further, in the embodiment, at the time of baseline measurement and the like of the secondary alignment system, heads $167_3$ and $168_2$ which are adjacent to the secondary alignment systems $AL2_1$ and $AL2_4$ in the X-axis direction face the pair of reference gratings 52 of FD bar 46, respectively, and by heads $167_3$ and $168_2$ that face the pair of reference gratings 52, the Y position of FD bar 46 is measured at the position of each reference grating 52. In the description below, the encoders configured by Y heads $167_3$ and $168_2$ which face the pair of reference gratings 52, respectively, are referred to as Y linear encoders (also shortly referred to "Y encoders" or "encoders" as needed) 170G and 170H (refer to FIG. 32) Incidentally, Y encoders 170G and 170H are described as such, focusing on the point that heads $167_3$ and $168_2$ which configure a part of encoders 170C and 170D function not as 2D heads, but as Y heads by facing the pair of reference gratings 52. In the following description as well, Y encoders 170G and 170H are to exist besides XY encoders 170C and 170D, for the sake of convenience.

Each of the encoders described above supply their measurement values to main controller 20. Main controller 20 controls the position (including rotation (yawing) in the θz direction) within the XY plane of wafer table WTB based on the measurement values of XY encoders 170A and 170B or 170C and 170D, and also controls the rotation of FD bar 46 (measurement stage MST) in the θz direction, based on the measurement values of Y encoders 170G and 170H.

FIG. 32 shows the main configuration of the control system of exposure apparatus 500. The control system is mainly configured of main controller 20 composed of a microcomputer (or workstation) that performs overall control of the entire apparatus.

Figure 33:
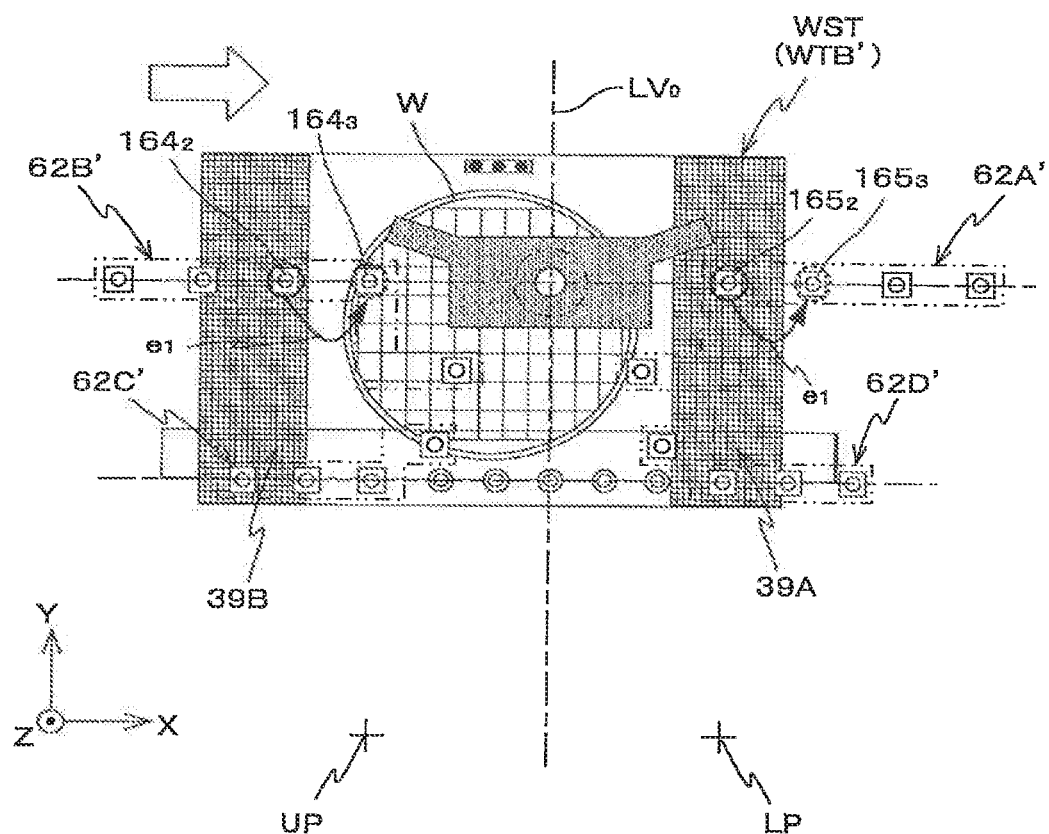
FIG. 33 is a view used to explain a position measurement within an XY plane of the wafer table by a plurality of encoders respectively including a plurality of heads and a switching linkage) of heads.

In exposure apparatus 500 of the second embodiment, because the placement of the moving scales on wafer table WTB' previously described and the placement of the heads previously described were employed, as shown in FIG. 33, in the effective stroke range of wafer stage WST (more specifically, the range where the stage moves for alignment and exposure operation), heads 165 and 164 (head units 62A' and 62B') or heads 168 and 167 (head units 62D' and 62C') face moving scales 39A and 39B, respectively, without fail. Incidentally, in FIG. 33, the heads facing the corresponding moving scale and are used for position measurement are shown circled by a solid line.

To enter the details furthermore, during the exposure operation by the step-and-scan method in which a pattern of reticle R is transferred onto wafer W, main controller 20 uses the measurement values of heads 165 and 164, which are one head each facing removing scales 39A and 39B, respectively, out of the five heads each that heads 165 and 164 of head units 62A' and 62B' have, to control the position and rotation (rotation in the θz direction) of wafer stage WST within the XY plane.

Further, on the wafer alignment, main controller 20 uses the measurement values of heads 168 and 167 (encoders 170D and 170C) of head units 62D' and 62C' each facing moving scales 39A and 39B to control the position and rotation (rotation in the θz direction) of wafer stage WST within the XY plane.

Further, when main controller 20 drives wafer stage WST in the X-axis direction as shown by an outlined arrow in FIG. 33, heads 165 and 164, which measure the X position and Y position of wafer stage WST, are sequentially switched to adjacent heads 165 and 164 as shown by an arrow $e_1$ in FIG. 33. For example, the head is switched from head $164_2$ surrounded by the circle in a solid line to head $164_3$ surrounded by the circle in a dotted line (and from head $165_2$ surrounded by the circle in a solid line to head $165_3$ surrounded by the circle in a dotted line). More specifically, in the second embodiment, in order to perform the switching (linkage) of the heads 165 and 164 smoothly, distance WD between the adjacent heads of heads 165 and 164 that head units 62A' and 62C' are equipped with, is set smaller than the width of moving scales 39A and 39B in the X-axis direction as is previously described.

Figure 34:
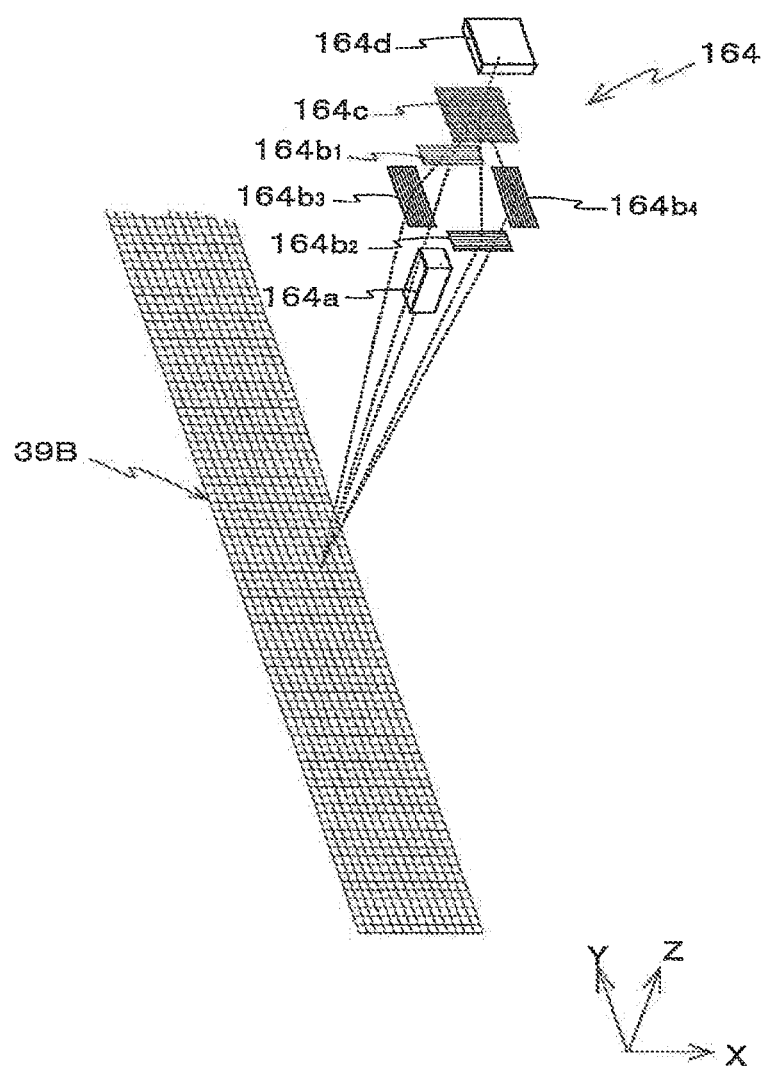
FIG. 34 is a view that shows an example of a configuration of an encoder.

Next, details on a configuration and the like of encoder systems 170A to 170D will be described, taking up encoder 170B shown enlarged in FIG. 34 representatively as an example. FIG. 34 shows one of the 2D heads 164 of head unit 62B' that irradiates a detection beam (a measurement beam) on moving scale 39B.

As shown in FIG. 34, head 164 includes a light source 164a which irradiates a laser beam on moving scale (movable grating) 39B arranged at the end on the −X side on the upper surface of wafer table WTB', fixed scales $164b_1$ and $164b_2$, and $164b_3$ and $164b_4$ that have a fixed positional relation with light source 164a and condense diffraction lights generated at moving scale 39B, an index scale 164c which makes diffraction lights condensed at fixed scales $164b_1$ and $164b_2$ and fixed scale $164b_3$ and $164b_4$ interfere, respectively, and a detector 164d, which detects the lights interfering at index scale 164c. Further, the posture of light source 164a is set from the viewpoint of design so that the optical axis of the laser beam emitted from light source 164a becomes perpendicular to the XY plane.

Fixed scales $164b_1$ and $164b_2$ are transmission-type phase gratings consisting of plates on which diffraction gratings having a periodic direction in the Y-axis direction have been formed. Meanwhile, fixed scales $164b_3$ and $164b_4$ are transmission-type phase gratings consisting of plates on which diffraction gratings having a periodic direction in the X-axis direction have been formed. Index scale 164c is transmission-type two-dimensional grating on which a diffraction grating having a periodic direction in the Y-axis direction and a diffraction grating having a periodic direction in the X-axis direction have been formed. Further, detector 164*d*, for example, includes a quartered detector or a CCD.

Fixed scale 164*b*$_1$ diffracts the −1st order diffraction light which has been generated in the diffraction grating of moving scale 39B whose periodic direction is in the Y-axis direction and generates the +1st order diffraction light, which proceeds toward index scale 164*c*. Further, fixed scale 164*b*$_2$ diffracts the +1st order diffraction light which has been generated in the diffraction grating of moving scale 395 whose periodic direction is in the Y-axis direction and generates the −1st order diffraction light, which proceeds toward index scale 164*c*.

In this case, the +1st order diffraction light and the −1st order diffraction light generated at fixed scale 164*b*$_1$ and fixed scale 164*b*$_2$ overlap each other at the same position on index scale 164*c*. More specifically, +1st order diffraction light and the −1st order diffraction light interfere on index scale 164*c*.

Meanwhile, fixed scale 164*b*$_3$ diffracts the −1st order diffraction light which has been generated in the diffraction grating of moving scale 39 whose periodic direction is in the X-axis direction and generates the −1st order diffraction light, which proceeds toward index scale 164*c*. Further, fixed scale 164*b*$_4$ diffracts the +1st order diffraction light which has been generated in the diffraction grating of moving scale 395 whose periodic direction is in the X-axis direction and generates the −1st order diffraction light, which proceeds toward index scale 164*c*.

In this case, the +1st order diffraction light and the −1st order diffraction light generated at fixed scale 164*b*$_3$ and fixed scale 164*b*$_4$ overlap each other at the same position on index scale 164*c*. More specifically, +1st order diffraction light and the −1st order diffraction light interfere on index scale 164*c*.

In this case, the diffraction angle of the diffraction lights generated in each grating of the moving scales is decided, based on the wavelength of the laser beam emitted from light source 164*a* and the pitch of moving scale (movable grating) 39B, and further, by appropriately deciding the wavelength of the laser beam and the pitch of fixed scales 164*b*$_1$ to 164*b*$_4$, the apparent bending angle of the +−1st order diffraction light generated in the moving scale (movable grating) 39B is decided.

In this case, in head 164 (encoder 170B), a two-dimensional pattern (checkered pattern) appears on detector 164*d*. Because the two-dimensional pattern changes according to the position of wafer stage WST in the Y-axis direction and the X-axis direction, by measuring this change with the quartered device configuring at least a part of detector 164*d*. or the CCD and the like, the position of wafer stage WST in the Y-axis direction and the X-axis direction can be measured.

Incidentally, a moire fringe can be generated by rotating index scale 164*c* around the Z-axis by a minutely small amount, and the moire fringes can be used to measure wafer stage WST.

As is obvious from the description above, because the optical path length of the two beams which are made to interfere is extremely short and also are almost equal to each other in encoder 170B different from each of the interferometers of interferometer system 118, the influence by air fluctuations can mostly be ignored. Other encoders 170A, 170C, and 170D are also configured similar to encoder 170B. As each encoder, an encoder having a resolution of, for example, around 0.1 nm is used.

In exposure apparatus 500 of the second embodiment, in the case of exposure operation described below, main controller 20 controls the position (including rotation in the θz direction) of wafer stage WST (wafer table WTB') in the XY plane, based on measurement values of two encoders 170A and 170B configured by two heads 165 and 164 that face moving scales 39A and 39B, respectively, and various correction information (the correction information includes stage position induced error correction information of each encoder according to the positional information (including tilt information) of wafer stage WST related to a direction besides the measurement direction of the encoder measured by interferometer system 118, characteristics information of the moving scale (for example, the degree of flatness of the grating surface, and/or the grating formation error and the like), and Abbe offset quantity (Abbe error correction information) of the moving scale and the like).

Stage position induced error correction information, here, refers to the degree to which the position (pitching amount, rolling amount, yawing amount and the Z position and the like) of wafer stage WST in a direction besides the measurement direction (in the second embodiment, directions besides the X-axis direction and the Y-axis direction, such as, for example, the ex direction, the θy direction, the θz direction and the Z-axis direction) with respect to the encoder head affects the measurement values of the encoder. Incidentally, in a brief outline, the stage position induced error correction information is acquired beforehand in the following manner.

More specifically, main controller 20 changes wafer stage WST into a plurality of different postures, and for each posture, moves wafer stage WST in the Z-axis direction at a predetermined stroke range while irradiating a detection light on specific areas of moving scales 39A and 39B from heads 165 and 164 in a state where the posture of wafer stage WST is maintained based on the measurement results of interferometer system 118, and during the movement, performs sampling of the measurement results of the encoder. In this manner, variation information (error characteristics curve) of the measurement values of the encoder according to the position in a direction (the Z-axis direction) orthogonal to the movement plane of wafer stage WST for each posture can be obtained. Then, by performing a predetermined operation based on the sampling results, or in other words, the variation information of the measurement values of the encoder according to the position of wafer stage WST in the Z-axis direction for each posture, main controller 20 obtains the correction information of the measurement values of the encoder according to the positional information of wafer stage WST in the direction besides the measurement direction. Accordingly, the stage position induced error correction information used to correct the measurement errors of the encoder due to relative change between a head and a moving scale in the direction besides the measurement direction can be decided by a simple method.

Further, in the second embodiment, in the case of deciding the correction information described above for a plurality of heads configuring the same head unit, such as for example, a plurality of heads 164 configuring head unit 62B, because the correction information of each head 164 (each encoder) facing moving scale 39B is decided based on sampling results when detection lights are irradiated from each head 164 on the same specific area of the corresponding scale 39B and the sampling of the measurement results of the encoder described above is performed, as a consequence, geometric errors caused by the gradient of the head are also corrected by using this correction information. In other words, on obtaining the correction information of a plurality of encoders serving as an object: corresponding to the same moving scale, main controller 20 obtains the correction information of the encoders taking into consideration the geometric errors caused by the gradient of heads of the object encoders which occur when moving wafer stage WST in the Z-axis direction. Accordingly, in the second embodiment, cosine errors which occur due to different gradient angles of the plurality of heads also do not occur. Further, even if a gradient does not occur in head 164, when, for example, a measurement error occurs in the encoder due to the optical properties (such as telecentricity) of the head, generation of measurement errors, or in turn, a decrease in position control accuracy of wafer stage WST, can be prevented by obtaining by the correction information in a similar manner. More specifically, in the second embodiment, wafer stage WST is driven so as to compensate for the measurement errors (hereinafter also referred to as a head induced error) of the encoder system caused by a head unit. Incidentally, for example, the correction information of the measurement values of the encoder system can be computed, based on characteristics information (including for example, the gradient of the head and/or the optical properties and the like) of the head unit.

Further, characteristics information of the moving scale is information on the unevenness (including the tilt) of the surface (to be precise, in the case the diffraction grating surface and the diffraction grating are covered with a cover glass, including the surface of the cover glass) of the scale, and/or the grating formation error (warp of the grating pitch and/or the grid line) and the like, and is measured in advance.

Further, the Abbe offset quantity refers to a difference between the height (the Z position) of the surface (the diffraction grating surface) of each moving scale on wafer table WTB' and the height of a reference surface which includes the exposure center (the center of exposure area IA previously described, and in the second embodiment, coincides with optical axis AX of projection optical system PL). When there is an error (or a gap) in the height of the reference surface of wafer stage WST and the height of the surface (the diffraction grating surface) of each moving scale, the so-called Abbe error occurs in the measurement values of the encoder on rotation (pitching or rolling) around an axis (the X-axis or the Y-axis) parallel to the XY plane of wafer stage WST. The reference surface, in this case, is the surface which becomes a reference of displacement in the Z-axis direction of wafer stage WST measured by interferometer system 118, and refers to a surface (in the second embodiment, coincides with the image plane of projection optical system PL) which becomes a reference of alignment (position control) of each shot area on wafer W in the Z-axis direction. Incidentally, in a brief outline, the Abbe offset quantity is acquired beforehand in the following manner.

More specifically, prior to a start of the lot process in which wafer stage WST is driven, at the time such as, for example, the startup of the apparatus, a calibration process to acquire the Abbe offset quantity of each moving scale (diffraction grating) surface previously described is performed as one of a series of calibration of the encoder system which measures the positional information of wafer stage WST within the XY plane. More specifically, main controller 20 inclines wafer stage WST with respect to the XY plane at an angle $\alpha$ in the periodic direction of the diffraction grating, based on measurement values of interferometer system 118 which measures the tilt angle of wafer stage WST with respect to the XY plane in the periodic direction of the diffraction grating for each moving scale of the encoder system, and computes the Abbe offset quantity of the diffraction grating surface, based on the measurement values of the encoder system before and after the inclination and information on angle a measured with interferometer system 118. Then, main controller 20 stores the information that has been computed in memory.

Next, a parallel processing operation that uses wafer stage WST and measurement stage MST in exposure apparatus 500 of the second embodiment will be described, based on FIGS. 35 to 39. Incidentally, during the operation below, main controller 20 performs the open/close control of each valve of liquid supply unit 5 of local liquid immersion unit 8 and liquid recovery unit 6 in the manner previously described, and water is constantly filled directly under tip lens 191 of projection optical system PL. However, in the description below, for the sake of simplicity, the explanation related to the control of liquid supply unit 5 and liquid recovery unit will be omitted. Further, many drawings are used in the operation description hereinafter, however, reference codes may or may not be given to the same member for each drawing. More specifically, the reference codes written are different for each drawing, however, such members have the same configuration, regardless of the indication of the reference codes. The same can be said for each drawing used in the description so far.

Figure 35:
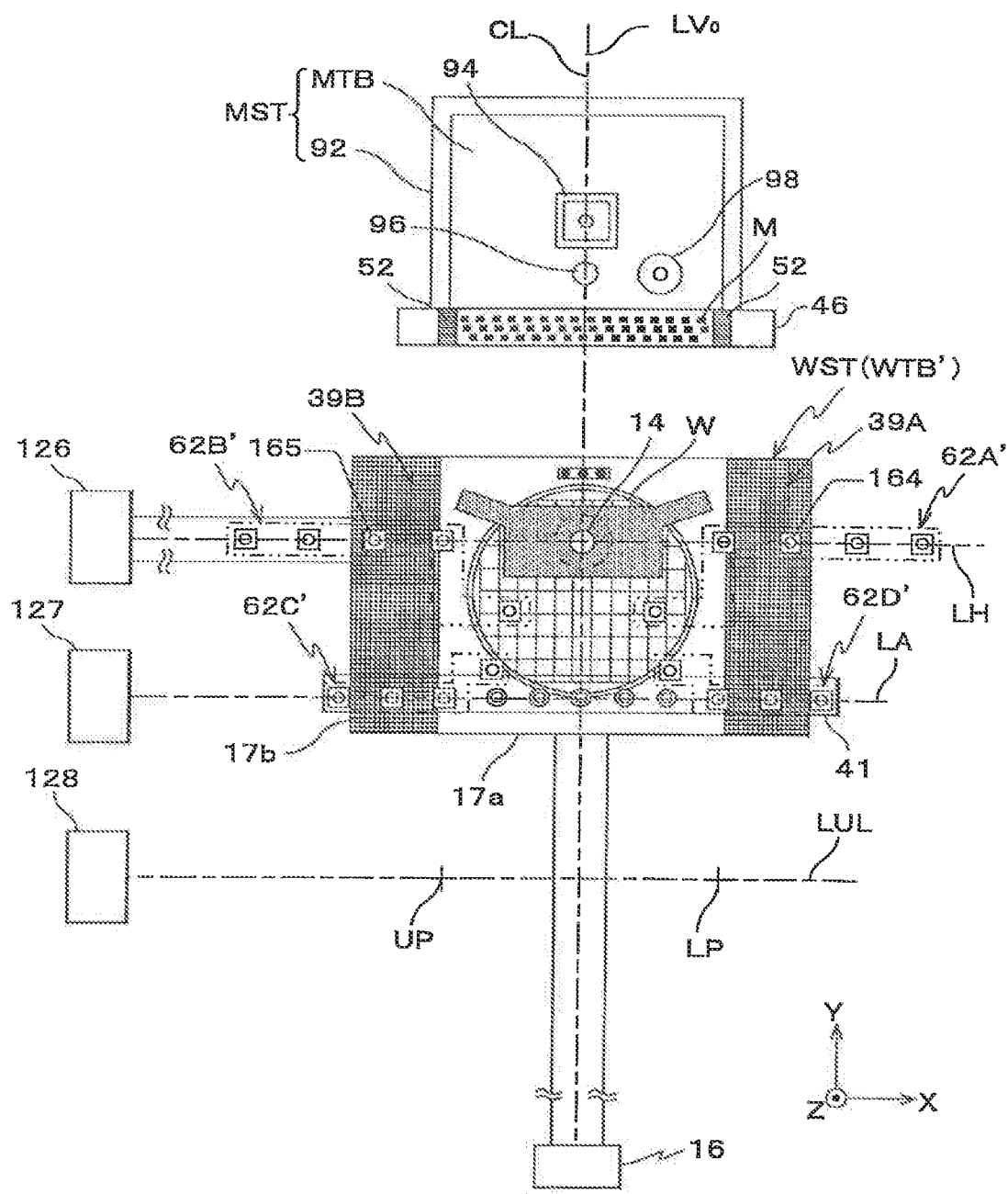
FIG. 35 is a view that shows a state of the wafer stage and the measurement stage when exposure to a wafer is performed by a step-and-scan method.

FIG. 35 shows a state in which an exposure the step-and-scan method of wafer W mounted on wafer stage WST is performed. This exposure is performed by repeating a movement between shots in which wafer stage WST is moved to a scanning starting position (acceleration, staring position) to expose each shot area on wafer W and scanning exposure in which the pattern formed on reticle R is transferred onto each shot area by the scanning exposure method, based on results of wafer alignment (for example, EGA) and the like which has been performed prior to the beginning of exposure. Further, exposure is performed in the following order, from the shot area located on the −Y side on water W to the shot area located on the +Y side.

During the exposure operation described above, main controller 20 controls the position (including the rotation in the θz direction) of wafer stage WST (wafer table WTB') within the XY plane, based on the measurement values of the two encoders 170A and 170B configured by two heads 165 and 164 that face moving scales 39A and 39B, respectively, and various correction information (stage position induced error correction information, characteristics information of the moving scales, and Abbe error correction information and the like) previously described to correct the encoder measurement values. Further, during the exposure operation described above, main controller 20 controls the θy rotation (rolling) and the θx rotation (pitching) of wafer stage WST based on measurement values of X interferometer 126 (or Z interferometers 43A and 43B) and Y interferometer 16. Incidentally, at least one of the position (Z position) of wafer stage WST in the Z-axis direction, the θy rotation (rolling), and the θx rotation (pitching), such as, for example, the Z position and the θy rotation can be measured by other sensors, such as for example, a sensor which detects the Z position of the upper surface of wafer table WTB', such as, for example, a head of an optical displacement sensor similar to an optical pickup used in a CD drive device. In any case, main controller 20 controls (focus leveling control of wafer W) the position of the Z-axis direction, the θy rotation, and the θx rotation of wafer stage WST (wafer table WTB') during the exposure, based on the measurement results of the surface position information of the wafer measured by main controller 20 beforehand and the measurement results of encoder system 150 and/or interferometer system 118.

When wafer stage WST moves in the X-axis direction during the exposure operation by the step-and-scan method described above, the switching of the head previously described is performed along with the movement. In this manner, main controller 20 performs stage control by appropriately switching the encoder to use depending on the position coordinate of wafer stage WST.

Incidentally, independent from the position measurement of wafer stage WST described above using the encoder system, position (X, Y, Z, θx, θy, θz) measurement of wafer stage WST using interferometer system 118 is constantly performed. For example, of X interferometers 126, 127, and 128, one interferometer is used according to the Y position of wafer stage WST. For example, X interferometer 126 is used secondarily during the exposure, as shown in FIG. 126.

When exposure of wafer W has been completed, main controller 20 drives wafer stage WST toward unload position UP. On this drive, wafer stage WST and measurement stage MST which were apart during exposure come into contact or move close to each other with a clearance of, for example, around 300 µm in between, and shift to a scrum state. In this case, the end surface on the −Y side of FD bar 46 on measurement table MTB and the end surface on the +Y side of wafer table WTB come into contact or move close together. And by moving both stages WST and MST in the −Y direction while maintaining the scrum condition, liquid immersion area 14 formed under projection unit PU moves to an area above measurement stage MST.

After shifting to the scrum state described above, when wafer stage WST moves further to the −Y direction and moves off from the effective stroke area (the area in which wafer stage WST moves at the time of exposure and wafer alignment), all the heads that constitute encoder system 150 move off from the corresponding scales on wafer table WTB'. Therefore, stage control based on the measurement results of encoder system 150 is no longer possible. Just before this, main controller 20 switches the stage control to a control based on the measurement results of interferometer system 118. In this case, of the three X interferometers 126, 127, and 128, X interferometer 128 is used.

Figure 36:
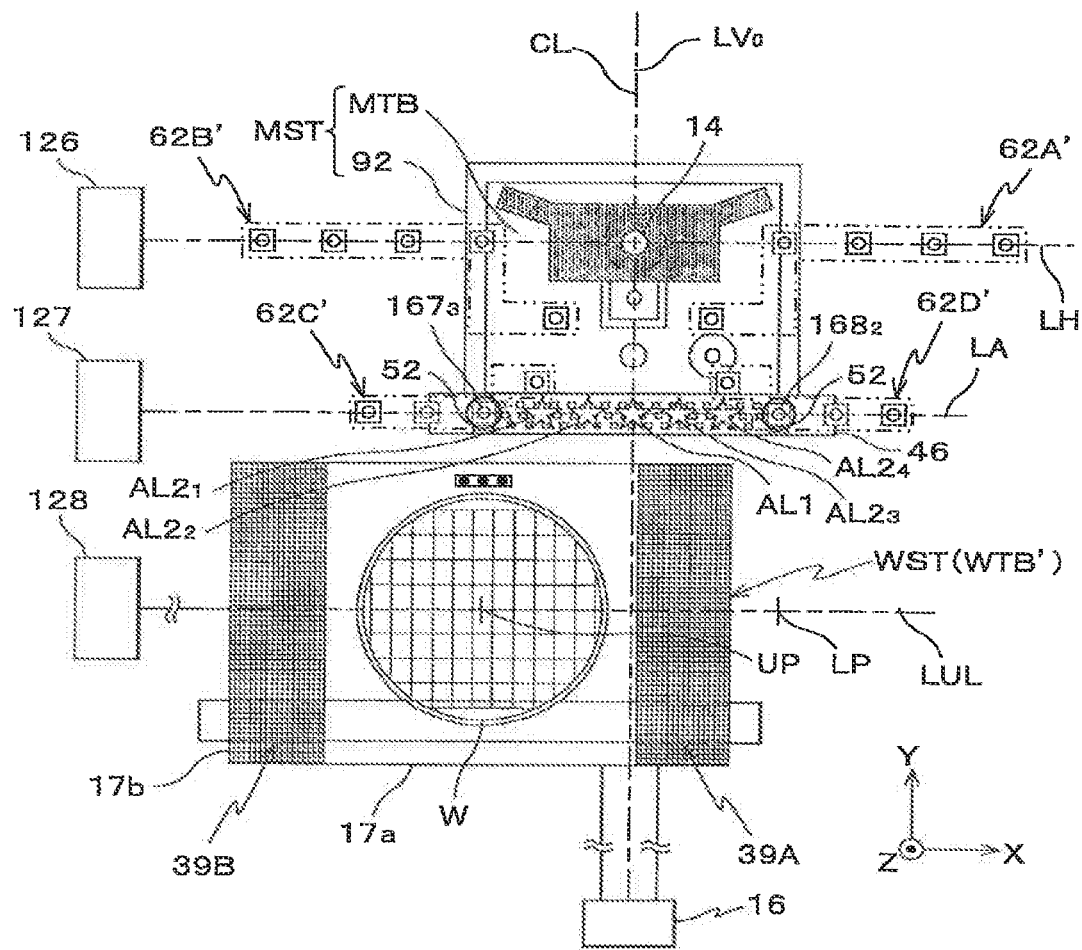
FIG. 36 is a view that shows a state of the wafer stage and the measurement stage at the time of unloading of a wafer.
Figure 37:
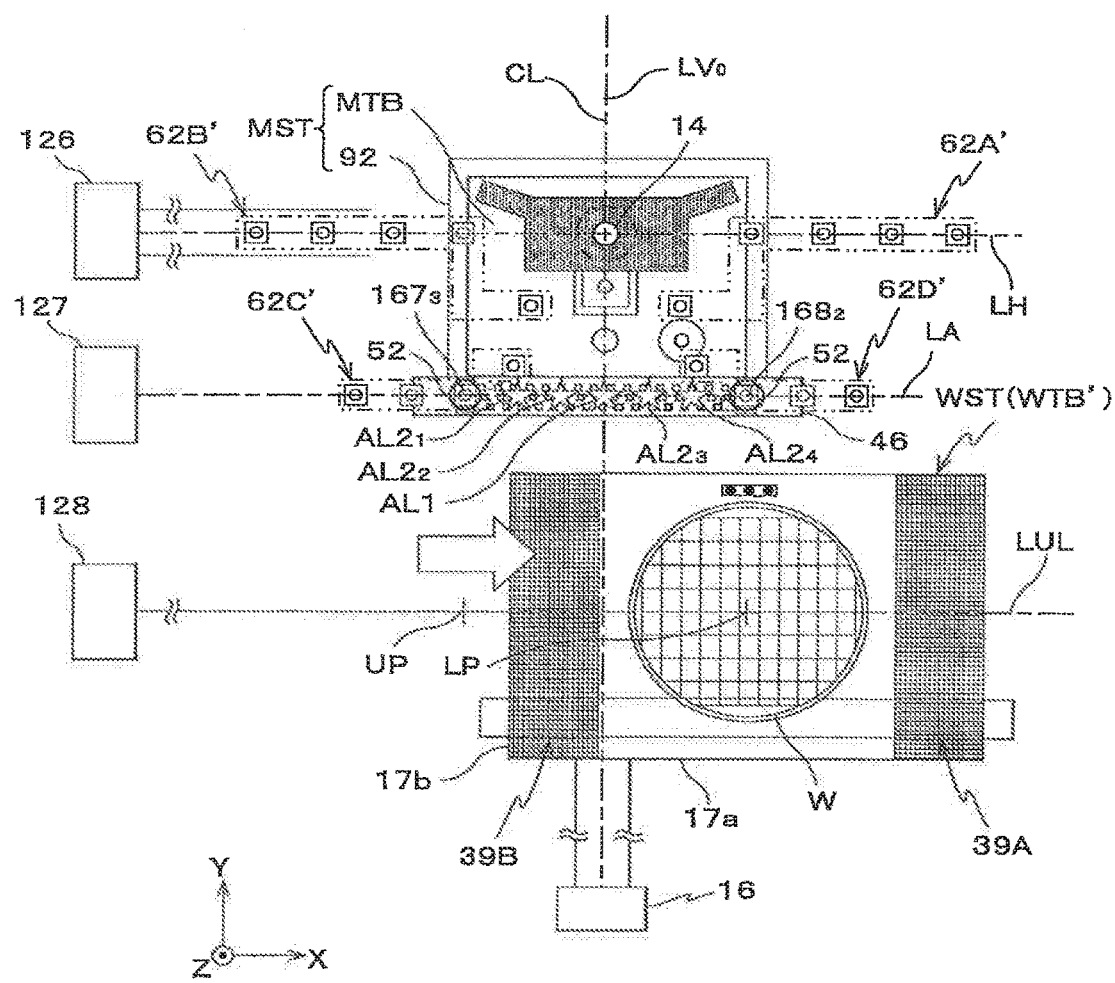
FIG. 37 is a view that shows a state of the wafer stage and the measurement stage at the time of loading of a wafer.

Then, as shown in FIG. 36, wafer stage WST releases the scrum state with measurement stage MST, and then moves to unload position UP. After the movement, main controller 20 unloads wafer W on wafer table WTB'. And then, as shown in FIG. 37, wafer stage WST is driven in the +X direction to loading position LP, and the next wafer W is loaded on wafer table WTB'.

In parallel with these operations, main controller 20 performs Sec-BCHK (a secondary base line check) in which position adjustment of FD bar 46 supported by measurement stage MST in the XY plane and baseline measurement of the four secondary alignment system $AL2_1$ to $AL2_4$ are performed. In this case, Y encoders 170G and 170H previously described are used to measure the rotation information of FD bar 46 in the θz direction.

Figure 38:
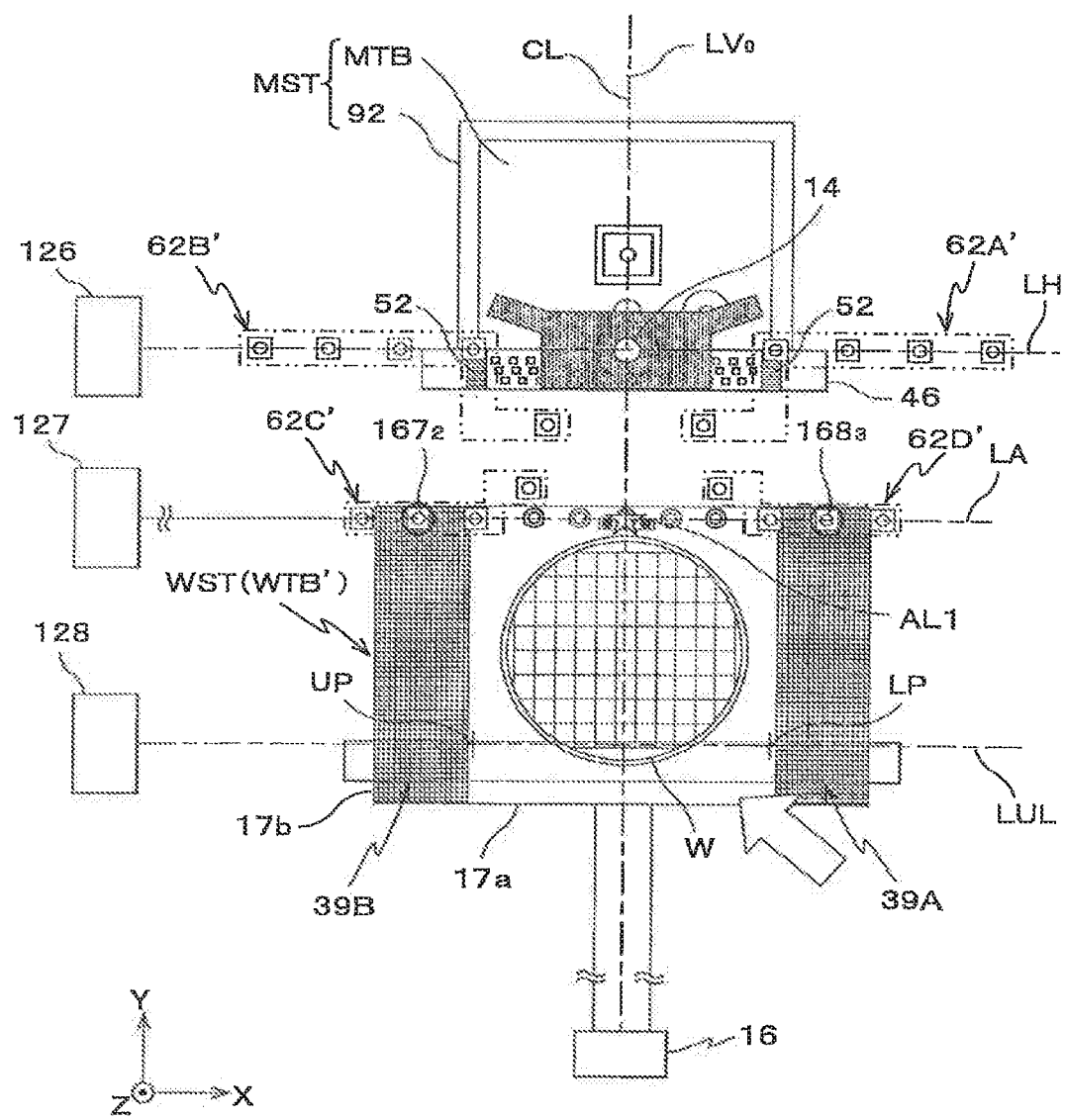
FIG. 38 is a view that shows a state of the wafer stage and the measurement stage, and the placement of encoder heads at the time of switching from stage servo control by an interferometer to stage servo control by an encoder.

Next, main controller 20 drives wafer stage WST, and as shown in FIG. 38, positions reference mark FM on measurement plate 30 within a detection field of primary alignment system AL1, and performs the former process of Pri-BCHK in which the reference position is decided for baseline measurement of alignment system AL1, and $AL2_1$ to $AL2_4$.

When the processing is performed, as shown in FIG. 38, two heads $168_3$ and $167_2$ (shown circled in the drawing) move to face moving scales 39A and 39B, respectively. Then, main controller 20 switches the stage control from a control using interferometer system 118, to a control using encoder system 150 (encoders 170D and 170C). Interferometer system 118 is used secondarily again. Incidentally, of the three X interferometers 126, 127, and 128, X interferometer 127 is used.

Figure 39:
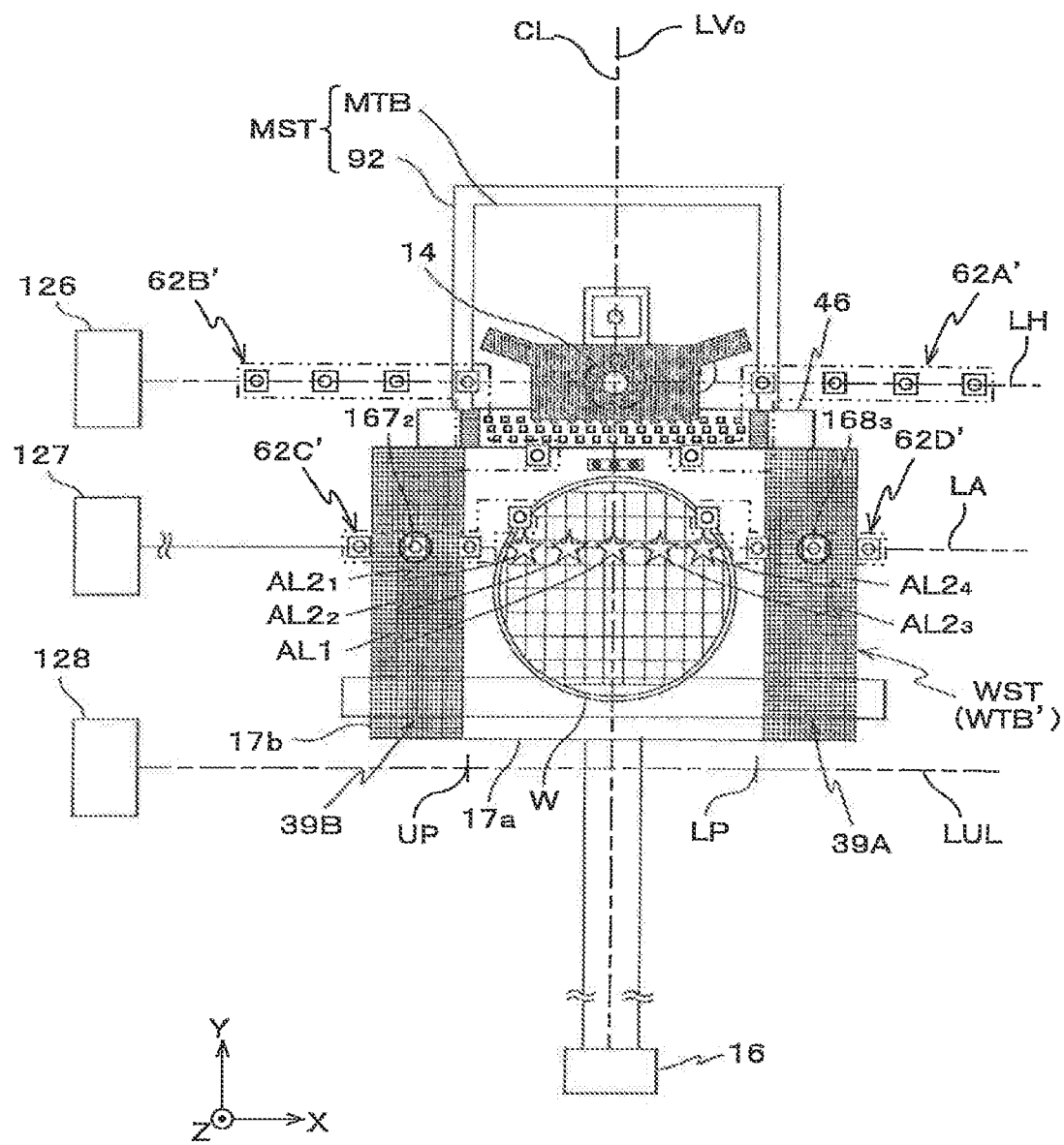
FIG. 39 is a view used to explain a state of the wafer stage and the measurement stage at the time of wafer alignment.

Then, main controller 20 performs wafer alignment (EGA), using primary alignment system AL1 and secondary alignment systems $AL2_1$ to $AL2_4$ (refer to the star mark in FIG. 39).

Incidentally, in the second embodiment, wafer stage WST and measurement stage MST are to be shifted to the scrum state by the time wafer alignment shown in FIG. 39 begins. Main controller 20 drives both stages WST and MST in the +Y direction, while maintaining the scrum state. Then, the water of liquid immersion area 14 is moved from above measurement table MTB to an area on wafer table WTB'.

In parallel with wafer alignment (EGA), main controller 20 performs the latter processing of Pri-BCHK in which the intensity distribution of a projection image of a mark on reticle with respect to the XY position of wafer table WTB' is measured using aerial image measuring device 45.

When the operation described above has been completed, main controller 20 releases the scrum state of both stages WST and MST. And, as shown in FIG. 35, exposure by the step-and-scan method is performed, and a reticle pattern is transferred on to a new wafer W. Hereinafter, a similar operation is executed repeatedly.

As described above, according to exposure apparatus 500 related to the second embodiment, a pair of moving scales 39A and 39B having a two-dimensional grating is arranged on both ends in the X-axis direction on the upper surface of wafer stage WST, and a pair of head units 62A' and 62B' having at least one head 165 or 164, which can constantly face moving scale 39A and 39B when wafer stage WST is located in the movement range to perform the exposure operation, is arranged on both sides of projection unit PU (nozzle unit 32) in the X-axis direction. By this arrangement, main controller 20 can measure the positional information (including rotation information in the θz direction) of wafer stage WST within the XY plane during the exposure operation by the step-and-scan method with high precision, using heads 165 and 164, or more specifically encoders 170A and 170B. Accordingly, with the second embodiment, the layout of the encoder head is simple when compared with the exposure apparatus disclosed as an embodiment in the pamphlet of International Publication No. 2007/097379.

Further, because the scale does not have to be placed in the area at the end on the +Y side on the upper surface of wafer table WTB' in the second embodiment, or more specifically, at the area where liquid immersion area 14 passes through frequently, even if the liquid remains or dust and the like adheres in that area, there is no risk of the measurement accuracy of the encoder system deteriorating.

Further, according to exposure apparatus 500 related to the second embodiment, each of the five heads $165_1$ to $165_5$ and $164_1$ to $164_5$ belonging to head units 62A' and 62B' respectively, that face moving scales 39A and 39B on exposure and are used for position measurement of wafer stage WST in the X-axis direction, the Y-axis direction, and the θz direction, are placed so that as for the X-axis direction, distance WD between adjacent heads is set to a desired distance as in, for example, 70 mm, which takes into consideration the width of moving scales 39A and 39B in the X-axis direction (for example, 76 mm), and the Y position of heads $165_1$ and $164_5$ located closest to the center of projection unit PU are also placed differently from the other (remaining four) heads, according to an open space (in the second embodiment, the open space around nozzle unit 32).

Accordingly, placement of each of the five heads 165 and 164 of head units 62A' and 62B' according to the open space becomes possible, as well as reducing the size of the overall apparatus by improving the space efficiency. In addition to this, linkage (switching of the heads to be used) between each of the five heads of heads 165 and 164 of head units 62A' and 62B' can be performed without any trouble. Accordingly, by encoder system 150 including XY encoders 170A and 170B that have head units 62A' and 62B', respectively, the position of wafer stage WST in the XY plane can be measured with high precision upon exposure, without being affected by air fluctuation.

Further, according to exposure apparatus 500 related to the second embodiment, when main controller 20 drives wafer stage WST on exposure and the like, main controller 20 controls the position (including rotation in the θz direction) of wafer stage WST within the XY plane with high precision, based on the measurement values of encoder system 150 (encoders 170A and 170B) and correction information (at least one of the stage position induced error correction information (including the correction information of head induced error), characteristics information of the moving scale, and Abbe error correction information) used to correct the measurement values of each encoder.

Further, according to exposure apparatus 500 related to the second embodiment, by repeating a movement operation between shots in which wafer stage WST is moved to a scanning starting position (acceleration starting position) for exposure of each shot area on wafer W and a scanning exposure operation in which a pattern formed on reticle R is transferred onto each shot area by a scanning exposure method, based on the latest baseline obtained from the baseline measurement of the alignment system previously described which is performed each time on wafer exchange and the results of wafer alignment EGA), it becomes possible to transfer the pattern of reticle R on the plurality of shot areas on wafer W with good precision (overlay accuracy). Furthermore, in the second embodiment, because a high-resolution exposure can be realized by liquid immersion exposure, a fine pattern can be transferred with good precision on wafer W also from this viewpoint.

Furthermore, with exposure apparatus 500 related to the second embodiment, periphery edge exposure unit 51 and multipoint AF system (90a, 90b) are actually arranged at positions similar to the first embodiment previously described. Therefore, according to exposure apparatus 500, by wafer stage WST (wafer W) linearly passing the plurality of detection points (detection area AF) of the multipoint AF system (90a, 90b), the detection area of the plurality of alignment systems AL1, and $AL2_1$ to $AL2_4$, and below periphery edge exposure unit 51, three operations which are detection of surface position information of substantially the entire surface of wafer W, detection of all the alignment marks (for example, alignment marks in the alignment area on EGA) which should be detected on wafer W, and periphery edge exposure of wafer W are completed, as in exposure apparatus 100 of the first embodiment. Therefore, throughput can be improved remarkably when compared with the case when detection operation of the alignment marks, detection operation of the surface position information (focus information), and periphery edge exposure operation are performed independently (separately).

Further, in exposure apparatus 500 related to the second embodiment, a surface position measurement system similar to the one described in the first embodiment can be arranged. Accordingly, it becomes possible to perform focus mapping and surface position control of wafer W using the results of the focus mapping similar to the first embodiment. Accordingly, in the embodiment, although the working distance between tip lens 191 and wafer W surface is narrow, focus leveling control of wafer W on exposure can be performed with good precision, without any trouble.

Further, in the second embodiment described above, the case has been described where exposure apparatus 500 is equipped with an encoder system which is configured of moving scales 39A and 39B (scale members) placed on wafer stage WST, and facing the scales, head units 62A' to 62D' placed external to wafer stage WST, or more specifically, below the mainframe (not shown) holding projection unit PU. However, as well as this, the encoder heads can be arranged on wafer stage WST, and the scale members can be arranged external to wafer stage WST as in the following third embodiment.

A Third Embodiment

Figure 40:
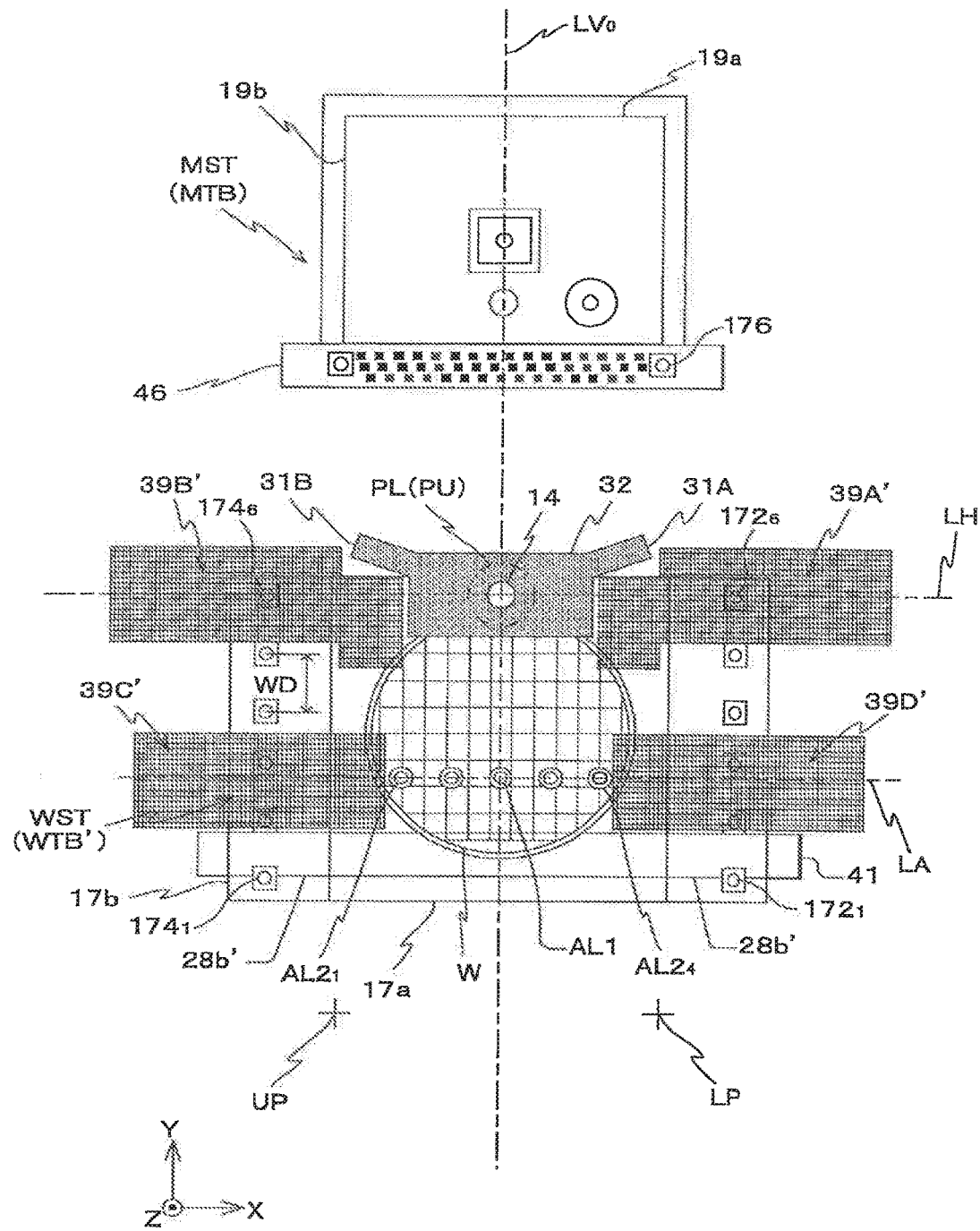
FIG. 40 is a planar view that shows a stage device which an exposure apparatus of a third embodiment is equipped with and a placement of a sensor unit.

FIG. 40 is a planar view that shows a stage device equipped in an exposure apparatus of a third embodiment and a placement of a sensor unit. The exposure apparatus of the third embodiment is different only in the configuration of the encoder system when compared with the exposure apparatus of the second embodiment previously described, and the configuration is the same for other sections. Accordingly, the description below will be focusing mainly on the difference, which is the encoder system. Further, the same reference numerals will be used for the same or similar sections as in the second embodiment previously described, and a description thereabout will be omitted.

As shown in FIG. 40, in the third embodiment, 2D heads $172_1$ to $172_6$ and $174_1$ to $174_6$ are arranged, respectively, on the pair of second water repellent plates 28b' on the upper surface of wafer table WTB' instead of moving scales 39A and 39B, in a direction parallel to reflection surface 17b at a predetermined distance WD. As each of the 2D heads $172_1$ to $172_6$ and $174_1$ to $174_6$, a head having a configuration similar to 2D heads 164,165,167, and 168 previously described is used. 2D heads $172_1$ to $172_6$ and 2D heads $174_1$ to $174_6$ are placed symmetric to the center line of wafer table WTB'. Hereinafter, 2D heads $172_1$ to $172_6$ and 2D heads $174_1$ to $174_6$ will also be described, appropriately, as heads 172 and 174, respectively.

Meanwhile, on the +X side and the −X side of nozzle unit 32, a pair of fixed scales 39A' and 39B' are placed, respectively, with the X-axis direction serving as a longitudinal direction. Fixed scales 39A' and 39B' are shaped, each having a rectangular shaped cutout portion formed in a part of one side on one end in the longitudinal direction of a rectangle, as shown in FIG. 40, and an extended portion having the same shape as the cutout portion arranged on the other side of the one end. In this case, fixed scale 39A' is placed in a state substantially in contact with the surface of nozzle unit 32 on the +X side with the X-axis direction serving as the longitudinal direction, and is shaped having a rectangular cutout portion is formed at a part of the −X end of the nozzle unit on the +Y side, and an extended portion having the same shape as the cutout portion arranged at the −X end on the −Y side. The extended portion protrudes slightly more to the −Y side than nozzle unit 32. Fixed scale 39B' has a shape symmetric to fixed scale 39A', and is placed symmetrically with respect to a reference line $LV_0$. Fixed scales 39A' and 39B' are fixed to the rear surface of the mainframe (not shown) holding projection unit PU, parallel to the XY plane. The length of fixed scales 39A' and 39B' are slightly shorter when compared with moving scales 39A and 39B previously described, and on the lower surfaces (the surface on the −Z side) of the scales, the reflection type two-dimensional diffraction gratings previously described are formed.

In the third embodiment, furthermore, as shown in FIG. 40, on the −Y side of fixed scales 39A' and 39B' a predetermined distance (for example, substantially the same dimension as the width of fixed scale 39A') away, fixed scales 39D' and 39C' having rectangular shapes are placed, with the X-axis direction serving as the longitudinal direction. Fixed scales 39D' and 39C' are placed symmetrically with respect to reference line $LV_0$ previously described. Further, fixed scales 39D' and 39C' are placed in proximity to secondary alignment systems $AL2_4$ and $AL2_1$, respectively. Fixed scales 39D' and 39C' are fixed to the rear surface of the mainframe (not shown) holding projection unit PU, parallel to the XY plane. The length of fixed scales 39D' and 39C' are slightly shorter when compared with fixed scales 39A' and 39B' previously described, and on the lower surfaces (the surface on the −Z side) of the scales, the reflection type two-dimensional diffraction gratings previously described are formed.

Further, on the upper surface of FD bar 46, instead of the pair of reference gratings 52, a pair of 2D heads 176 is arranged.

Figure 41:
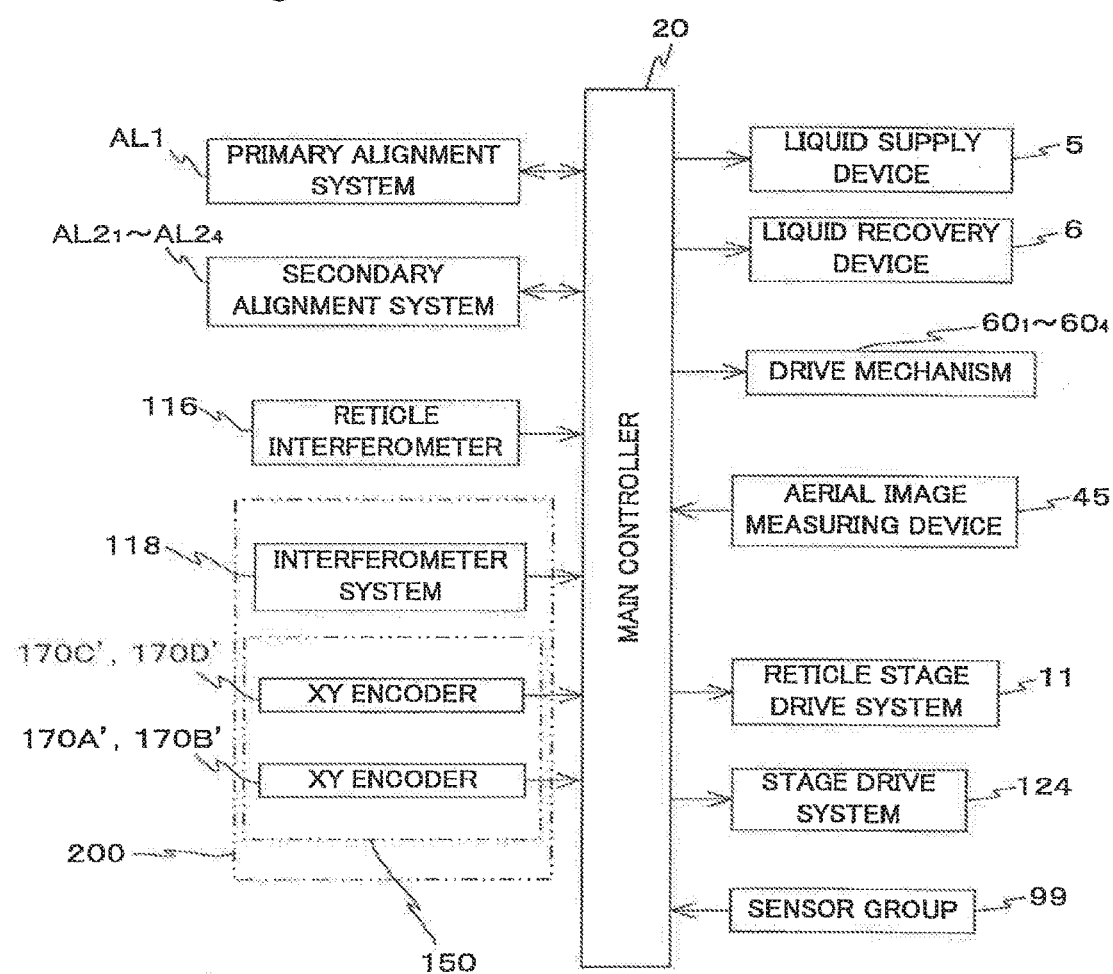
FIG. 41 is a block diagram that shows a main configuration of a control system of an exposure apparatus related to a third embodiment.

2D heads $172_1$ to $172_6$ constitute a multiple-lens (six-lens, in this case) XY encoder 170A' (refer to FIG. 41) that measures the X position and the Y position of wafer stage WST (wafer table WTB') using fixed scale 39A' or 39D' previously described. Similarly, 2D heads $174_1$ to $174_6$ constitute a multiple-lens (five-lens, in this case) XY encoder 170B' (refer to FIG. 41) that measures the X position and the Y position of wafer stage WST (wafer table WTB') using fixed scale 39B' or 39C' previously described.

On exposure operation and the like, at least one each of heads 172 and 174 face fixed scales 39A' and 39B', respectively. That is, of the measurement beams (encoder beam) that heads 172 and 174 emit, at least one measurement beam each constantly irradiates fixed scales 39A' and 39B'. The X position, Y position, and θz rotation of wafer stage WST are measured by heads 172 and 174 (more specifically, encoders 170A' and 170B' configured by heads 172 and 174).

Further, on alignment operation and the like, at least one each of heads 174 and 172 face fixed scales 39C' and 39D', respectively. That is, of the measurement beams (encoder beams) that heads 174 and 172 emit, at least one measurement beam each constantly irradiates moving scales 39C' and 39D'. The X position, Y position, and θz rotation of wafer stage WST are measured by heads 174 and 172 (more specifically, encoders 170B' and 170A' configured by heads 174 and 172).

Further, in the third embodiment, at the time of base line measurement and the like of the secondary alignment system, the pair of 2D heads 176 on FD bar 46 faces fixed scales 39C' and 39D', and the X and Y positions and the θz rotation of FD bar 46 is measured by the pair of 2D heads 176. In the description below, the encoders configured by the pair of 2D heads 176 which face fixed scales 39C' and 39D', respectively, are referred to as encoders 170C' and 170D' (refer to FIG. 41).

The four encoders 170A' to 170D' described above supply their measurement values to main controller 20. Main controller 20 controls the position (including rotation (yawing) in the θz direction) within the XY plane of wafer table WTB' based on the measurement values of encoders 170A' and 170B', and also controls the position of FD bar 46 in the X, Y, and θz direction, based on the measurement values of encoders 170C' and 170D'.

The configuration for other sections is the same as the second embodiment previously described.

According to the exposure apparatus of the third embodiment configured in the manner described above, main controller 20 performs the control operation of each section in a similar manner as exposure apparatus 500 or the second embodiment previously described, which makes at possible to obtain an effect equivalent to the first embodiment.

Incidentally, in the second and third embodiments described above, while a 2D head having the configuration shown in FIG. 34 is used as an example as an encoder head, as well as this, two one-dimensional heads can be combined to configure a two-dimensional head. More specifically, the two-dimensional head referred to in the description includes a head which is a combination of two one-dimensional heads.

In the first to third embodiment described above, while the case has been described where the present invention has been applied to an exposure apparatus which is equipped with a wafer stage and a measurement stage, as well as this, the present invention can also be applied to an exposure apparatus equipped with only a single stage, or a multi-stage type exposure apparatus equipped with a plurality of wafer stages, such as for example, a twin-stage type exposure apparatus, as is disclosed in, for example, U.S. Pat. Nos. 6,590,634, 5,969,441, 6,208,407 and the like. In this case, in parallel with the exposure which is performed on the wafer held by one of the two wafer stages, the controller of the exposure apparatus can control the periphery edge exposure unit which is placed on the movement path between the area (a measurement station) where measurement such as alignment measurement of the wafer is performed and the area (an exposure station) where exposure of the wafer is performed, while moving the other wafer stage in at least the Y-axis direction, and can perform the periphery edge exposure of a part of the shot areas in the periphery portion of the wafer held by the other wafer stage while the stage passes under the periphery edge exposure unit while moving toward the exposure position.

Further, the periphery edge exposure operation can be started during the measurement operation at the measurement station. In this case, the periphery edge exposure operation is to be completed after finishing the measurement operation and also before starting the exposure.

Incidentally, the periphery edge exposure unit can be placed at the measurement station along with the alignment systems ($AL1$, $AL2_1$ to $AL2_5$), and the periphery edge exposure operation can be performed during the measurement operation.

Further, while the position control (including the period, while at least a part of the periphery edge exposure operation is being performed) of the wafer stage between the measurement station and the exposure station can be performed using any kind of a measurement device, it is preferable to perform the control, using the encoder system or the interferometer system described above.

Further, in the twin stage type exposure apparatus, the periphery edge exposure operation can be performed in the proceeding path (more specifically, the movement path of the wafer stages from the measurement station to the exposure station), or the operation can be performed in the returning path (more specifically, the movement path of the wafer stage from the exposure station to the measurement station (unloading position)), or, the periphery edge exposure operation of one wafer can be performed dividing the operation into the proceeding path and the returning path.

Incidentally, in the case of applying the second and third embodiments to the twin stage type exposure apparatus, the periphery edge exposure unit does not have to be arranged, and only the encoder system having the 2D heads (2D encoders) previously described has to be adopted as the position measurement device of at least one wafer stage. More specifically, in the second and third embodiments described above, while the encoder system having the 2D heads previously described is required, the configuration besides the encoder system, the sequence (stage movement and a measurement operation are performed in parallel) and the like can be combined and employed optionally and is not essential.

Further, in the second and third embodiments above, while the case has been described where measurement system 200 includes both interferometer system 118 and encoder system 150, as well as this, the measurement system can include only one of interferometer system 118 and encoder system 150.

Next, a fourth embodiments of the present invention related to a twin stage type exposure apparatus will be described.

A Fourth Embodiment

Hereinafter, a fourth embodiment of the present invention will be described, with reference to FIGS. 42 to 76. Here, the same reference numerals will be used for the same or similar sections as in the first embodiment, and/or the second embodiment previously described, and a detailed description thereabout will be simplified or omitted.

Figure 42:
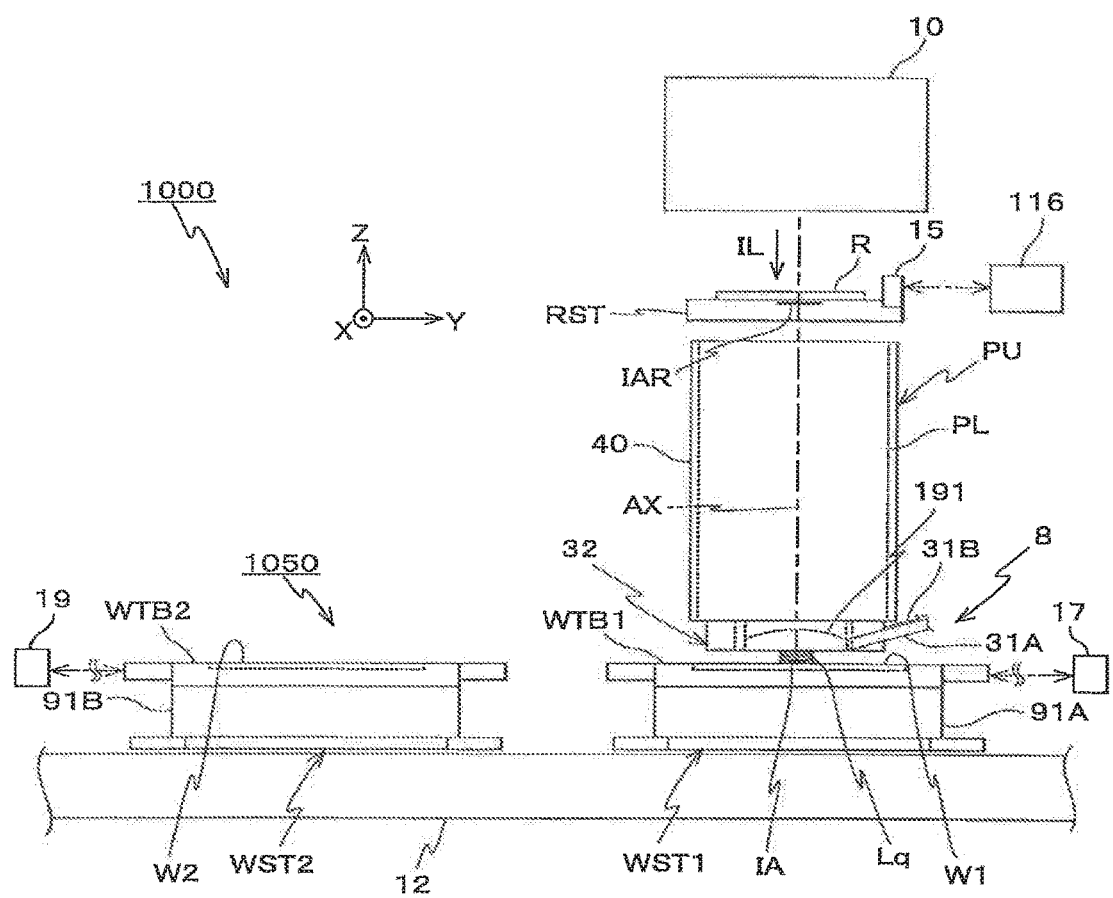
FIG. 42 is a view that schematically shows a configuration of an exposure apparatus of a fourth embodiment.

FIG. 42 schematically shows a configuration of an exposure apparatus 1000 in the fourth embodiment. Exposure apparatus 1000 is a projection exposure apparatus by the step-and-scan method, or a so-called scanner. As it will be described later, because a projection optical system PL is arranged also in the fourth embodiment, in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 1000 is equipped with an illumination system 10, a reticle stage RST which holds a reticle R illuminated by illumination light IL from illumination system 10, a projection unit PU including projection optical system PL which irradiates illumination light IL outgoing from reticle R on a wafer, a stage device 1050 including two wafer stages WST1 and WST2, a local liquid immersion device 8 and a control system of these sections. On wafer stages WST1 and WST2, wafers W1 and W2 are held, respectively.

Figure 47:
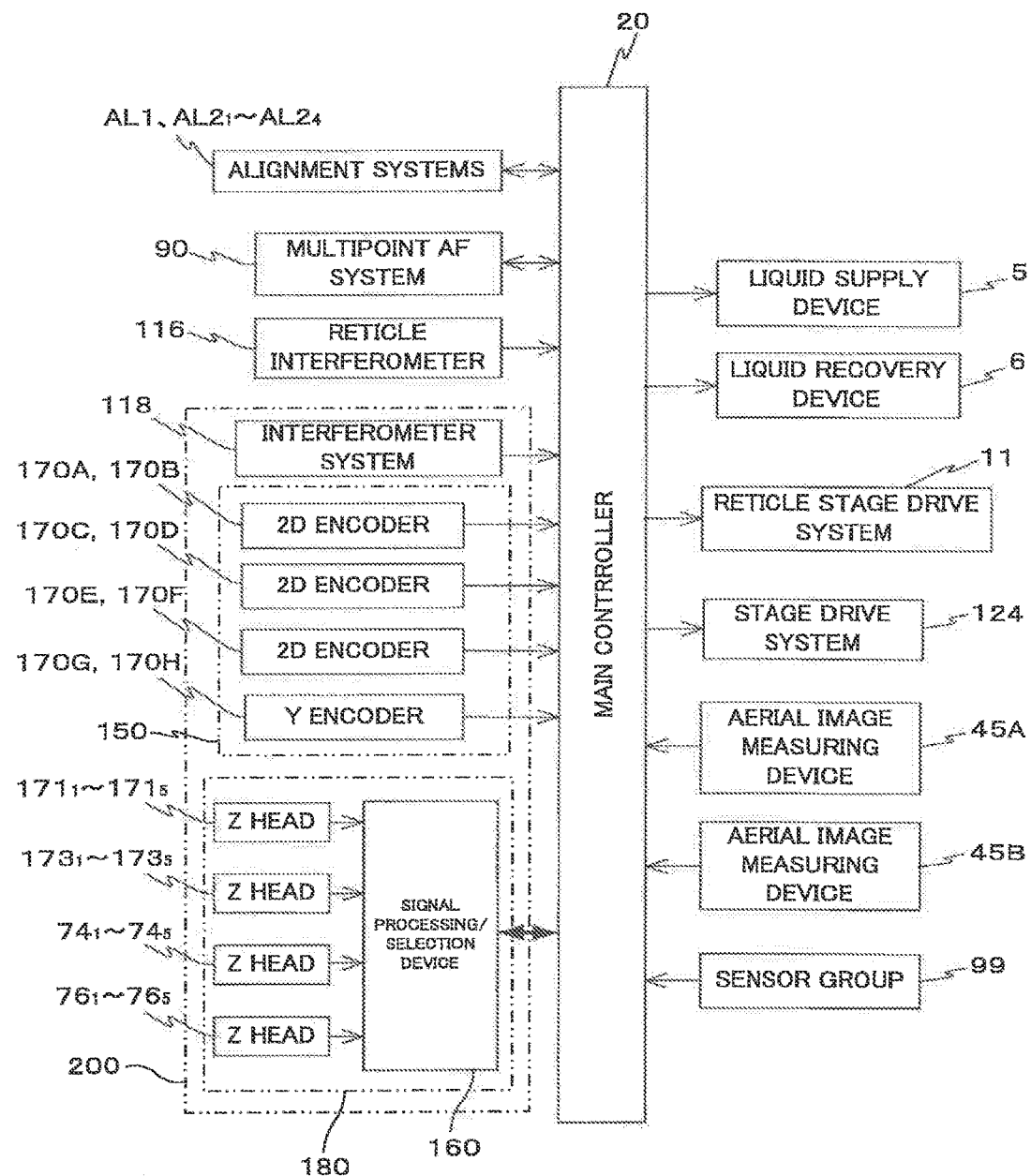
FIG. 47 is a block diagram that shows a main configuration of a control system of an exposure apparatus of a second embodiment.

Stage device 1050, as shown in FIG. 42, is equipped with two wafer stages WST1 and WST2 placed above a base board 12, a measurement system 200 (refer to FIG. 47) that measures positional information of wafer stages WST1 and WST2, and a stage drive system 124 (refer to FIG. 47) which drives wafer stages WST1 and WST2 and the like. Measurement system 200 includes an interferometer system 118, an encoder system 150, and a surface position measurement system 180 as shown in FIG. 47.

Wafer stages WST1 and WST2 are supported by levitation above base board 12 via a clearance of several μm by, for example, air sliders (to be described later) that each stage has. And, by a planar motor described below configuring stage drive system 124, wafer stages WST1 and WST2 are drivable independently within the XY plane along the upper surface (movement guide surface) of base board 12.

Figure 43A:
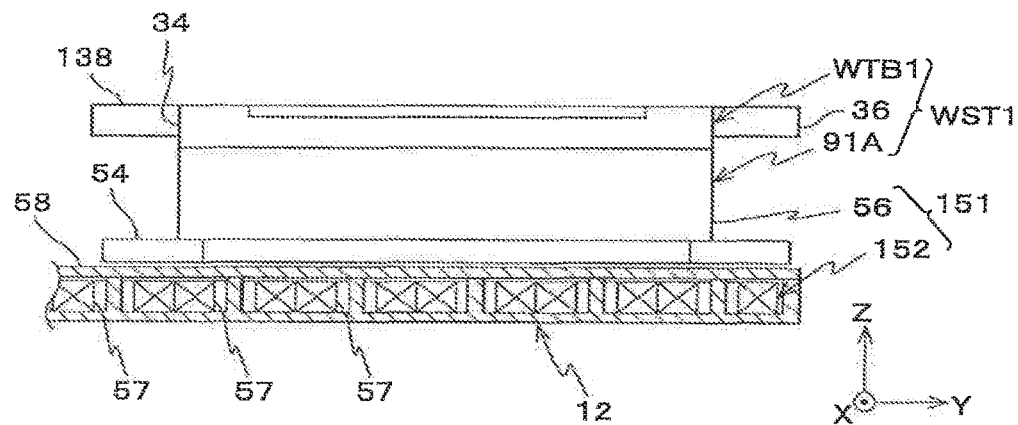
FIG. 43 is a side view that shows a wafer stage WST1 of FIG. 42.
FIG. 43B is a planar view that shows wafer stage WST1.

Wafer stage WST1, as shown in FIGS. 42 and 43A, includes a stage main section 91A, and a wafer table WTB1 mounted on stage main section 91A. Stage main section 91A, as shown in FIG. 43A, has a mover 56 which configures a planar motor 151 along with a stator 152 embedded inside base board 12, and an air slider 54, which is arranged integrally in the periphery of the lower half section of mover 56 and has a plurality of air bearings.

Mover 56 is configured, for example, by a magnet unit including a planar magnetism generating body consisting of a plurality of flat plate magnets having a matrix arrangement so that the polarity of adjacent pole faces are different from one another. Mover 56 has a thin rectangular solid shape.

Meanwhile, stator 152 is configured by an armature unit having a plurality of armature coils (drive coils) 57 disposed in a matrix in the interior of base board 12. As armature coil 57, in the fourth embodiment, an X drive coil and a Y drive coil are arranged. And, by stator 152 consisting of the armature unit including the plurality of X drive coils and Y drive coils and mover 56 consisting of the magnet unit previously described, a moving magnet type planar motor 151 by an electromagnetic drive method (Lorentz force drive method) is configured.

A plurality of armature coils 57 is covered by a tabular member 58 made of a non-magnetic material that configures the upper surface of base board 12. The upper surface of tabular member 58 configures a pressure receiving surface of pressurized air from air bearings which the movement guide surface of wafer stage WST1 and WST2 and air slider 54 are equipped with.

Wafer table WTB1 has three sections which are a table main section 34 consisting of a thin rectangular (a thick plate-shaped) member, an FD bar 46 attached (to be precise, kinematically supported by table main section 34 by a full-kinematic mount structure) to the side surface on the +Y side of table main section 34, and a measurement section 138 fixed to the side surface on the −Y side of table main section 34. Hereinafter, table main section 34, FD bar 46, and measurement section 138 will be referred to as wafer table WTB1 as a whole, besides the case when specifying is especially necessary. In this case, table main section 34 has the same shape and outer shape size as mover 56 when viewed from above.

Wafer table WTB1 is mounted on stage main section 91A via a Z leveling mechanism (not shown) (for example, including voice coil motors and the like), which configures a part of stage drive system 124. Wafer table WTB1 is driven finely in the Z-axis direction, the ex direction, and the θy direction with respect to stage main section 91A by the Z leveling mechanism. Accordingly, wafer table WTB1 is drivable in directions of six degrees of freedom (X, Y, Z, θx, θy, and θz) with respect to base board 12, by stage drive system 124 (refer to FIG. 47) including planar motor 151 and the Z leveling mechanism.

Figure 43B:
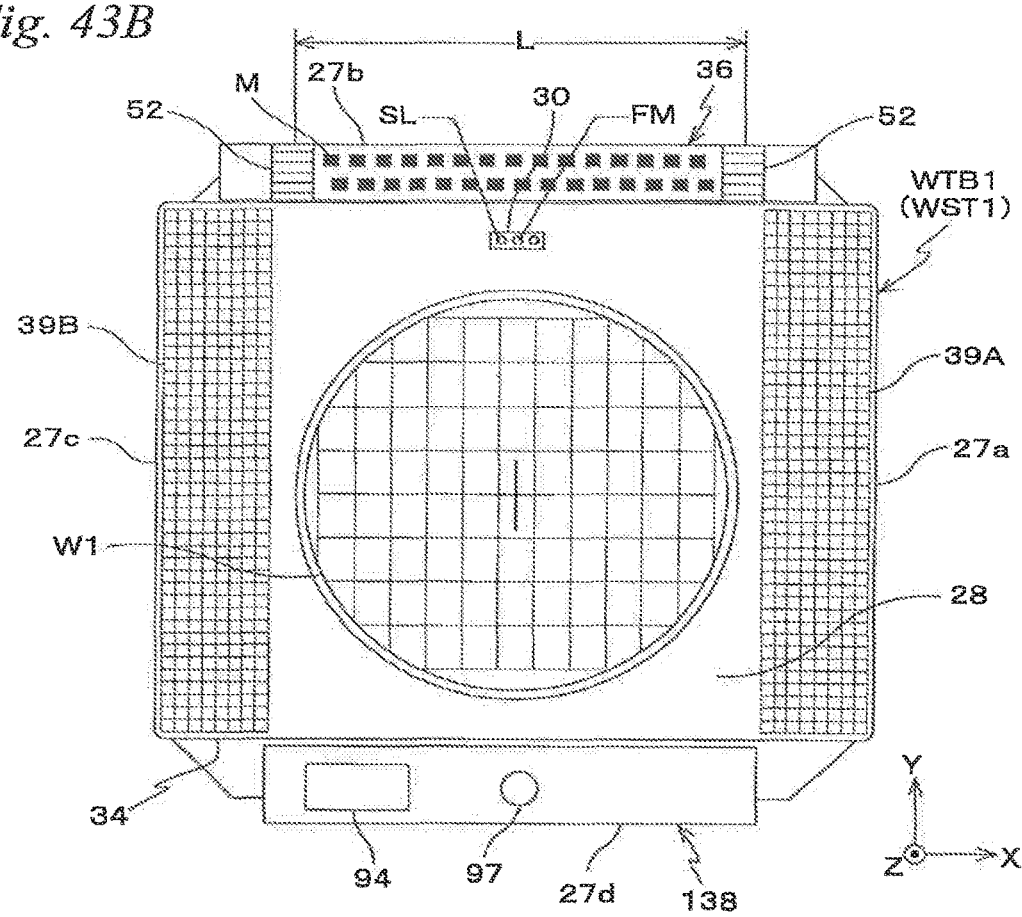

In the center of the upper surface of wafer table WTB1, a wafer holder (not shown) is arranged which holds the wafer by vacuum suction or the like. On the outer side of the wafer holder (mounting area of the wafer), as shown in FIG. 43B, a plate 28 is arranged that has a circular opening one size larger than the wafer holder formed in the center, and also has a rectangular outer shape (contour). A liquid repellent treatment against liquid Lq is applied to the surface of plate 28. Incidentally, plate 28 is set so that its entire surface becomes substantially flush with the surface of wafer W.

Further, FD bar 46 and measurement section 138 are attached to table main section 34 so that each of their surfaces becomes substantially flush with the surface of plate 28.

Further, a rectangular opening is formed substantially at the center in the X-axis direction of plate 28 in the vicinity of the +Y side end, and inside the opening, a measurement plate 30 is embedded. And, below each of a pair of aerial image measurement slit patterns SL of measurement plate 30 inside wafer table WTB1, a pair of aerial image measuring devices 45A (refer to FIG. 47) including an optical system including an object lens and the like and a light receiving element (for example, a photomultiplier tube and the like) is arranged corresponding to the pair of aerial image measurement slit patterns SL described above. As aerial image measuring device 45A, a device having a configuration similar to the one that is disclosed in, for example, U.S. Patent Application Publication No. 2002/0041377 and the like is used. Measurement plate 30 has its surface arranged substantially flush with plate 28.

Furthermore, in the area on the upper surface of plate 28 on one side and the other side (on the right and left sides in FIG. 43B) in the X-axis direction, moving scales 39A and 39B are formed. Moving scales 39A and 39B are each configured of a reflection type two-dimensional grating (for example, a diffraction grating), which is, for example, a grating having a periodic direction in the Y-axis direction and a grating having a periodic direction in the X-axis direction combined. The pitch of the grid lines of the two-dimensional diffraction gratings is, for example, 1 μm, for both the Y-axis direction and the X-axis direction. Incidentally, in FIG. 43B, the pitch of the gratings is illustrated larger than the actual pitch for the sake of convenience. The same is true also in other drawings. Moving scales 39A and 39B are covered with a liquid repellent film (water repellent film).

Incidentally, in order to protect the diffraction grating, it is also effective to cover the grating with a glass plate with low thermal expansion that has water repellency. In this case, as the glass plate, a plate whose thickness is the same level as the wafer, such as for example, a plate 1 mm thick, can be used, and the plate is set on the upper surface of table main section 34 (wafer table WTB1) so that the surface of the glass plate becomes the same height (surface position) as the wafer surface.

Incidentally, near the edge of each scale of plate 28, a pattern for positioning (not shown) is arranged for deciding the relative position between an encoder head and a scale (to be described later). The pattern for positioning is configured, for example, from grid lines that have different reflectivity, and when the encoder head scans the pattern, the intensity of the output signal of the encoder changes. Therefore, a threshold value is determined beforehand, and the position where the intensity of the output signal exceeds the threshold value is detected. Then, the relative position between the encoder head and the scale is set, with the detected position as a reference.

As described above, in the fourth embodiment, because plate 28 itself constitutes the scale, a glass plate with low-thermal expansion is used as plate 28. However, besides such a plate, a scale member made up of a glass plate or the like with low-thermal expansion on which a grating is formed can also be fixed on the upper surface of wafer table WTB1, for example, by a plate spring (or vacuum suction) or the like so as to prevent local shrinkage/expansion. Or, wafer table WTB1 can also be formed by materials with a low-thermal expansion, and in such a case, the moving scales may be directly formed on the upper surface of wafer table WTB1.

FD bar 46 is configured similar to the first embodiment previously described, as shown in FIG. 43B. The distance between a pair of reference gratings 52 formed on FD bar 46 is referred to as a distance L.

Measurement section 138 is a rectangular solid shape whose longitudinal direction is in the X-axis direction. In measurement section 138, members for various measurements which will be described later on are arranged.

Figure 44A:
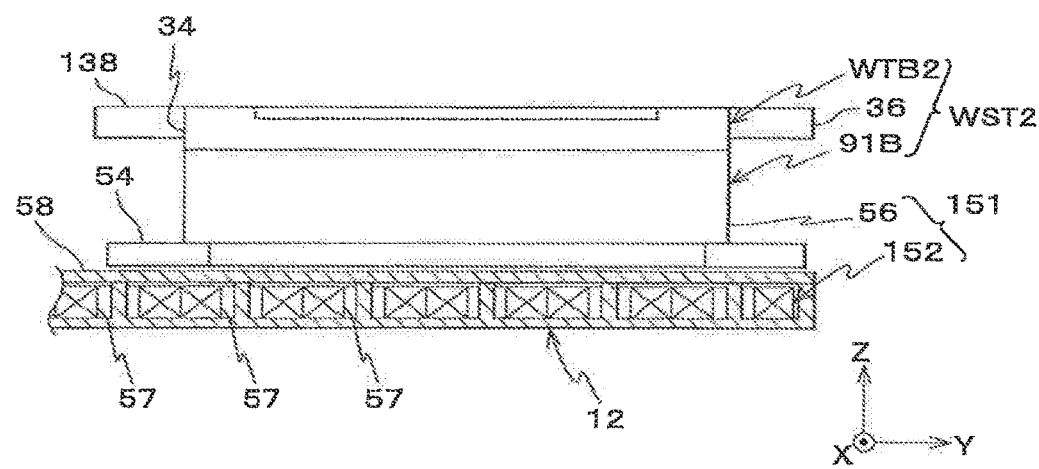
FIG. 44A is a side view that shows a wafer stage WST2 of FIG. 42.
Figure 44B:
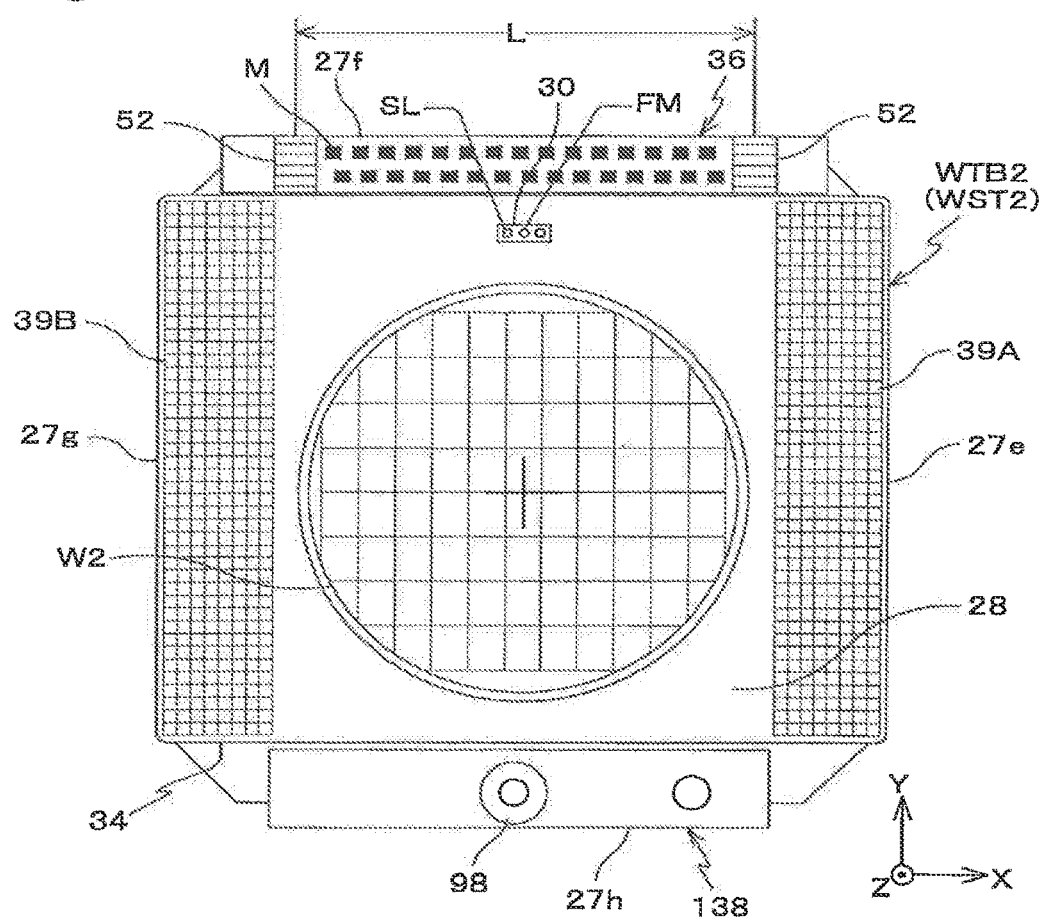
FIG. 44B is a planar view that shows wafer stage WST2.

Wafer stage WST2, as shown in FIGS. 42, 44A, and 44B and the like, includes stage main section 91B and a wafer table WTB2, and is configured in a similar manner with wafer stage WST1 described above. Wafer stage WST2 is driven by planar motor 151 consisting of mover 56 and stator 152.

As shown in FIGS. 44A and 44B, wafer table WTB2 has three sections which are a table main section 34, and an FD bar 46 and a measurement section 138 which are attached to the side surfaces on the side and the −Y side of table main section 34, respectively, as in wafer table WTB1 previously described. However, the members for various measurements equipped in measurement section 138 of wafer stage WST2 is different from the members for various measurements equipped in measurement section 138 of wafer stage WST1. More specifically, in the fourth embodiment, members for a plurality of types of measurement are placed dispersed at measurement sections 138 that wafer stages WST1 and WST2 each have. Incidentally, in the description below, the pair of aerial image measuring devices configured including measurement plate 30 of wafer table WTB2 will be described as aerial image measuring device 45B.

As the members used for the measurements described above, for example, an uneven illuminance measuring sensor 94 as in the previous description and an illuminance monitor 97 which has a light-receiving section of a predetermined area to receive illumination light IL on the image plane of projection optical system PL as shown in FIG. 43B, and a wavefront aberration measuring instrument 98 and an aerial image measuring instrument as shown in FIG. 44B and the like can be used.

In the fourth embodiment as well, as the measurement members, for example, a member such as a transmittance measuring instrument that measures the transmittance of projection optical system PL, and/or a measuring instrument that observes local liquid immersion device 8 previously described, such as, for example, nozzle unit 32 (or tip lens 191) and the like can be used. Furthermore, members different from the measurement members such as a cleaning member that cleans nozzle unit 32, tip lens 191 or the like may also be mounted on either one of the wafer stages.

Incidentally, also in the fourth embodiment, liquid immersion exposure is performed in which wafer W is exposed with exposure light (illumination light) IL via projection optical system PL and liquid (water) Lq, and accordingly, uneven illuminance measuring sensor 94, illuminance monitor 97, wavefront aberration measuring instrument 98, and the aerial image measuring instrument that are used in measurement using illumination light IL receive illumination light IL via projection optical system PL and water. Further, a part of each sensor, such as, for example, the optical system, can be mounted on the wafer table, or the whole sensor may be placed on the wafer table. The same can be said for aerial image measuring devices 45A and 45B previously described.

Incidentally, although it is omitted in the drawings, a wiring/piping cable (not shown) connects from the −X side end of wafer stage WST1 to a first cable shuttle (not shown) movable in the Y-axis direction arranged on the −X side of base board 12. Similarly, a wiring/piping cable (not shown) connects from the +X side end of wafer stage WST2 to a second cable shuttle (not shown) movable in the Y-axis direction arranged on the +X side of base board 12. By these cables, power supply to the Z leveling mechanism, the measurement members and the like, and the supply of pressurized air to the air sliders and the like arranged in both wafer stages WST1 and WST2 are performed.

Figure 45:
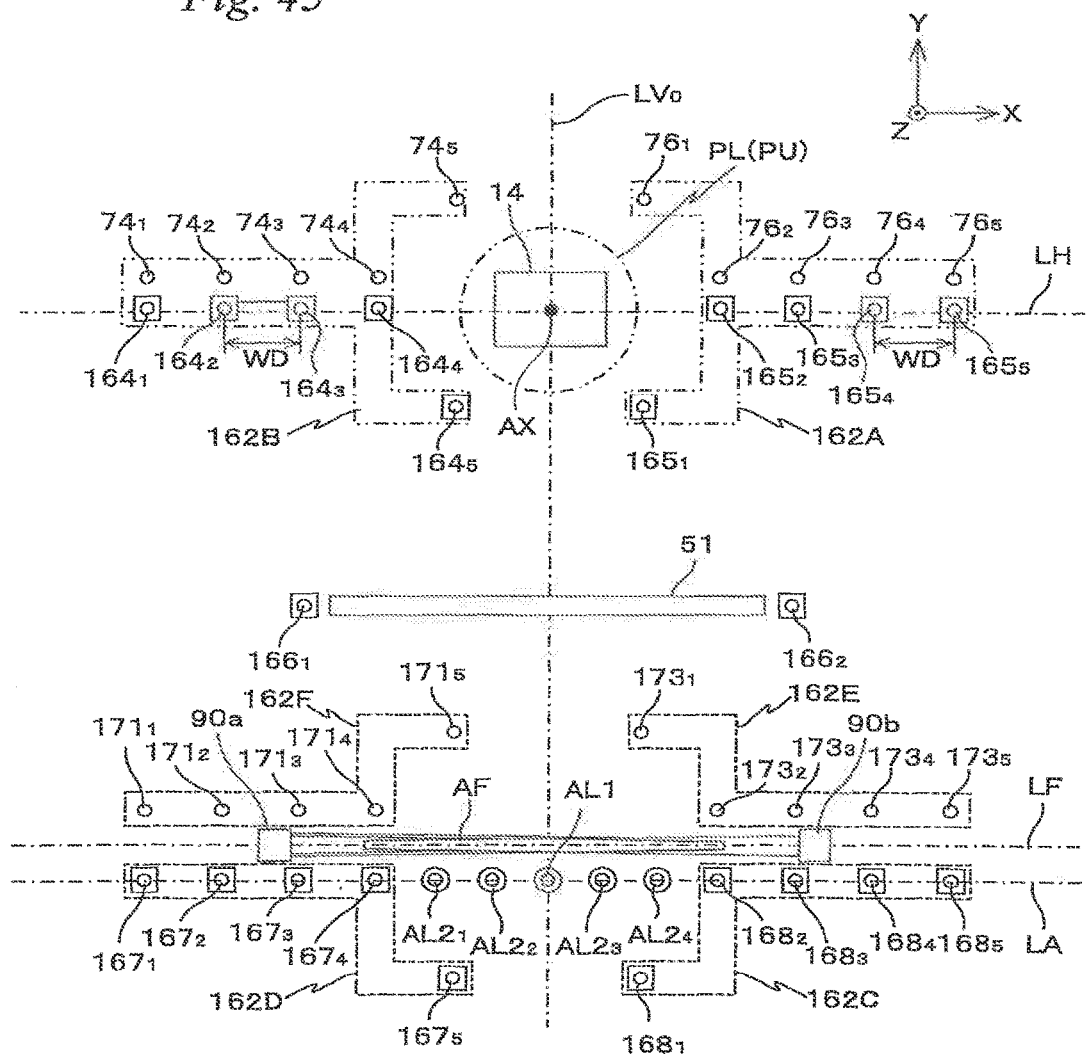

In exposure apparatus 1000 of the fourth embodiment, although it is omitted in FIG. 42 from the viewpoint of avoiding intricacy of the drawing, in actual practice, as shown in FIG. 45, a primary alignment system AL1 having a detection center at a position spaced apart from optical axis AX at a predetermined distance on the −Y side is placed, on a straight line that passes through the center (an optical axis AX of projection optical system PL, also coincides with the center of exposure area IA previously described in the fourth embodiment) of projection unit PU and is also parallel to the Y-axis, or more specifically, on reference axis $LV_0$. Further, on one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to reference axis $LV_0$ are severally arranged. That is, five alignment systems AL1 and $AL2_1$ to $AL2_4$ are placed so that their detection centers are at different positions in the X-axis direction, or more specifically, placed along the X-axis direction.

As each of primary alignment system alignment system. AL1, and secondary alignment systems $AL2_1$ to $AL2_4$, for example, an FIA (Field Image Alignment) system by an image processing method is used. The imaging signal from each of primary alignment system AL1 and the four secondary alignment systems $AL2_1$ to $AL2_4$ is supplied to main controller 20 in FIG. 47, via an alignment signal processing system (not shown)

Next, a configuration and the like of interferometer system 118 which measures the positional information of wafer stages WST1 and WST2 will be described.

On a surface on the +X side (the +X end surface) and a surface on the −X side (the −X end surface) of wafer table WTB1, respectively, mirror-polishing is applied and reflection surfaces 27a and 27c shown in FIG. 43B are formed. Further, on a surface on the +Y side (the +Y end surface) of wafer table WTB1, or more specifically, the +Y end surface of FD bar 46, and on a surface on the −Y side (the −Y end surface) of wafer table WTB1, or more specifically, the −Y end surface of measurement section 138, reflection surfaces 27b and 27d are formed, respectively.

Similarly, mirror-polishing is applied to each of the +X end surface, the −X end surface, the +Y end surface (the +Y end surface of the FD bar), and the −Y end surface (the −Y end surface of the measurement section) of wafer table WTB2, and reflection surfaces 27e, 27g, 27f, and 27h shown in FIG. 44B are formed, respectively.

Figure 46:
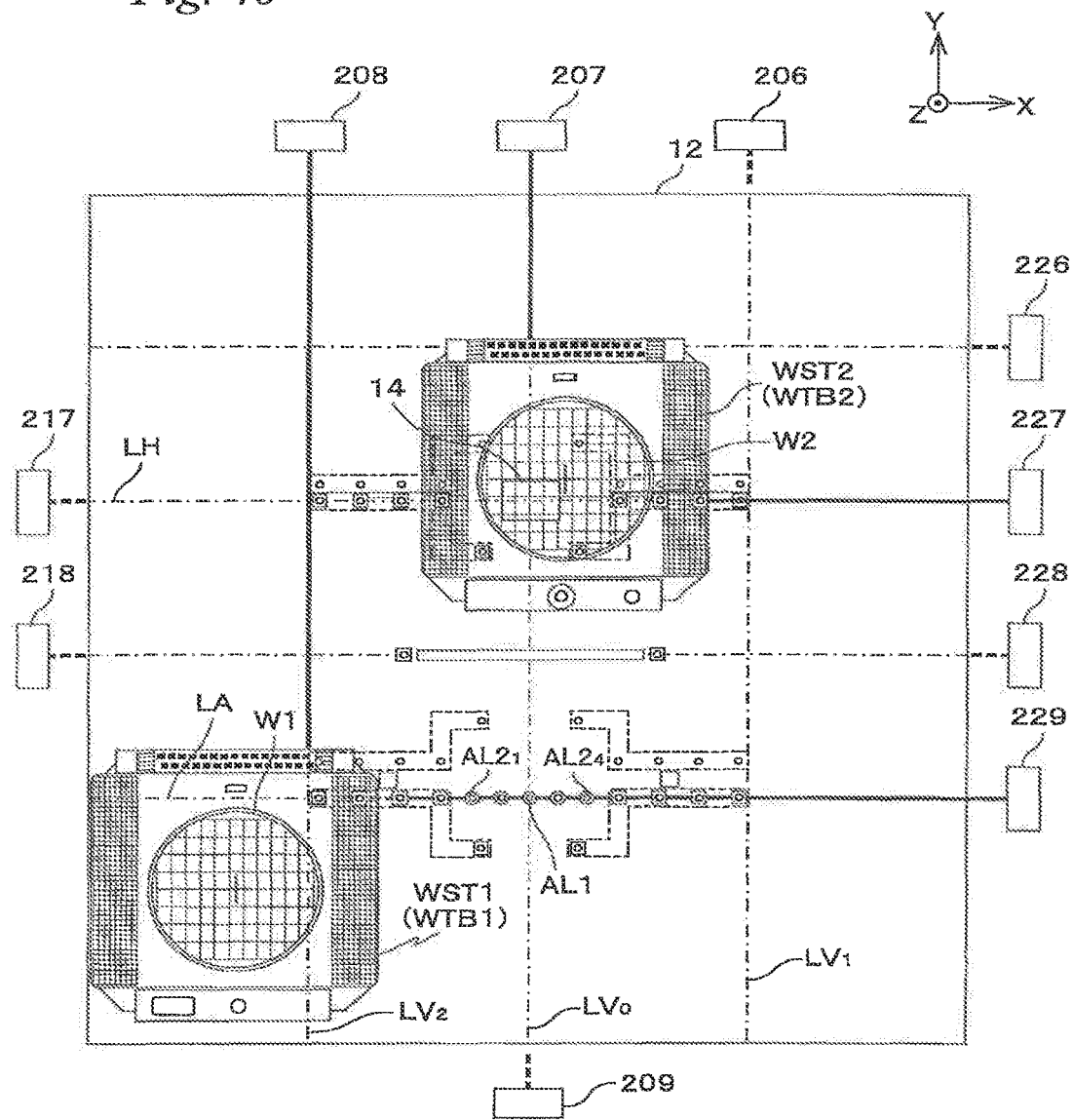
FIG. 46 is a view used to explain a configuration of an interferometer system which constitutes the measurement system.

As shown in FIG. 46, interferometer system 118 includes four Y interferometers 206, 207, 208, and 209, and six X interferometers 217, 218, 226, 227, 228, and 229. Y interferometers 206, 207, and 208 are placed on the +Y side of base board 12, at different positions in the X-axis direction. Y interferometer 209 is placed on the −Y side of base board 12, facing Y interferometer 207. X interferometers 217 and 218 are placed on the −X side of base board 12, at a predetermined distance in the Y-axis direction. Further, X interferometers 226, 227, 228, and 229 are placed at different positions in the Y-axis direction on the +X side of base board 12. Of these interferometers, X interferometers 227 and 228 are placed, facing X interferometers 217 and 218, respectively.

To enter the details, as shown in FIG. 46, Y interferometer 207 is a multiaxial interferometer which uses reference axis $LV_0$ previously described as a substantial measurement axis in the Y-axis direction. Y interferometer 207 irradiates at least three measurement beams parallel to the Y-axis on reflection surface 27b (or reflection surface 27f of wafer table WTB2) of wafer table WTB1, and receives the reflected lights thereof and measures positional information of reflection surface 27b (or 27f) in the Y-axis direction at the irradiation points of each measurement beam. Such positional information is sent to main controller 20 (refer to FIG. 47). Main controller 20 computes a position (Y position) in the Y-axis direction, θz rotation quantity (yawing amount), and θx rotation quantity (pitching amount) of wafer table WTB1 (or WTB2), based on positional information measured with Y interferometer 207.

Y interferometers 206, 208, and 209 are used in a similar manner as Y interferometer 207 to measure the Y position, pitching amount, and yawing amount of wafer table WTB1 (or WTB2). Y interferometers 206 and 208 have substantial measurement axes $LV_1$ and $LV_2$ in the Y-axis direction, which are parallel to reference axis $LV_0$, respectively. Further, Y interferometer 209 uses reference axis $LV_0$ as the substantial measurement axis, and irradiates at least three measurement beams on reflection surface 27d of wafer table WTB1 or on reflection surface 27h of wafer table WTB2.

X interferometers 217 and 227 are multiaxial interferometers which use reference axis LH previously described as substantial measurement axes in the X-axis direction. More specifically, X interferometer 217 irradiates a plurality of measurement beams parallel to the X-axis on reflection surface 27c of wafer table WTB1, and receives each of the reflected lights and measures positional information of reflection surface 27c in the X-axis direction at the irradiation points of each measurement beam. Similarly X interferometer 227 irradiates a plurality of measurement beams parallel to the X-axis on reflection surface 27e of wafer table WTB2, and receives each of the reflected lights and measures positional information of reflection surface 27e in the X-axis direction at the irradiation points of each measurement beam. Such positional information is sent to main controller 20. Main controller 20 computes the X position and the θy rotation quantity (rolling amount) of wafer table WTB1 and WTB2, based on positional information measured by X interferometers 217 and 227, respectively.

X interferometers 218 and 228 consist of multiaxial interferometers similar to X interferometers 217 and 227, and are each used to measure the X position and the θy rotation quantity (rolling amount) of wafer tables WTB1 and WTB2, respectively.

The remaining X interferometers 226 and 229 consist of multiaxial interferometers similar to X interferometers 217 and 227, and are used together to measure the X position and the θy rotation quantity (rolling amount) of wafer tables WTB1 and WTB2. Incidentally, X interferometer 229 uses reference axis LA previously described as a measurement axis.

By using interferometer system 118 including Y interferometers 206, 207, 208, and 209 and X interferometers 217, 218, 226, 227, 228, and 229 as described, positional information of wafer tables WTB1 and WTB2 in directions of five degrees of freedom (X, Y, θx, θy, and θz) can be measured. Incidentally, the multiaxial interferometers, such as, for example, each of the X interferometers, can irradiate a laser beam on a reflection surface (not shown) arranged in a part of a mainframe holding projection unit PU via a reflection surface set on wafer stages WST1 and WST2 inclined at an angle of 45 degrees, and can detect the Z position of wafer stages WST1 and WST2.

Next, the structure and the like of encoder system 150 which measures positional information (including information on the θz rotation) of wafer stages WST1 and WST2 in the XY plane will be described.

In exposure apparatus 1000 of the fourth embodiment, as shown in FIG. 45, two head units 162A and 162B of encoder system 150 are placed on the +X side and −X side of liquid immersion area 14 (nozzle unit 32) previously described with the X-axis direction serving as the longitudinal direction. Although illustration of head units 162A and 162B is omitted in FIG. 45 and the like from the viewpoint of avoiding intricacy of the drawings, in actual practice, head units 162A and 162B are fixed to the main frame previously described that holds projection unit PU in a suspended state via a support member.

Head units 162B and 162A are each equipped with a plurality of (five, in this case) two-dimensional encoder heads (hereinafter, shortly referred to as 2D heads) $164_i$ and $165_j$ (i, j=1 to 5) that are placed at a distance WD in the X-axis direction. More particularly, head units 162B and 162A are each equipped with a plurality of (four, in this case) 2D heads ($164_1$ to $164_4$ or $165_2$ to $165_5$) that are placed on reference axis LH previously described at distance WD except for the periphery of projection unit PU, and a 2D head ($164_5$ or $165_1$) which is placed at a position a predetermined distance away in the −Y direction from reference axis LH in the periphery of projection unit PU, or more specifically, on the −Y side of nozzle unit 32. Head units 162A and 162B are each also equipped with five Z heads which will be described later on. A two-dimensional encoder (a 2D encoder) herein is an encoder head which has sensibility in two axial directions in directions orthogonal to each other, in this case, the X-axis direction and the Y-axis direction, or more specifically, an encoder head whose measurement direction is in the directions of the two orthogonal axes. As the 2D head, for example, a 2D head which has a configuration similar to the 2D head employed in the second and third embodiments previously described (for example, the head shown in FIG. 34) can be used.

Head unit 162A constitutes a multiple-lens (five-lens, in this case) two-dimensional encoder (hereinafter appropriately shortened to "encoder") 170A (refer to FIG. 47) that measures the position of wafer stages WST1 and WST2 in the X-axis direction (the X position) and the Y-axis direction (the Y position) using moving scale 39A previously described. Similarly, head unit 162B constitutes a multiple-lens (five-lens, in this case) two-dimensional encoder 170B (refer to FIG. 47) that measures the X position and Y position of wafer stages WST1 and WST2 using moving scale 39B previously described, in this case, distance WD in the X-axis direction of the five 2D heads ($164_i$ or $165_j$) (more particularly, the measurement beams) that head units 162A and 162B are each equipped with, is set slightly narrower than the width of moving scales 39A and 39B (or more precisely, the two-dimensional gratings) in the X-axis direction.

Further, at a position a predetermined distance away in the −Y direction from 2D heads $164_3$ and $165_3$, 2D heads $166_1$ and $166_2$ are placed. 2D heads $166_1$ and $166_2$ are arranged in a placement symmetric to each other with respect to reference axis $LV_0$. In actual practice, the 2D heads $166_1$ and $166_2$ are fixed to the main frame previously described that holds projection unit PU in a suspended state, via a support member.

2D heads $166_2$ and $166_1$ constitute two-dimensional encoders 170S and 170F (refer to FIG. 47) that measure the X position and the Y position of wafer stages WST1 and WST2 using moving scales 39A and 39B previously described, respectively. On periphery edge exposure operation and the like which will be described later on, 2D heads 1661 and 1662 face moving scales 39B and 39A, respectively, and the X and Y positions, and the θz rotation quantity of wafer stage WST1 or WST2 are measured by 2D heads $166_1$ and $166_2$ (more specifically, two-dimensional encoders 170E and 170F).

In the embodiment, head units 162C and 162D are respectively arranged a predetermined distance away further on the −Y side of 2D heads $166_2$ and $166_1$. Although illustration of head units 162C and 162D is omitted in FIG. 45 and the like from the viewpoint of avoiding intricacy of the drawings, in actual practice, head units 162C and 162D are fixed to the main frame previously described that holds projection unit PU in a suspended state via a support member.

Head unit 162C is equipped with five 2D heads $167_1$ to $167_5$, which are each placed at the same X position as the five 2D heads 64 to 64 belonging to head unit 162B. More particularly, head unit 162D is equipped with four 2D heads $167_1$ to $167_4$ placed on the −X side of the secondary alignment system $AL2_1$ on reference axis LA previously described at a distance WD, and one 2D head $167_5$, which is placed at a position on the −Y side of the secondary alignment system $AL2_1$ located away on the side from the innermost (the +X side) 2D head $167_4$ by a distance WD and is also a predetermined distance away to the −Y side from reference axis LA.

Head unit 162C is symmetrical to head unit 162D with respect to reference axis $LV_0$ previously described, and is equipped with five 2D heads $168_1$ to $168_5$ which are placed in symmetry to five 2D heads $167_5$ to $167_1$ with respect to reference axis $LV_0$. On alignment operation and the like which will be described later on, at least one each of 2D heads $167_p$ and $168_q$ (p, q=1 to 5) faces moving scales 39B and 39A, respectively, and by such 2D heads 167 and 168 (more specifically, two-dimensional encoders 170D and 170C (refer to FIG. 47) which are configured by these 2D heads 167 and 168) the X, Y positions, and the θz rotation of wafer stages WST1 and WST2 are measured. In this case, the distance in the X-axis direction of 2D heads $167_4$ and $168_2$ adjacent to the secondary alignment systems $AL2_1$ and $AL2_4$ in the X-axis direction is also set approximately equal to distance L previously described.

Further, in the fourth embodiment, a baseline measurement of the secondary alignment systems $AL2_1$ to $AL2_4$ is performed in a procedure similar to Sec-BCHK (interval) disclosed in, for example, the pamphlet of International Publication 2007/097379, regularly. At the time of base line measurement of the secondary alignment systems $AL2_1$ to $AL2_4$, the two 2D heads $167_4$ and $168_2$ described above face a pair of reference gratings 52 of FD bar 46, respectively, and by the 2D heads $167_4$ and $168_2$ which face the pair of reference gratings 52, the Y position of FD bar 46 is measured at the position of each reference grating 52. In the description below, the encoders configured by 2D heads $167_4$ and $168_2$ which face the pair of reference gratings 52, respectively, are referred to as Y linear encoders (also shortly referred to as "Y encoders" or "encoders" as needed) 170G and 170H (refer to FIG. 47)

The encoders 170A to 170H described above measure the position coordinates of wafer stages WST1 (or WST2) at a resolution of, for example, around 0.1 nm, and the measurement values are supplied to main controller 20. Main controller 20 controls the XY position (including the θz rotation) of wafer stage WST1 (or WST2) within the XY plane based on the measurement values of encoders 170A and 170B, or 170C and 170D, or 170E and 170F, as well as control the θz rotation of FD bar 46 (wafer stage) based on the measurement values of Y encoders 170G and 170H.

In the fourth embodiment, as 2D heads $164_i$, $165_j$, $166_1$, $166_2$, $167_p$, and $168_q$ described above, for example, an encoder is used of a diffraction interference mode using three gratings, which has two pairs of fixed scales placed in the X-axis direction and the Y-axis direction, and converges diffraction lights of the same order in the directions of the two orthogonal axes generated from the two-dimensional gratings (moving scales 39A and 39B) on each pair of the fixed scales, respectively, on a common index scale. However, besides such a head, a 2D head having any configuration can be used, as long as the XY two-dimensional position of the wafer table can be measured with a single head.

In exposure apparatus 1000 of the fourth embodiment, a multipoint AF system consisting of an irradiation system 90a and a photodetection system 90b is arranged as shown in FIG. 45. In this case, as an example, irradiation system 90a is placed on the +Y side of head unit 162D previously described, and photodetection system 90b is placed on the +Y side of head unit 162C previously described in a state opposing irradiation system 90a. Irradiation system 90a and photodetection system 90b are placed symmetric to each other, with respect to reference axis $LV_0$.

In FIG. 45, the plurality of detection points to which a detection beam is severally irradiated are not individually shown, but are shown as an elongate detection area (beam area) AF that extends in the X-axis direction between irradiation system 90a and photodetection system 90b. Because the length of detection area AF in the X-axis direction is set slightly longer than the diameter of the wafer (W1 and W2) position information (surface position information) in the Z-axis direction across the entire surface of the wafer can be measured by only scanning the wafer once in the Y-axis direction. Further, since detection area AF is placed between liquid immersion area 14 (exposure area IA) and the detection areas of the alignment systems (AL1, $AL2_1$, $AL2_2$, $AL2_3$ and $AL2_4$) in the Y-axis direction, the detection operations of the multipoint AF system and the alignment systems can be performed in parallel. The multipoint AF system 90 is arranged on the mainframe and the like that holds projection unit PU.

Regarding a straight line LF in the X-axis direction passing through the center in the Y-axis direction of detection area AF of the multipoint AF system (90a, 90b), a pair of head units 162E and 162F are placed in a placement almost symmetric to the pair of head units 162C and 162D. Head units 162E and 162F are fixed to the lower surface of the mainframe (not shown). Head units 162E and 162F are arranged in a symmetric placement with respect to reference axis $LV_0$. Head unit 162F has 2D heads $167_1$ to $167_5$ belonging to head unit 162D previously described, and five Z heads $171_1$ to $171_5$ which are placed symmetrical with respect to straight line LF. Further, head unit 162E has 2D heads $168_1$ to $168_5$ belonging to head unit 162C previously described, and five Z heads $173_1$ to $173_5$ which are placed symmetrical with respect to straight line LF. In this case, Z heads $171_1$ to $171_5$ and Z heads $173_5$ to $173_1$ are placed symmetrically with respect to reference line $LV_0$ described.

As Z heads $171_1$ to $171_5$ and Z heads $173_1$ to $173_5$, a sensor head that irradiates a light on wafer table WTB1 or WTB2, or to be more specific, on moving scales 39A and 39B, from above, receives the reflected light and measures position information of the wafer table WTB1 or WTB2 surface in the Z-axis direction at the irradiation point of the light, as an example, a head of an optical displacement sensor (a sensor head by an optical pickup method), which has a configuration like an optical pickup used in a CD drive device, is used.

Furthermore, head units 162B and 162A previously described are respectively equipped with five Z heads $74_i$ and $76_j$ (i, j=1 to 5), which are five heads each, at the same X position as Y heads $164_i$ and $165_j$ (i, j=1 to 5) respectively equipped in head units 162B and 162A, with the Y position shifted. In this case, Z heads $76_2$ to $76_5$ and $74_1$ to $74_4$, which are four heads each on the outer side belonging to head units 162A and 162B, respectively, are placed parallel to reference axis LH a predetermined distance away in the +Y direction from reference axis LH. Further, Z heads $76_1$ and $74_5$, which are heads on the innermost side belonging to head units 162A and 162B, respectively, are placed on the +Y side of projection unit PU. And Z heads $74_i$, $76_j$ (i, j=1 to 5), which are five heads each belonging to head unit 162B and 162A, respectively, are placed symmetric to each other with respect to reference axis $LV_0$.

Z heads $171_1$ to $171_5$, Z heads $173_1$ to $173_5$, Z heads $74_1$ to $74_5$, and Z heads $76_1$ to $76_5$ described above connect to main controller 20 via a signal processing/selection device 160, as shown in FIG. 47. Main controller 20 selects an arbitrary Z head from $171_1$ to $171_5$, Z heads $173_1$ to $173_5$, Z heads $74_1$ to $74_5$, and Z heads $76_1$ to $76_5$ via signal processing/selection device 160 and makes the head move into an operating state, and then receives the surface position information detected by the Z head which is in the operating state via signal processing/selection device 160. In the fourth embodiment, a surface position measurement system 180 that measures positional information of wafer table WTB1 (or WTB2) in the Z-axis direction and the direction of inclination with respect to the XY plane is configured, including Z heads $171_1$ to $171_5$, Z heads $173_1$ to $173_5$, Z heads $74_1$ to $74_5$, and Z heads $76_1$ to $76_5$, and signal processing/selection device 160.

Furthermore, in exposure apparatus 1000 of the fourth embodiment, a periphery edge exposure unit 51 (refer to FIG. 8) having an active mask 51a used for periphery edge exposure extending in the X-axis direction is placed in between 2D heads $166_1$ and $166_2$ previously described, as shown in FIG. 45. Periphery edge exposure unit 51 is supported in a suspended state via a support member (not shown) on the lower surface of the mainframe (not show). In periphery edge exposure unit 51, by switching each micro mirror that constitute a pair of variable shaped masks VM1 and VM2 of the active mask used for periphery edge exposure between an ON state and an OFF state, any areas of the periphery shots on wafer W1 (or W2) positioned below periphery edge exposure unit 51 can be exposed. Incidentally, active mask 51a used for periphery edge exposure of periphery edge exposure unit 51 can be configured by a single variable shaped mask which extends in the X direction. Further, instead of the light from the light source, for example, an optical fiber can be used to guide illumination light IL to the active mask used for periphery edge exposure.

According to periphery edge exposure unit 51, by moving wafer stage WST1 or WST2 in the Y-axis direction in a state where the center of wafer W1 or W2 in the X-axis direction and the center of periphery edge exposure unit 51 in the longitudinal direction almost coincide with each other, an arbitrary pattern can be formed by exposing an arbitrary periphery edge exposure area (for example, refer to areas S1a, S7a, S8a, S16a, S17a, S27a, S50a, S60a, S61a, S69a, S70a, and S76a in FIG. 13) of wafer W1 or W2.

FIG. 47 shows the main configuration of the control system of exposure apparatus 1000. The control system is mainly configured of main controller 20 composed of a microcomputer (or workstation) that performs overall control of the entire apparatus. Incidentally, in FIG. 47, various sensors such as uneven illuminance measuring sensor 94, illuminance monitor 97, and wavefront aberration measuring instrument 98 previously described are collectively shown as a sensor group 99.

Next, a parallel processing operation that uses wafer stage WST1 and wafer stage WST2 will be described, based on FIGS. 48 to 76. Incidentally, during the operation described below, main controller 20 controls liquid supply device 5 and liquid recovery device 6 so that liquid Lq is supplied to the space under tip lens 191 of projection optical system PL as well as is recovered from the space directly under tip lens 191, and a constant quantity of liquid Lq is held between tip lens 191 and wafer table WTB1 and/or WTB2, which constantly forms liquid immersion area 14. However, in the description below, for the sake of simplicity, the explanation related to the control of liquid supply unit 5 and liquid recovery unit 6 will be omitted. Further, many drawings are used in the operation description hereinafter, however, reference codes may or may not be given to the same member for each drawing. More specifically, the reference codes written are different for each drawing, however, such members have the same configuration, regardless of the indication of the reference codes. The same can be said for each drawing used. In the description so far. Incidentally, in FIGS. 48 to 76, only liquid immersion area 14 is illustrated for the sake of convenience, and projection unit PU (projection optical system PL), local liquid immersion device 8 (nozzle unit 22) and the like are omitted.

Figure 48:
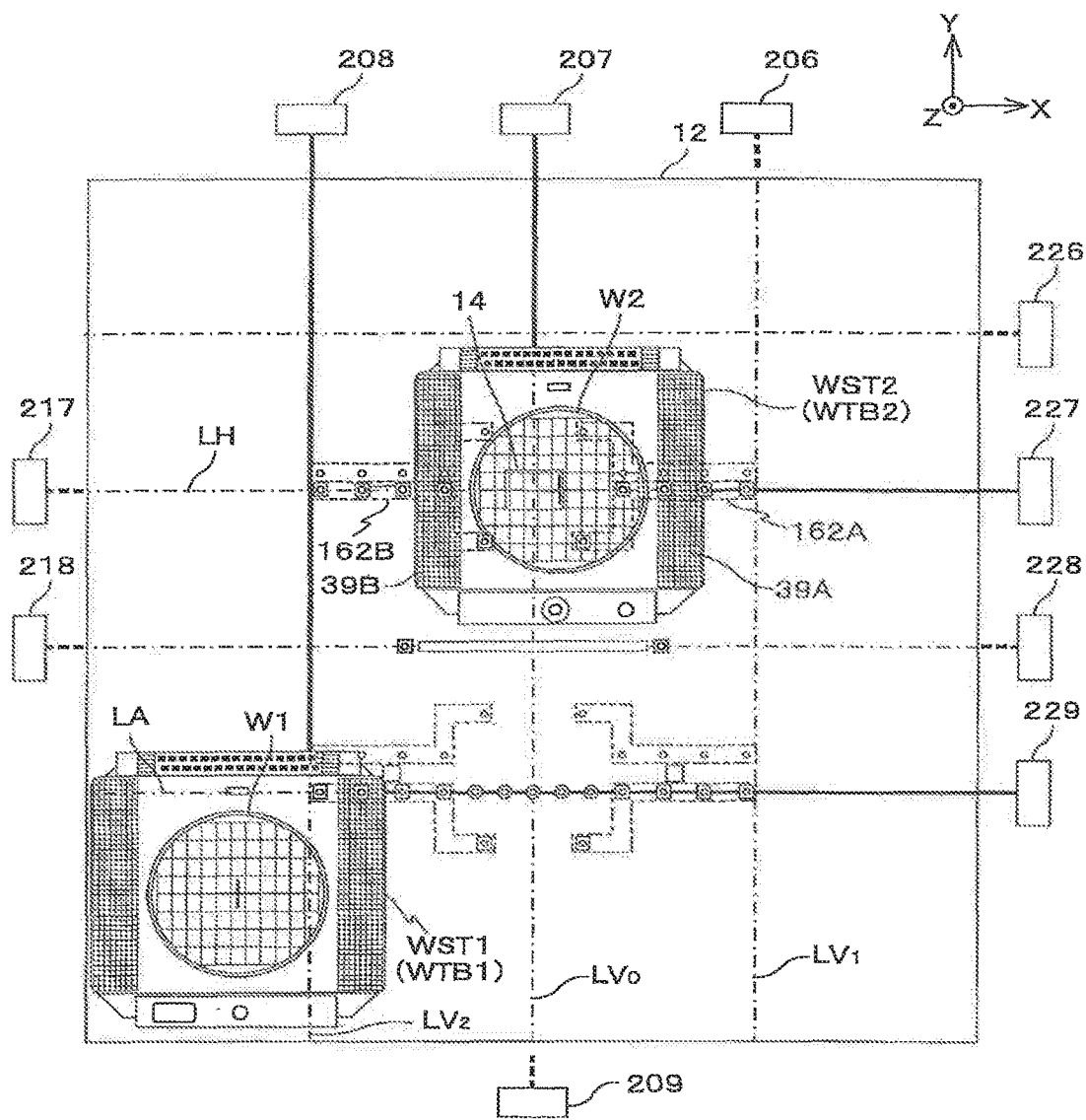
FIG. 48 is a view (No. 1) used to explain a parallel processing operation using wafer stage WST1 and WST2.

FIG. 48 shows a state in which exposure by the step-and-scan method is performed on wafer W2 mounted on wafer stage WST2 below liquid immersion area 14 (projection unit PU), and wafer exchange performed between a wafer carriage mechanism (not shown) and wafer stage WST1, cooling of a wafer holder, and other preparatory operations for exposure (hereinafter referred to as a Pit operation) have been concurrently performed at a left-side loading position. At this point, the position of wafer table WTB1 is controlled by main controller 20, based on measurement values of Y interferometer 208 and X interferometer 229. Further, at this point, the position (including rotation quantity in the θz direction) within the XY plane of wafer table WTB2 is controlled by main controller 20, based on measurement values of 2D heads $165_j$ and $164_i$ (more specifically, two-dimensional encoders 170A and 170B) belonging to head units 162A and 162B, respectively facing moving scales 39A and 39B of wafer table WTB2.

Further, the position in the Z-axis direction and rotation (rolling) in the θy direction of wafer table WTB2 which is being exposed is controlled by main controller 20, based on measurement values of a pair of Z head $74i$ and $76j$ which respectively face the ends on the wafer table WTB2 surface on one side and the other side (movement scale 39B, 39A) in the X-axis direction. Further, the rotation (pitching) in the θx direction of wafer table WTB2 which is being exposed is controlled by main controller 20, based on measurement values of Y interferometer 207. The control (the focus leveling control of wafer W) of the position of wafer table WTB2 in the Z-axis direction, the θy rotation, and the θx rotation during this exposure is performed, based on results of a focus mapping performed beforehand. Furthermore, the position wafer table WTB2 in directions of five degrees of freedom, except for the Z-axis direction, is also measured by interferometers 207 and 227.

The exposure operation described above is performed by main controller 20, based on results of wafer alignment (for example, EGA) that has been performed beforehand and on the latest baseline and the like of alignment systems AL1, and $AL2_1$ to $AL2_4$, by repeating a movement operation between shots in which wafer stage WST is moved to a scanning starting position (an acceleration starting position) for exposure of each shot area on wafer W2, and a scanning exposure operation in which a pattern formed on reticle R is transferred onto each shot area by a scanning exposure method. Incidentally, the number of rows of shot areas subject to exposure on wafer W2 is even, and in the exposure described above, exposure is performed in a complete alternate scan, in the order from a shot area located on the upper left side in FIG. 48 to a shot area located on the lower left side.

Figure 49:
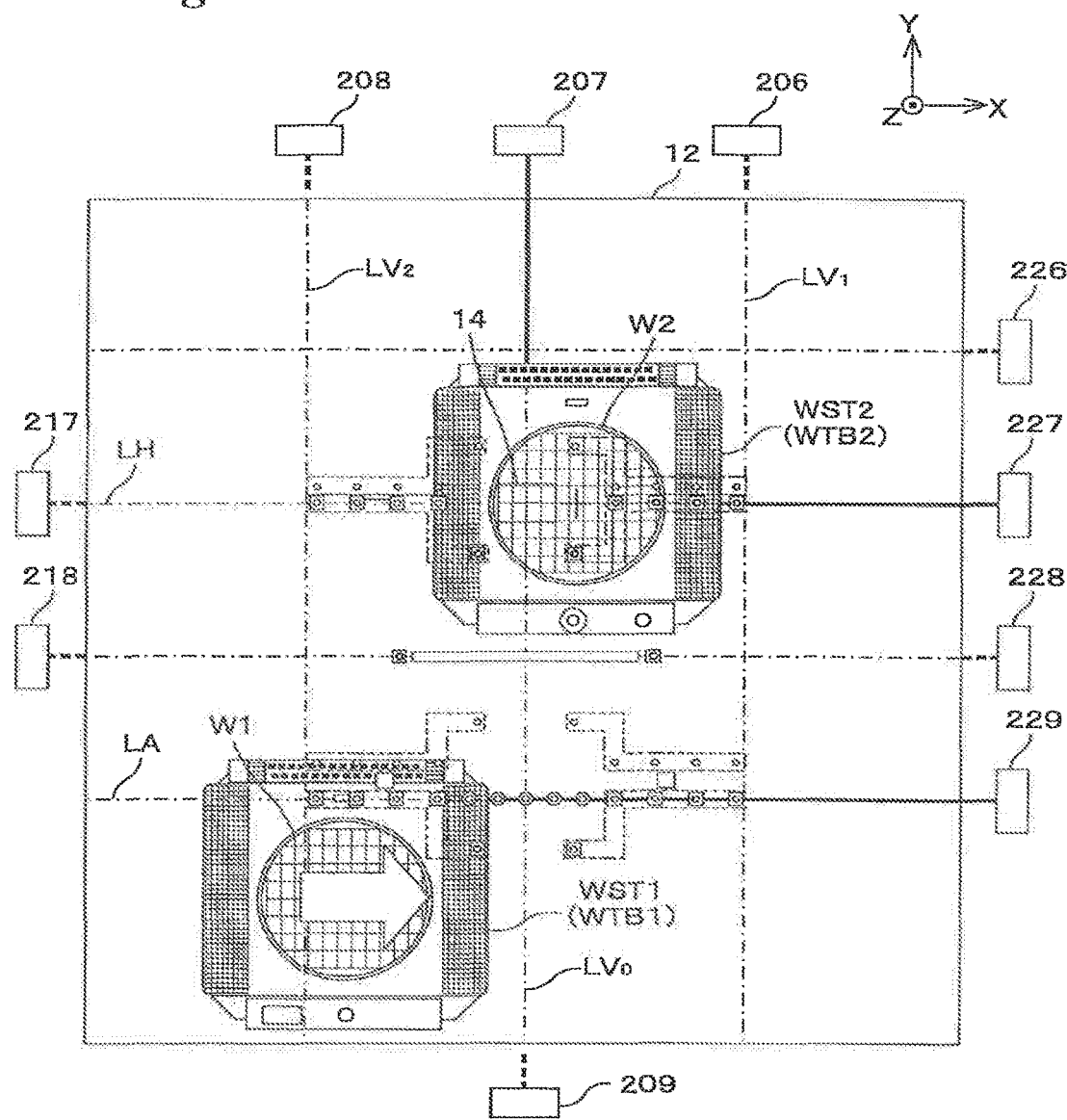
FIG. 49 is a view (No. 2) used to explain a parallel processing operation using wafer stage WST1 and WST2.
Figure 50:
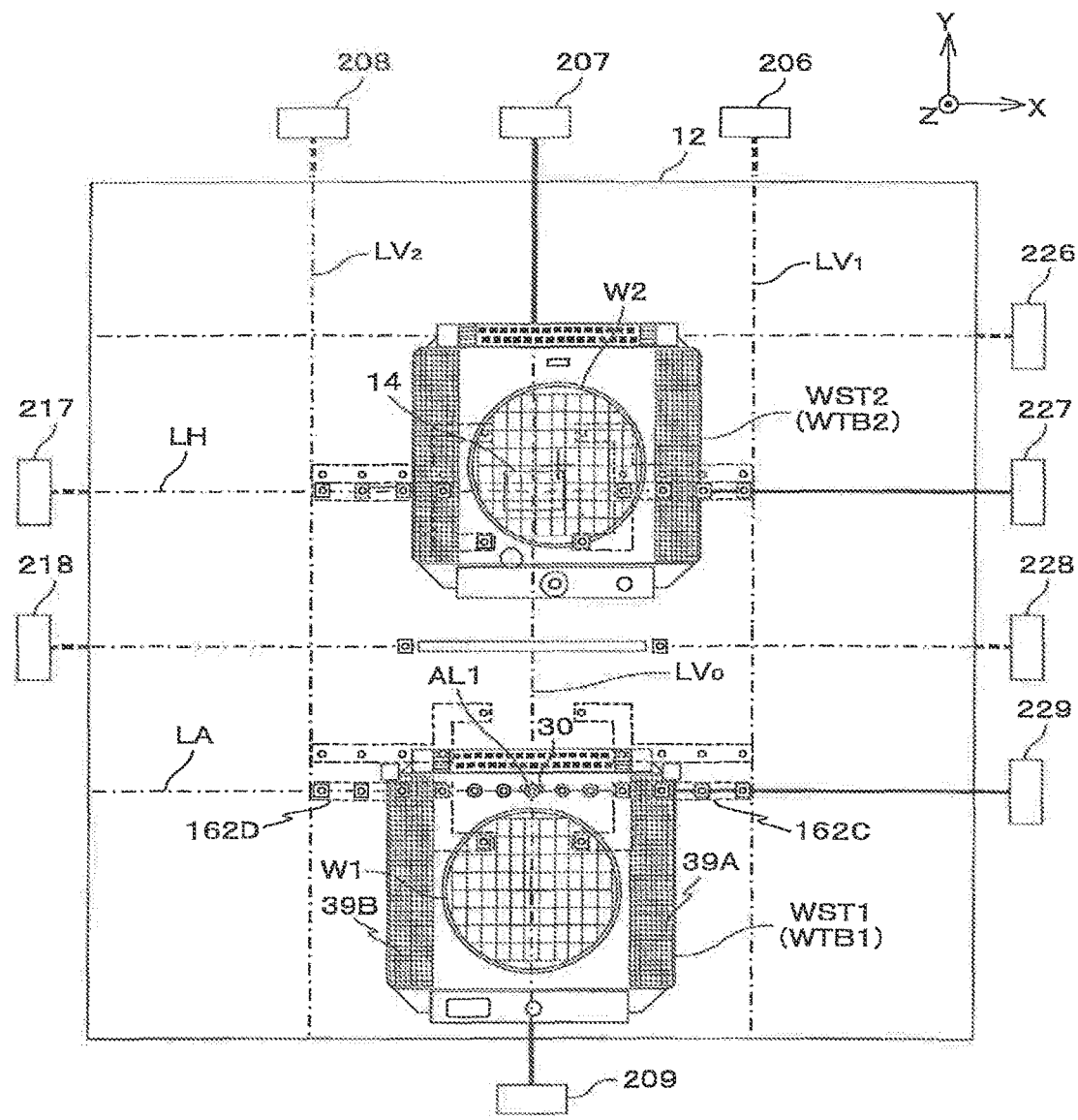
FIG. 50 is a view (No. 3) used to explain a parallel processing operation using wafer stage WST1 and WST2.

While exposure by the step-and-scan method of wafer W2 on wafer table WTB2 is being continued in the manner described above, main controller 20 begins the drive of wafer stage WST1 in the +X direction, as shown in FIG. 49. And, wafer stage WST1 is moved to a position where a reference mark FM on measurement plate 30 is positioned within a field (a detection area) of primary alignment system AL1, as shown in FIG. 50. During this movement, main controller 20 switches the control of the position of wafer table WTB1 within the XY plate from a control based on measurement values of interferometers 208 and 229 previously described to a control based on 2D heads $167_p$ and $168_q$ (p, q=1 to 5) belonging to head units 162D and 162C facing moving scales 39B and 39A of wafer table WTB1, or more specifically, to a control based on measurement values of two-dimensional encoders 170D and 170C.

Then, when wafer stage WST1 moves to the position shown in FIG. 50, main controller 20 performs a reset (origin reset) of Y interferometer 209, X interferometer 229, and two-dimensional encoders 170D and 170C, prior to starting wafer alignment (and other preprocessing measurements) of a new wafer W1.

When the reset of interferometers 209, 229, and two-dimensional encoders 170D and 170C are completed, main controller 20 uses primary alignment system AL1 to detect reference mark FM on measurement plate 30 of wafer stage WST1. And, main controller 20 detects the position of reference mark FM with the index center of primary alignment system AL1 serving as a reference, and makes a link between the detection results and the measurement values of encoders 170C and 170D at the time of the detection, and then stores them in memory.

Figure 51:
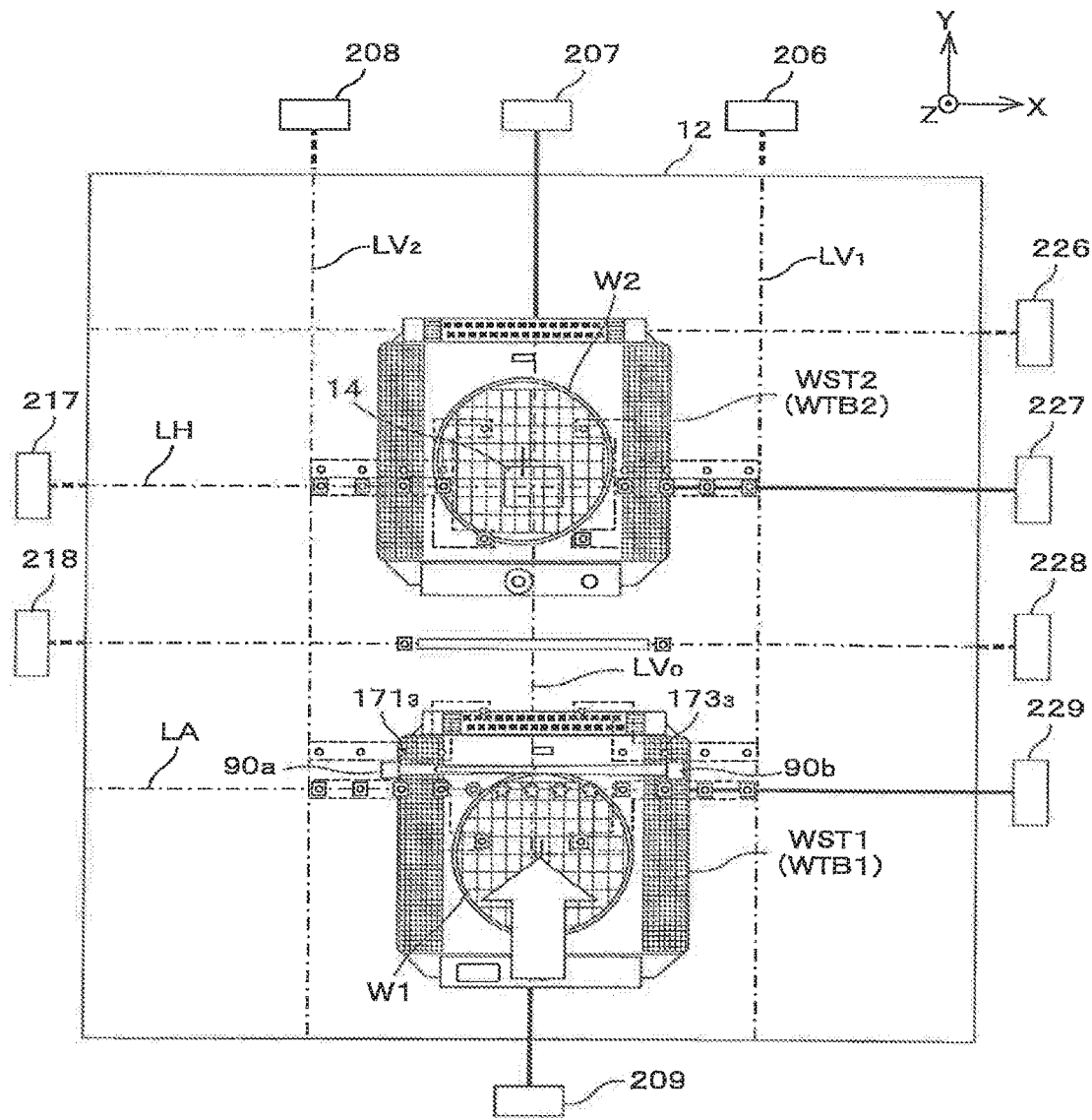
FIG. 51 is a view (No. 4) used to explain a parallel processing operation using wafer stage WST1 and WST2.

Next, main controller 20 begins the scanning (scan) of wafer stage WST1 in the direction, and moves wafer stage WST1 to the alignment area, as shown in FIG. 51. Then, main controller 20 begins enhanced global alignment (EGA) using encoders 170C and 170D (and interferometers 209 and 229), while measuring the position coordinates of wafer stage WST2. More specifically, while wafer stage WST1 is moved in the X-axis direction and a step movement in the Y-axis direction is also performed, main controller 20 detects a part of a plurality of alignment marks arranged in a plurality of shot areas (sample shot areas) which are specified on wafer W1 using at least one alignment system that includes primary alignment system AL1 for each step position, and makes a link between the detection results and the measurement values of encoders 170C and 170D at the time of the detection, and then stores them in memory (not shown).

FIG. 51 shows a state where alignment marks arranged in four sample shot areas are detected almost simultaneously and individually, using primary alignment system AL1, and secondary alignment systems $AL2_2$, $AL2_3$, and $AL2_4$ (refer to the star-shaped marks in FIG. 51). At this point, exposure by the step-and-scan method of wafer W2 held on wafer table WTB2 is being continued.

After the scanning (scan) of wafer stage WST1 in the +Y direction begins in the manner described above until wafer stage WST1 moves in the +Y direction and detection beams of multipoint AF system (90a, 90b) begin to irradiate wafer W1, main controller 20 activates (turns ON) two Z heads $171_p$ and $173_q$ (for example, $171_3$ and $173_3$) that face moving scales 39B and 39A, respectively, and multipoint AF system (90a, 90b) together, and begins focus mapping.

In this case, focus mapping in the fourth embodiment refers to a process of taking in positional information (surface position information) in the Z-axis direction of the surface (the surface of plate 28, or to be specific, the surface of moving scales 39B and 39A) of wafer table WTB1 (or WTB2) measured by Z heads $171_p$ and $173_q$ and positional information (surface position information) in the Z-axis direction of the surface of wafer table WTB1 (or WTB2) at a plurality of detection points detected by multipoint AF system (90a, 90b) at a predetermined sampling interval, in a state where Z heads $171_p$ and $173_q$ and multipoint AF system (90a, 90b) are operating simultaneously and while wafer stage WST1 (or WST2) is proceeding in the +Y direction (refer to FIGS. 51 to 55), making each surface position information which has been taken in and the measurement values of encoders 170C and 170D at the time of each sampling correspond to one another, and then sequentially storing the information in memory (not shown).

Figure 52:
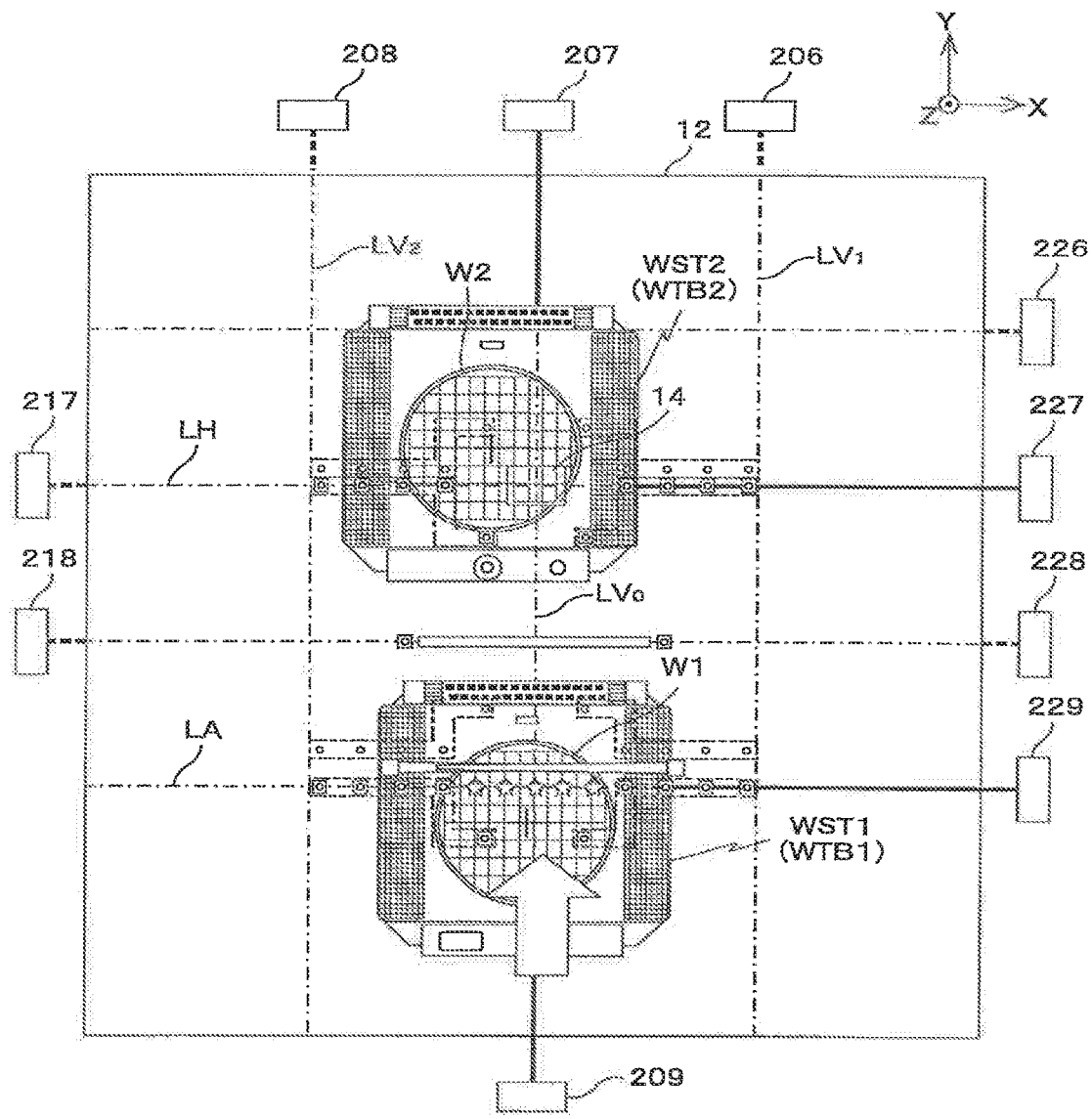
FIG. 52 is a view (No. 5) used to explain a parallel processing operation using wafer stage WST1 and WST2.

After the focus mapping has started, main controller 20 moves wafer stage WST1 in the +Y direction by a predetermined distance as well as in the −X direction by a predetermined distance based on the measurement values of encoders 170C and 170D, and sets the position of wafer stage WST1 at a position where five alignment systems AL1, and $AL2_1$ to $AL2_4$ can detect alignment marks arranged in five sample shot areas on wafer W almost simultaneously and individually, as shown in FIG. 52. Then, main controller 20 detects the five alignment mark substantially at the same time as well as individually (refer to the star-shaped marks in FIG. 52), using the five alignment systems AL1, and $AL2_1$ to $AL2_4$, and makes a link between the detection results of the five alignment systems AL1, and $AL2_1$ to $AL2_4$ and the measurement values of encoders 170C and 170D at the time of the detection, and then stores them in memory (not shown). At this point, focus mapping performed on the wafer stage WST1 side, and exposure by the step-and-scan method of wafer W2 held on wafer table WTB2 previously described are being continued.

Figure 53:
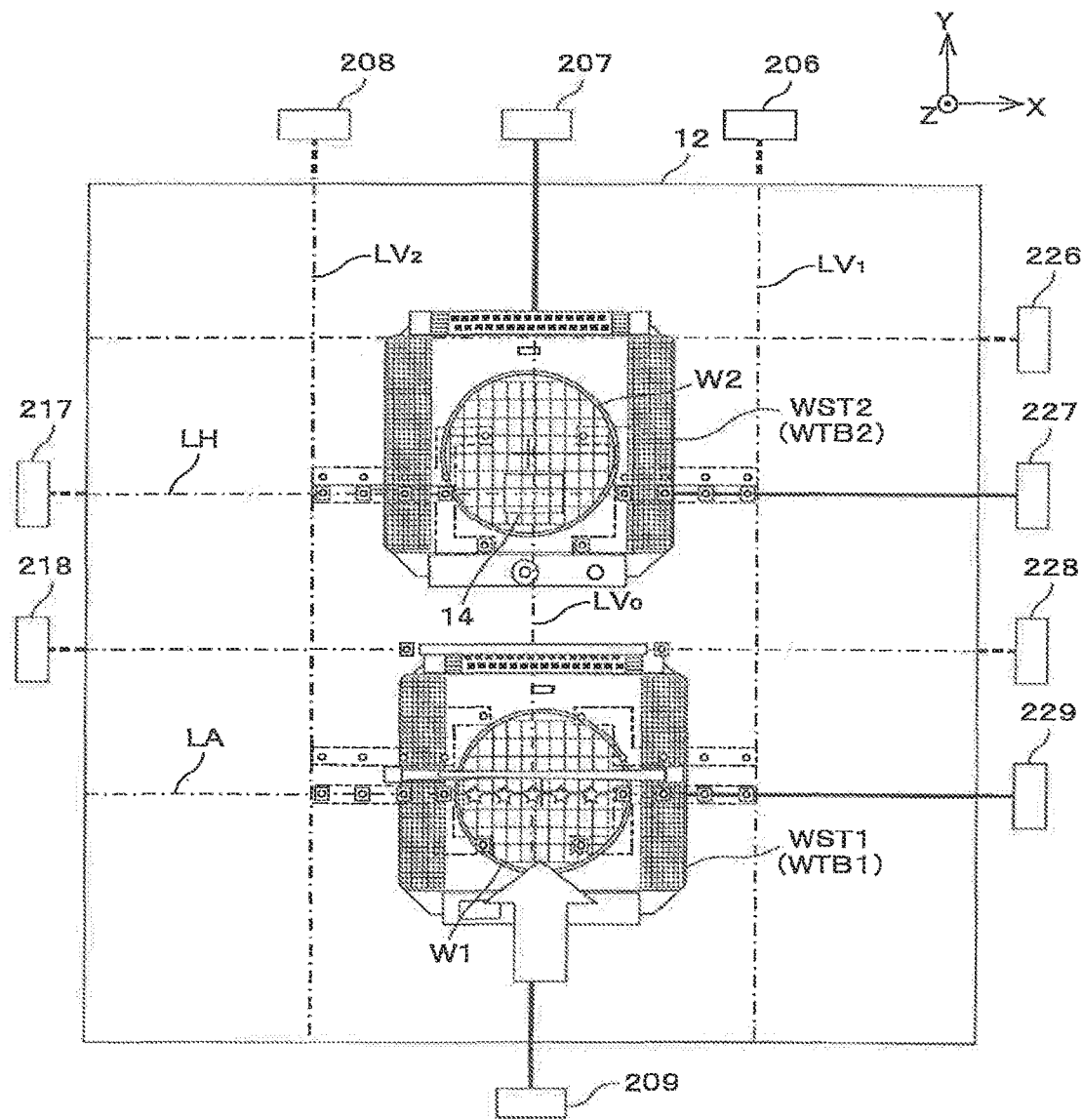
FIG. 53 is a view (No. 6) used to explain a parallel processing operation using wafer stage WST1 and WST2.

Next, main controller 20 moves wafer stage WST1 in the +Y direction by a predetermined distance as well as in the +X direction by a predetermined distance based on the measurement values of encoders 170C and 170D, and sets the position of wafer stage WST1 at a position where five alignment systems AL1 and $AL2_1$ to $AL2_4$ can detect alignment marks arranged in five sample shot areas on wafer W almost simultaneously and individually, as shown in FIG. 53. Then, main controller 20 detects the five alignment mark substantially at the same time as well as individually (refer to the star-shaped marks in FIG. 5), using the five alignment systems AL1, and $AL2_1$ to $AL2_4$, and makes a link between the detection results of the five alignment systems AL1, and $AL2_1$ to $AL2_4$ and the measurement values of encoders 170C and 170D at the time of the detection, and then stores them in memory (not shown). At this point, focus mapping performed on the wafer stage WST1 side, and exposure by the step-and-scan method of wafer W2 on wafer table WTB2 previously described are being continued.

Figure 54:
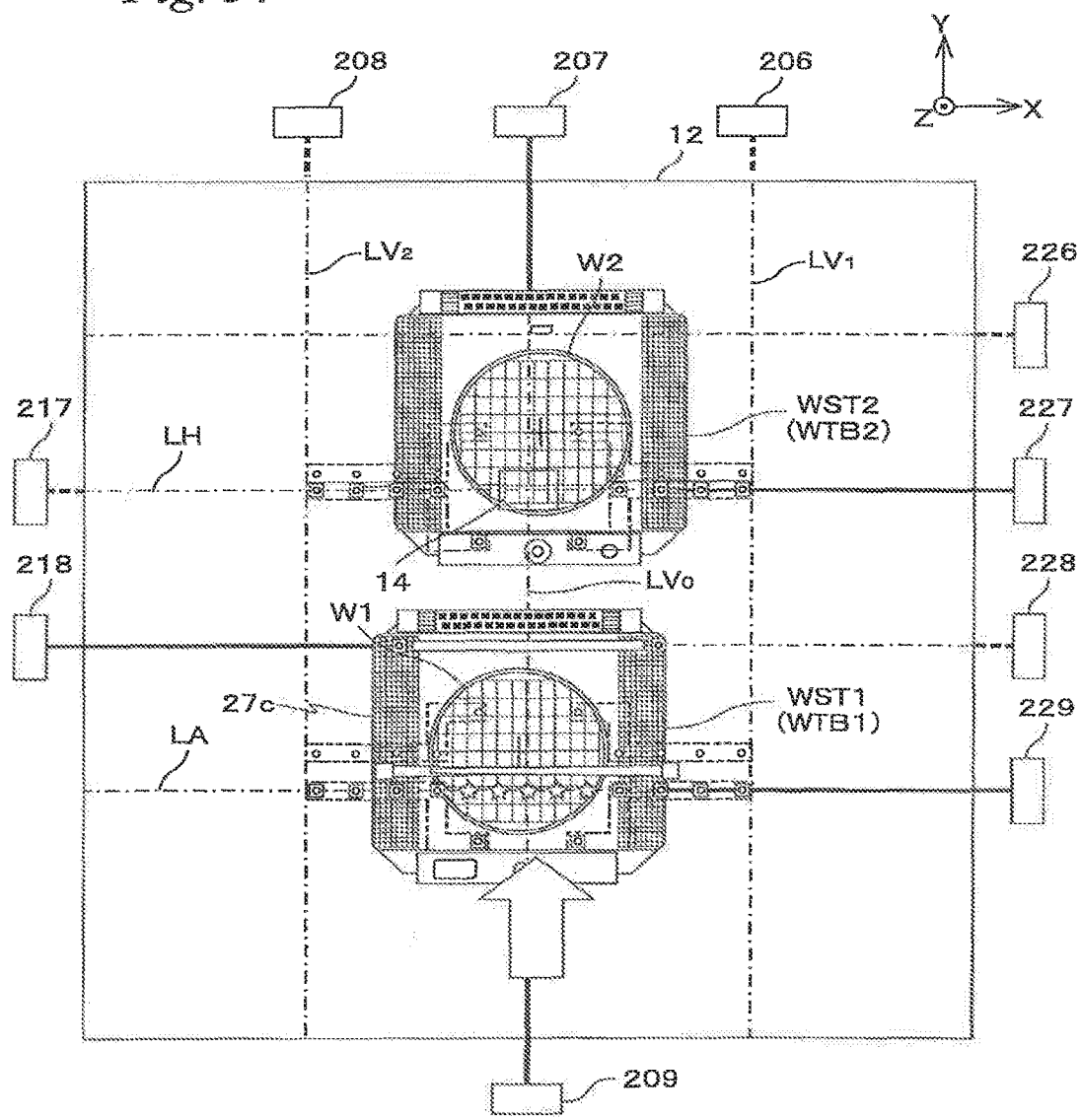
FIG. 54 is a view (No. 7) used to explain a parallel processing operation using wafer stage WST1 and WST2.

Next, main controller 20 moves wafer stage WST1 in the +Y direction by a predetermined distance as well as in the −X direction by a predetermined distance based on the measurement values of encoders 170C and 170D, and sets the position of wafer stage WST1 at a position where five alignment systems AL1 and $AL2_1$ to $AL2_4$ can detect alignment marks arranged in five sample shot areas on wafer W almost simultaneously and individually, as shown in FIG. 54. Then, main controller 20 detects the five alignment mark substantially at the same time as well as individually (refer to the star-shaped marks in FIG. 54), using the five alignment systems AL1, and $AL2_1$ to $AL2_4$, and makes a link between the detection results of the five alignment systems AL1, and $AL2_1$ to $AL2_4$ and the measurement values of encoders 170C and 170D at the time of the detection, and then stores them in memory (not shown). At this point, because a measurement beam from X interferometer 218 begins to irradiate reflection surface 27c of wafer table WTB1, main controller 20 pre-sets X interferometer 218 based on measurement values of X interferometer 229 (or measurement values of encoders 170C and 170D) at this point. By this operation, the X position and the rotation quantity (rolling amount) in the θy direction of wafer table WTB1 can also be measured by X interferometer 218 hereinafter. At this point, focus mapping performed on the wafer stage WST1 side, and exposure by the step-and-scan method of wafer W2 held on wafer table WTB2 previously described are being continued.

Figure 55:
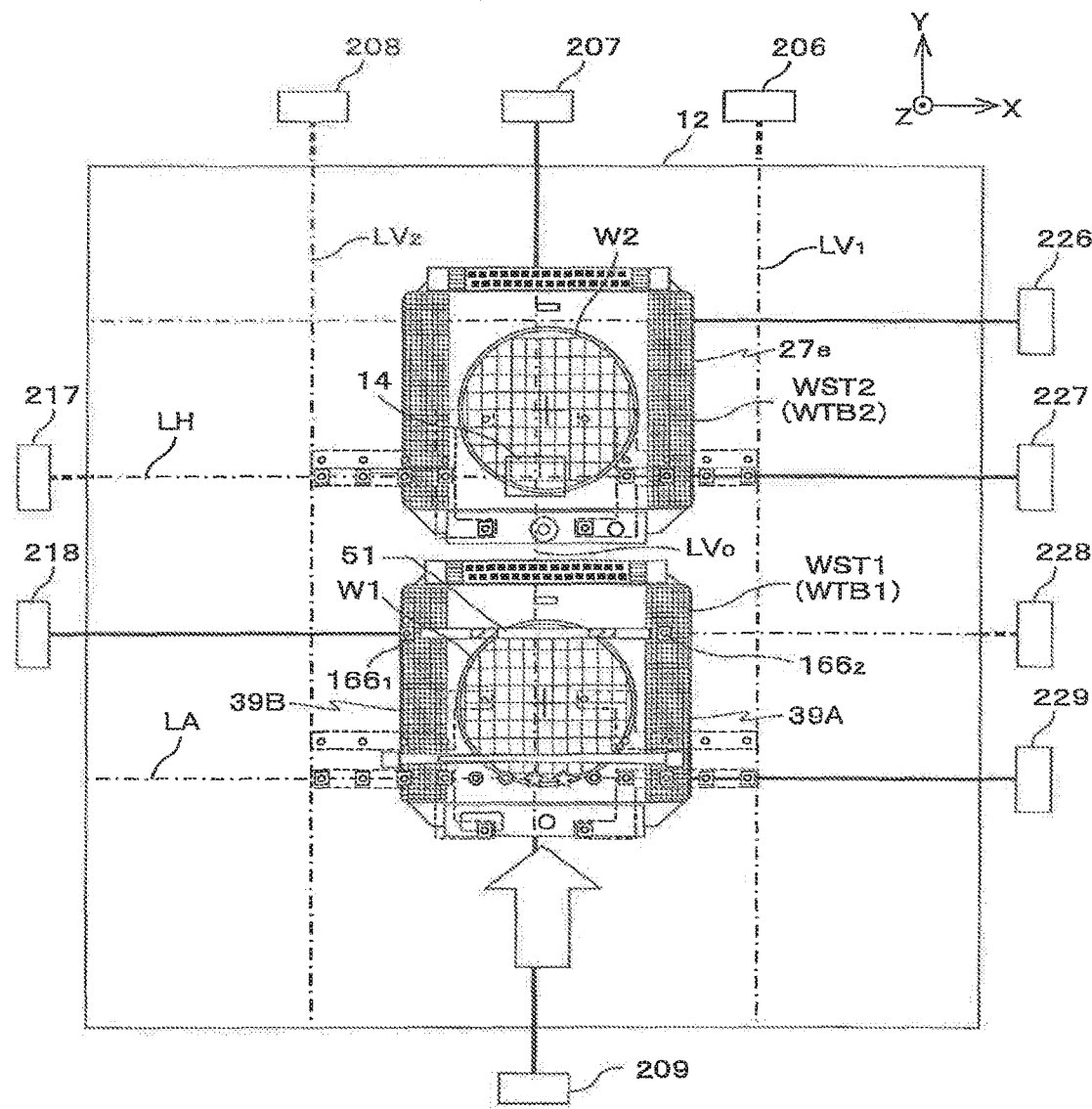
FIG. 55 is a view (No. 8) used to explain a parallel processing operation using wafer stage WST1 and WST2.

Next, main controller 20 moves wafer stage WST in the +Y direction by a predetermined distance as well as in the +X direction by a predetermined distance based on the measurement values of encoders 170C and 170D, and sets the position of wafer stage WST at a position where alignment systems AL1 and $AL2_3$ can detect alignment marks arranged in the last two sample shot areas on wafer W almost simultaneously and individually, as shown in FIG. 55. Then, main controller 20 detects the two alignment mark substantially at the same time as well as individually (refer to the star-shaped marks in FIG. 55), using the two alignment systems AL1 and $AL2_3$, and makes a link between the detection results of the two alignment systems AL1 and $AL2_3$ and the measurement values of encoders 170C and 170D at the time of the detection, and then stores them in memory (not shown). Exposure of the step-and-scan method to wafer W2 in wafer stage WST2 is finished then. However, at this point in time, the focus mapping on the wafer stage WST1 side previously described is continued. Because a measurement beam from X interferometer 226 begins to irradiate reflection surface 27e of wafer table WTB2 before wafer stage WST2 arrives at the exposure completing position, main controller 20 pre-sets X interferometer 226 based on measurement values of X interferometer 227 (or measurement values of encoders 170A and 170B).

Prior to completing the exposure described above, main controller 20 begins periphery edge exposure (periphery scanning exposure) of wafer W1 by the scanning exposure method, using periphery edge exposure unit 51 (refer to FIG. 55). As it can be seen from FIG. 55, at the point when the periphery edge exposure begins, because 2D heads $166_2$ and $166_1$ face moving scales 39A and 39B, main controller 20 hereinafter also begins measurement of positional information of wafer stare WST1 within the X plane, based on measurement values of 2D heads $166_2$ and $166_1$, or more specifically, measurement values of encoders 170E and 170F.

Figure 56:
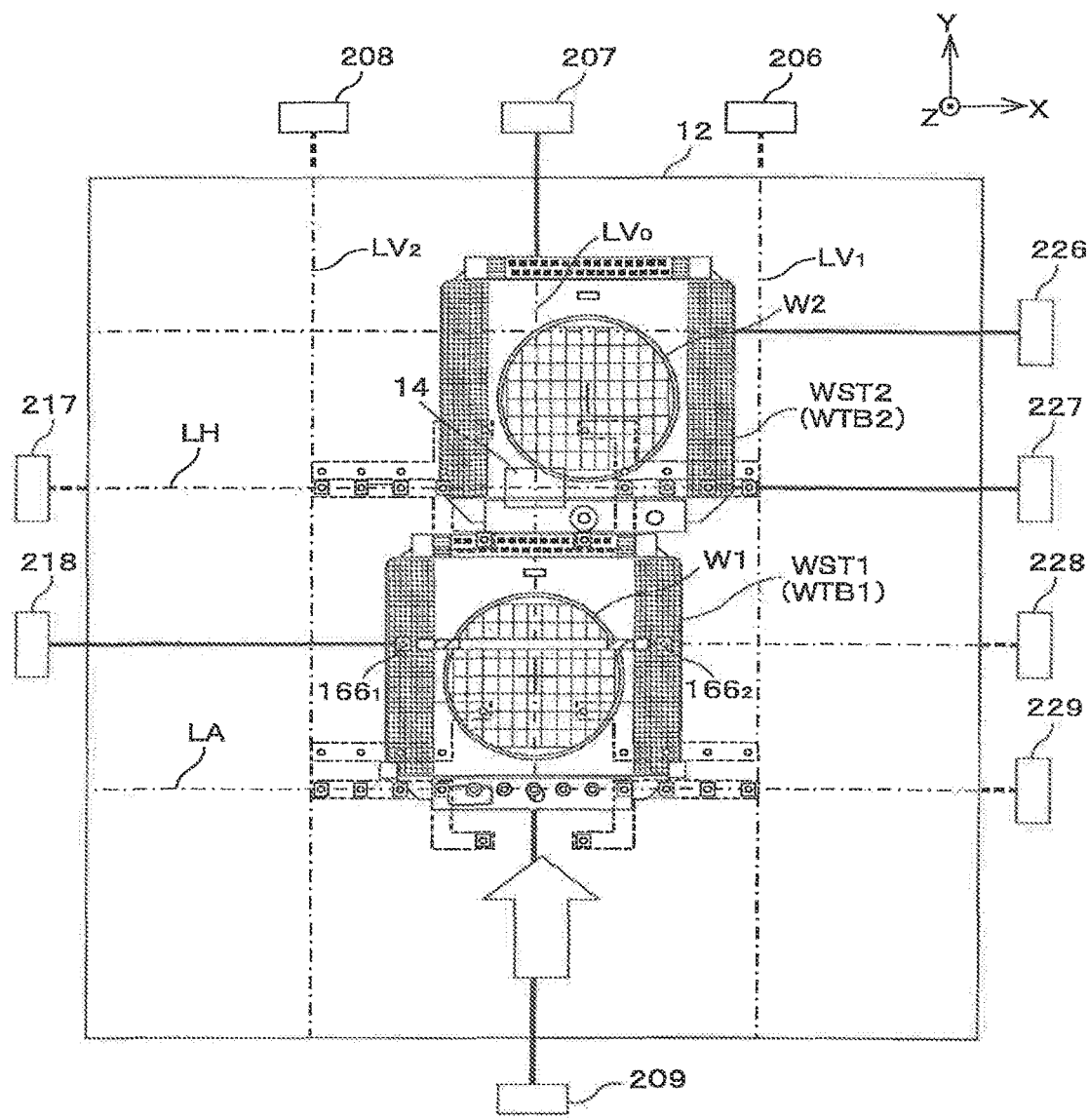
FIG. 56 is a view (No. 9) used to explain a parallel processing operation using wafer stage WST1 and WST2.

Subsequently, main controller 20 moves wafer stage WST1 and wafer stage WST2 to a first scrum starting position shown in FIG. 56 while continuing the per heap scanning exposure. Prior to this, the encoder used for the measurement of the positional information in the XY plane of wafer stage WST1 is changed from encoders 170C and 170D to encoders 170E and 170F.

And when wafer stages WST1 and WST2 arrive at the first scrum starting position, main controller 20 stops (turns OFF) the operation of the multipoint AF system (90a, 90b) (and Z heads $171_p$ and $173_q$) and completes the focus mapping, and then converts the surface position information on each detection point of the multipoint AF system (90a, 90b) into data which uses the surface position information by Z heads $171_p$ and $173_q$ taken in simultaneously as a reference. The conversion in this case is performed in a method similar to the method disclosed in, for example, the pamphlet of International Publication No. 2007/097379.

By obtaining such converted data in advance in the manner described above, for example, in the case of exposure and the like, main controller 20 measures the wafer table WTB1 surface (a point on the areas where scales 39YB and 39A are each formed) with Z heads $74_i$ and $76_j$ previously described, and computes the Z position and the amount of tilt (mainly the θy rotation amount) with respect to the XY plane of wafer table WTB1. And by using the Z position and the amount of tilt (mainly the θy rotation amount) with respect to the XY plane of wafer table WTB1 that has been computed and the conversion data previously described, surface position control of the wafer W upper surface becomes possible without actually acquiring the surface position information of the wafer surface.

Because EGA is also completed at the point when the focus mapping described above is completed, main controller 20 uses the measurement values of the two encoders 170C and 170D described above which correspond to the detection results of the plurality of alignment marks which has been acquired so far and the baseline of the secondary alignment system $AL2_n$ measured in advance to perform a statistics operation by the EGA method disclosed in, for example, U.S. Pat. No. 4,780,617 and the like, and computes the arrays (position coordinates) of all the shot areas on wafer W1 on a coordinate system (for example, an XY coordinate system (alignment coordinate system) which uses the detection center of primary alignment system AL1 as the origin) which is set by the measurement axes of the two encoders 170C and 170D (the two head units 162C and 162D) described above.

As described above, in the fourth embodiment, main controller 20 makes wafer stage WST1 move back and forth in a zigzag manner while moving wafer stage WST1 in the +Y direction, and sets the position of wafer stage WST1 at a plurality of points on the movement path, and on each position setting, detects alignment marks using at least two alignment systems simultaneously out of the five alignment systems AL1, and $AL2_1$ to $AL2_4$. Therefore, according to the fourth embodiment, positional information of alignment marks in the plurality of sample shot areas on wafer W1 can be obtained in a remarkably shorter period of time, compared with the case where a single alignment system sequentially detects the alignment marks. Accordingly, even if all the shot areas on wafer W1 serves as a sample shot area, measurement within a short period of time is possible.

And, in a state where both wafer stages WST1 and WST2 are moved to the first scrum starting position, the stages move into a scrum state in which the −Y end surface (the −Y end surface of measurement section 138) of wafer table WTB2 and the +Y end surface (the +Y end surface of FD bar 46) of wafer table WTB1 come into contact (or in proximity via a clearance of around 300 μm), in a state where the center line of wafer table WTB1 substantially coincides with reference axis $LV_0$ and the center line of wafer table WTB2 is shifted by a predetermined distance (a first offset amount) to the +X side of reference axis $LV_0$. More specifically, in this scrum state, by the −Y side end of measurement section 138 configuring a part of wafer table WTB2 and the +Y end of FD bar 46 configuring a part of wafer table WTB1 being in contact (or in proximity), wafer stage WST1 and wafer stage WST2 can be in contact (or in proximity) in the Y-axis direction via FD bar 46 and measurement section 138, in a state where a part of the surface on the +Y side of wafer stage WST1 face a part of the surface on the −Y side of wafer stage WST2.

The total length of the length of measurement section. 138 of wafer table WTB2 in the Y-axis direction and the length of FD bar 46 of wafer table WTB1 in the Y-axis direction is set to a level of length so that wafer stage WST1 and wafer stage WST2 (or more specifically, the +Y side end of air slider 54 of wafer stage WST1 and the −Y side end of air slider 54 of wafer stage WST2) can be kept from being in contact in a state where measurement section 138 and FD bar 46 are in contact.

Figure 57:
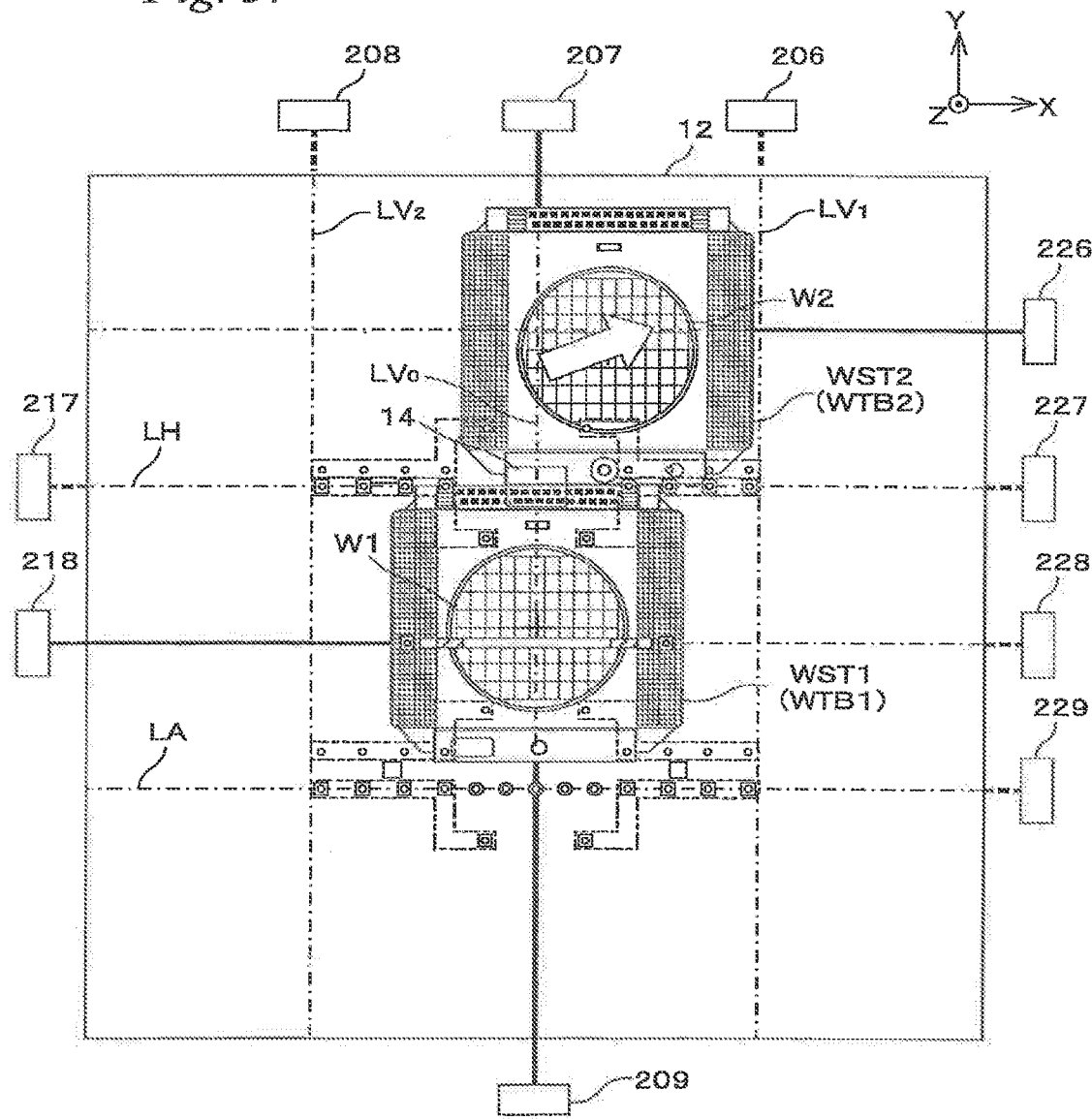
FIG. 57 is a view (No. 10) used to explain a parallel processing operation using wafer stage WST1 and WST2.

Main controller 20 drives wafer stage WST1 in the +Y direction, based on measurement values of encoders 170E and 170F while maintaining the scrum state, and simultaneously drives wafer stage WST2 in the +Y direction and the +X direction as shown in the outlined bold arrow shown in FIG. 57, based on measurement values of interferometers 207 and 226. During this movement of both wafer stages WST1 and WST2, the periphery scanning exposure is being continued.

Along with wafer stages WST1 and WST2 moving in their movement directions while keeping the scrum state, liquid immersion area 14 formed in the space between tip lens 191 and wafer table WTB2 moves from above wafer table WTB2 to wafer table WTB1. FIG. 57 shows a state of both wafer stages WST1 and WST2 just before liquid immersion area 14 is passed to table main section 34 of wafer table WTB1 from above wafer table WTB2, via measurement section 138 of wafer table WTB2 and FD bar 46 of wafer table WTB1, during such movement.

Figure 58:
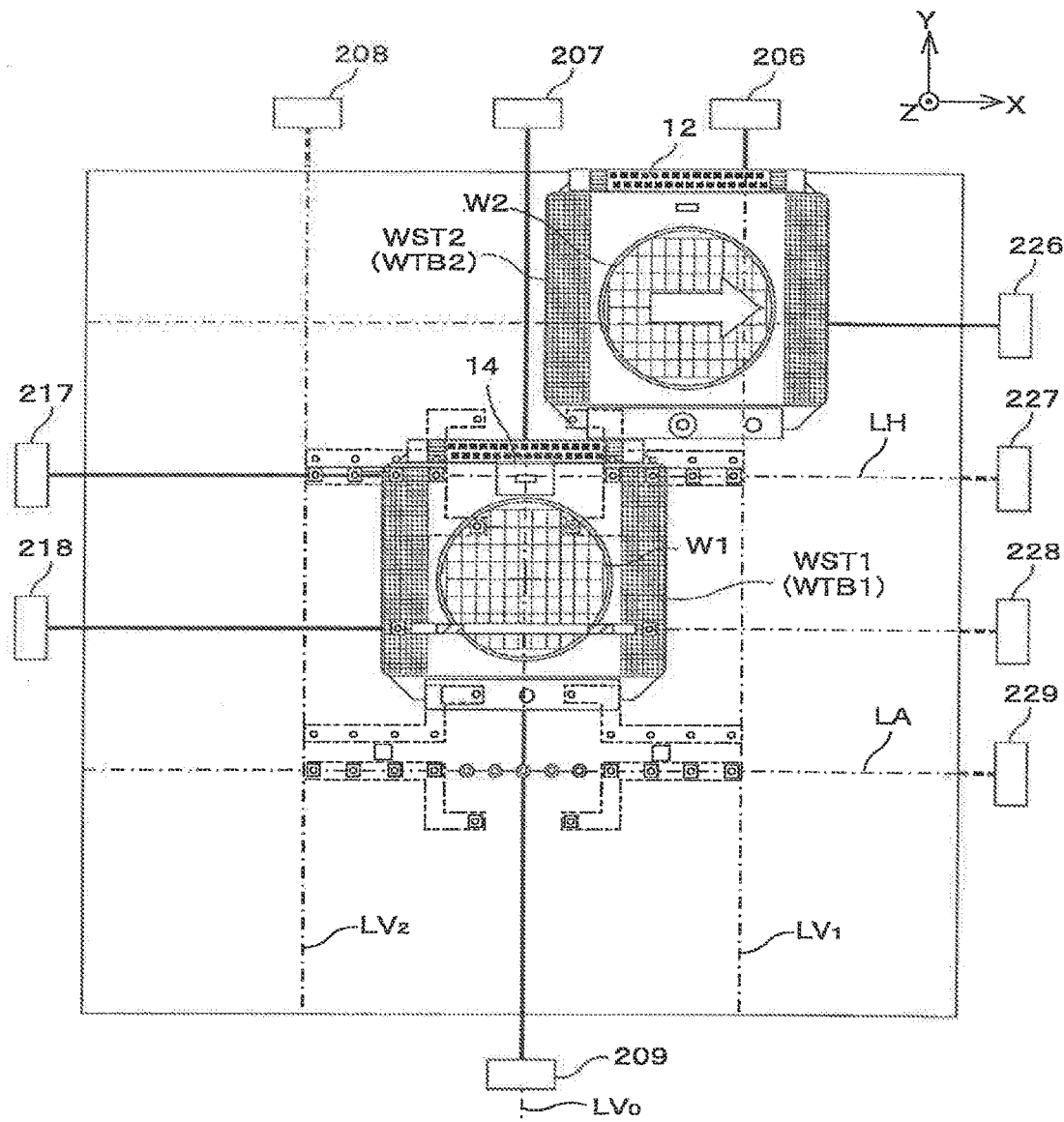
FIG. 58 is a view (No. 11) used to explain a parallel processing operation using wafer stage WST1 and WST2.

When movement of liquid immersion area 14 to the area above wafer table WTB1 (table main section 34) is completed, and wafer stage WST1 reaches the position (the position where measurement plate 30 is positioned directly under projection optical system PL) shown in FIG. 58, main controller 20 reduces the drive force of both water stages WST1 and WST2 in +Y direction to zero. This suspends wafer stage WST1, and as shown in an outlined bold arrow in FIG. 58, drive of wafer stage WST2 in the +X direction begins.

Next, main controller 20 measures a projection image (aerial image) of a pair of measurement marks on reticle R projected by projection optical system PL, using aerial image measuring device 45A previously described which includes measurement plate 30 of wafer stage WST1. An aerial image of a pair of measurement marks is each measured by an aerial image measurement operation of the slit scanning method using a pair of aerial image measurement slit patterns SL, similar to the method disclosed in, for example, U.S. Patent Application Publication No. 2002/0041377 and the like, and the measurement results (aerial image intensity according to the XY position of wafer table WTB1) are stored in memory. On the measurement process of the aerial image of the pair of measurement marks on reticle R, the position of wafer table WTB1 in the XY plane is controlled, based on two 2D heads $164i$ and $165j$ (encoders 170B and 170A) that face X scales 39B and 39A.

Now, prior to starting the drive of wafer stage WST2 in the +X direction at a stage where a measurement beam from Y interferometer 207 irradiates reflection surface $27f$ of wafer table WTB2, a measurement beam from Y interferometer 206 also begins to irradiate reflection surface $27f$. Therefore, main controller 20 pre-sets Y interferometer 205 based on measurement values of Y interferometer 207 right after a measurement beam from Y interferometer 206 begins to irradiate reflection surface $27f$. The position of wafer table WTB2 after the point when this preset has been performed is controlled by main controller 20, based on measurement values of interferometers 206 and 226, as shown in FIG. 58.

Meanwhile, at a stage where wafer stages WST1 and WST2 move to the position shown in FIG. 58 a measurement beam from X interferometer 217 irradiates reflection surface $27c$ of wafer table WTB1, along with a measurement beam from Y interferometer 207 which begins to irradiate reflection surface $27b$ of wafer table WTB1. Therefore, main controller 20 pre-sets X interferometer 217 based on measurement values of X interferometer 218, along with pre-set of Y interferometer 207 based on measurement values of Y interferometer 209. Or, main controller 20 pre-sets interferometers 207 and 217 based on measurement values of encoders 170B and 170A. In any case, after this point in time, main controller 20 measures positional information of wafer table WTB1 using interferometers 207 and 217. As a matter of course, control of the position of wafer table WTB1 in the XY plane is performed based on measurement values of encoder 170B and 170A.

Figure 59:
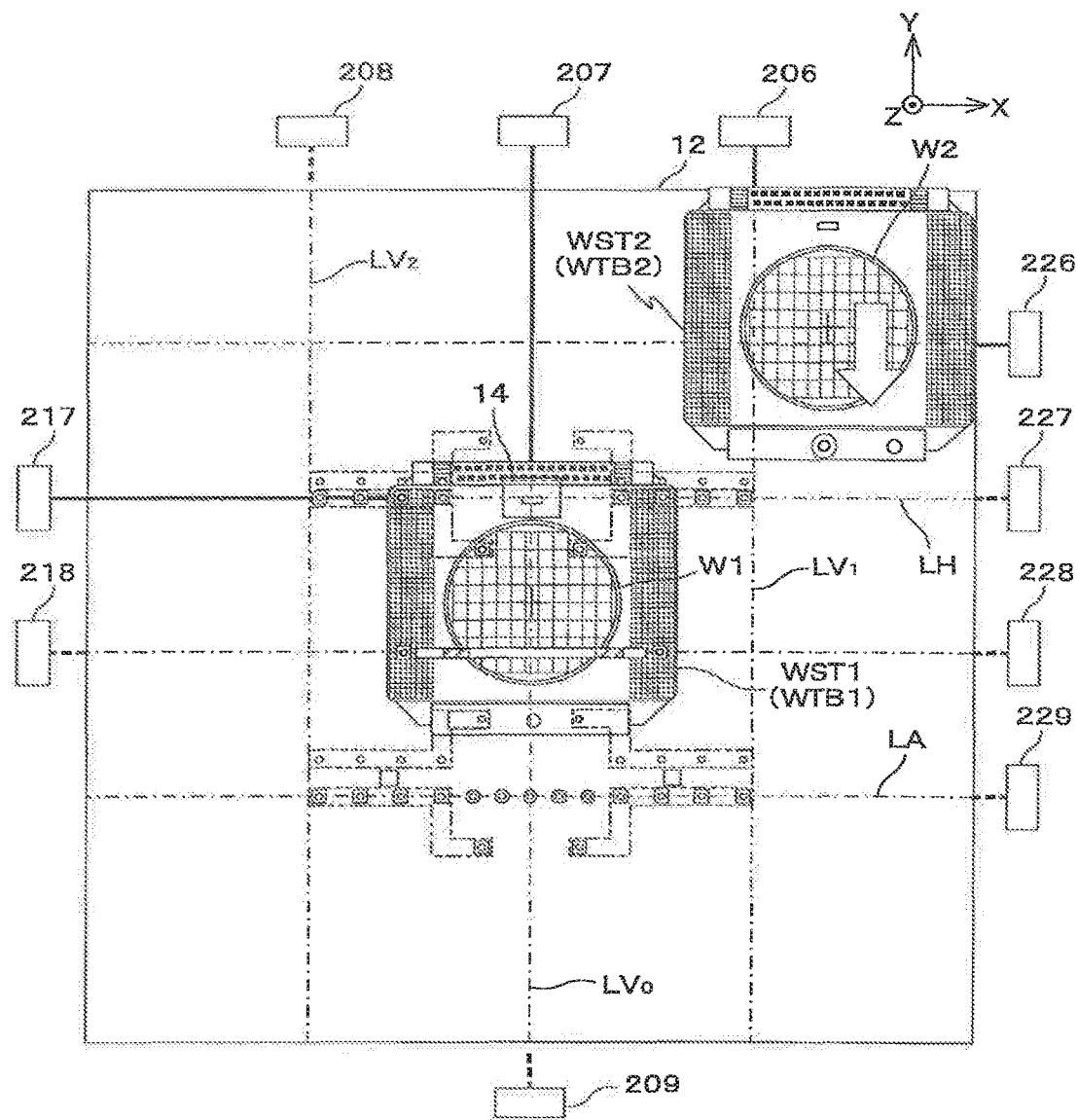
FIG. 59 is a view (No. 12) used to explain a parallel processing operation using wafer stage WST1 and WST2.

And, in parallel with performing the aerial image measurement operation described above, main controller 20 moves wafer stage WST2 to the position shown in FIG. 59.

Then, when aerial image measurement operation is completed, main controller 20 computes the baseline of primary alignment system AL1, based on detection results on detecting fiducial mark FM on measurement plate 30 of wafer stage WST1 using primary alignment system AL1 previously described and measurement results of the aerial image described above. At this point in time, the periphery edge exposure of wafer W1 previously described is being continued.

Figure 60:
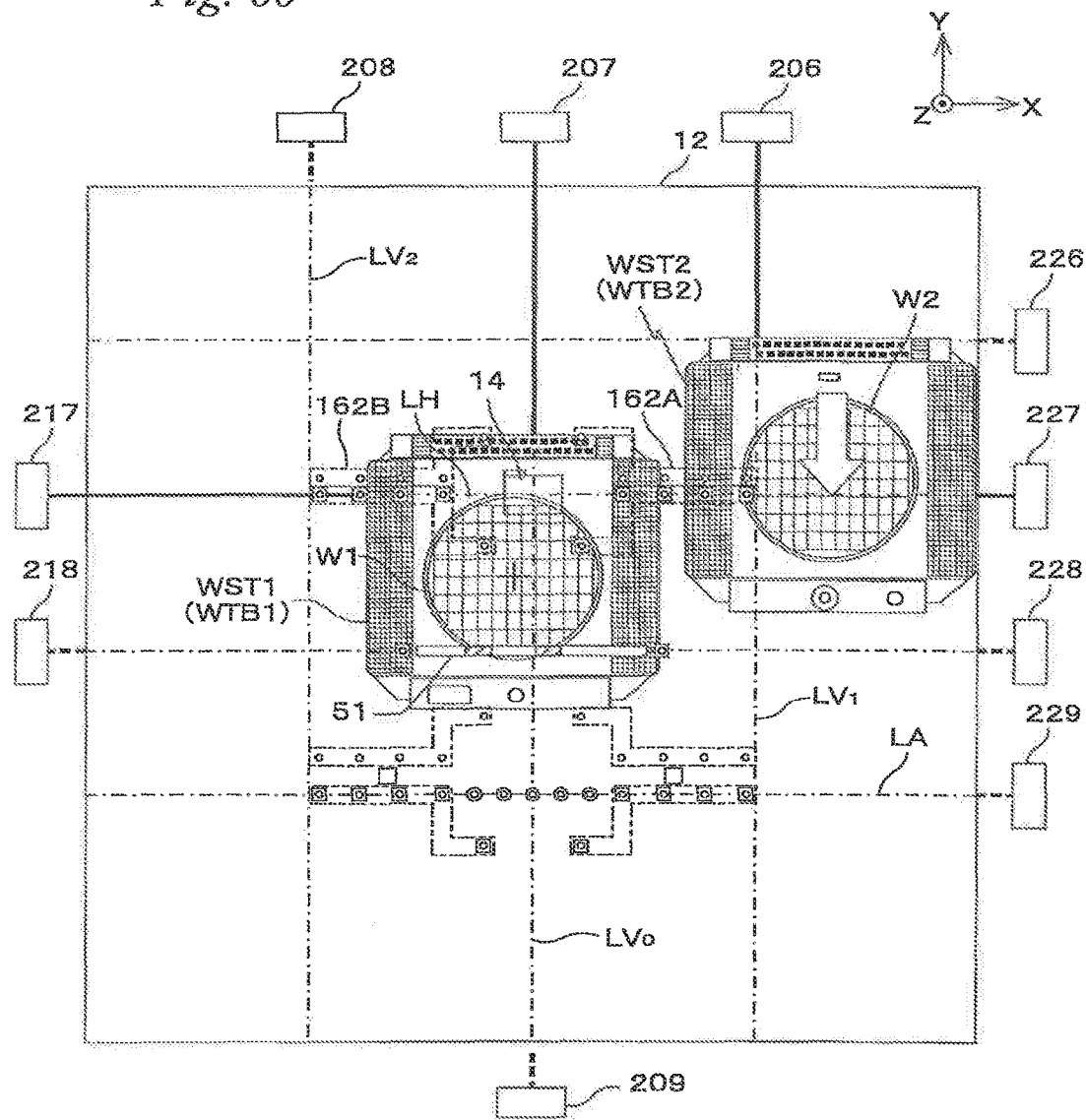
FIG. 60 is a view (No. 13) used to explain a parallel processing operation using wafer stage WST1 and WST2.
Figure 61:
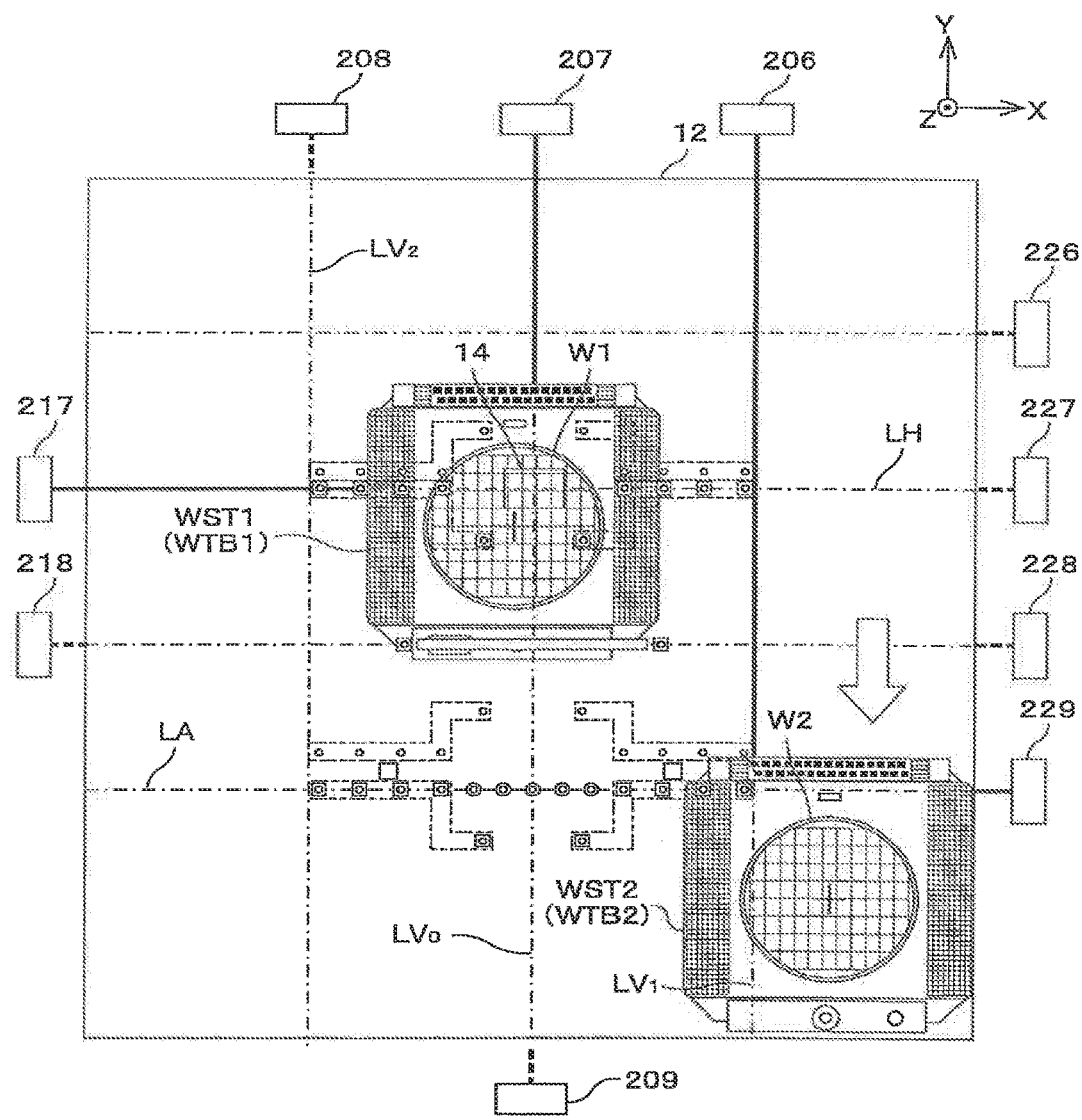
FIG. 61 is a view (No. 14) used to explain a parallel processing operation using wafer stage WST1 and WST2.

Next, main controller 20 moves wafer stage WST1 to the exposure starting position of wafer W1 while continuing the periphery edge exposure of wafer W1 as shown in FIG. 60, and also begins moving wafer stage WST2 in the −Y direction toward a right side loading position shown in FIG. 61. At the point in time when exposure of wafer W1 has begun, the periphery edge exposure has been completed.

The exposure operation described above is performed by main controller 20, based on results of wafer alignment (EGA previously described) that has been performed beforehand and on the latest baseline and the like of alignment systems AL1, and $AL2_1$ to $AL2_4$, by repeating a movement operation between shots in which wafer stage WST1 is moved to a scanning starting position (an acceleration starting position) for exposure of each shot area on wafer W1, and a scanning exposure operation in which a pattern formed on reticle R is transferred onto each shot area by a scanning exposure method. Incidentally, the number of rows of shot areas subject to exposure on wafer W1 is even, and in the exposure described above, exposure is performed in a complete alternate scan, in the order from a shot area located on the upper right side in FIG. 60 to a shot area located on the lower right side.

Incidentally, during the exposure of wafer W1, the position (including rotation in the θz direction) within the XY plane of wafer table WTB1 is controlled by main controller 20, based on measurement values of 2D heads $165_j$ and $164_i$ (more specifically, two-dimensional encoders 170A and 170B) belonging to head units 162A and 162B, respectively facing movement scales 39A and 39B. Further, the position in the Z-axis direction and θy rotation (rolling) of wafer table WTB1 which is being exposed is controlled by main controller 20, based on measurement values of a pair of Z head $74_i$ and $76_j$ which respectively face the ends on the wafer table WTB1 surface on one side and the other side (movement scale 39B, 39A) in the X-axis direction. Further, the rotation (pitching) in the θx direction of wafer table WTB1 which is being exposed is controlled by main controller 20, based on measurement values of Y interferometer 207. The control (the focus leveling control of wafer W) of the position of wafer table WTB1 in the Z-axis direction, the θy rotation, and the θx rotation during this exposure is performed based on results of the focus mapping previously described. Further, the position wafer table WTB1 in directions of five degrees of freedom, except for the Z-axis direction, is also measured by interferometers 207 and 217.

As is obvious from FIG. 60, during the movement of wafer stage WST2 toward the right side loading position, measurement beams from X interferometer 226 will no longer irradiate reflection surface $27e$ of wafer stage WST2, however, prior to this, measurement beams from X interferometer 227 begin to irradiate reflection surface $27e$ while measurement beams from X interferometer 226 irradiate reflection surface $27e$. Therefore, main controller 20 pre-sets the measurement values of X interferometer 227, based on the measurement values of X interferometer 226.

When wafer stage WST2 moves further in the −Y direction from the position shown in FIG. 60, measurement beams from X interferometer 228 begins to irradiate reflection surface $27e$. Therefore, while measurement beams from X interferometer 227 irradiates reflection surface $27e$, main controller 20 pre-sets the measurement values of X interferometer 228 based on the measurement values of X interferometer 227

When wafer stage WST2 moves further in the −Y direction, measurement beams from X interferometer 229 begins to irradiate reflection surface $27e$. Therefore, while measurement beams from X interferometer 228 irradiates reflection surface $27e$, main controller 20 pre-sets the measurement values of X interferometer 229 based on the measurement values of X interferometer 228.

Main controller 20 continues the exposure operation by the step-and-scan method to wafer W1 concurrently with driving wafer stage WST2 toward the right side loading position, while switching the X interferometer used for position control in the manner described above.

Then, when wafer stage WST2 reaches the right side loading position shown in FIG. 61, main controller 20 begins Pit operation at the right side loading position.

Figure 62:
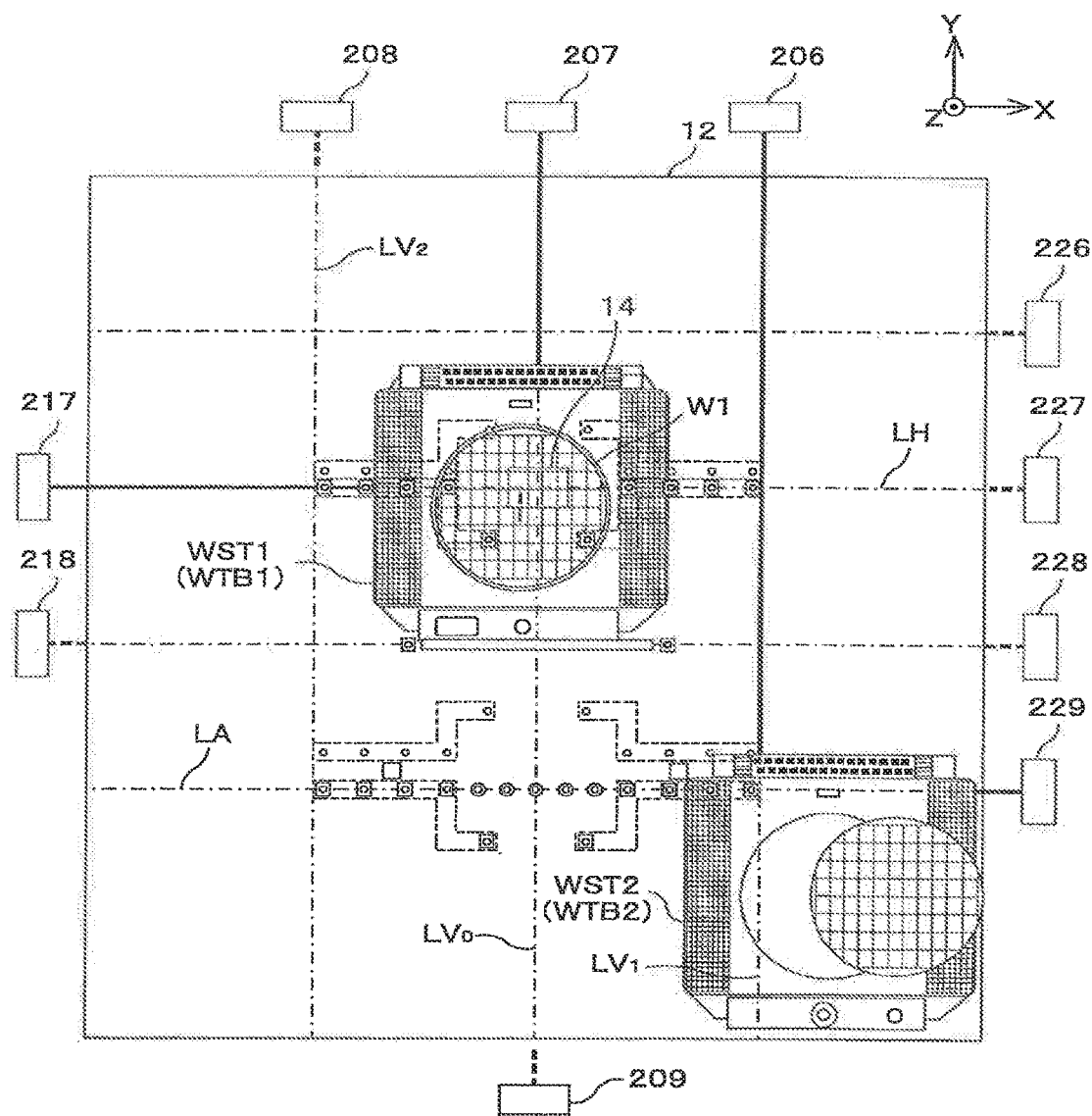
FIG. 62 is a view (No. 15) used to explain a parallel processing operation using wafer stage WST1 and WST2.

FIG. 62 shows a state in which Pit operation (wafer exchange performed between a wafer carriage mechanism (not shown) and wafer stage WST2, cooling of a wafer holder, and other preparatory operations for exposure) is performed at the right side loading position, and exposure by the step-and-scan method being concurrently performed on wafer W1 held on wafer stage WST1 below projection unit PU. At this point, the position of wafer table WTB2 is controlled by main controller 20, based on measurement values of Y interferometer 206 and X interferometer 229.

Figure 63:
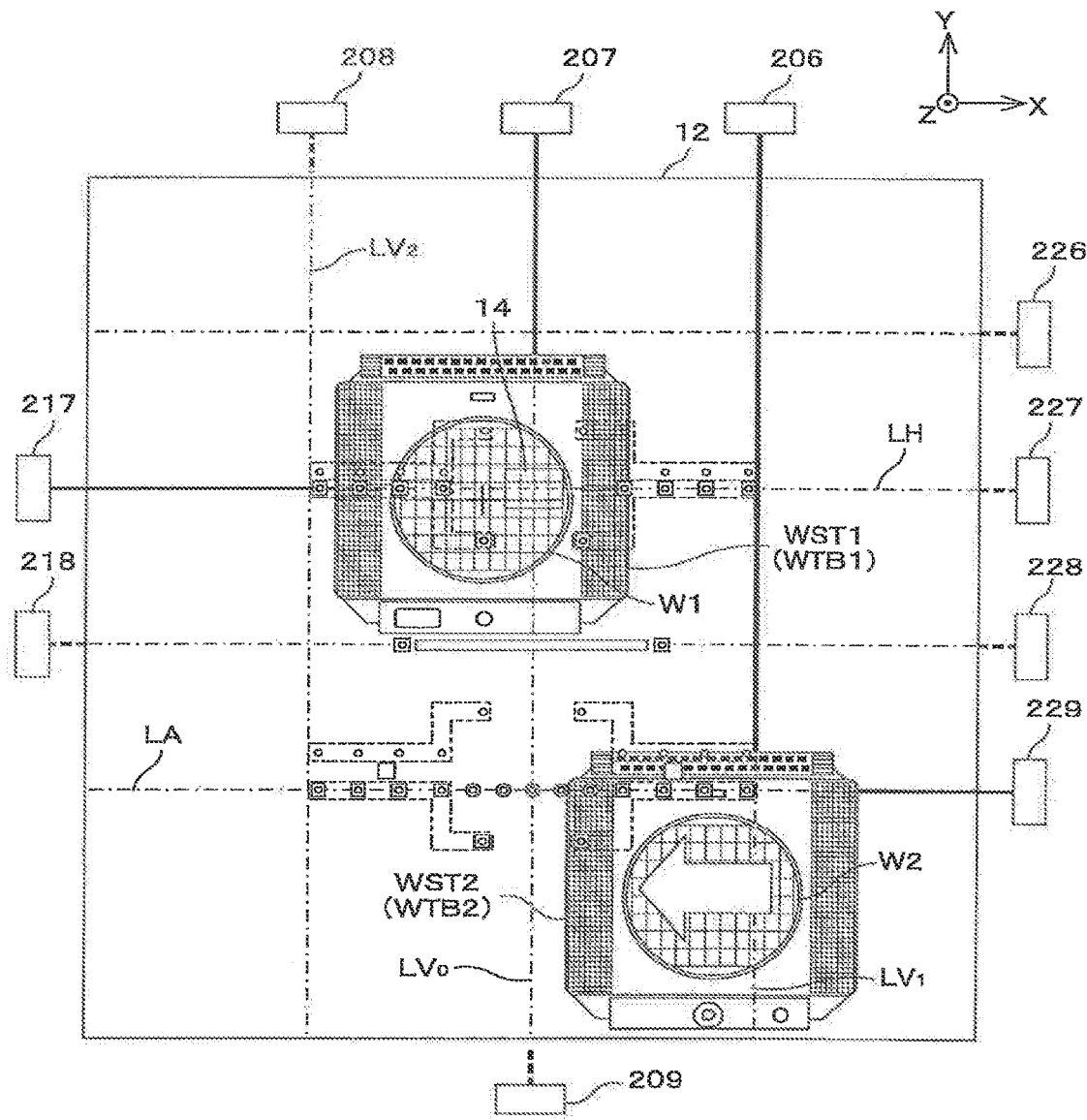
FIG. 63 is a view (No. 16) used to explain a parallel processing operation using wafer stage WST1 and WST2.
Figure 64:
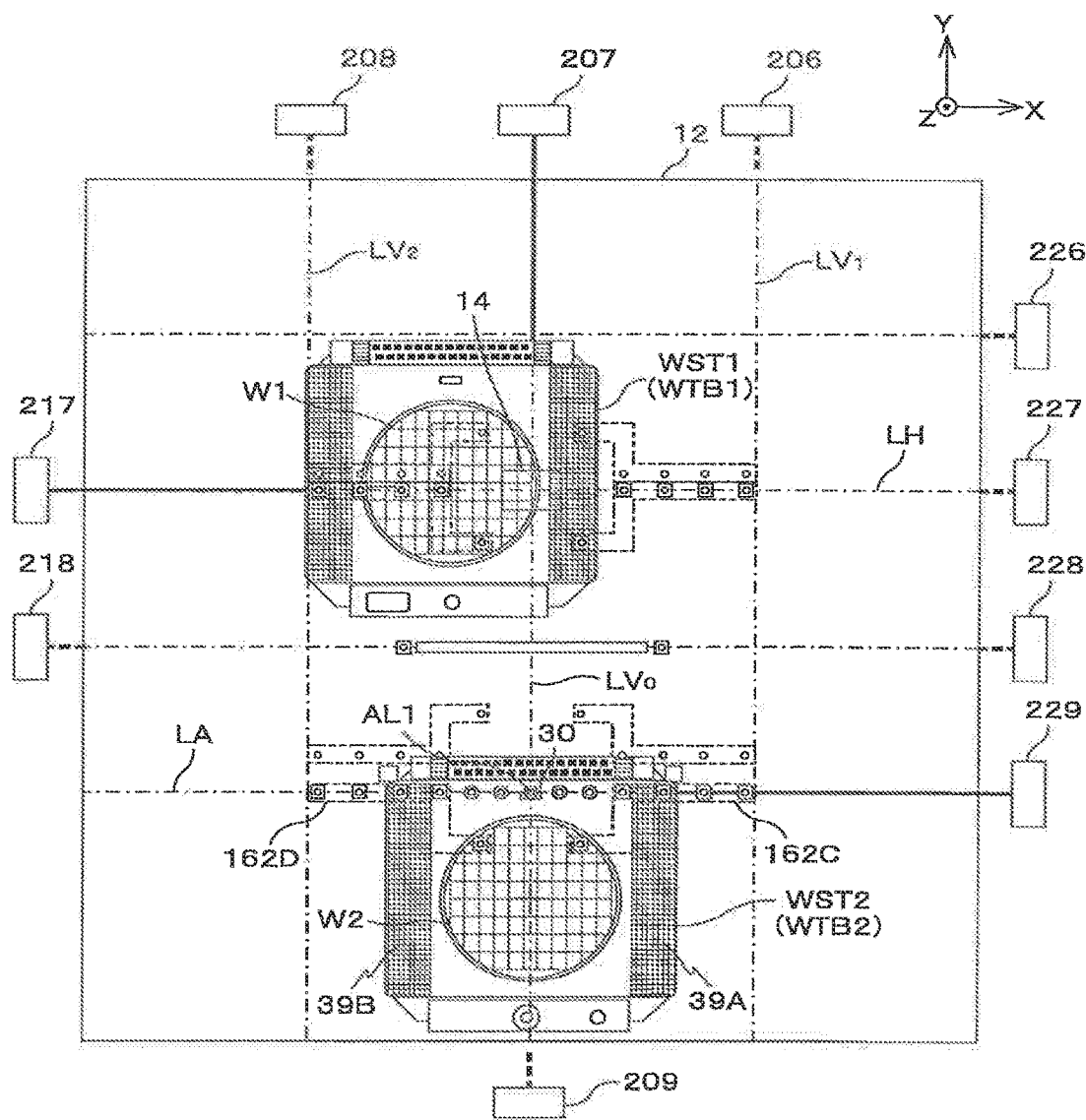
FIG. 64 is a view (No. 17) used to explain a parallel processing operation using wafer stage WST1 and WST2.

While exposure by the step-and-scan method of wafer W1 on wafer table WTB1 is being continued in the manner described above, main controller 20 begins the drive of wafer stage WST2 in the −X direction on which Pit operation has been completed, as shown in FIG. 63. And, wafer stage WST2 is moved to a position where a reference mark FM on measurement plate 30 is positioned within a field (a detection area) of primary alignment system AL1, as shown in FIG. 64. During this movement, main controller 20 switches the control of the position of wafer table WTB2 within the XY plane from a control based on measurement values of interferometers 206 and 229 previously described to a control based on 2D heads $167_p$ and $168_q$ belonging to head units 162D and 162C facing moving scales 39B and 39A of wafer table WTB2, or more specifically, to a control based on measurement values of two-dimensional encoders 170D and 170C.

Then, when wafer stage WST2 moves to the position shown in FIG. 64, main controller 20 performs a reset (origin reset) of Y interferometer 209, X interferometer 229, and two-dimensional encoders 170D and 170C, prior to starting wafer alignment (and other preprocessing measurements) of a new wafer W2.

When the reset of interferometers 209 and 229 are completed, main controller 20 uses primary alignment system AL1 to detect reference mark FM on measurement plate 30 of wafer stage WST2. And, main controller 20 detects the position of reference mark FM with the index center of primary alignment system AL1 serving as a reference, and makes a link between the detection results and the measurement values of encoders 170C and 170D at the time of the detection, and then stores them in memory.

Figure 65:
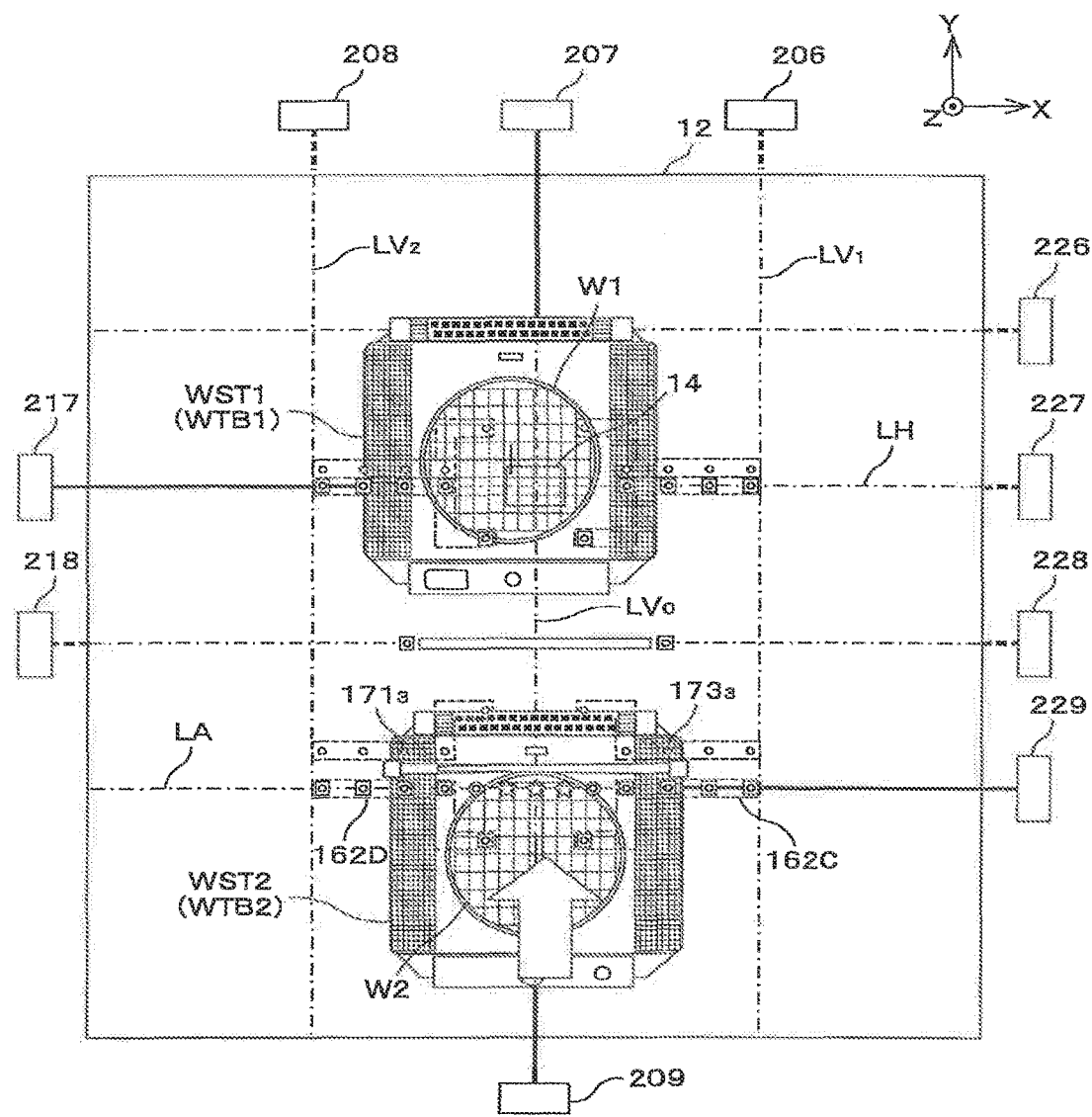
FIG. 65 is a view (No. 18) used to explain a parallel processing operation using wafer stage WST1 and WST2.

Next, main controller 20 begins the scanning (scan) of wafer stage WST2 in the +Y direction, and moves wafer stage WST2 to the alignment area, as shown in FIG. 65. Then, main controller 20 begins EGA previously described using encoders 170C and 170D (and interferometers 209 and 229) while measuring the position coordinates of wafer stage WST2.

FIG. 65 shows a state where alignment marks arranged in three sample shot areas are detected almost simultaneously and individually by main controller 20, using primary alignment system AL1, and secondary alignment systems $AL2_2$ and $AL2_3$ (refer to the star-shaped marks in FIG. 65). At this point, exposure by the step-and-scan method of wafer W1 held on wafer table WTB1 is being continued.

After the scanning (scan) of wafer stage WST2 in the +Y direction begins in the manner described above until wafer stage WST2 moves in the +Y direction and detection beams of multipoint AF system (90a, 90b) begin to irradiate wafer W1, main controller 20 activates (turns ON) two Z heads $171p$ and $173q$ and multipoint AF system (90a, 90b) together, and begins the focus mapping previously described.

Figure 66:
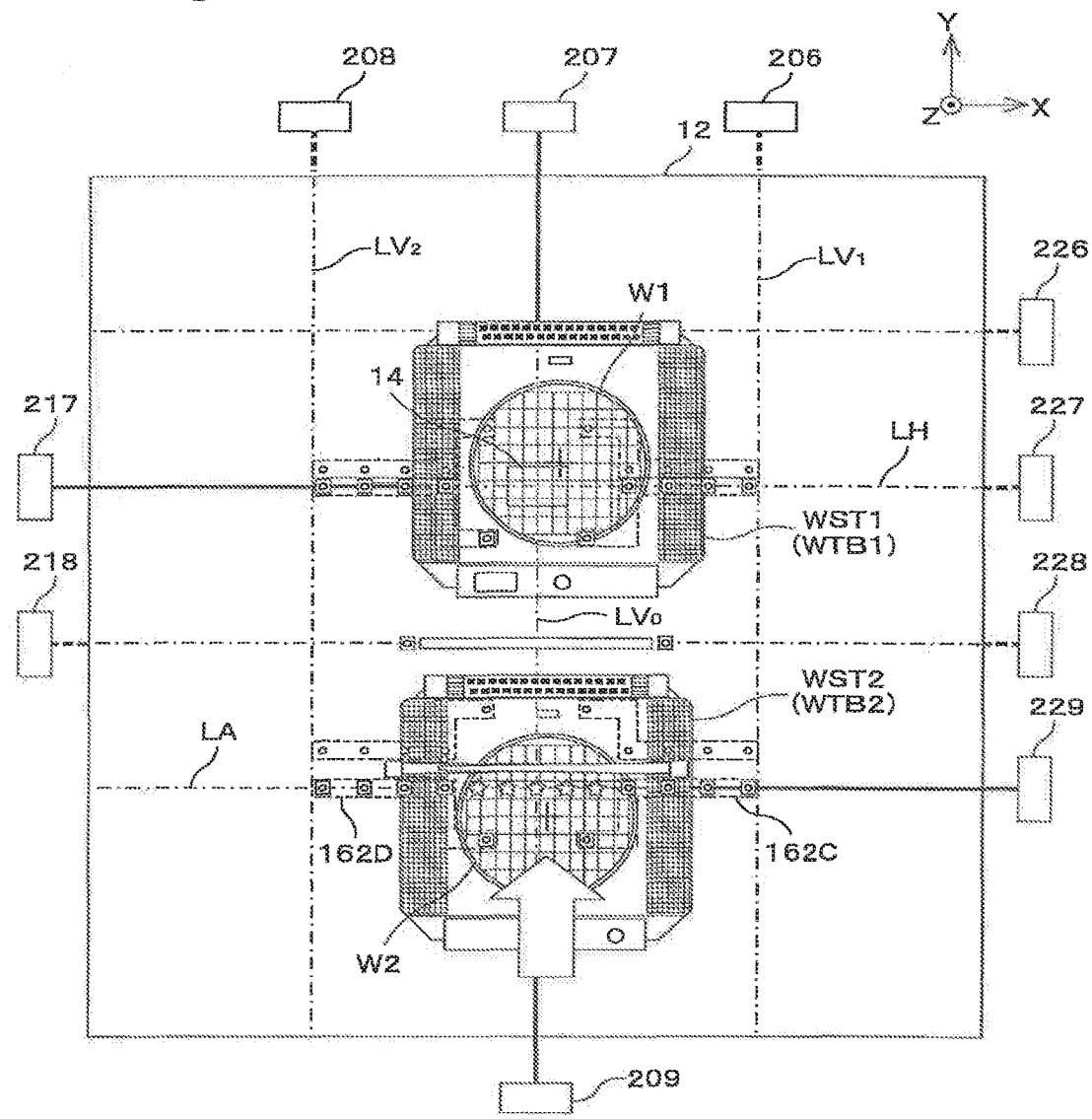
FIG. 66 is a view (No. 19) used to explain a parallel processing operation using wafer stage WST1 and WST2.

After the focus mapping has started, main controller 20 moves wafer stage WST2 in the +Y direction by a predetermined distance as well as in the +X direction by a predetermined distance based on the measurement values of encoders 170C and 170D, and sets the position of wafer stage WST2 at a position shown in FIG. 66. Then, main controller 20 detects the five alignment mark substantially at the same time as well as individually (refer to the star-shaped marks in FIG. 66), using the five alignment systems AL1, and $AL2_1$ to $AL2_4$, and makes a link between the detection results of the five alignment systems AL1, and $AL2_1$ to $AL2_4$ and the measurement values of encoders 170C and 170D at the time of the detection, and then stores them in memory (not shown). At this point, focus mapping performed on the wafer stage WST2 side, and exposure by the step-and-scan method of wafer W1 held on wafer table WTB1 previously described are being continued.

Figure 67:
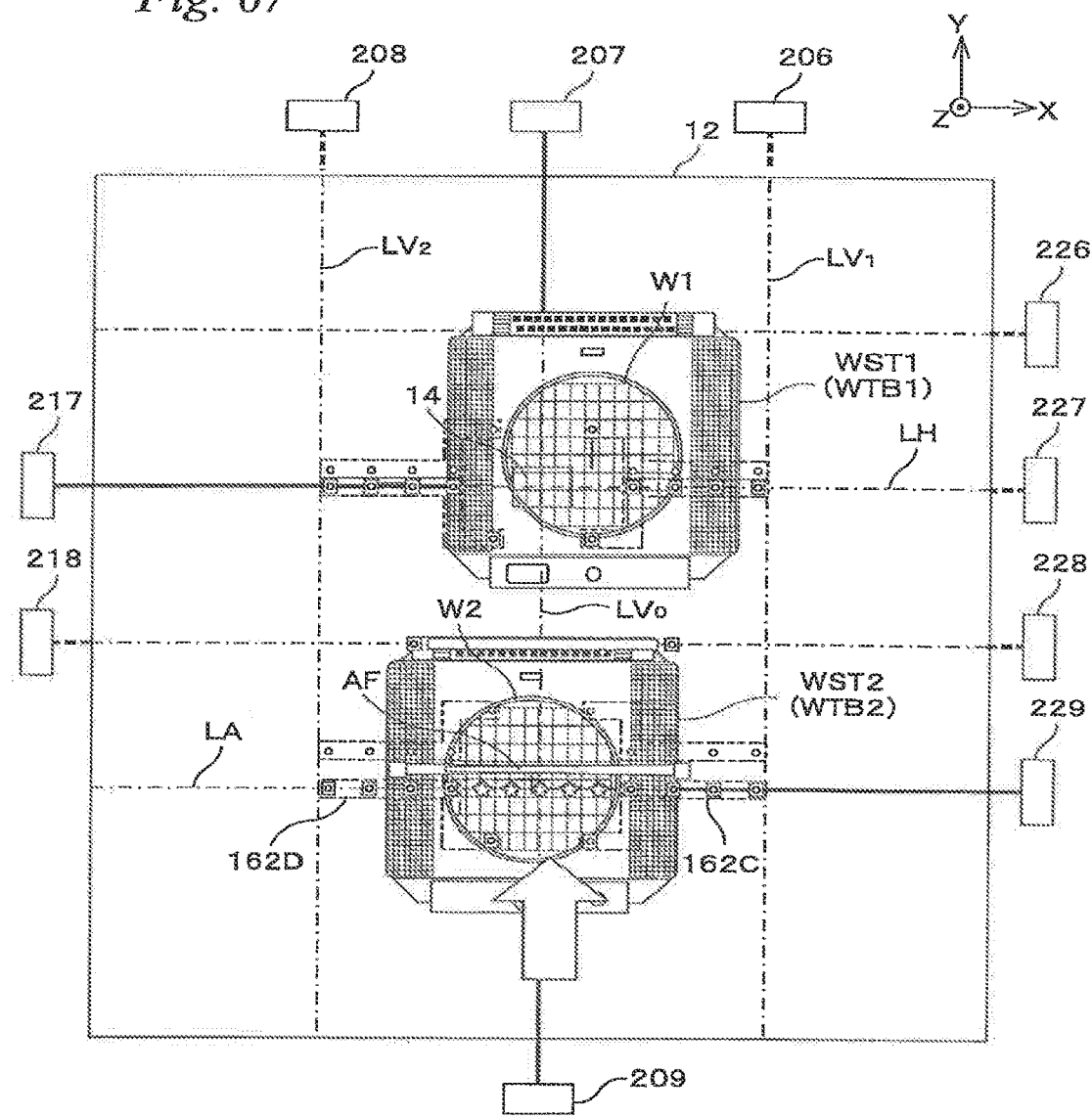
FIG. 67 is a view (No. 20) used to explain a parallel processing operation using wafer stage WST1 and WST2.

Next, main controller 20 moves wafer stage WST in the +Y direction by a predetermined distance as well as in the −X direction by a predetermined distance based on the measurement values of encoders 170C and 170D, and sets the position of wafer stage WST at a position shown in FIG. 67. Then, main controller 20 detects the five alignment mark substantially at the same time as well as individually (refer to the star-shaped marks in FIG. 67), using the five alignment systems AL1, and $AL2_1$ to $AL2_4$, and makes a link between the detection results of the five alignment systems AL1, and $AL2_1$ to $AL2_4$ and the measurement values of encoders 170C and 170D at the time of the detection, and then stores them in memory (not shown). At this point, focus mapping performed on the wafer stage WST2 side, and exposure by the step-and-scan method of wafer W1 held on wafer table WTB1 previously described are being continued.

Figure 68:
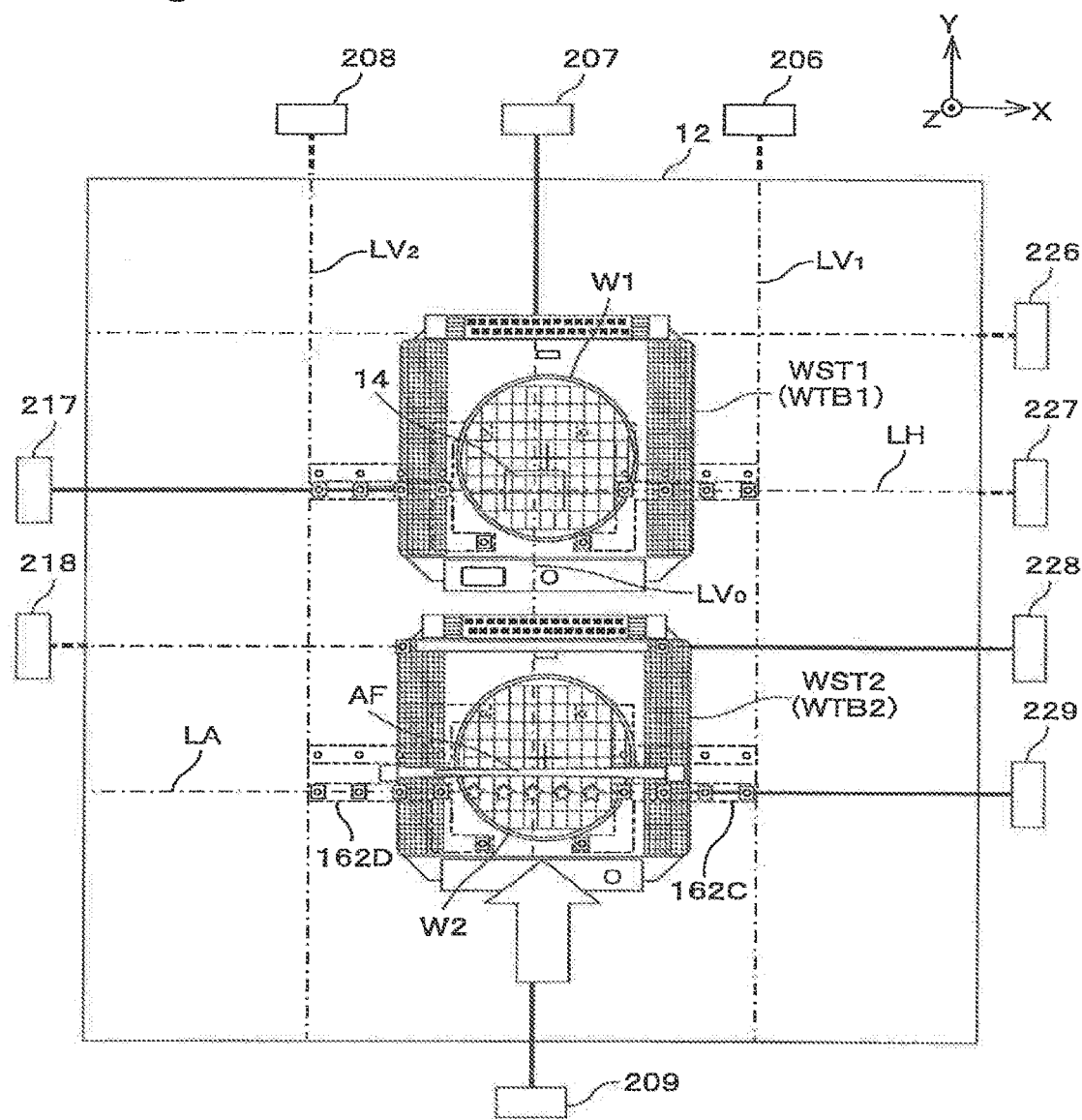
FIG. 68 is a view (No. 21) used to explain a parallel processing operation using wafer stage WST1 and WST2.

Next, main controller 20 moves wafer stage WST2 in the +Y direction by a predetermined distance as well as in the +X direction by a predetermined distance based on the measurement values of encoders 170C and 170D, and sets the position of wafer stage WST2 at a position shown in FIG. 68. Then, main controller 20 detects the five alignment mark substantially at the same time as well as individually (refer to the star-shaped marks in FIG. 68), using the five alignment systems AL1, and $AL2_1$ to $AL2_4$, and makes a link between the detection results of the five alignment systems AL1, and $AL2_1$ to $AL2_4$ and the measurement values of encoders 170C and 170D at the time of the detection, and then stores them in memory (not shown). At this point, because a measurement beam from X interferometer 228 begins to irradiate reflection surface 27e of wafer table WTB2, main controller 20 pre-sets X interferometer 228 based on measurement values of X interferometer 229 at this point. By this operation, the X position and the rotation quantity (rolling amount) in the θy direction of wafer table WTB2 can also be measured by X interferometer 228 hereinafter. At this point, focus mapping performed on the wafer stage WST2 side, and exposure by the step-and-scan method of wafer W1 held on wafer table WTB1 previously described are being continued.

Figure 69:
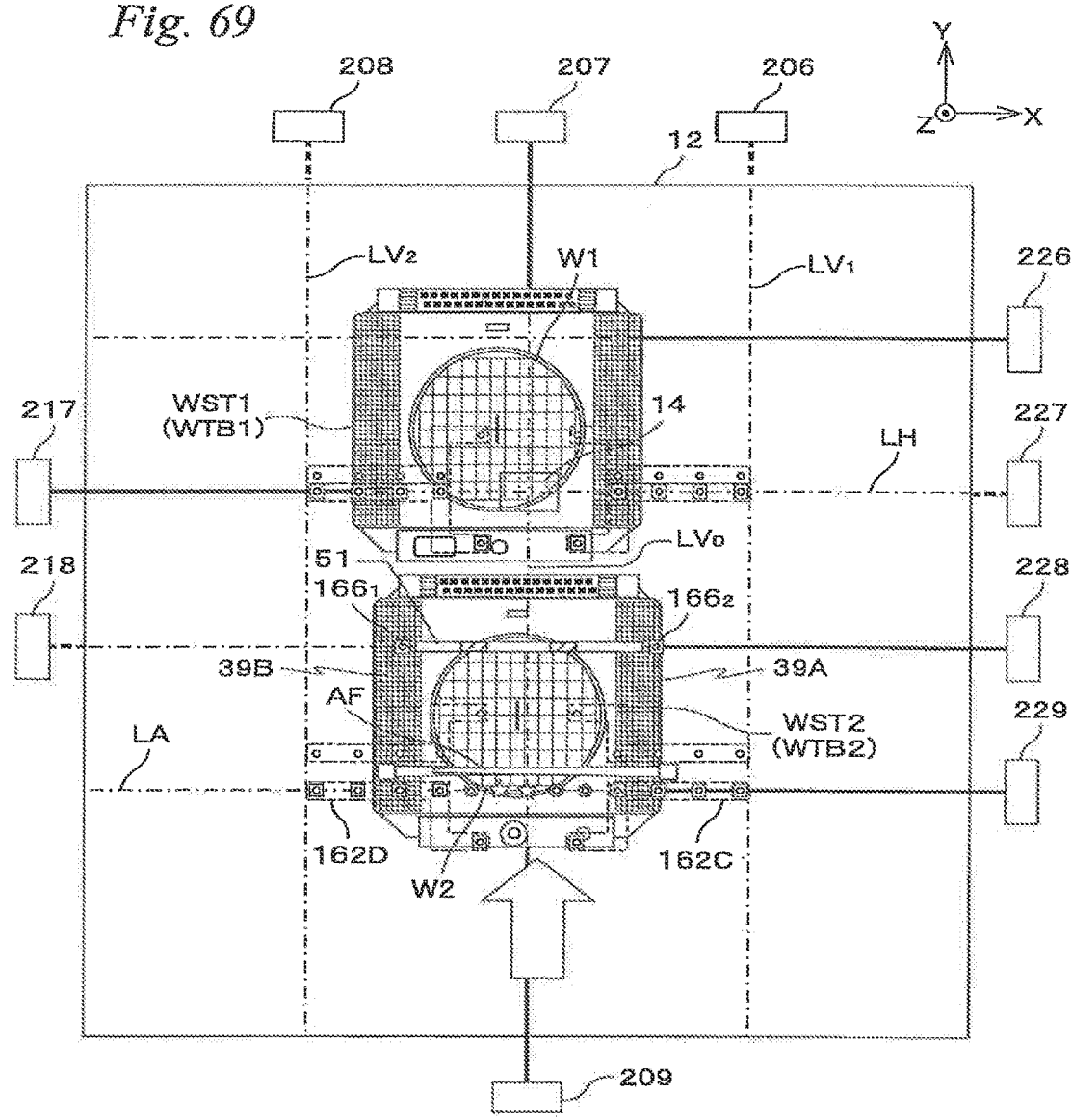
FIG. 69 is a view (No. 22) used to explain a parallel processing operation using wafer stage WST1 and WST2.

Next, main controller 20 moves wafer stage WST2 in the +Y direction by a predetermined distance as well as in the −X direction by a predetermined distance based on the measurement values of encoders 170C and 170D, and sets the position of wafer stage WST2 at a position shown in FIG. 69. Then, main controller 20 detects the two alignment mark substantially at the same time as well as individually (refer to the star-shaped marks in FIG. 69), using the two alignment systems AL1 and $AL2_2$, and makes a link between the detection results of the two alignment systems AL1 and AL2$_2$ and the measurement values of encoders 170C and 170D at the time of the detection, and then stores them in memory (not shown). At this point, the exposure by the step-and-scan method of wafer W1 on wafer stage WST1 is completed. However, at this point in time, the focus mapping on the wafer stage WST2 side previously described is continued. Because a measurement beam from X interferometer 226 begins to irradiate reflection surface 27a of wafer table WTB1 before wafer stage WST1 arrives at the exposure completing position, main controller 20 pre-sets X interferometer 226 based on measurement values of X interferometer 217 (or measurement values of encoders 170A and 170B).

Prior to completing the exposure described above, main controller 20 begins periphery scanning exposure of wafer W2 (refer to FIG. 69). As it can be seen from FIG. 69, at the point when the periphery edge exposure begins, because 2D heads 166$_2$ and 166$_1$ face moving scales 39A and 39B, main controller 20 hereinafter also begins measurement of positional information of wafer stage WST2 within the XY plane, based on measurement values of 2D heads 166$_2$ and 166$_1$, or more specifically, measurement values of encoders 170E and 1701F.

Figure 70:
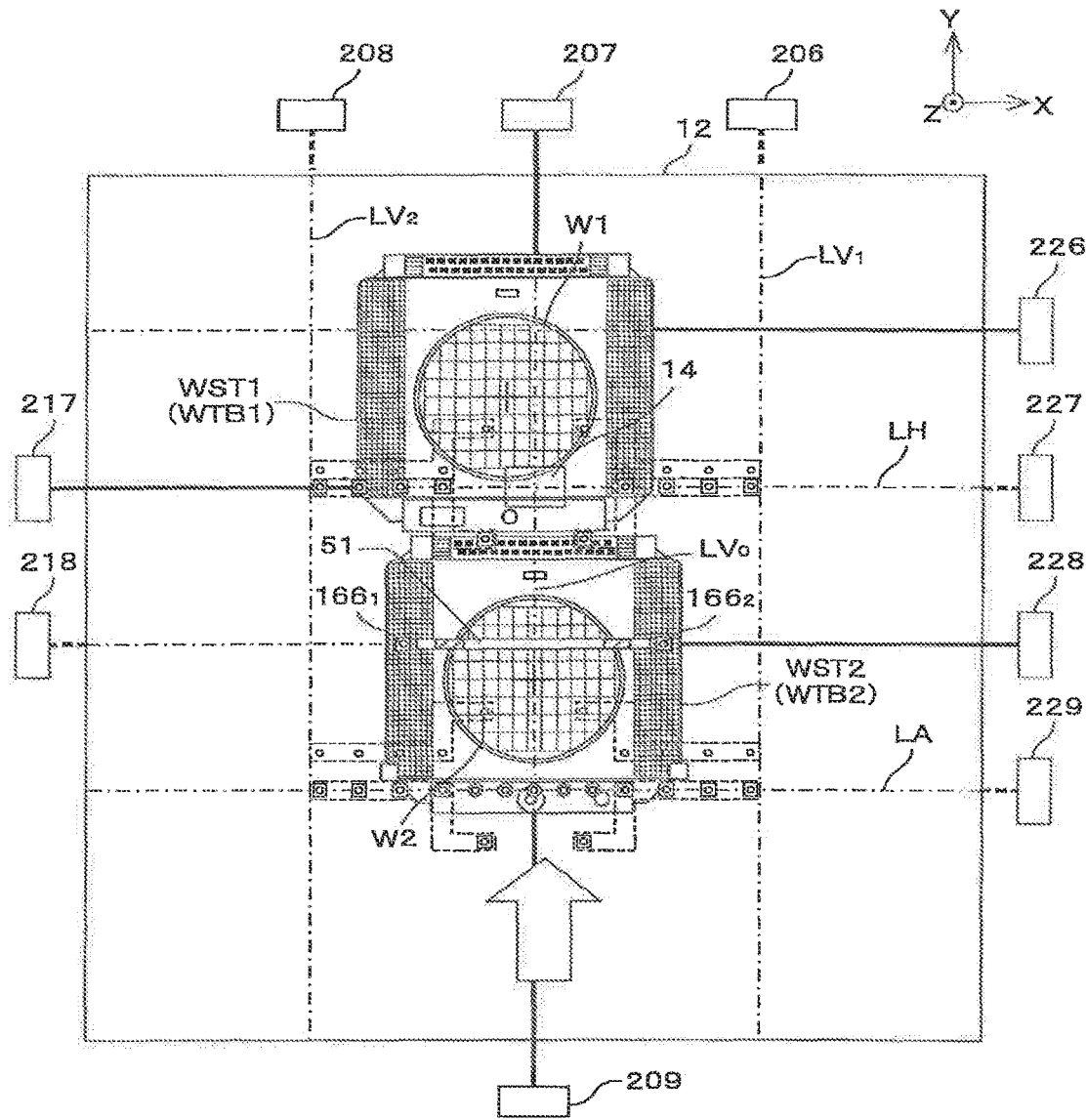
FIG. 70 is a view (No. 23) used to explain a parallel processing operation using wafer stage WST1 and WST2.

Subsequently, main controller 20 moves wafer stage WST1 and wafer stage WST2 to a second scrum starting position shown in FIG. 70 while continuing the periphery scanning exposure. Prior to this, the encoder used for the measurement of the positional information in the XY plane of wafer stage WST2 is changed from encoders 170C and 170D to encoders 170E and 170F.

And when wafer stages WST1 and WST2 arrive at the second scrum starting position, main controller 20 completes the focus mapping, and then converts the surface position information on each detection point of the multipoint AF system (90a, 90b) into data which uses the surface position information by Z heads 171$_p$ and 173$_q$ taken in simultaneously as a reference in a similar manner as previously described.

Because EGA is also completed at the point when the focus mapping described above is completed, main controller 20 uses the measurement values of the two encoders 170C and 170D described above which correspond to the detection results of the plurality of alignment marks which has been acquired so far and the baseline of the secondary alignment system AL2, measured in advance to perform a statistics operation by the EGA method, and computes the arrays (position coordinates) of all the shot areas on wafer W1 on a coordinate system (for example, an XY coordinate system (alignment coordinate system) which uses the detection center of primary alignment system AL1 as the origin) which is set by the measurement axes of the two encoders (the two head units) described above.

In this case, in a state where both wafer stages WST1 and WST2 are moved to the second scrum starting position, the stages move into a scrum state in which the −Y end surface (the −Y end surface of measurement section 138) of wafer table WTB2 and the +Y end surface (the +Y end surface of FD bar 46) of wafer table WTB1 come into contact (or in proximity via a clearance of around 300 μm), in a state where the center line of wafer table WTB2 substantially coincides with reference axis LV$_0$ and the center line of wafer table WTB1 is shifted by a predetermined distance (a second offset amount) to the −X side of reference axis LV$_0$. More specifically, in this scrum state, by the −Y side end of measurement section 138 configuring a part of wafer table WTB1 and the +Y end of PD bar 46 configuring a part of wafer table WTB2 being in contact (or in proximity), wafer stage WST2 and wafer stage WST1 can be in contact (or in proximity) in the Y-axis direction via FD bar 46 and measurement section 138, in a state where a part of the surface on the +Y side of wafer stage WST2 face a part of the surface on the −Y side of wafer stage WST1. In this case, the second offset amount is set to a distance the same as the first offset amount previously described.

The total length of the length of measurement section 138 of wafer table WTB1 in the Y-axis direction and the length of FD bar 46 of wafer table WTB2 in the Y-axis direction is set to a level of length so that wafer stage WST2 and wafer stage WST1 (or more specifically, the +Y side end of air slider 54 of wafer stage WST2 and the −Y side end of air slider 54 of wafer stage WST1) can be kept from being in contact in a state where measurement section 138 and FD bar 46 are in contact.

Figure 71:
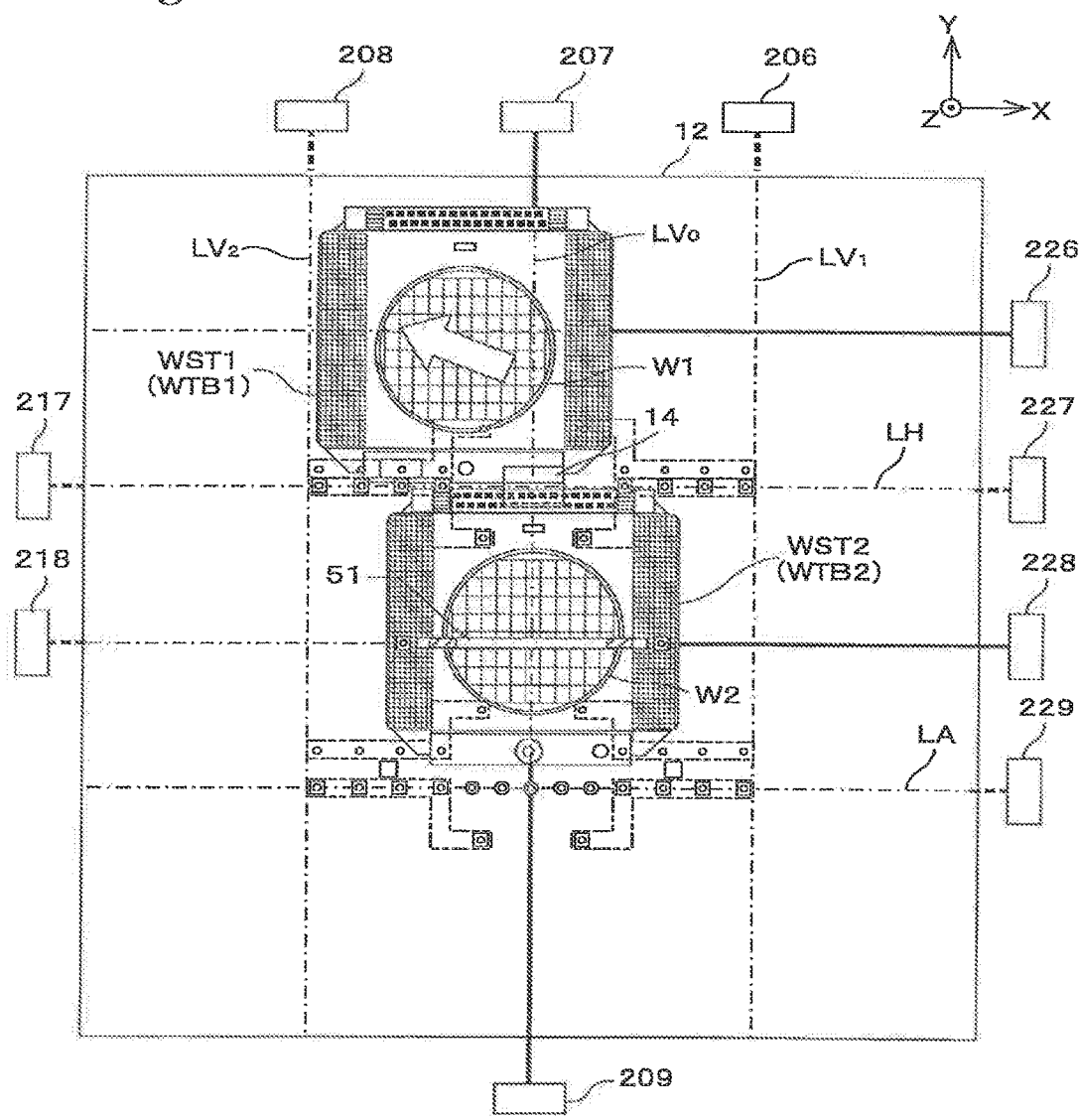
FIG. 71 is a view (No. 24) used to explain a parallel processing operation using wafer stage WST1 and WST2.

Main controller 20 drives wafer stage WST2 in the +Y direction, based on measurement values of encoders 170E and 170F while maintaining the scrum state, and simultaneously drives wafer stage WST1 in the +Y direction and the −X direction as shown in the outlined bold arrow shown in FIG. 71, based on measurement values of interferometers 207 and 226. During this movement of both wafer stages WST1 and WST2, the periphery scanning exposure is being continued.

Along with wafer stages WST1 and WST2 moving in their movement directions while keeping the scrum state, liquid immersion area 14 formed in the space between tip lens 191 and wafer table WTB2 moves from above wafer table WTB1 to wafer table WTB2. FIG. 71 shows a state of both wafer stages WST1 and WST2 just before liquid immersion area 14 is passed to table main section 34 of wafer table WTB2 from above wafer table WTB1, via measurement section 138 of wafer table WTB1 and FD bar 46 of wafer table WTB2, during such movement.

Figure 72:
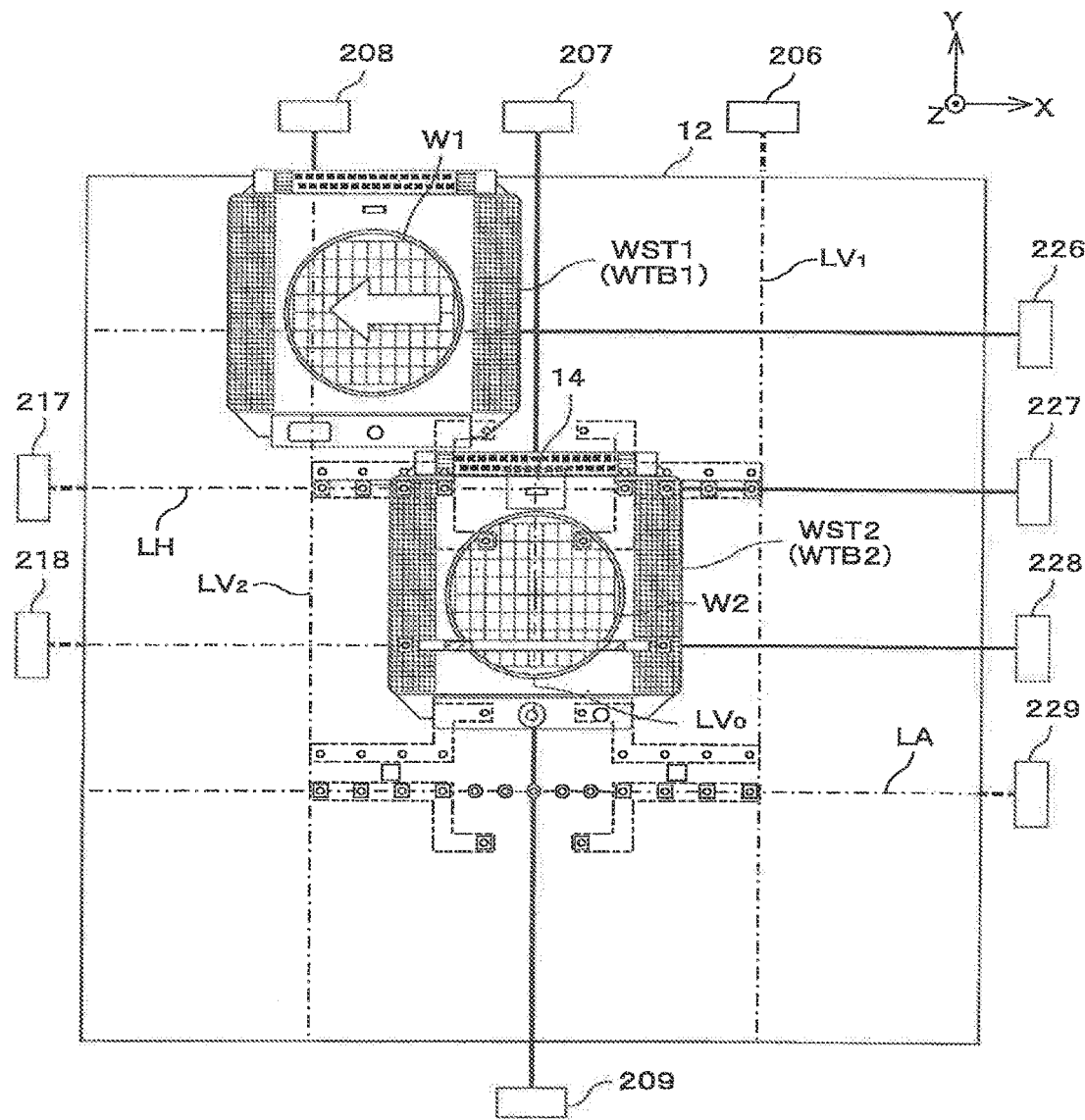
FIG. 72 is a view (No. 25) used to explain a parallel processing operation using wafer stage WST1 and WST2.

When movement of liquid immersion area 14 to the area above wafer table WTB2 (table main section 34) is completed, and wafer stage WST2 reaches the position (the position where measurement plate 30 is positioned directly under projection optical system PL) shown in FIG. 72, main controller 20 reduces the drive force of both wafer stages WST1 and WST2 in +Y direction to zero. This suspends wafer stage WST2, and as shown in an outlined bold arrow in FIG. 72, drive of wafer stage WST1 in the −X direction begins.

Next, main controller 20 measures a projection image (aerial image) of a pair of measurement marks on reticle R projected by projection optical system PL, using aerial image measuring device 45B previously described which includes measurement plate 30 of wafer stage WST2. On the measurement process of the aerial image, the position of wafer table WTB2 in the XY plane is controlled, based on two 2D heads 165$_j$ and 164$_i$ (encoders 170B and 170A) that face X scales 39A and 39B.

Now, prior to starting the drive of wafer stage WST1 in the −X direction at a stage where a measurement beam from Y interferometer 207 irradiates reflection surface 27b of wafer table WTB1, a measurement beam from Y interferometer 208 also begins to irradiate reflection surface 27b. Therefore, main controller 20 pre-sets Y interferometer 208 based on measurement values of Y interferometer 207, right after a measurement beam from Y interferometer 208 begins to irradiate reflection surface 27b. The position of wafer table WTB1 after the point when this preset has been performed, is controlled by main controller 20, based on measurement values of interferometers 208 and 226, as shown in FIG. 72.

Meanwhile, at a stage where wafer stages WST1 and WST2 move to the position shown in FIG. 72, a measurement beam from X interferometer 227 irradiates reflection surface 27e of wafer table WTB2, along with a measurement beam from Y interferometer 207 which begins to irradiate reflection surface 27f of wafer table WTB1. Therefore, main controller 20 pre-sets X interferometer 227 based on measurement values of X interferometer 228, along with pre-set of Y interferometer 207 based on measurement values of Y interferometer 209. Or, main controller 20 pre-sets interferometers 207 and 227 based on measurement values of encoders 170B and 170A. In any case, after this point in time, main controller 20 measures positional information of wafer table WTB1 using interferometers 207 and 227. As a matter of course, control of the position of wafer table WTB2 in the XY plane is performed based on measurement values of encoder 170B and 170A.

Figure 73:
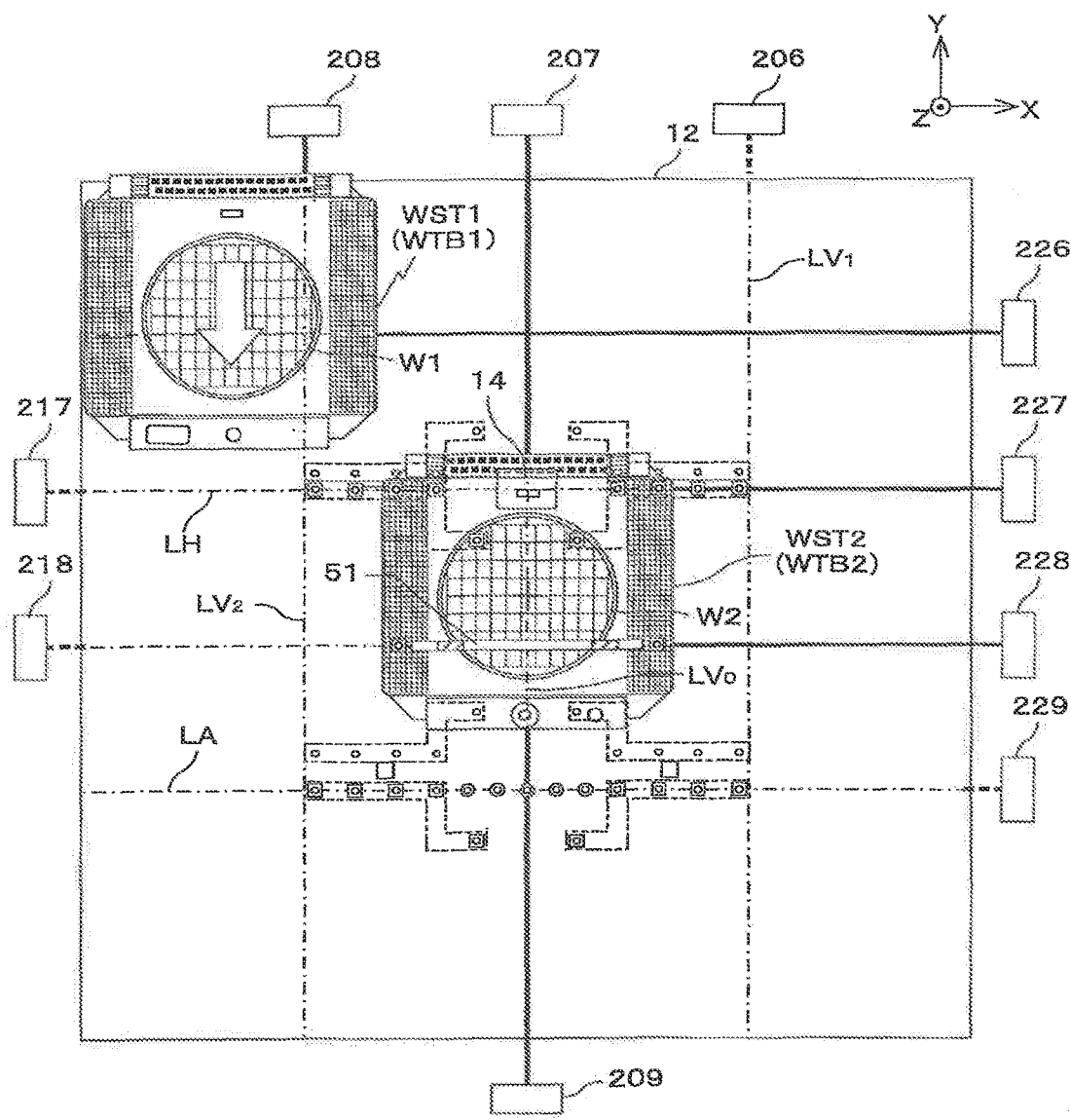
FIG. 73 is a view (No. 26) used to explain a parallel processing operation using wafer stage WST1 and WST2.

And, in parallel with performing the aerial image measurement operation described above, main controller 20 moves wafer stage WST1 to the position shown in FIG. 73.

Then, when aerial image measurement is completed, main controller 20 computes the baseline of primary alignment system AL1, based on detection results on detecting fiducial mark FM on measurement plate 30 of wafer stage WST2 using primary alignment system AL1 previously described and measurement results of the aerial image described above. At this point in time, the periphery edge exposure of wafer W2 previously described is being continued.

Figure 75:
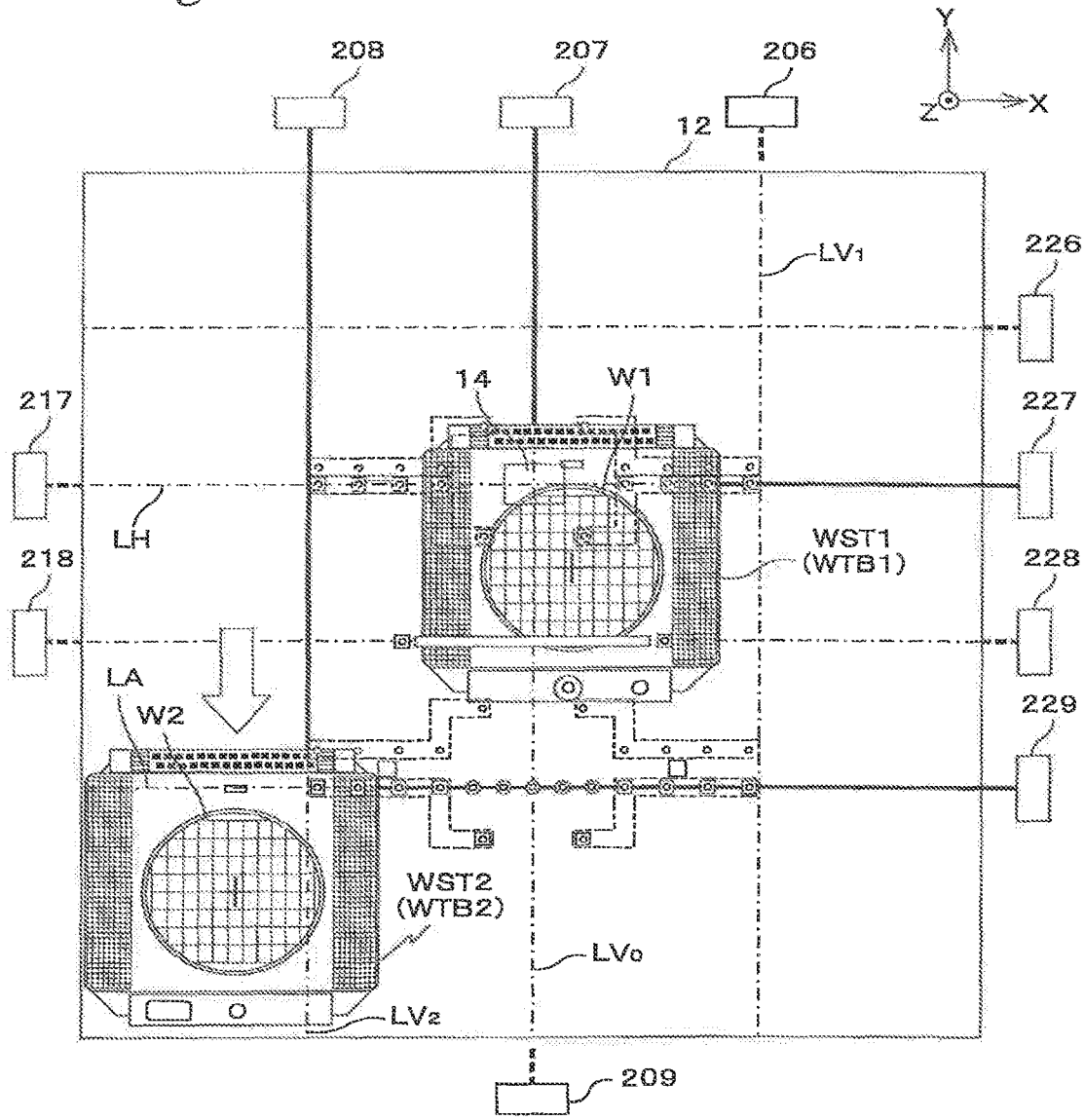
FIG. 75 is a view (No. 28) used to explain a parallel processing operation using wafer stage WST1 and WST2.

Next, main controller 20 moves wafer stage WST2 to the exposure starting position of wafer W2 while continuing the periphery edge exposure of wafer W2 as shown in FIG. 73, and also begins moving wafer stage WST1 in the –Y direction toward a left side loading position shown in FIG. 75.

Then, main controller 20 begins exposure of wafer W2 in a procedure similar to the one previously described. At the point in time when exposure of wafer W2 has begun, the periphery edge exposure has been completed.

Figure 74:
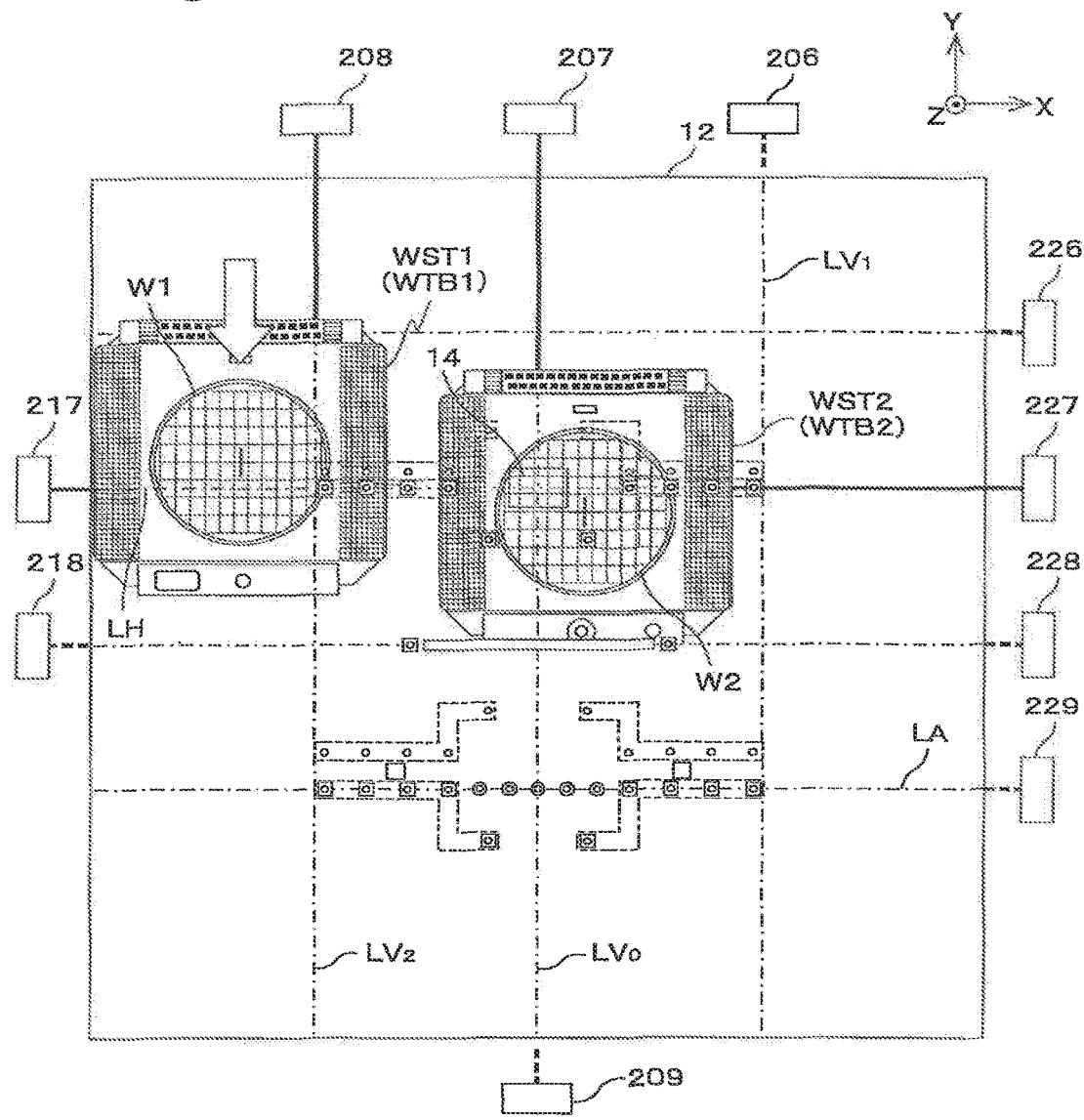
FIG. 74 is a view (No. 27) used to explain a parallel processing operation using wafer stage WST1 and WST2.

As is obvious from FIG. 74, during the movement of wafer stage WST1 toward the left side loading position, measurement beams from X interferometer 226 will no longer irradiate reflection surface 27a of wafer stage WST1, however, prior to this, measurement beams from X interferometer 217 begin to irradiate reflection surface 27c while measurement beams from X interferometer 226 irradiate reflection surface 27a. Therefore, the measurement values of X interferometer 217 are pre-set, based on the measurement values of X interferometer 226.

When wafer stage WST1 moves further in the –Y direction from the position shown in FIG. 74, measurement beams from X interferometer 218 begins to irradiate reflection surface 27c. Therefore, while measurement beams from X interferometer 217 irradiates reflection surface 27c, main controller 20 pre-sets the measurement values of X interferometer 218 based on the measurement values of X interferometer 217.

When wafer stage WST1 moves further in the –Y direction, measurement beams from X interferometer 229 begins to irradiate reflection surface 27a. Therefore, while measurement beams from X interferometer 218 irradiates reflection surface 27c, main controller 20 pre-sets the measurement values of X interferometer 229 based on the measurement values of X interferometer 228.

Main controller 20 continues the exposure operation by the step-and-scan method to wafer W2 concurrently with driving wafer stage WST1 toward the left side loading position, while switching the X interferometer used for position control in the manner described above.

Then, when wafer stage WST1 reaches the left side loading position shown in FIG. 75, main controller 20 begins Pit operation at the left side loading position.

Figure 76:
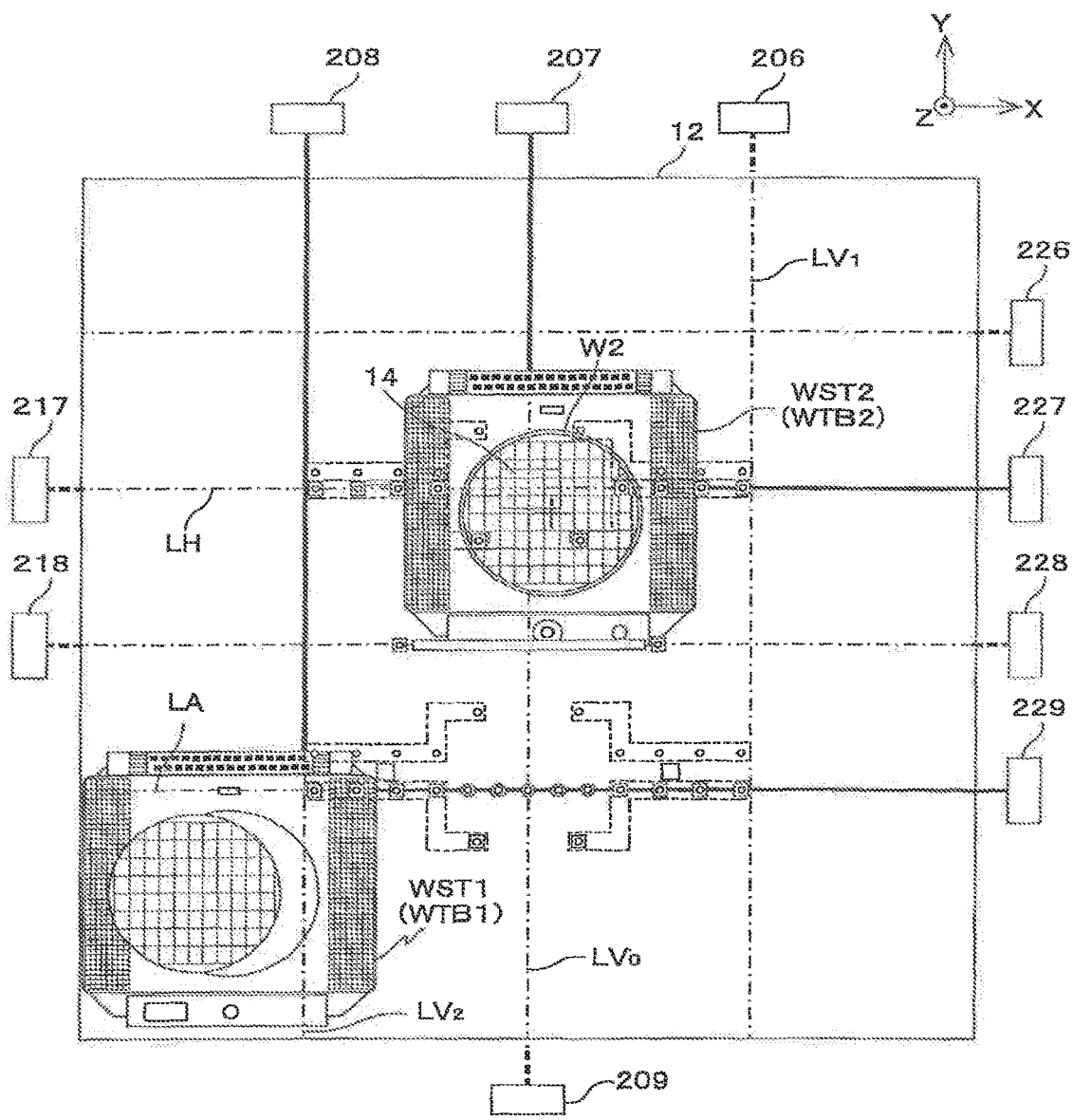
FIG. 76 is a view (No. 29) used to explain a parallel processing operation using wafer stage WST1 and WST2.

FIG. 76 shows a state in which wafer exchange between a wafer carriage mechanism (not shown) and wafer stage WST1 is performed as a part of Pit operation at the left side loading position, and exposure by the step-and-scan method is being concurrently performed on wafer W2 held on wafer stage WST2 below projection unit PU.

Hereinafter, main controller 20 repeatedly executes the parallel operation using wafer stage WST1 and WST2 described above.

As discussed in detail so far, according to exposure apparatus 1000 of the fourth embodiment, in parallel with the exposure of the wafer (W1 or W2) held by one of wafer stages WST1 and WST2 performed by main controller 20, the other stage of wafer stages WST1 and WST2 is moved in the X-axis direction while also being moved in the Y-axis direction, and a plurality of different alignment marks on the wafer held by the other wafer stage is positioned sequentially within the detection area (a plurality of detection areas) of alignment systems AL1, and $AL2_1$ to $AL2_4$, and positional information of the alignment marks which are located within the detection areas of alignment system AL1, and $AL2_1$ to $AL2_4$ is sequentially detected. Accordingly, while the other wafer stage moves in the Y-axis direction from a position. In the vicinity of the detection areas (for example, a position in the vicinity of the position where exchange of the wafer which is held by the wafer stage is performed) of alignment systems AL1, and $AL2_1$ to $AL2_4$ to the exposure position (directly below projection unit PU, exposure area IA) concurrently with the exposure of the wafer held by the one wafer stage WST, it becomes possible to detect the plurality of alignment marks, for example, all of the alignment marks on the wafer held by the other stage. As a consequence, it becomes possible to achieve improvement of the throughput as well as improvement of the overlay accuracy. Further, main controller 20 controls periphery edge exposure unit 51, and an energy beam which has almost the same wavelength as illumination light IL is irradiated on a part of the shot areas in the periphery section of the wafer held by the other wafer stage passing below periphery edge exposure unit 51, while the stage moves toward the exposure position. Accordingly, improvement of the yield can be achieved without decreasing the throughput.

Further, in exposure apparatus 1000 of the fourth embodiment, main controller performs Pit operation, or more specifically, wafer exchange between the wafer transport mechanism (not shown) and the other wafer stage, cooling of the wafer holder, and other preparatory operations for exposure at the other loading position of wafer stages WST1 and WST2, concurrently with the exposure of the wafer (W1 or W2) held by one of wafer stages WST1 and WST2. Accordingly, operations such as the cooling of the wafer holder can be performed without decreasing the throughput.

Further, according to the fourth embodiment, main controller 20 controls planar motor 151 which drives wafer stages WST1 and WST2 within the XY plane, as well as move wafer stage WST1 to the left side loading position where exchange of wafer W1 on wafer stage WST1 is performed along a first return path located on one side (–X side) in the X-axis direction of the exposure position of wafer stage WST1 when exposure of wafer W1 held by wafer stage WST1 has been completed, and also move wafer stage WST2 to the right side loading position where exchange of wafer W2 on wafer stage WST2 is performed along a second return path located on the other side (+X side) in the X-axis direction of the exposure position of wafer stage WST2 when exposure of wafer W2 held by wafer stage WST2 has been completed. Accordingly, attaching a cable for wiring/piping to wafer stage WST1 from one side in the +X direction, while attaching a cable for wiring/piping to wafer stage WST2 from the other side in the +X direction can keep the cables from being tangled, as well as keep the length as short as possible.

Further, in exposure apparatus 1000 of the fourth embodiment, when exposure of wafer W1 is completed, main controller 20 drives wafer stage WST2 in the +Y direction as well as drive wafer stage WST1 in the +Y direction and the −X direction while maintaining a scrum state in which measurement section 138 of wafer stage WST1 and FD bar 46 of wafer stage WST2 are in proximity or in contact, and delivers liquid immersion area 14 from the area over wafer stage WST1 to wafer stage WST2. As soon as liquid immersion area 14 has been delivered, main controller reduces the drive force of both wafer stages WST1 and WST2 in the +Y direction to zero at a position where measurement plate 30 of wafer stage WST2 is positioned directly under projection optical system PL. This suspends wafer stage WST2, and as shown in an outlined bold arrow in FIG. 72, wafer stage WST1 begins to move in the −X direction and moves toward the left loading position along the first return path described above. In order to efficiently begin the movement of wafer stage WST1 along the first return path, at the second scrum starting position, the scrum state of both wafer stages WST1 and WST2 is to begin in a state where the center line of wafer table WTB2 approximately coincides with reference axis $LV_0$, and the center line of wafer table WTB1 is shifted by a predetermined distance (the second offset amount) to the −X side from reference axis $LV_0$.

Meanwhile, when exposure of wafer W2 is completed, main controller 20 drives wafer stage WST1 in the +Y direction as well as drive wafer stage WST2 in the +Y direction and the +X direction while maintaining a scrum state in which measurement section 138 of wafer stage WST2 and FD bar 46 of wafer stage WST1 are in proximity or in contact in a similar manner as is previously described, and delivers liquid immersion area 14 from the area over wafer stage WST2 to wafer stage WST1. As soon as liquid immersion area 14 has been delivered, main controller reduces the drive force of both wafer stages WST1 and WST2 in the +Y direction to zero at a position where measurement plate 30 of wafer stage WST1 is positioned directly under projection optical system PL. This suspends wafer stage WST1, and as shown in an outlined bold arrow in FIG. 58, wafer stage WST1 begins to move in the +X direction and moves toward the right loading position along the second return path described above. In order to efficiently begin the movement of wafer stage WST2 along the second return path, at the first scrum starting position, the scrum state of both wafer stages WST1 and WST2 is to begin in a state where the center line of wafer table WTB1 approximately coincides with reference axis $LV_0$, and the center line of wafer table WTB2 is shifted by a predetermined distance (the first offset amount) to the +X side from reference axis $LV_0$.

As it can be seen from the description above, in exposure apparatus 1000 of the fourth embodiment, the offset amount of wafer stage WST1 and WST2 in the X-axis direction at the time when the scrum begins is decided so that the movement of one of the wafer stages along the return path toward the loading position to which the one wafer stage corresponds can be started most efficiently after exposure of the wafer on the one wafer stage has been completed, or more specifically, so that the movement path of the one wafer stage is the shortest, and also has the shortest time distance.

Incidentally, in the fourth embodiment described above, while the offset amount of wafer stage WST1 and WST2 in the X-axis direction at the time when the scrum begins was decided so that the movement of the wafer stage holding the wafer which has been exposed along the return path toward the loading position to which the one water stage corresponds can be started most efficiently, instead of this, or along with this, the offset amount of wafer stage WST1 and WST2 in the X-axis direction at the time when the scrum begins can be decided so that exposure of the wafer subject to the next exposure can be started most efficiently.

The scrum of both wafer stages which makes it possible to most efficiently start the movement of one of the wafer stages along the return path toward the loading position to which the one wafer stage corresponds after exposure of the wafer on the one wafer stage has been completed, or the scrum of both wafer stages which allows the exposure of the wafer subject to the next exposure to be performed in the most efficient manner can be referred to as the most efficient scrum.

Further, in the fourth embodiment described above, while the case has been described where a Y direction scrum in which both wafer stages WST1 and WST2 are in contact or in proximity in the Y-direction was employed to deliver liquid immersion area 14 between both wafer stages WST1 and WST2, besides this, an X direction scrum in which both wafer stages WST1 and WST2 are in contact or in proximity in the X-direction can he employed to deliver liquid immersion area 14 between both wafer stages WST1 and WST2. In this case, an offset can be applied to both wafer stages WST1 and WST2 in the Y-axis direction at the beginning of the scrum.

Further, even in the case the Y direction scrum is employed as in the fourth embodiment described above, a case can be considered where a part of the mechanism section protrudes from the side surface of wafer stages WST1 and WST2 in the Y-axis direction. In such cases, it is desirable to set the length of the measurement section and the dimension of the FD bar in the Y-axis direction, and/or the offset amount at the time of the scrum to a level so that such a protruding section does not come into contact with a part of the other wafer stage.

Incidentally, in the fourth embodiment described above, while the case has been described where a fixed protruding section was arranged in wafer stages WST1 and WST2 in the measurement section and table main section 34 such as the FD bar and the like, in the case the main purpose of the protruding section is to deliver the liquid immersion area between both wafer stages WST1 and WST2, the protruding section can be movable. In this case, for example, the protruding sections can be in a substantially horizontal state only when both wafer stages WST1 and WST2 are in a serum state, and at the time besides the scrum, or more specifically, when the protruding sections are not used, the protruding sections can be folded. Further, in the fourth embodiment, while the measurement section and the FD bar were used also as a protruding section, besides this, a fixed protruding section can be arranged exclusively in wafer stages WST1 and WST2.

Incidentally, in the fourth embodiment described above, the case has been described where after the exposure has been completed, wafer stage WST1 is moved to the first exchange position where exchange of wafer W1 on wafer stage WST1 is performed along the first return path located on the −X side of wafer stage WST1 and wafer stage WST2 is moved to the second exchange position where exchange of wafer W2 on wafer stage WST2 is performed along the second return path located on the +X side of wafer stage WST2, after switching between a proximity state (a scrum state) in which both wafer stages WST1 and WST2 are made to be in proximity in the Y-axis direction by a predetermined distance or less and a separation state (a scrum release state) in which both wafer stages WST1 and WST2 are separated, in order to deliver liquid immersion area 14 from one of the wafer stages to the other wafer stage. More specifically, the case where first exchange position and the second exchange position are separate was described. However, as well as this, the second exchange position can be the same as the first exchange position. In such a case, a configuration can be employed where after exposure has been completed on the wafer held by one of the wafer stages at the exposure position, main controller 20 makes both stages WST1 and WST2 perform the switching between the proximity state (scrum state) in which both wafer stages WST1 and WST2 are made to be in proximity in the Y-axis direction by a predetermined distance or less and the separation state (scrum release state) in which both wafer stages WST1 and WST2 are separated in order to deliver liquid immersion area 14 from one of the wafer stages to the other wafer stage, and also controls the planar motor so that the one wafer stage separated from the other wafer stage is moved to the exchange position where exchange of the wafer on both stages WST1 and WST2 is performed along a return path positioned on one side of the exposure position in the X-axis direction. In such a case, the movement range of both wafer stages in the X-axis direction can be set narrower when compared with the case where one wafer stage is moved to the exchange position along a return path positioned on one side of the exposure position in the X-axis direction and the other wafer stage is moved to the exchange position along a return path positioned on the other side of the exposure position in the X-axis direction.

Further, in the fourth embodiment above, wafer stages WST1 and WST2 were driven independently along the XY plane by a planar motor, with the movement path of wafer stages WST1 and WST2 previously described given as a premise. However, the planar motor does not necessarily have to be used, and a linear motor may also be used depending on the movement path.

Incidentally, in the fourth embodiment, periphery edge exposure unit 51 does not necessarily have to be arranged. Even in such a case, the various kinds of effects described above can be obtained.

Incidentally, in the fourth embodiment above, in parallel with main controller 20 performing exposure on the wafer (W1 or W2) held by one of wafer stages WST1 and WST2, only a plurality of different alignment marks on the wafer held by the other wafer stage has to be detected by alignment systems AL1 and $AL2_1$ to $AL2_4$ and the positional information measured, while the other wafer stage of wafer stages WST1 and WST2 is driven in the Y-axis direction. More specifically, the movement path from the exposure position to the wafer exchange position can be the same for wafer stages WST1 and WST2. Further, as for the other wafer stage of wafer stages WST1 and WST2 described above, only a plurality of different alignment marks on the wafer held by the other wafer stage has to be detected while being moved in the Y-axis direction, without being moved in the X-axis direction. Further, periphery edge exposure does not have to be performed while the other wafer stage is moving in the Y-axis direction as described above. Further, wafer stages WST1 and WST2 do not necessarily have to be driven by a planar motor.

Meanwhile, in the fourth embodiment described above, main controller 20 only has to control planar motor 151 which drives wafer stages WST1 and WST2 within the XY plane, as well as move wafer stage WST1 to the left side loading position where exchange of wafer W1 on wafer stage WST1 is performed along a first return path located on one side (−X side) in the X-axis direction of the exposure position of wafer stage WST1 when exposure of wafer W1 held by wafer stage WST1 has been completed, and also move wafer stage WST2 to the right side loading position where exchange of wafer W2 on wafer stage WST2 is performed along a second return path located on the other side (+X side) in the X-axis direction of the exposure position of wafer stage WST2 when exposure of wafer W2 held by wafer stage WST2 has been completed. More specifically, measurement of the positional information of a plurality of different alignment marks on the wafer held by the other wafer stage does not have to be performed in parallel with the exposure performed on the wafer held by one of wafer stages WST1 and WST2, not to mention the periphery edge exposure of the wafer held by the other wafer stage of wafer stages WST1 and WST2. Further, the planar motor can be a moving coil type motor.

Further, in the fourth embodiment above, while the case has been described where measurement system 200 includes interferometer systems 118 and encoder system 150, as well as this, the measurement system can include only one of interferometer system 118 and encoder system 150. Especially in the case when the measurement system includes only an encoder system, the encoder system does not necessarily have to be a two-dimensional encoder including a 2D head.

Incidentally, in each of the first and fourth embodiments described above, while the examples were described where periphery edge exposure unit 51 was configured using a micromirror array, besides such examples, the configuration of periphery edge exposure unit 51 is not an issue in particular, as long as exposure of an arbitrary position (area) on the wafer can be performed freely, using a light having almost the same wavelength as illumination light IL. For example, the periphery edge exposure unit can be configured using a spatial light modulator other than the micromirror array. Further, the periphery edge exposure unit can be configured using a reticle and projection optical system PL. Further, in the periphery edge exposure, a pattern which is the same as the one transferred on a shot area in normal exposure can be transferred, or a different pattern can be transferred. In this case, for example, the transfer pattern density and the like is preferably the same, or not too different. However, the line width can be coarse.

Incidentally, placements, configurations and the like of each of the measurement devices such as the encoder head, Z head, interferometer and the like described in the first to fourth embodiments above are mere examples, and it is a matter of course that the present invention is not limited to this. For example, the number of heads that the head units are equipped with is not limited to the ones described above, and the numbers are not an issue as long as the heads are arranged on both the outer sides of the plurality of mark detection systems (in each of the embodiments above, alignment systems AL1, AL2$_1$ to AL2$_4$). The important thing is, on detecting specific alignment marks on wafer w with each of the plurality of mark detection systems, the heads facing the pair of scales should be at least one each. Further, in each of the embodiments above, while the case has been described where the Y position of the two heads which were located innermost among the plurality of heads arranged on both of the outer sides of the plurality of mark detection systems were different from the other heads, the Y position of any other heads can also be different. The important thing is, the Y position of an arbitrary head should be different from the Y position of other heads, in correspondence with the empty space. Or, in the case there is enough empty space on both of the outer sides of the plurality of mark detection systems, all the heads can be placed at the same Y position.

Further, the number of mark detection systems (alignment systems) is not limited to five, and while it is desirable that two or more mark detection systems whose position of the detection area is different in a second direction (the X-axis direction in each of the embodiments above), the number is not an issue in particular.

Further, in each of the embodiments above, in the case when only an encoder system is arranged without arranging an interferometer system, the Z head can also be made to measure the positional information of the wafer table in the θx direction.

Further, in each of the first, second, and fourth embodiments, an encoder system which has an encoder head arranged on a wafer table as well as a scale on which a one-dimensional or a two-dimensional grating (for example, a diffraction grating) is formed that is placed above the wafer table facing the encoder head can be used, as in the third embodiment or as is disclosed in, for example, the U.S. Patent Application Publication No. 2006/0227309 and the like. In this case, the Z heads can also be placed on the wafer table, and the surface of the scale described above can be used also as the reflection surface on which the measurement beams from the Z heads are irradiated. Further, a head whose measurement direction is also in the Z-axis direction in addition to the X-axis direction and/or the Y-axis direction that also has the function of, so to speak, an encoder head and a Z head, can be used. In this case, the Z heads will, not be necessary. Incidentally, in each of the embodiments above, while the lower surface of nozzle unit 32 and the lower end surface or the tip optical element of projection optical system PL were on a substantially flush surface, as well as this, for example, the lower surface of nozzle unit 32 can be placed nearer to the image plane (more specifically, to the wafer) of projection optical system PL than the outgoing surface of the tip optical element. That is, the configuration of local liquid immersion unit 8 is not limited to the configuration described above, and the configurations can be used, which are described in, for example, EP Patent Application Publication No. 1420298, the pamphlet of International Publication No. 2004/055803, the pamphlet of International Publication No. 2004/057590, the pamphlet of international Publication No. 2005/029559 (the corresponding U.S. Patent application Publication No. 2006/0231206), the pamphlet of International Publication No. 2004/086468 (the corresponding U.S. Patent Application Publication No. 2005/0280791), Kokai (Japanese Unexamined Patent Application Publication) No. 2004-289126 (the corresponding U.S. Pat. No. 6,952,253), and the like. Further, as disclosed in the pamphlet of International Publication No. 2004/019128 (the corresponding U.S. Patent Application Publication No. 2005/0248856 description), the optical path on the object plane side of the tip optical element may also be filled with liquid, in addition to the optical path on the image plane side of the tip optical element. Furthermore, a thin film that is lyophilic and/or has dissolution preventing function may also be formed on the partial surface (including at least a contact surface with liquid) or the entire surface of the tip optical element. Incidentally, quartz has a high affinity for liquid, and also needs no dissolution preventing film, while in the case of fluorite, at least a dissolution preventing film is preferably formed.

Incidentally, in each of the embodiments above, pure water (water) was used as the liquid, however, it is a matter of course that the present invention is not limited to this. As the liquid, a chemically stable liquid that has high transmittance to illumination light IL and is safe to use, such as a fluorine-containing inert liquid can be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of these liquids may be used, or a liquid obtained by adding (mixing) at least one of these liquids to (with) pure water may be used. Alternatively as the liquid, a liquid obtained by adding (mixing) base or acid such as $H^+$, $Cs^+$, $K^+$, $Cl^-$, $SO_4^{2-}$, or $PO_4^{2-}$ to (with) pure water can be used. Moreover, a liquid obtained by adding (mixing) particles of Al oxide or the like to (with) pure water can be used. These liquids can transmit ArF excimer laser light. Further, as the liquid, which has a small absorption coefficient of light, is less temperature-dependent, and is stable to a projection optical system (tip optical member) and/or a photosensitive agent (or a protection film (top coat film), an antireflection film, or the like) coated on the surface of a wafer, is preferable. Further, in the case an $F_2$ laser is used as the light source, fomblin oil can be selected. Further, as the liquid, a liquid having a higher refractive index to illumination light IL than that of pure water, for example, a refractive index of around 1.6 to 1.8 may be used. As the liquid, supercritical fluid can also be used. Further, the tip optical element of projection optical system PL may be formed by quartz (silica), or single-crystal materials of fluoride compound such as calcium fluoride (fluorite), barium fluoride, strontium fluoride, lithium fluoride, and sodium fluoride, or may be formed by materials having a higher refractive index than that of quartz or fluorite (e.g. equal to or higher than 1.6). As the materials having a refractive index equal to or higher than 1.6, for example, sapphire, germanium dioxide, or the like disclosed in the pamphlet of International Publication No. 2005/059617, or kalium chloride (having a refractive index of about 1.75) or the like disclosed in the pamphlet of International Publication No. 2005/059618 can be used.

Further, in each of the embodiments above, withdrawn liquid may be reused, it is desirable that this case arranges a filter removing impurities from withdrawn liquid in liquid recovery device or a recovery pipe.

Further, in each of the embodiments above, the case has been described, where the exposure apparatus is a liquid immersion type exposure apparatus. However, the present invention is not limited to this, but can also be employed in a dry type exposure apparatus that performs exposure of wafer W without liquid (water).

Further, in each of the embodiments above, the case has been described where the present invention is applied to a scanning exposure apparatus by a step-and-scan method or the like. However, the present invention is not limited to this, but may also be applied to a static exposure apparatus such as a stepper. Further, the present invention can also be applied to a projection exposure apparatus by a step-and-stitch method that synthesizes a shot area and a shot area, an exposure apparatus by a proximity method, a mirror projection aligner, or the like.

Further, the magnification of the projection optical system in the exposure apparatus in each of the embodiments above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image. Moreover, exposure area IA to which illumination light IL is irradiated via projection optical system PL is an on-axis area that includes optical axis AX within the field of projection optical system PL. However, for example, as is disclosed in the pamphlet of International Publication No. 2004/107011, exposure area IA may also be an off-axis area that does not include optical axis AX, similar to a so-called inline type catadioptric system, in part of which an optical system (catoptric system or catadioptric system) that has plural reflection surfaces and forms an intermediate image at least once is arranged, and which has a single optical axis. Further, the illumination area and exposure area described above are to have a rectangular shape. However, the shape is not limited to rectangular, and can also be circular arc, trapezoidal, parallelogram or the like.

Incidentally, the light source of the exposure apparatus in each of the embodiments above is not limited to the ArF excimer laser, but a pulse laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generating unit of a YAG laser or the like can also be used. Besides the sources above, as is disclosed in, for example, the pamphlet of International Publication No. 1999/46835 (the corresponding U.S. Pat. No. 7,023,610 description), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, the present invention can also be suitably applied to an EUV exposure apparatus that uses a total reflection reduction optical system designed under a wavelength range of 5 to 15 nm, such as for example, 13.5 nm, and a reflective mask. Besides such an apparatus, the present invention can also be applied to an exposure apparatus that uses charged particle beams such as an electron beam or an ion beam.

Further, in each of the embodiments above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used.

Further, as is disclosed in, for example, the pamphlet of International Publication No. 2001/035168, the present invention can also be applied to an exposure apparatus (lithography system) that forms line-and-space patterns on a wafer by forming interference fringes on the wafer.

Moreover, the present invention can also be applied to an exposure apparatus that synthesizes two reticle patterns via a projection optical system and almost simultaneously performs double exposure of one shot area by one scanning exposure, as is disclosed in, for example, Kohyo (published Japanese translation of international Publication for Patent Application) No. 2004-519850 bulletin (the corresponding U.S. Pat. No. 6,611,316).

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy beam is irradiated) in each of the embodiments above is not limited to a wafer, but may be other objects such as a glass plate, a ceramic substrate, a film member, or a mask blank.

The use of the exposure apparatus is riot limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs thin-film magnetic heads, imaging devices (such as CCDs) micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a reticle is transferred onto the wafer by the exposure apparatus (pattern formation apparatus) in each of the embodiments above, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus in each of the embodiments above, a highly integrated device can be produced with good productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes a substrate with an illumination light via a projection optical system and a liquid, the apparatus comprising:
   a mask stage system having a first stage and a first drive system, the first stage being disposed above the projection optical system and holding a mask illuminated with the illumination light, and the first drive system having a motor configured to drive the first stage;
   a nozzle member provided to surround a lens that is disposed closest to an image plane side, of a plurality of optical elements of the projection optical system, the nozzle member having a lower surface that is disposed lower than an emitting surface of the lens and forming a liquid immersion area with the liquid under the lens;
   a base member disposed below the nozzle member;
   a substrate stage system having two second stages and a second drive system, the two second stages being disposed on the base member and each holding a substrate, and the second drive system having a planar motor configured to drive the two second stages; and
   a controller coupled to the mask stage system and the substrate stage system, the controller controlling the first and the second drive systems so that scanning exposure in which the mask and the substrate are each moved relative to the illumination light is performed with a first direction within a predetermined plane serving as a scanning direction, and the predetermined plane being orthogonal to an optical axis of the projection optical system,
   wherein a cable is connected to one second stage of the two second stages from one side in a second direction and another cable is connected to an other second stage of the two second stages from an other side in the second direction, the second direction being orthogonal to the first direction within the predetermined plane, and
   wherein the controller:
      controls the second drive system so that the other second stage comes close to the one second stage placed facing the projection optical system from one side in the first direction, and the two second stages that have come close together are moved from the one side to another side in the first direction, in order to place the other second stage to face the projection optical system instead of the one second stage while substantially maintaining the liquid immersion area under the lens,
      controls the second drive system so that the one second stage, that is located on the other side in the first direction with respect to the other second stage placed facing the projection optical system, is moved to an exchange position of the substrate, by passing the one side in the second direction with respect to the other second stage, the exchange position being set on the one side in the first direction with respect to the projection optical system,
      controls the second drive system so that the one second stage comes close to the other second stage placed facing the projection optical system from the one side in the first direction, and the two second stages that have come close together are moved from the one side to the other side in the first direction, in order to place the one second stage to face the projection optical system instead of the other second stage while substantially maintaining the liquid immersion area under the lens, and
      controls the second drive system so that the other second stage, that is located on the other side in the first direction with respect to the one second stage placed facing the projection optical system, is moved to the exchange position, by passing the other side in the second direction with respect to the one second stage.

2. The exposure apparatus according to claim 1, wherein each of the two second stages has a measurement member that detects the illumination light via the projection optical system and the liquid of the liquid immersion area, and
   the controller controls the second drive system so that a detection operation of the illumination light by the measurement member is performed prior to the scanning exposure.

3. The exposure apparatus according to claim 2, wherein the measurement member includes an aerial image measurement device that detects an image via a slit pattern disposed on an upper surface of the second stage, the image being projected via the projection optical system and the liquid of the liquid immersion area, and
   the slit pattern is disposed on the other side in the first direction on the upper surface of the second stage.

4. The exposure apparatus according to claim 3, further comprising:
   a mark detection system that is disposed on the one side in the first direction with respect to the projection optical system, spaced apart from the projection optical system, and that detects a mark of the substrate, wherein
   the controller controls the second drive system so that:
   a detection operation of the mark is performed with respect to each of the two second stages in a measurement station in which the mark detection system is disposed;
   each of the two second stages is moved from the measurement station to an exposure station in which the projection optical system is disposed, and an exposure operation of the substrate is performed with respect to each of the two second stages; and
   each of the two second stages is moved from the exposure station to the measurement station and an exchange operation of the substrate is performed at the exchange position.

5. The exposure apparatus according to claim 4, wherein
exchange of a substrate held by the one second stage is performed at a first exchange position in the measurement station, and
exchange of a substrate held by the other second stage is performed at a second exchange position that is disposed on the other side in the second direction with respect to the first exchange position, spaced apart from the first exchange position in the measurement station.

6. The exposure apparatus according to claim 1, wherein the controller controls the second drive system so that in movement of the two second stages that have come close together, the two second stages are placed shifted in the second direction.

7. The exposure apparatus according to claim 6, wherein
in a first replacement operation of placing the other second stage to face the projection optical system instead of the one second stage by the movement of the two second stages that have come close together, the other second stage is placed shifted to the other side in the second direction with respect to the one second stage, and
in a second replacement operation of placing the one second stage to face the projection optical system instead of the other second stage by the movement of the two second stages that have come close together, the one second stage is placed shifted to the one side in the second direction with respect to the other second stage.

8. The exposure apparatus according to claim 7, wherein
in the first replacement operation, the one second stage is placed shifted to the one side in the second direction with respect to the nozzle member, and
in the second replacement operation, the other second stage is placed shifted to the other side in the second direction with respect to the nozzle member.

9. The exposure apparatus according to claim 8, further comprising:
a frame member that supports the projection optical system; and
an encoder system that has a plurality of heads provided at each of the two second stages and irradiates reflective gratings of a plurality of scale members from below with measurement beams via the plurality of heads, the plurality of scale members being supported by the frame member to be substantially parallel to the predetermined plane, wherein
at least in an exposure operation of the substrate, positional information of the two second stages is measured with the encoder system.

10. A device manufacturing method, comprising:
exposing a substrate by the exposure apparatus according to claim 1; and
developing the substrate that has been exposed.

11. An exposure method of exposing a substrate with an illumination light via a projection optical system and a liquid, the method comprising:
holding a mask with a first stage disposed above the projection optical system;
placing one second stage of two second stages to face the projection optical system, on a base member disposed below a nozzle member, the nozzle member being provided to surround a lens that is disposed closest to an image plane side, of a plurality of optical elements of the projection optical system, the nozzle member having a lower surface that is disposed lower than an emitting surface of the lens and forming a liquid immersion area with the liquid under the lens, and the two second stages each holding a substrate and being moved by a planar motor;
moving the first stage and the one second stage so that scanning exposure in which the mask and the substrate are each moved relative to the illumination light is performed with a first direction within a predetermined plane serving as a scanning direction, the predetermined plane being orthogonal to an optical axis of the projection optical system;
moving an other second stage of the two seconds stages to come close to the one second stage placed facing the projection optical system from one side in the first direction, a cable being connected to the one second stage from one side in a second direction and another cable being connected to the other second stage from an other side in the second direction, and the second direction being orthogonal to the first direction within the predetermined plane;
moving the two second stages that have come close together from the one side to an other side in the first direction, in order to place the other second stage to face the projection optical system instead of the one second stage while substantially maintaining the liquid immersion area under the lens;
moving the one second stage, that is located on the other side in the first direction with respect to the other second stage placed facing the projection optical system, to an exchange position of the substrate, by making the one second stage pass the one side in the second direction with respect to the other second stage, the exchange position being set on the one side in the first direction with respect to the projection optical system;
moving the one second stage to come close to the other second stage placed facing the projection optical system from the one side in the first direction;
moving the two second stages that have come close together from the one side to the other side in the first direction, in order to place the one second stage to face the projection optical system instead of the other second stage while substantially maintaining the liquid immersion area under the lens; and
moving the other second stage, that is located on the other side in the first direction with respect to the one second stage placed facing the projection optical system, to the exchange position, by making the other second stage pass the other side in the second direction with respect to the one second stage.

12. The exposure method according to claim 11, wherein
each of the two second stages has a measurement member that detects the illumination light via the projection optical system and the liquid of the liquid immersion area, and
each of the two second stages is moved so that a detection operation of the illumination light by the measurement member is performed prior to the scanning exposure.

13. The exposure method according to claim 12, wherein
the measurement member includes an aerial image measurement device that detects an image via a slit pattern disposed on an upper surface of the second stage, the image being projected via the projection optical system and the liquid of the liquid immersion area, and
the slit pattern is disposed on the other side in the first direction on the upper surface of the second stage.

14. The exposure method according to claim 13, wherein
a mark of the substrate is detected with a mark detection system that is disposed on the one side in the first direction with respect to the projection optical system, spaced apart from the projection optical system, and
each of the two second stages is moved from a measurement station in which the mark detection system is disposed to an exposure station in which the projection optical system is disposed, and is also moved from the exposure station to the measurement station, and an exchange operation of the substrate is performed in the measurement station.

15. The exposure method according to claim 14, wherein
exchange of a substrate held by the one second stage is performed at a first exchange position in the measurement station, and
exchange of a substrate held by the other second stage is performed at a second exchange position that is disposed on the other side in the second direction with respect to the first exchange position, spaced apart from the first exchange position in the measurement station.

16. The exposure method according to claim 11, wherein
in movement of the two second stages that have come close together, the two second stages are placed shifted in the second direction.

17. The exposure method according to claim 16, wherein
in a first replacement operation of placing the other second stage to face the projection optical system instead of the one second stage by the movement of the two second stages that have come close together, the other second stage is placed shifted to the other side in the second direction with respect to the one second stage, and
in a second replacement operation of placing the one second stage to face the projection optical system instead of the other second stage by the movement of the two second stages that have come close together, the one second stage is placed shifted to the one side in the second direction with respect to the other second stage.

18. The exposure method according to claim 17, wherein
in the first replacement operation, the one second stage is placed shifted to the one side in the second direction with respect to the nozzle member, and
in the second replacement operation, the other second stage is placed shifted to the other side in the second direction with respect to the nozzle member.

19. The exposure method according to claim 18, wherein
at least in an exposure operation of the substrate, positional information of the two second stages is measured with an encoder system that has a plurality of heads provided at each of the two second stages and irradiates reflective gratings of a plurality of scale members from below with measurement beams via the plurality of heads, the plurality of scale members being supported by a frame member to be substantially parallel to the predetermined plane, and the frame member supporting the projection optical system.

20. A device manufacturing method, comprising:
exposing a substrate by the exposure method according to claim 11; and
developing the substrate that has been exposed.

21. A making method of an exposure apparatus that exposes a substrate with an illumination light via a projection optical system and a liquid, the method comprising:
providing a mask stage system having a first stage and a first drive system, the first stage being disposed above the projection optical system and holding a mask illuminated with the illumination light, and the first drive system having a motor configured to drive the first stage;
providing a nozzle member to surround a lens that is disposed closest to an image plane side, of a plurality of optical elements of the projection optical system, the nozzle member having a lower surface that is disposed lower than an emitting surface of the lens and forming a liquid immersion area with the liquid under the lens;
providing a base member disposed below the nozzle member;
providing a substrate stage system having two second stages and a second drive system, the two second stages being disposed on the base member and each holding a substrate, and the second drive system having a planar motor configured to drive the two second stages; and
providing a controller coupled to the mask stage system and the substrate stage system, the controller controlling the first and the second drive systems so that scanning exposure in which the mask and the substrate are each moved relative to the illumination light is performed with a first direction within a predetermined plane serving as a scanning direction, and the predetermined plane being orthogonal to an optical axis of the projection optical system,
wherein a cable is connected to one second stage of the two second stages from one side in a second direction and another cable is connected to an other second stage of the two second stages from an other side in the second direction, the second direction being orthogonal to the first direction within the predetermined plane, and
wherein the controller:
controls the second drive system so that the other second stage comes close to the one second stage placed facing the projection optical system from one side in the first direction, and the two second stages that have come close together are moved from the one side to an other side in the first direction, in order to place the other second stage to face the projection optical system instead of the one second stage while substantially maintaining the liquid immersion area under the lens,
controls the second drive system so that the one second stage, that is located on the other side in the first direction with respect to the other second stage placed facing the projection optical system, is moved to an exchange position of the substrate, by passing the one side in the second direction with respect to the other second stage, the exchange position being set on the one side in the first direction with respect to the projection optical system,
controls the second drive system so that the one second stage comes close to the other second stage placed facing the projection optical system from the one side in the first direction, and the two second stages that have come close together are moved from the one side to the other side in the first direction, in order to place the one second stage to face the projection optical system instead of the other second stage while substantially maintaining the liquid immersion area under the lens, and
controls the second drive system so that the other second stage, that is located on the other side in the first direction with respect to the one second stage placed facing the projection optical system, is moved to the exchange position, by passing the other side in the second direction with respect to the one second stage.

\* \* \* \* \*